United States Patent
Ogura et al.

(10) Patent No.: US 7,969,780 B2
(45) Date of Patent: Jun. 28, 2011

(54) NONVOLATILE SEMICONDUCTOR MEMORY USING AN ADJUSTABLE THRESHOLD VOLTAGE TRANSISTOR IN A FLIP-FLOP

(75) Inventors: Taku Ogura, Hyogo (JP); Masaaki Mihara, Hyogo (JP); Yoshiki Kawajiri, Hyogo (JP)

(73) Assignee: Genusion, Inc., Hyogo (JP)

( * ) Notice: Subject to any disclaimer, the term of this patent is extended or adjusted under 35 U.S.C. 154(b) by 179 days.

(21) Appl. No.: 11/776,491

(22) Filed: Jul. 11, 2007

(65) Prior Publication Data
US 2009/0073740 A1 Mar. 19, 2009

(30) Foreign Application Priority Data

Jul. 21, 2006 (JP) .................................. 2006-199673

(51) Int. Cl.
*G11C 11/34* (2006.01)
*G11C 14/00* (2006.01)
(52) U.S. Cl. ............... 365/185.08; 365/185.07; 365/154
(58) Field of Classification Search ............. 365/185.07, 365/185.08, 185.27, 154, 156
See application file for complete search history.

(56) References Cited

U.S. PATENT DOCUMENTS

| | | | |
|---|---|---|---|
| 4,149,268 A * | 4/1979 | Waters | 365/95 |
| 5,523,971 A * | 6/1996 | Rao | 365/185.07 |
| 5,526,303 A * | 6/1996 | Okajima | 365/154 |
| 5,646,885 A * | 7/1997 | Matsuo et al. | 365/185.07 |
| 5,745,417 A | 4/1998 | Kobayashi et al. | |
| 5,757,694 A * | 5/1998 | Mitani | 365/154 |
| 5,757,696 A | 5/1998 | Matsuo et al. | |
| 5,898,606 A | 4/1999 | Kobayashi et al. | |
| 5,956,269 A * | 9/1999 | Ouyang et al. | 365/185.08 |
| 5,986,932 A * | 11/1999 | Ratnakumar et al. | 365/185.07 |
| 6,009,010 A * | 12/1999 | Ohkubo | 365/154 |
| 6,411,545 B1 * | 6/2002 | Caywood | 365/185.07 |
| 6,518,614 B1 | 2/2003 | Breitwisch et al. | |
| 6,529,407 B2 * | 3/2003 | Shukuri | 365/185.07 |
| 6,906,962 B2 | 6/2005 | Layman et al. | |
| 6,963,103 B2 * | 11/2005 | Forbes | 257/315 |
| 7,236,396 B2 * | 6/2007 | Houston et al. | 365/185.07 |
| 7,430,137 B2 * | 9/2008 | Greene et al. | 365/185.05 |
| 7,447,082 B2 * | 11/2008 | Wang et al. | 365/185.28 |
| 7,602,640 B2 * | 10/2009 | Schatzberger | 365/185.07 |
| 7,778,076 B2 * | 8/2010 | Kuo et al. | 365/185.07 |

(Continued)

FOREIGN PATENT DOCUMENTS

| JP | 06-076582 | | 3/1994 |
|---|---|---|---|
| JP | 06076582 A | * | 3/1994 |
| JP | 2004-56905 A | | 2/2004 |

(Continued)

*Primary Examiner* — Tuan T Nguyen
*Assistant Examiner* — R Lance Reidlinger
(74) *Attorney, Agent, or Firm* — The Marbury Law Group PLLC

(57) ABSTRACT

An object of this invention is to provide a rewritable nonvolatile memory cell that can have a wide reading margin, and can control both a word line and a bit line by changing the level of Vcc. As a solution, a flip-flop is formed by cross (loop) connect of inverters including memory transistors that can control a threshold voltage by charge injection into the side spacer of the transistors. In the case of writing data to one memory transistor, a high voltage is supplied to a source of the memory transistor through a source line and a high voltage is supplied to a gate of the memory transistor through a load transistor of the other side inverter. In the case of erasing the written data, a high voltage is supplied to the source of the memory transistor through the source line.

22 Claims, 89 Drawing Sheets

U.S. PATENT DOCUMENTS

2003/0222303 A1* 12/2003 Fukuda et al. .............. 257/321
2007/0109861 A1* 5/2007 Wang et al. .............. 365/185.18
2008/0019162 A1* 1/2008 Ogura et al. .............. 365/72
2009/0147577 A1* 6/2009 Ivanov et al. .............. 365/185.07

FOREIGN PATENT DOCUMENTS

JP 2005-353106 12/2005
WO WO 2005059922 A1 * 6/2005
WO WO 2006034782 A1 * 4/2006

* cited by examiner

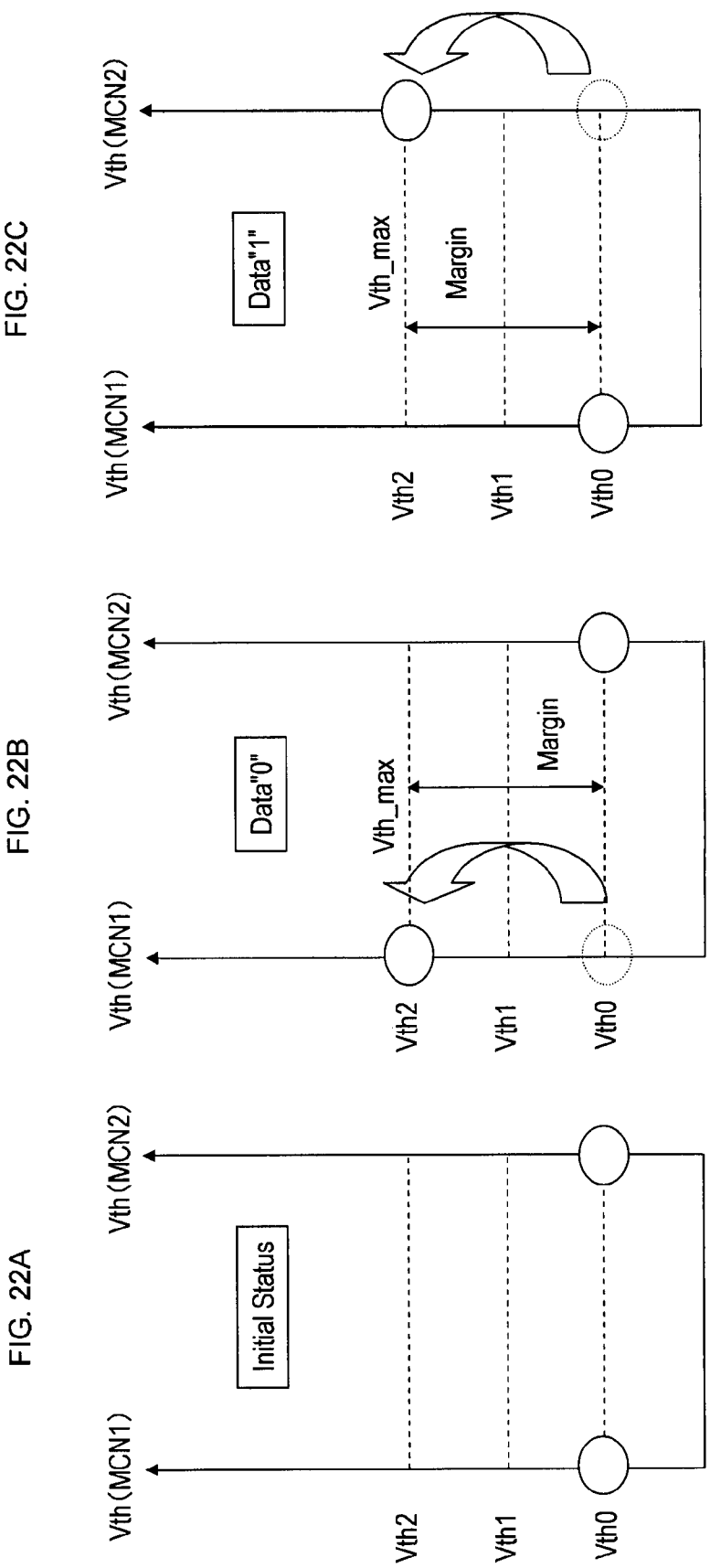

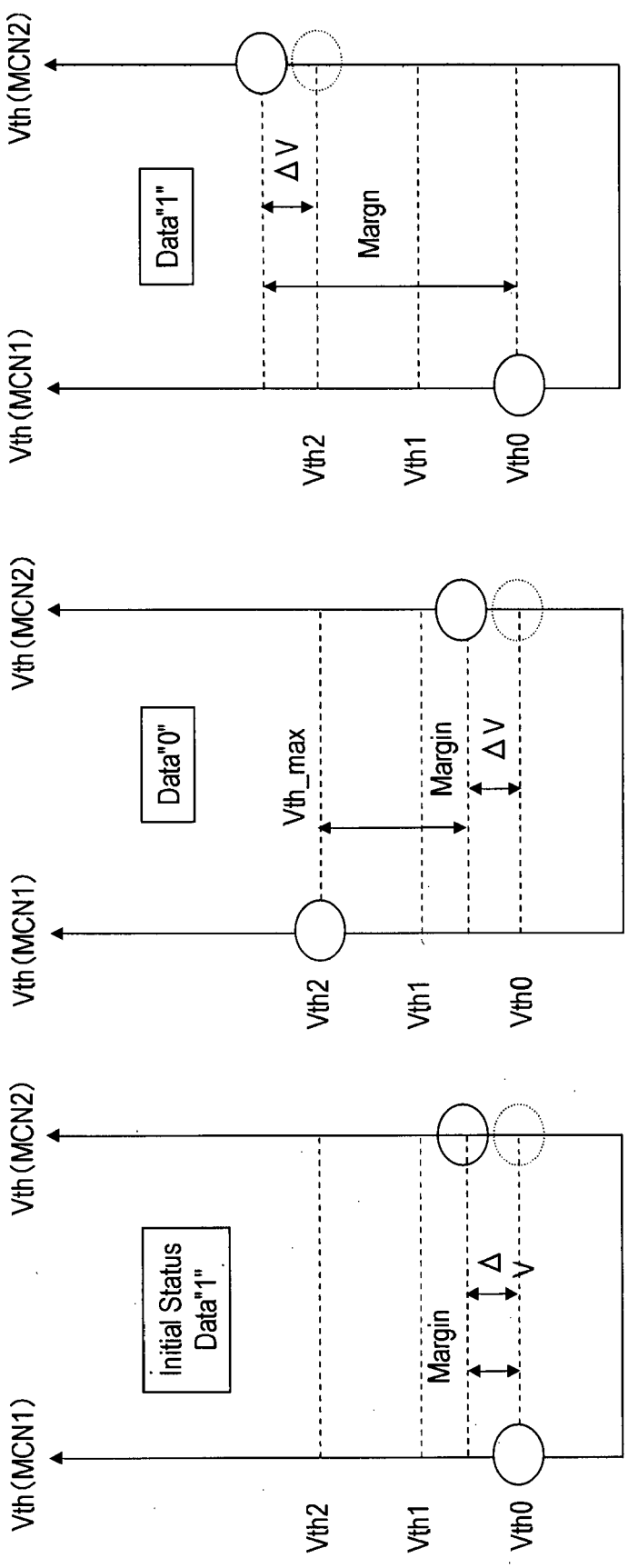

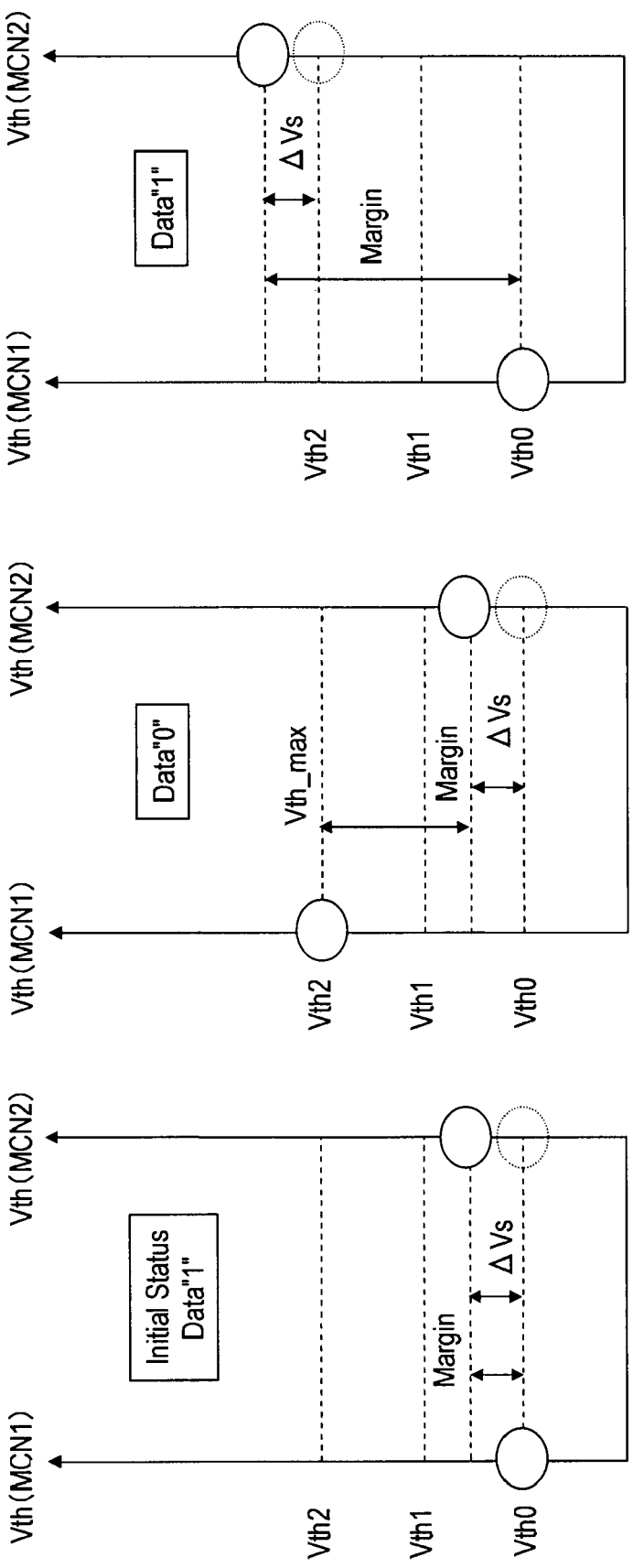

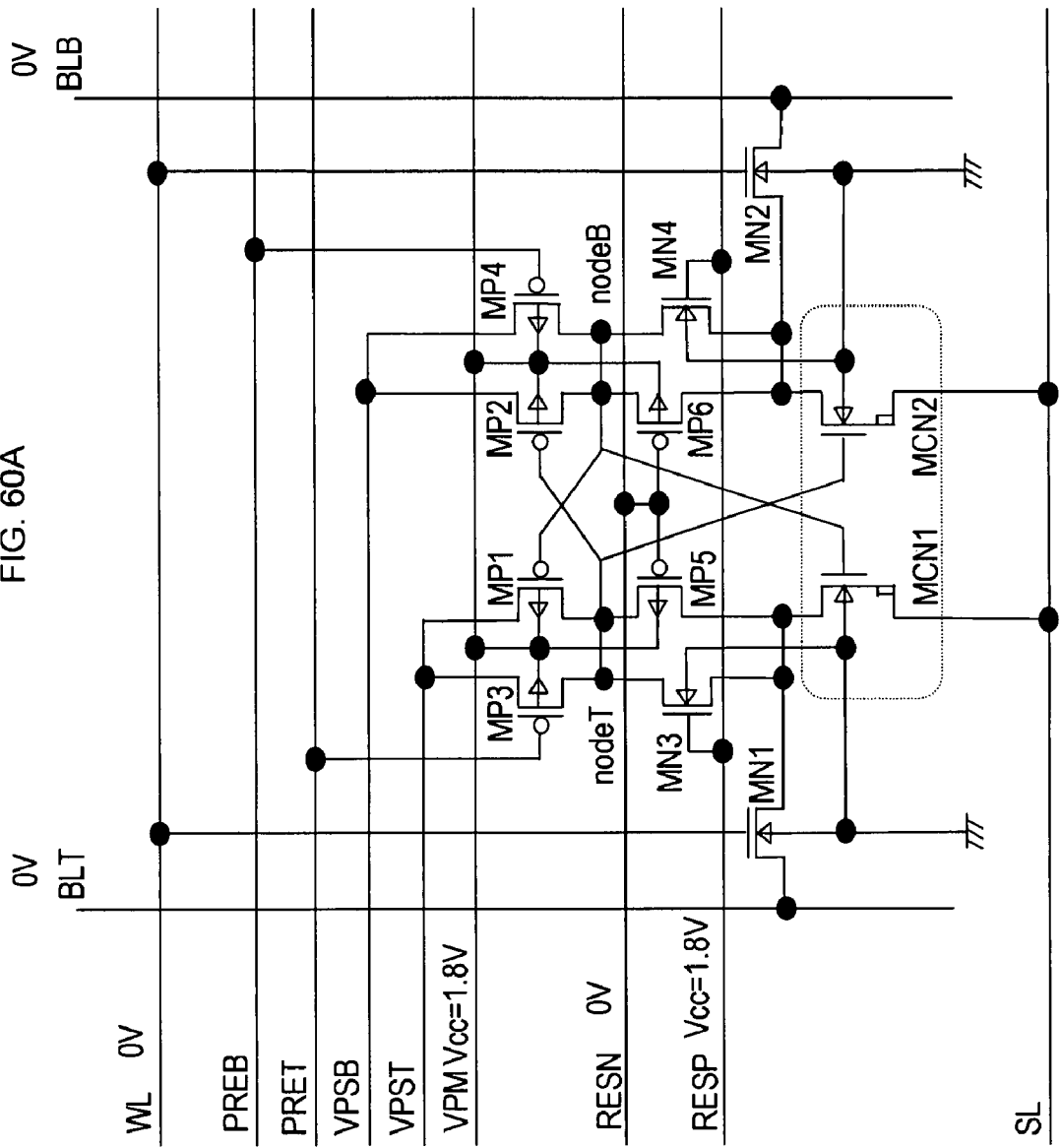

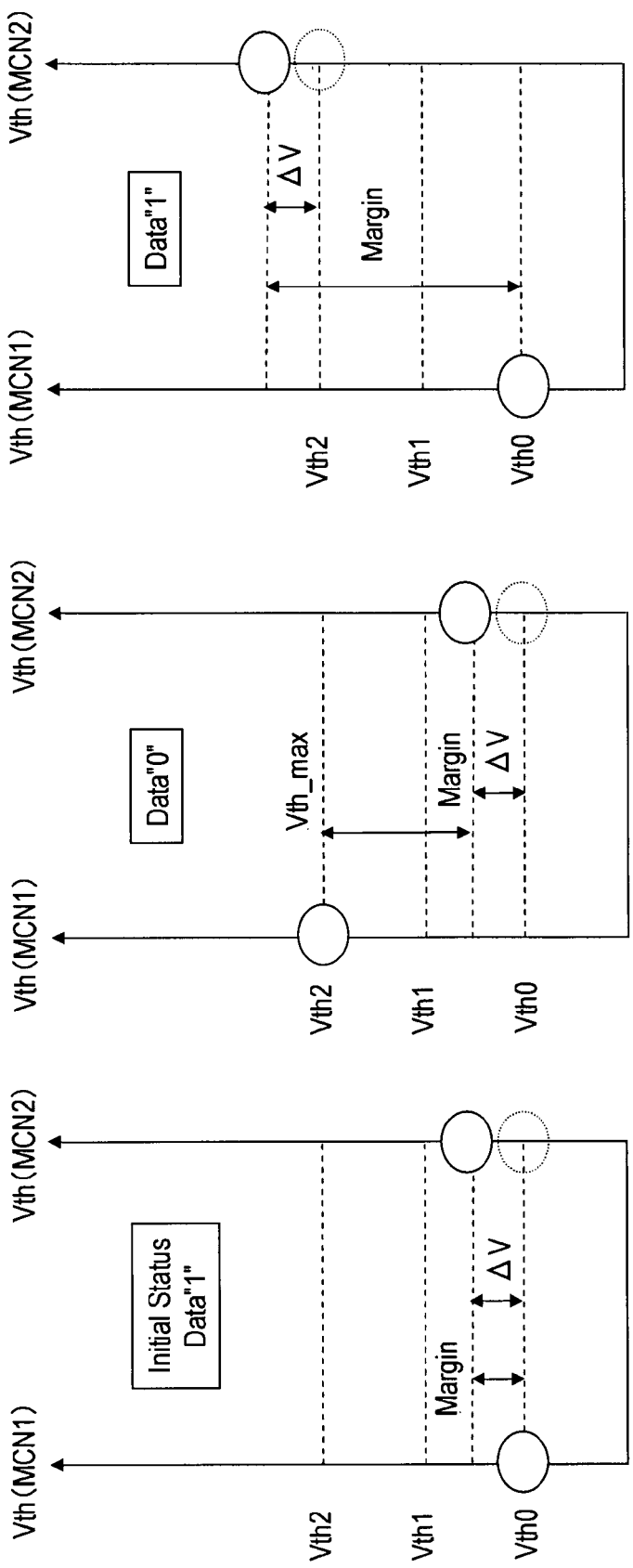

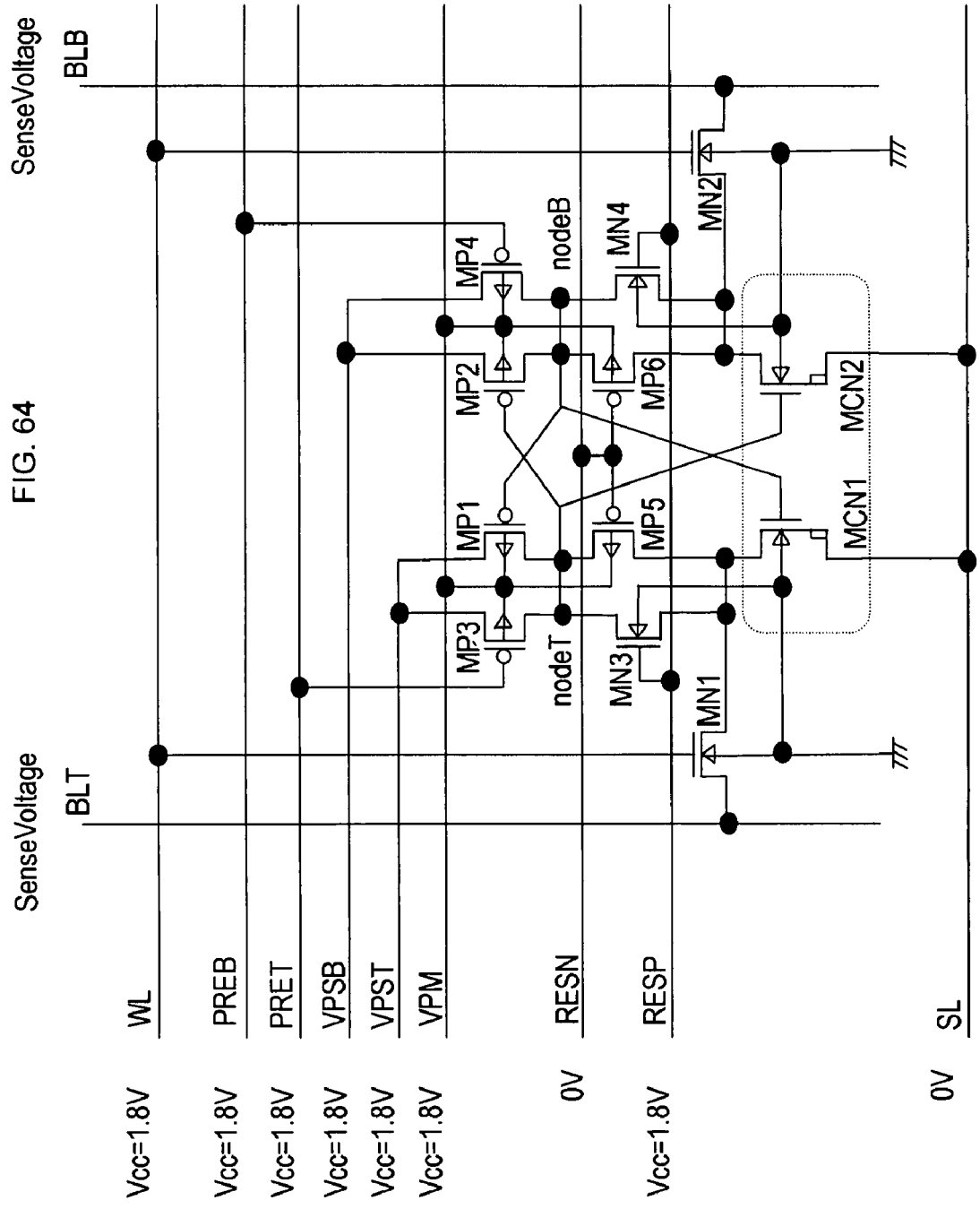

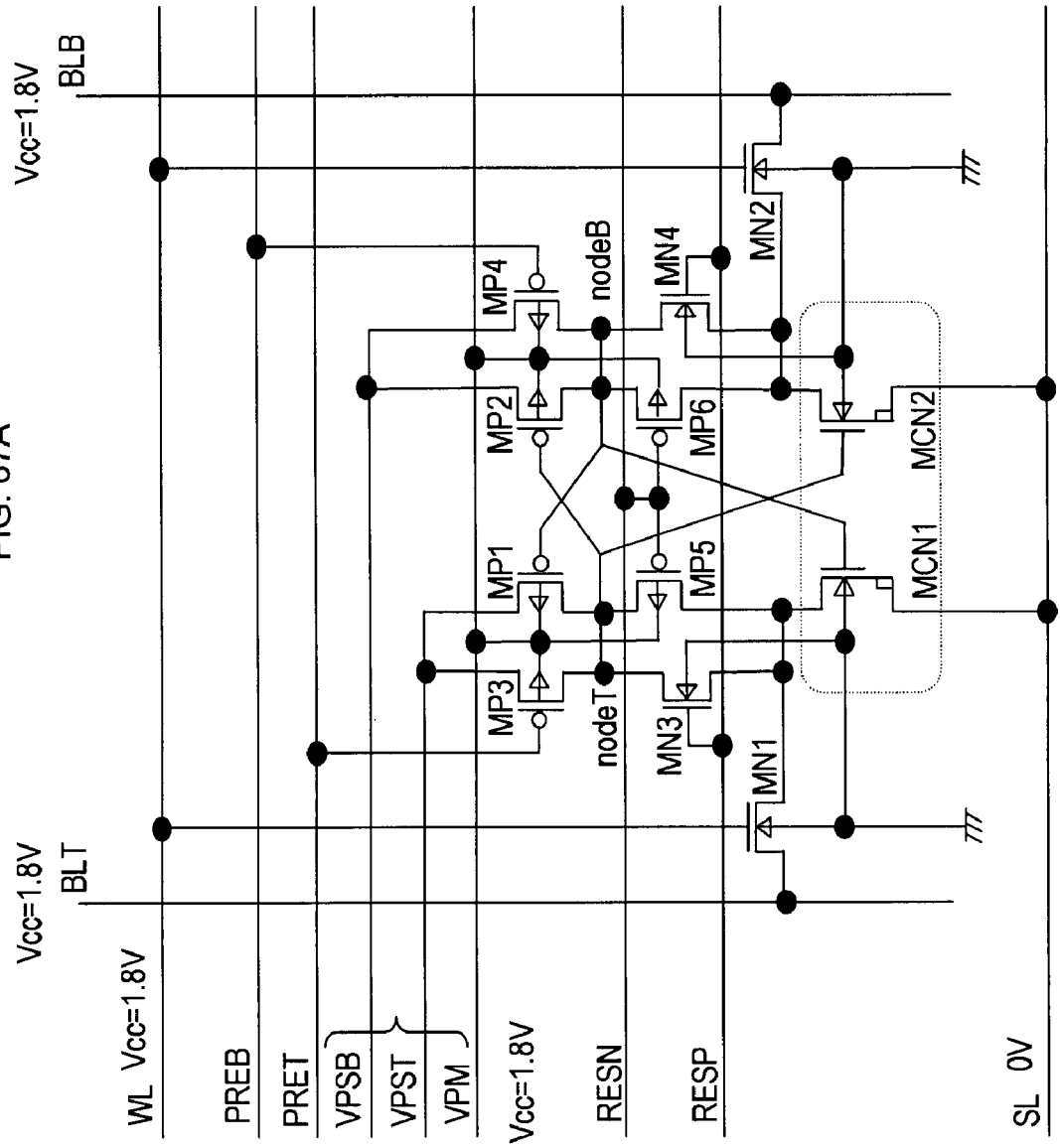

NONVOLATILE SEMICONDUCTOR MEMORY USING AN ADJUSTABLE THRESHOLD VOLTAGE TRANSISTOR IN A FLIP-FLOP

BACKGROUND OF THE INVENTION

1. Field of the Invention

This invention relates to electrically erasable and rewritable nonvolatile semiconductor memory devices, and semiconductor devices therewith.

2. Description of the Related Art

A low cost fuse memory device has been required, for making redundancy of an incorporated SRAM due to increasing its capacity, for tuning a driver such as an LCD driver individually after implementation, and for enhancing user-friendliness of personal identification information (an ID code, a decryption key, or IC card etc.).

A fuse having a poly-silicon or a wiring metal layer melted down by a laser or a current surge or a fuse having a gate insulator broken down by high voltage has been used as a fuse memory device formed in the standard logic CMOS process. However, these fuses having the meltdown portion or the breakdown portion cannot be applied to the foregoing usage because these are not reprogrammable.

An electrically erasable and rewritable fuse of a nonvolatile device having a floating gate can be manufactured in the logic CMOS process. However, additional mask steps over the standard logic CMOS process for manufacturing the floating gate does not worth the cost, and a floating gate device manufactured in a standard CMOS process deteriorates in data-retention due to a thinner insulator of a highly integrated circuit U.S. Pat. No. 6,518,614 B1 and JPA2004-056095 show a nonvolatile memory device that is manufactured in the standard CMOS process, and JPA2005-353106 shows a nonvolatile memory device without the floating gate manufactured without the additional mask steps.

SUMMARY OF THE INVENTION

FIG. 1 shows a memory cell manufactured in the standard CMOS process disclosed in the JPA2005-353106 as a related art. This memory cell includes n-type MOS transistors (MCN1 and MCN2) as nonvolatile data memory units, and flip-flop units (MN3, MN4, MP1, and MP2) as static latches which input differential-input voltage outputted from nodes (nodeT and nodeB) of the nonvolatile data memory units. The flip-flop units can be written and read as with a SRAM, and further be loaded store data of the nonvolatile data memory unit.

FIG. 2 shows a data writing method of a related art shown in the FIG. 1. This data writing method is a method that forms differential in threshold voltages between MCN1 and MCN2. In the initial state before writing of data, the threshold voltages of the n-type MOS transistors (MCN1 and MCN2) are Vth0, and the output data of the flip-flop unit is unstable in this state. Therefore, the threshold voltage of MCN1 is raised to the Vth1 (Vth1>Vth0) which is high enough to determine "0". And the subsequent writing of data "1" is achieved by raising the threshold voltage of MCN2 to Vth2 (Vth2>Vth1).

FIG. 3 shows a method for programming threshold voltages of the n-type MOS transistor of the nonvolatile data memory unit of the related art shown in the FIG. 1. The figure shows the case of raising the threshold voltage of MCN1 for programming data "0". This method actively utilizes a characteristic degradation of a n-type MOS transistor by hot carrier, therefore threshold voltage of MCN1 is raised by hot carrier injection from the vicinity of an edge of drain, due to setting a source voltage at 0 V, setting a gate voltage (MLW) of it at 2.5V, and setting a drain voltage (nodeT) at 5V in the MCN1 required to raise its threshold voltage. At this time, voltage of a word line WL of the flip-flop unit is required to be raised sufficiently ex. 7V so as to supply nodeT with the BLT voltage at 5V. A drain voltage of MCN2 whose threshold voltage is kept low is controlled so as not to lead to hot carrier injection by setting the BLT voltage at 0V. In the case of writing of data "1", all conditions except that setting the BLT at 0V, and a BLB at 5V are the same as the case of writing of data "0" because the threshold voltage of MCN2 shall be raised.

FIG. 4 shows a procedure for transferring data from the nonvolatile data memory unit to the flip-flop unit of the above related art. The figure shows a procedure of applying voltage in the case of data "0", i.e. the case where the threshold voltage Vth1 of MCN1 is higher than the threshold voltage Vth0 of MCN2. Under the condition of setting a control signal RESTORE for restoring at 0V, the voltages of both nodeT and nodeB are equalized by reducing a equalize control signal ZEQ from Vcc to 0V at t0. This equalizing procedure is finished at t1. MCN2 which has lower threshold voltage than MCN1, turns on and the voltage of nodeB is reduced, due raising a gate voltage MLW of both MCN1 and MCN2 gradually. In a matter of time, MCN1 also turns on state and a latch operation is finalized by setting nodeB of the lower threshold voltage in the MCN2-side at 0V and setting nodeT in the MCN1-side at Vcc. Raising voltage operation of MLW is finished at t3. The data is retained stably by activating the latch operation in the flip-flop units due to raising RESTORE from 0V to Vcc at t4, then MLW is finally reduced to 0V at t5.

The memory cell of the above related art has the following problems.

[1] The differential between the threshold voltages is narrow. The differential between the threshold voltages corresponds to Vth1−Vth0 in the case of data "0", and to Vth2−Vth1 in the case of data "1." The raise of threshold voltage due to the hot carrier injection has a upper limit of the Vth_max. The voltage differential becomes (Vth_max−Vth0)/2 on condition that data "0" and "1" should be written once each. On condition that data should be rewritten N times, the value (Vth_max−Vth0) needs to be divided by 2N, and the voltage differential becomes up to narrower (Vth_max−Vth0)/2N.

[2] High voltage (7V and 5V) is necessary to be applied to the word line WL and the bit lines BLT, BLB which need to be controlled on a memory cell to memory cell basis, at the time of writing operation. This means that a high voltage transistor is required as driver transistors of the word lines and ones of the bit lines and as column-select transistors to select bit lines. Generally, a high-voltage optimized transistor works low performance on the operation voltage Vcc of 1.8V such as reading voltage, to leads accessing delay problem. Sizing up transistors to improve the current drive performance lead to enlarging a chip area.

An object of this invention is to provide a rewritable nonvolatile memory devices and a rewritable semiconductor integrated circuit device that can have a wide reading margin, and can control both a word line and a bit line by changing the level of Vcc.

[A Nonvolatile Semiconductor Memory Device]

(1) One of the present inventions is characterized by a nonvolatile semiconductor memory device comprising: a memory transistor having a gate electrode; a flip-flop formed by two inverters cross-connected to each other; and two gate transistors connected to two nodes of the flip-flop respectively, wherein the inverter includes a load transistor and the memory transistor connected in series, wherein the memory transistor is composed of a threshold voltage-controllable transistor controlled by electron injection to the vicinity of the gate electrode of the memory transistor, wherein the two gate transistors are connected to respective bit lines controlled between supply voltage (Vcc) and ground voltage individually, wherein gate electrodes of the two gate transistor are connected to a common word line controlled between the supply voltage and the ground voltage, wherein a source of the memory transistor and a source of the load transistor are connected to a high voltage supply line supplying a high voltage during a programming operation or an erase operation.

(2) One of the present inventions is characterized by a nonvolatile semiconductor memory device of above (1), wherein the inverter has a precharge transistor connected in parallel to the load transistor, wherein the precharge transistor operates in an on-off state independent of the load transistor by precharge control voltage.

[A Method for Determining a State of the Nonvolatile Semiconductor Memory Device]

(3) One of the present inventions is characterized by a method for determining a state of the nonvolatile semiconductor memory device of above (2) comprising the following steps of: turning off the two memory transistors by raising source voltages of the two memory transistors; applying a precharge voltage with a same voltage to the two memory transistors through the precharge transistor; and reducing the source voltage of the two memory transistors synchronously.

BRIEF DESCRIPTION OF THE DRAWINGS

FIGS. 22A to 22C are conceptual diagrams illustrating a method for data setting and voltage differential in the memory cell of the second embodiment.

FIGS. 24A to 24C are conceptual diagrams illustrating voltage differential of each datum fixed by the above method for data fixing.

FIGS. 42A to 42C are conceptual diagrams illustrating a voltage differential of each datum fixed by the above method for data fixing of the third embodiment.

FIGS. 60A and 60B are schematic diagrams illustrating a voltage applying procedure for data fixing of the fourth embodiment to fix data "1" even if no programming operation is performed.

FIGS. 61A to 61C are conceptual diagrams illustrating voltage differential of each datum fixed by the above method for data fixing of the fourth embodiment.

FIG. 64 is a schematic diagram showing a voltage applying procedure for reading data on a memory transistor of the memory cell of the fourth embodiment.

FIGS. 66A and 65B are schematic diagrams illustrating a voltage applying procedure for data fixing of the fourth embodiment.

FIGS. 67A and 67B are schematic diagrams illustrating a voltage applying procedure for data fixing of the fourth embodiment.

DESCRIPTION OF THE PREFERRED EMBODIMENTS

The First Embodiment

A nonvolatile memory device and a semiconductor integrated circuit device therewith of the first embodiment will now be described with referent to FIG. 5 through FIG. 15.

Figure 1:
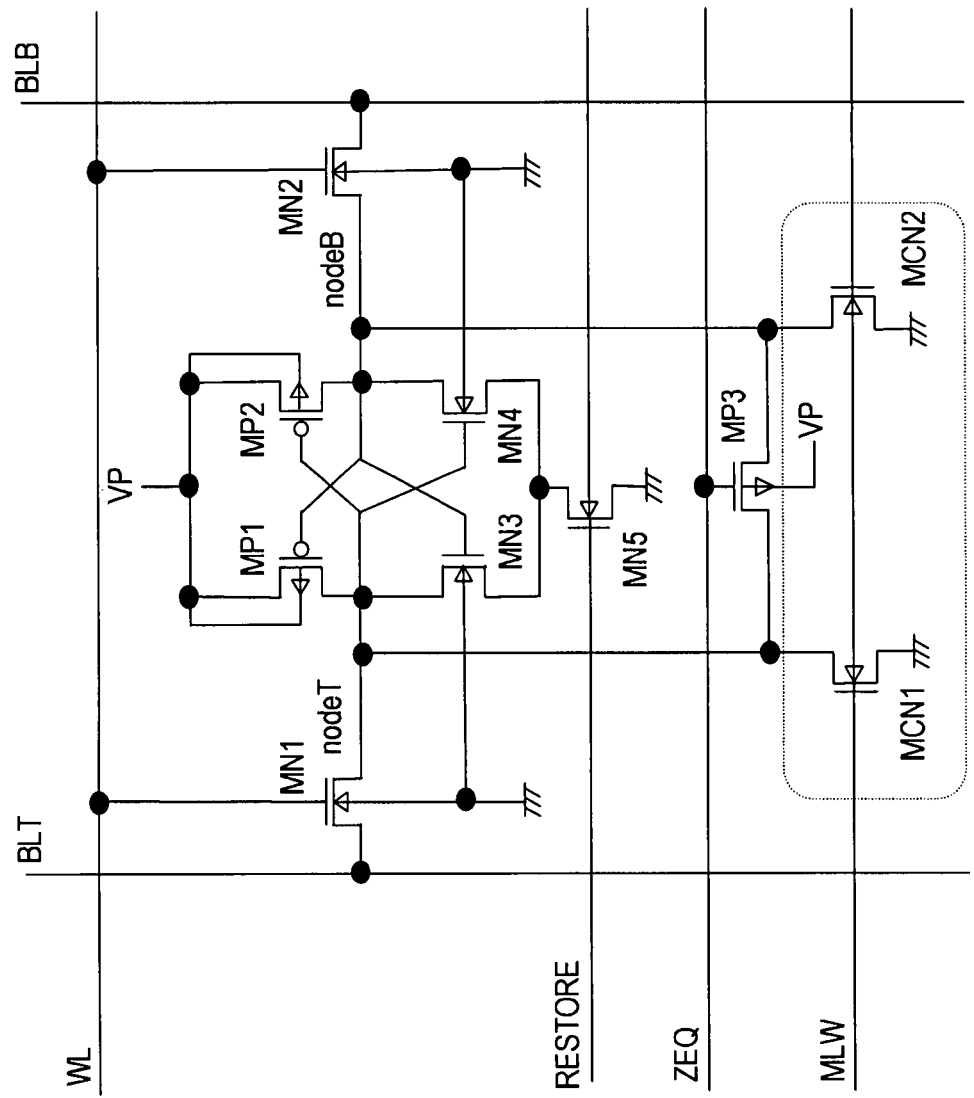
FIG. 1 is a schematic diagram showing a configuration of a conventional memory cell.
Figure 2:
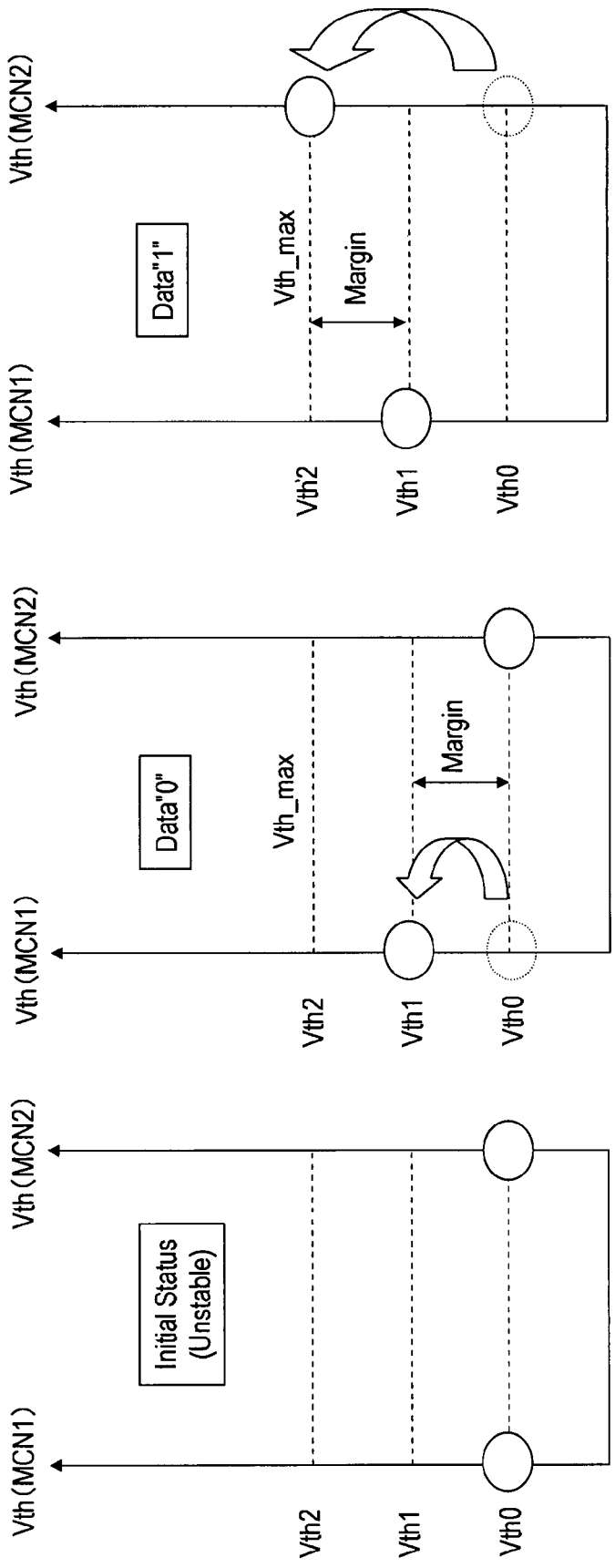
FIG. 2 is a conceptual diagram illustrating a method for data setting and reading margin of a conventional memory cell.
Figure 3:
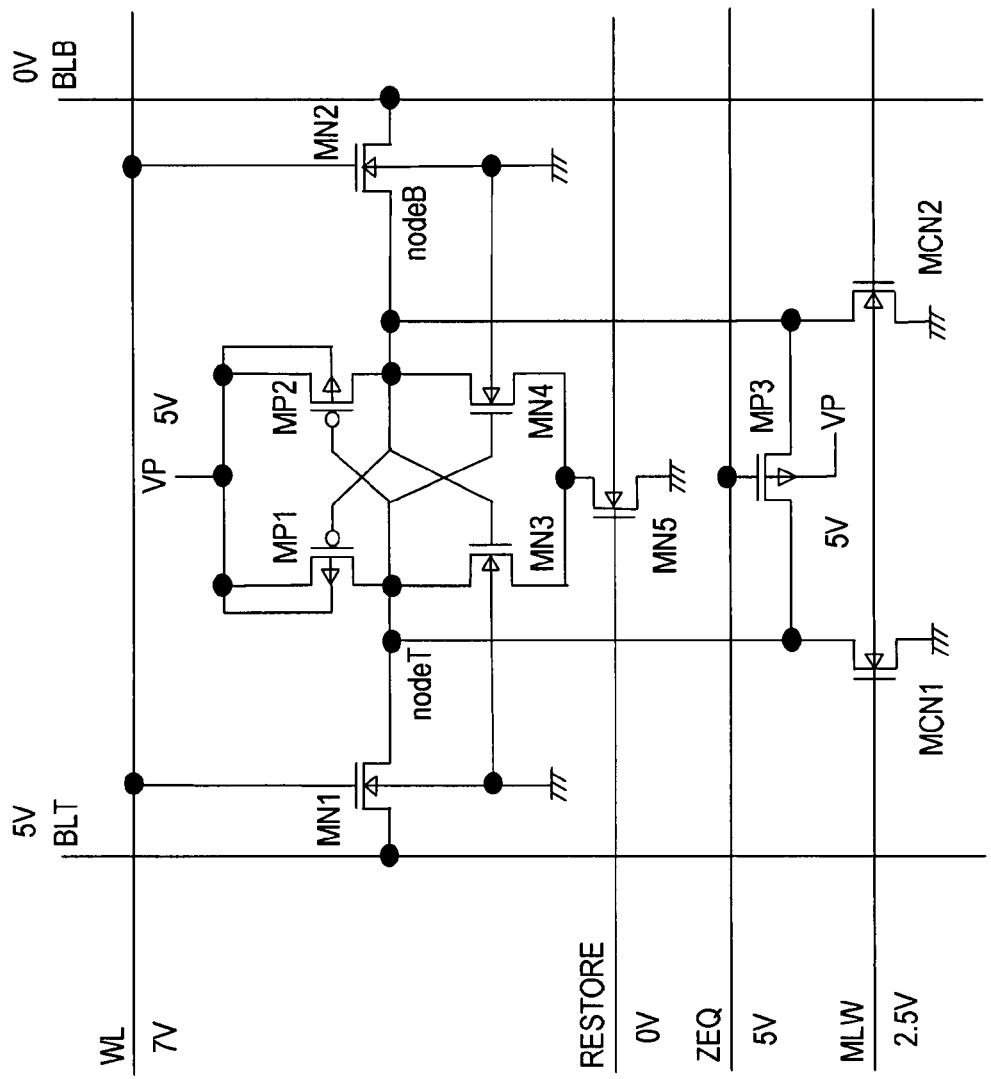
FIG. 3 is a schematic diagram showing an applied voltage condition for writing in a nonvolatile data memory unit of a conventional memory cell.
Figure 4A:
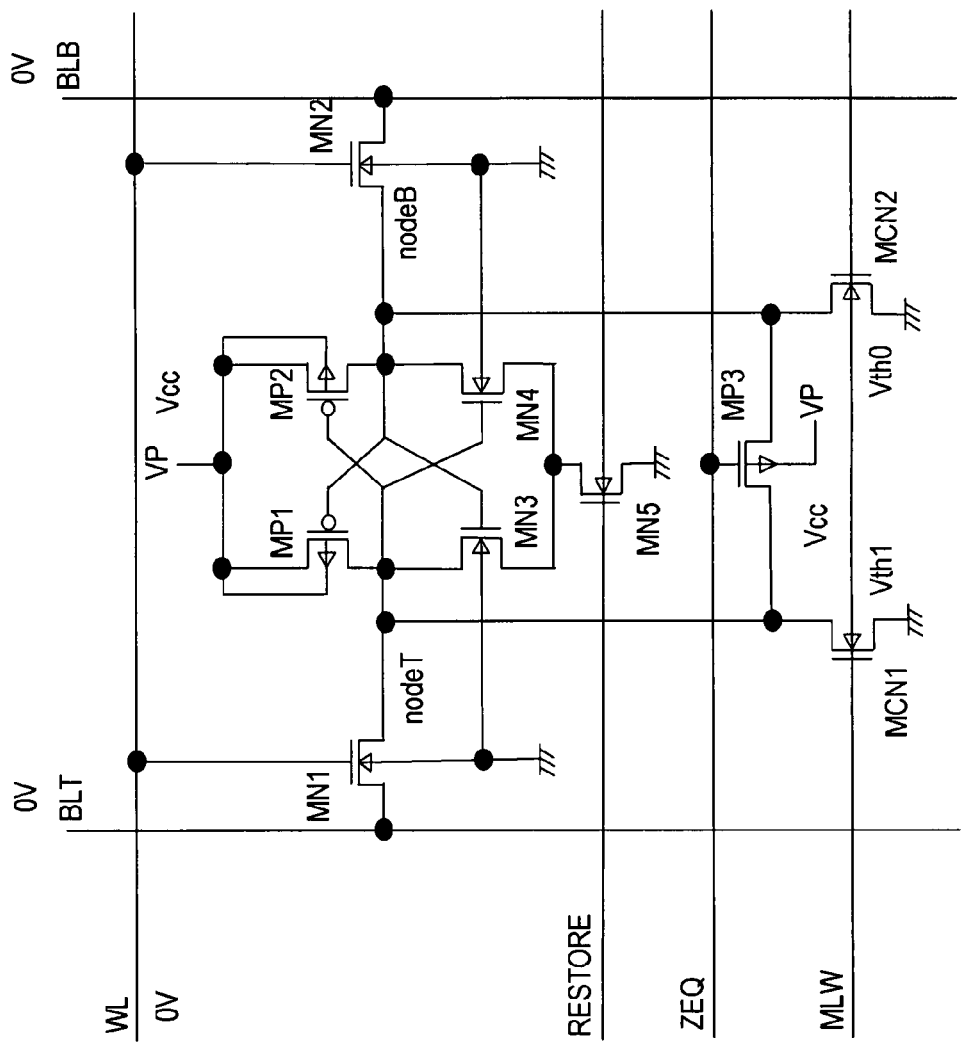
FIGS. 4A and 4B are schematic diagrams illustrating a method for transferring data from the nonvolatile data memory unit of the foregoing conventional memory cell to the flip-flop unit.
Figure 4B:
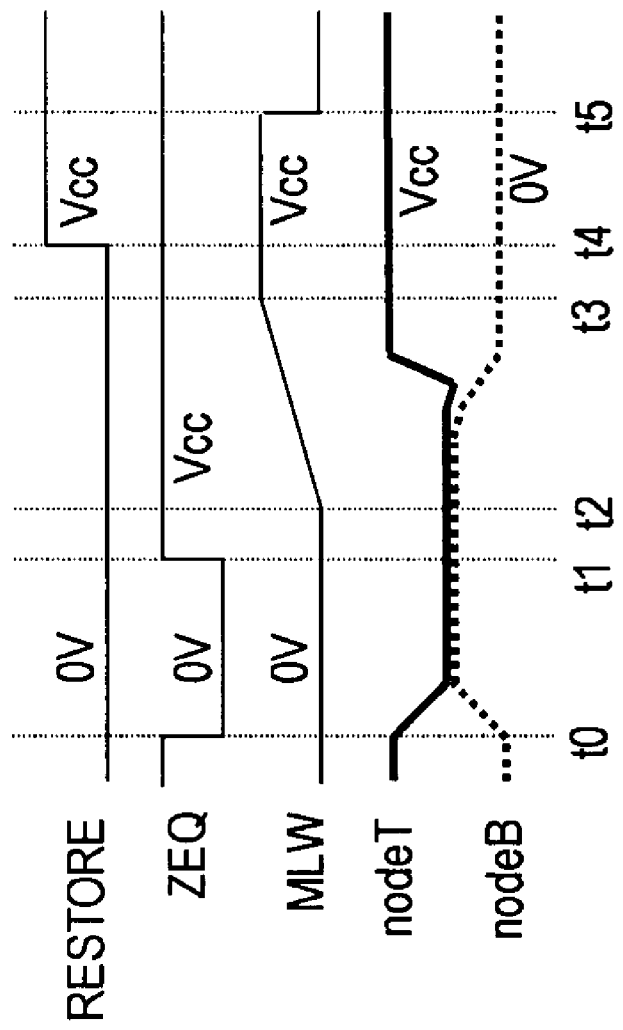
Figure 5:
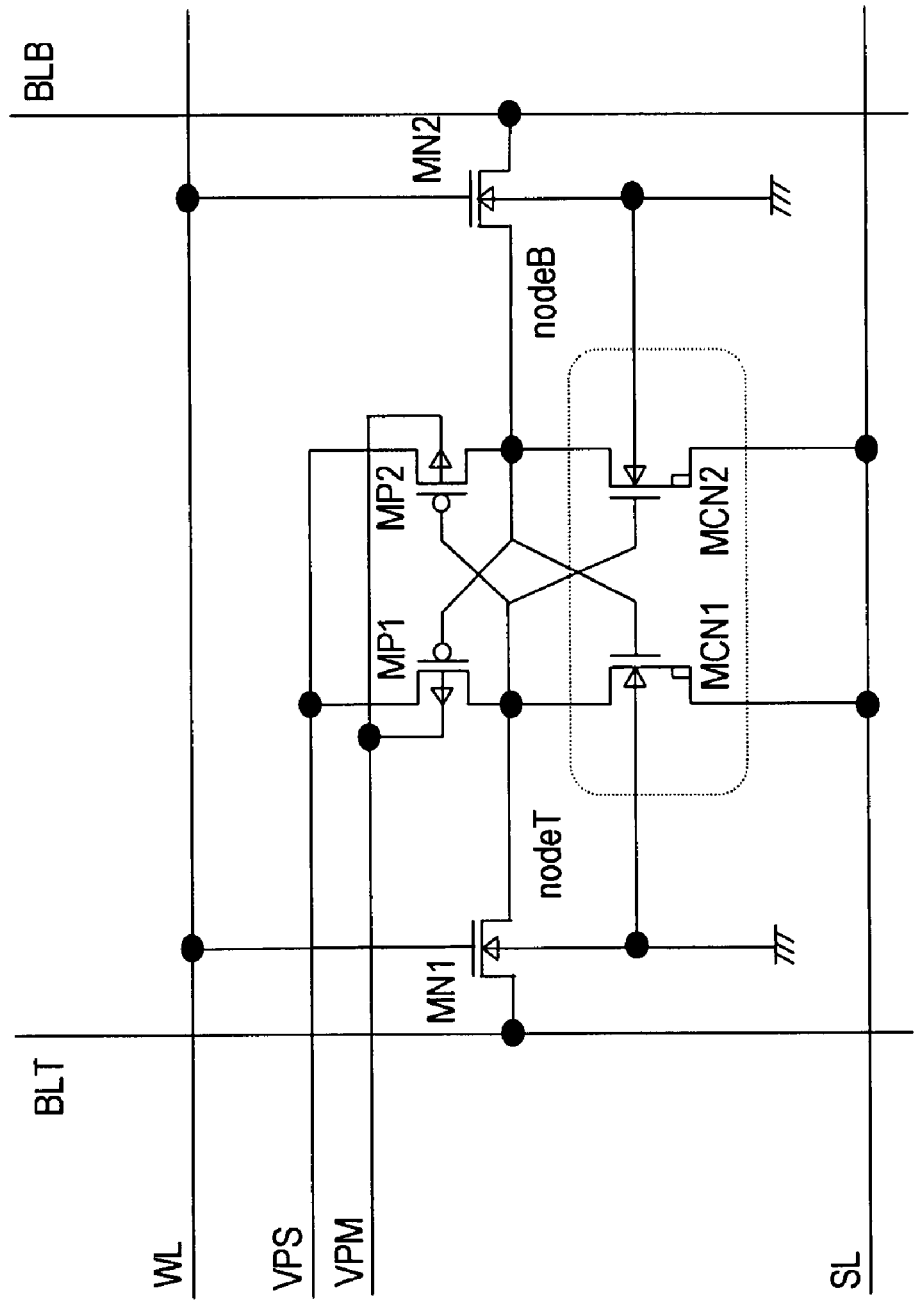
FIG. 5 is a schematic diagram showing a 6-transistor memory cell configuration of the first embodiment of the present invention.

FIG. 5 is a circuit diagram of one nonvolatile memory cell of a nonvolatile memory device. This memory cell comprises 6 MOS transistors. The memory cell has a static latch type flip-flop formed by connecting an inverter (true-side-inverter) and an inverter (bar-side-inverter). The true-side-inverter is formed by series connection of a p-type MOS transistor MP1 and an n-type MOS transistor MCN1. The bar-side-inverter is formed by series connection of a p-type MOS transistor MP2 and an n-type MOS transistor MCN2. The p-type MOS transistors MP1 and MP2 are referred to as load transistors, and the n-type MOS transistors MCN1 and MCN2 are referred to as memory transistors. The memory transistors MCN1 and MCN2 can be injected and erased electrons in a side wall of a gate, as illustrated in and after FIG. 7. The threshold voltage of the memory transistors MCN1 and MCN2 is changed without volatilization, thus the memory transistors MCN1 and MCN2 perform as nonvolatile devices.

In the flip-flop, the inverter (true-side-inverter) formed by series connection of the load transistor MP1 and the memory transistor MCN1 performs as a memory unit for the "true" state of the cell, and the inverter (bar-side-inverter) formed by series connection of the load transistor MP2 and the memory transistor MCN2 performs as a memory unit for the "bar" state of the cell. The junction of the load transistor MP1 with the memory transistor MCN1 is nodeT, and the junction of the load transistor MP2 with the memory transistor MCN2 is nodeB. If nodeT has a high voltage and nodeB has a low voltage, then "0" is written in the memory, and if nodeT has a low voltage and nodeB has a high voltage, then "1" is written in the memory.

In the each inverter, bottom of the memory transistor, i.e. a source of the memory transistor MCN1, MCN2, is connected to a source line SL, top of the load transistor, i.e. a source of the load transistor MP1, MP2, is connected to VPM line. In addition, a well of each load transistor MP1, MP2 is connected to VPM line.

NodeT is connected to a bit line BLT (BitLine-True) through a transfer gate MN1, and NodeB is connected to a bit line BLB (BitLine-Bar) through a transfer gate MN2. Each transfer gate MN1, MN2 is composed of an n-type transistor, and each gate is connected to a common word line WL.

Figure 6:
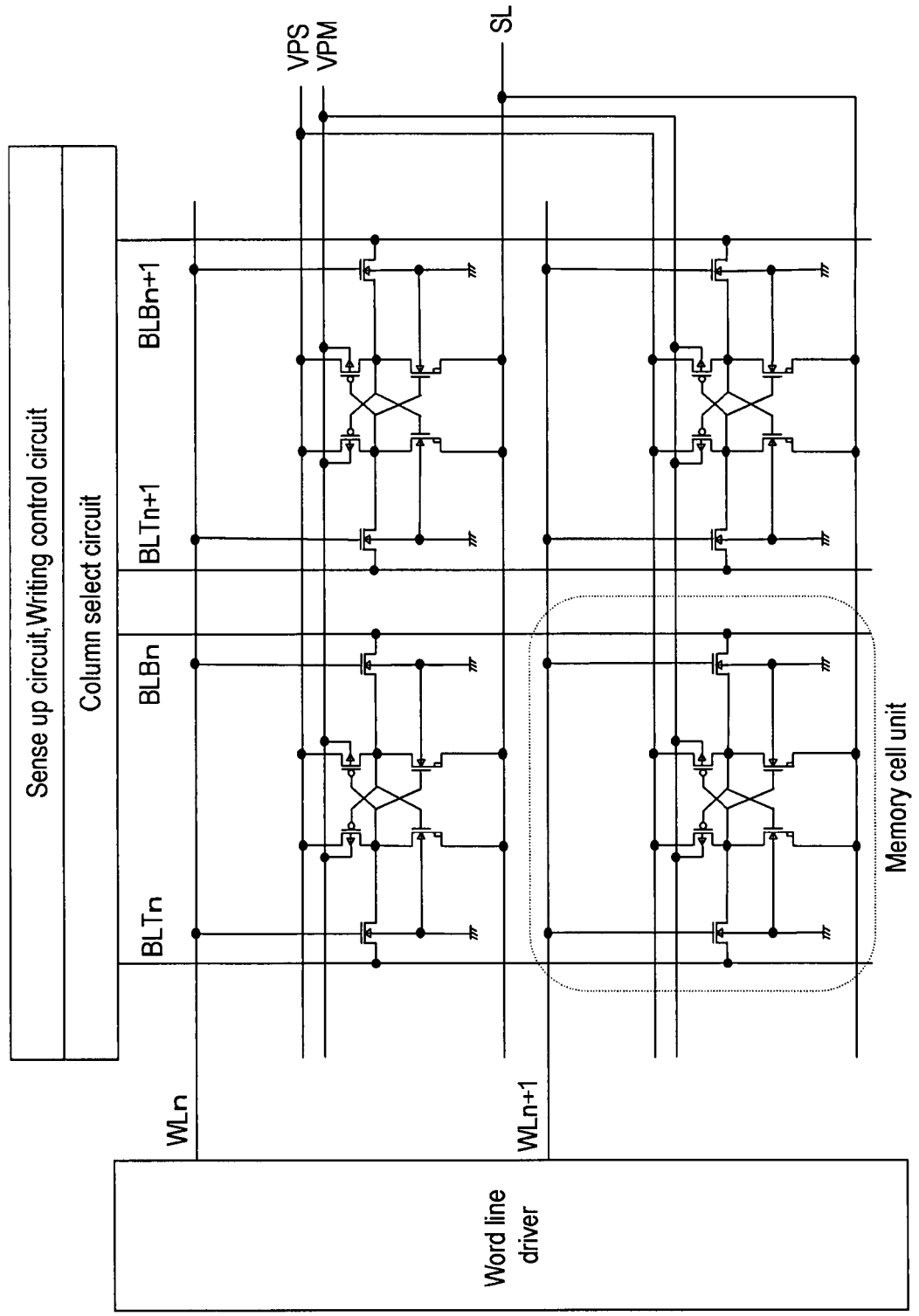
FIG. 6 is a schematic diagram showing a configuration of a memory device in which the memory cells of the first embodiment are arrayed.

FIG. 6 is a schematic diagram showing a memory device in which the nonvolatile memory cells as shown FIG. 5 is arrayed. In this memory cell array, the nonvolatile memory cells in FIG. 5 are arrayed so as to be row-column matrix layout. Each row has a word line WL, and each column has one bit line BLT and BLB. Each word line WL, and each bit line BLT, BLB is individually controlled. Each memory cell has signal lines (VPS, VPM, SL) other than the foregoing lines and these signal lines are controlled integrally in the entire memory cell array.

Figure 7:
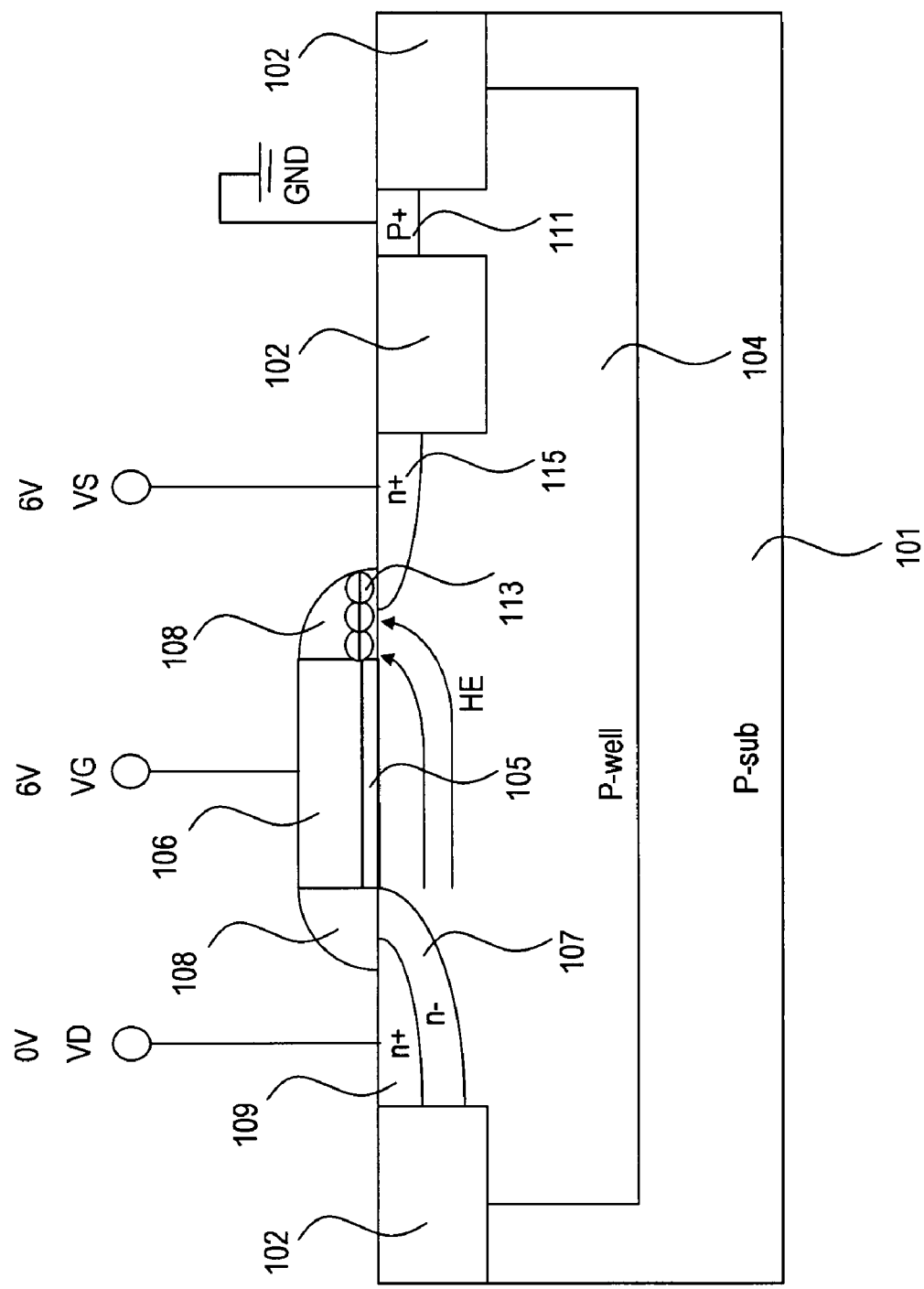
FIG. 7 is a schematic diagram showing an applied voltage condition for writing data of a memory transistor of the memory cell of the first embodiment.
Figure 9:
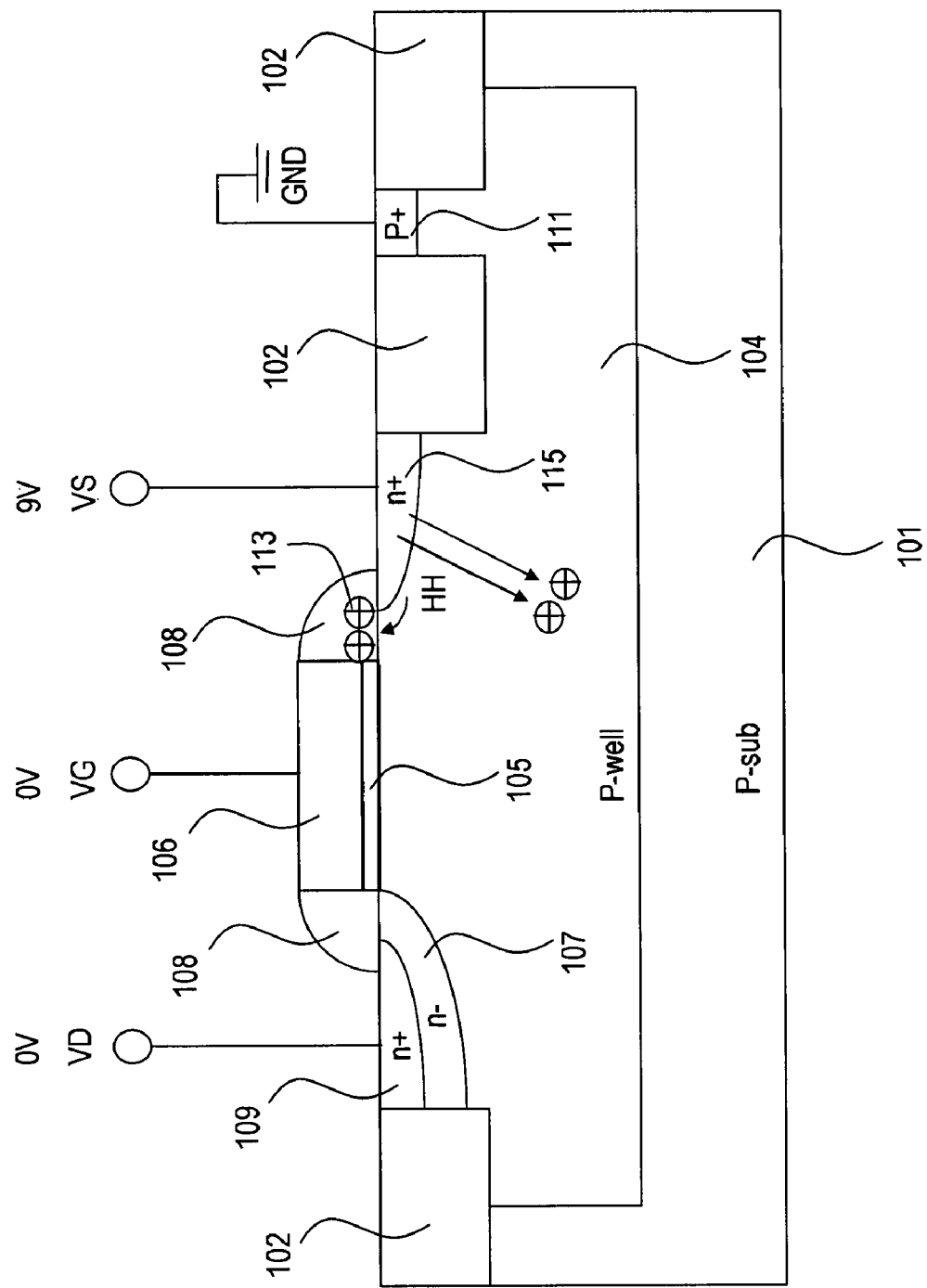
FIG. 9 is a schematic diagram showing an applied voltage condition for erasing data of the memory transistor of the first embodiment
Figure 12:
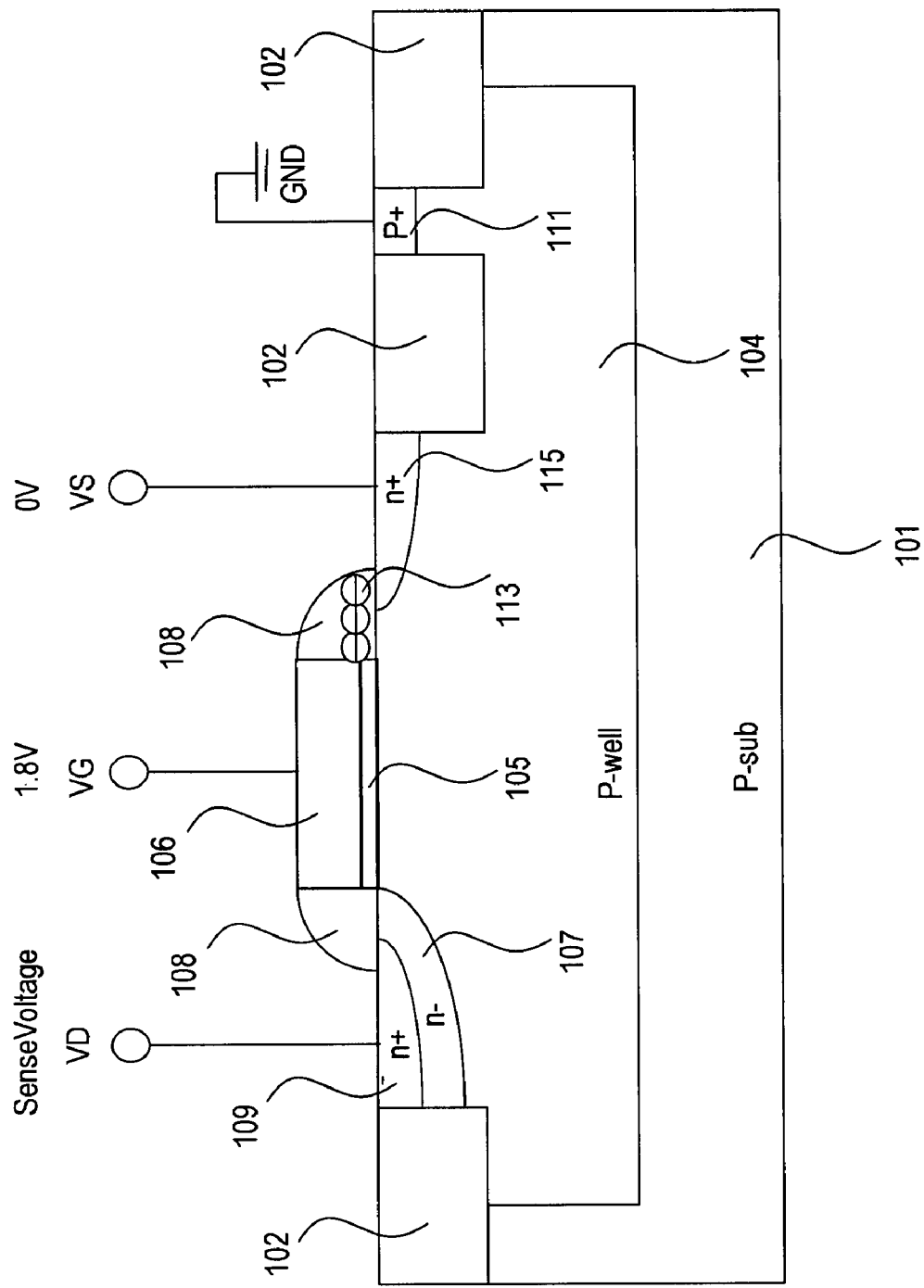
FIG. 12 is a schematic diagram showing an applied voltage condition for reading data on a memory transistor of the memory cell of the first embodiment.

FIG. 7, FIG. 9, and FIG. 12 are schematic diagrams showing cross section structures of the memory transistors MCN1 and MCN2. Concretely, FIG. 7 shows a voltage condition of programming operation. FIG. 9 shows a voltage condition of erase operation. FIG. 12 shows a voltage condition of reading operation.

Figure 8:
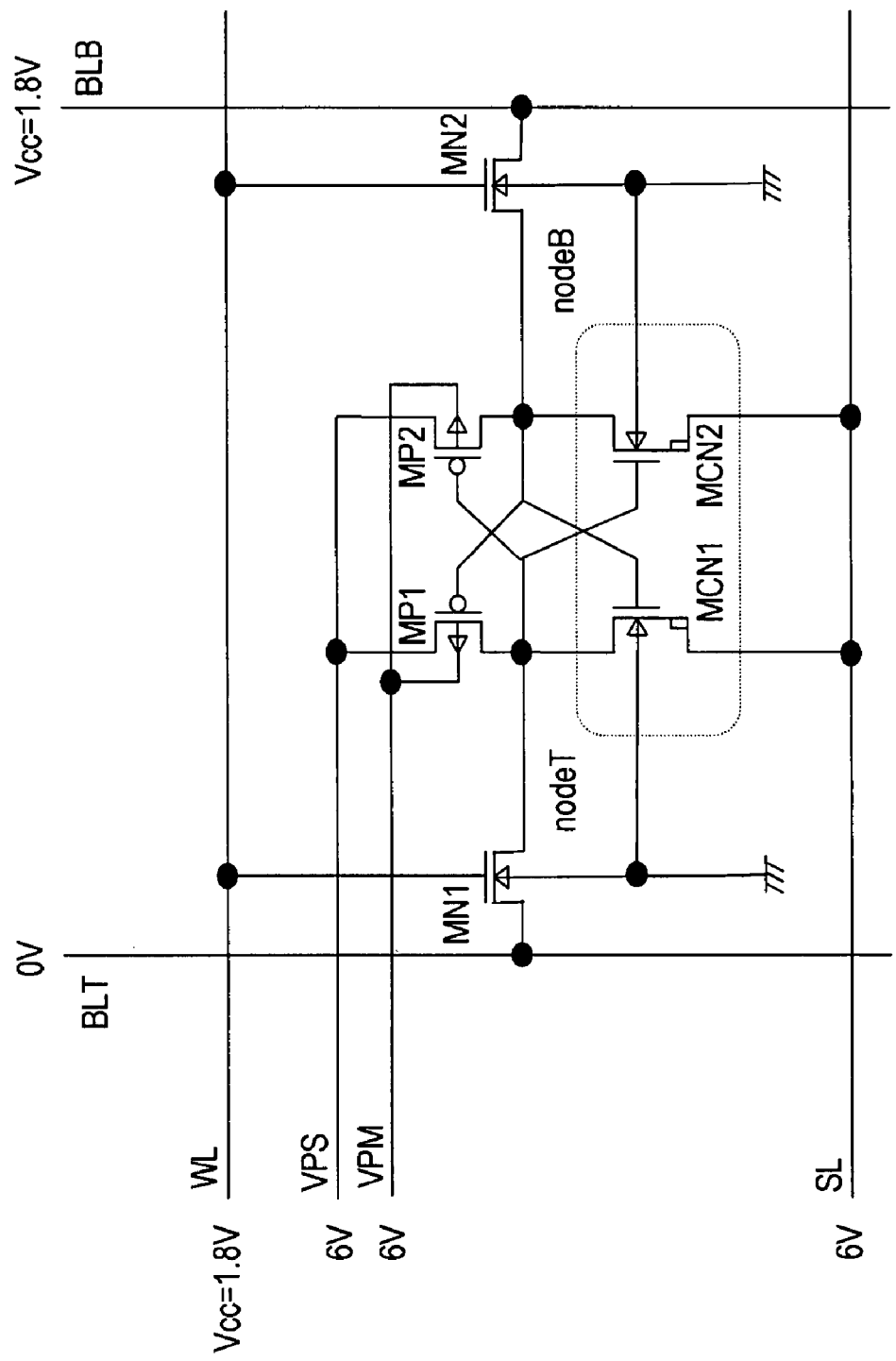
FIG. 8 is a schematic diagram showing a voltage applying procedure for writing data on a memory transistor of the memory cell of the first embodiment.
Figure 10:
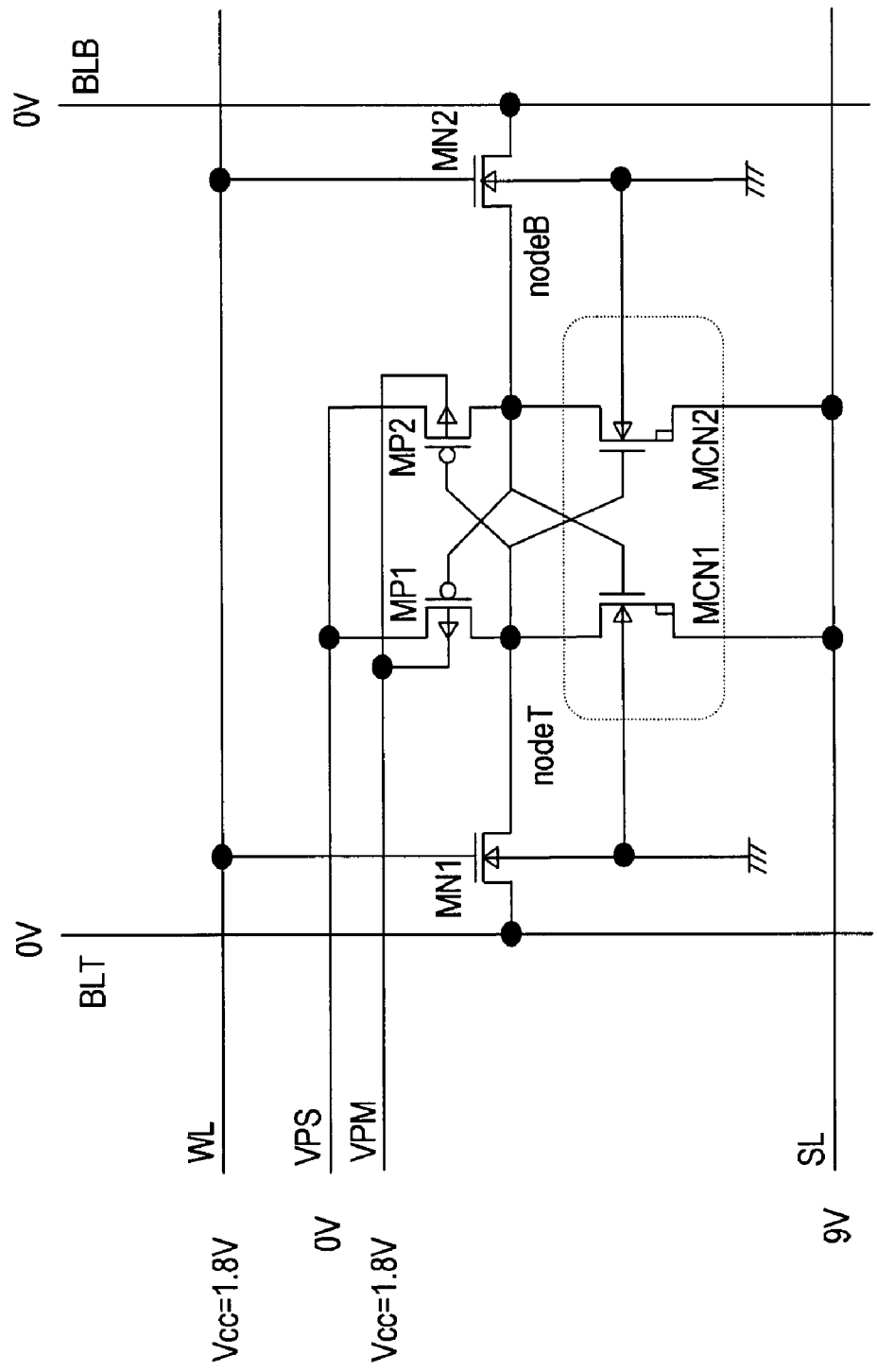
FIG. 10 is a schematic diagram showing a voltage applying procedure for erasing data on a memory transistor of the memory cell of the first embodiment.
Figure 11:
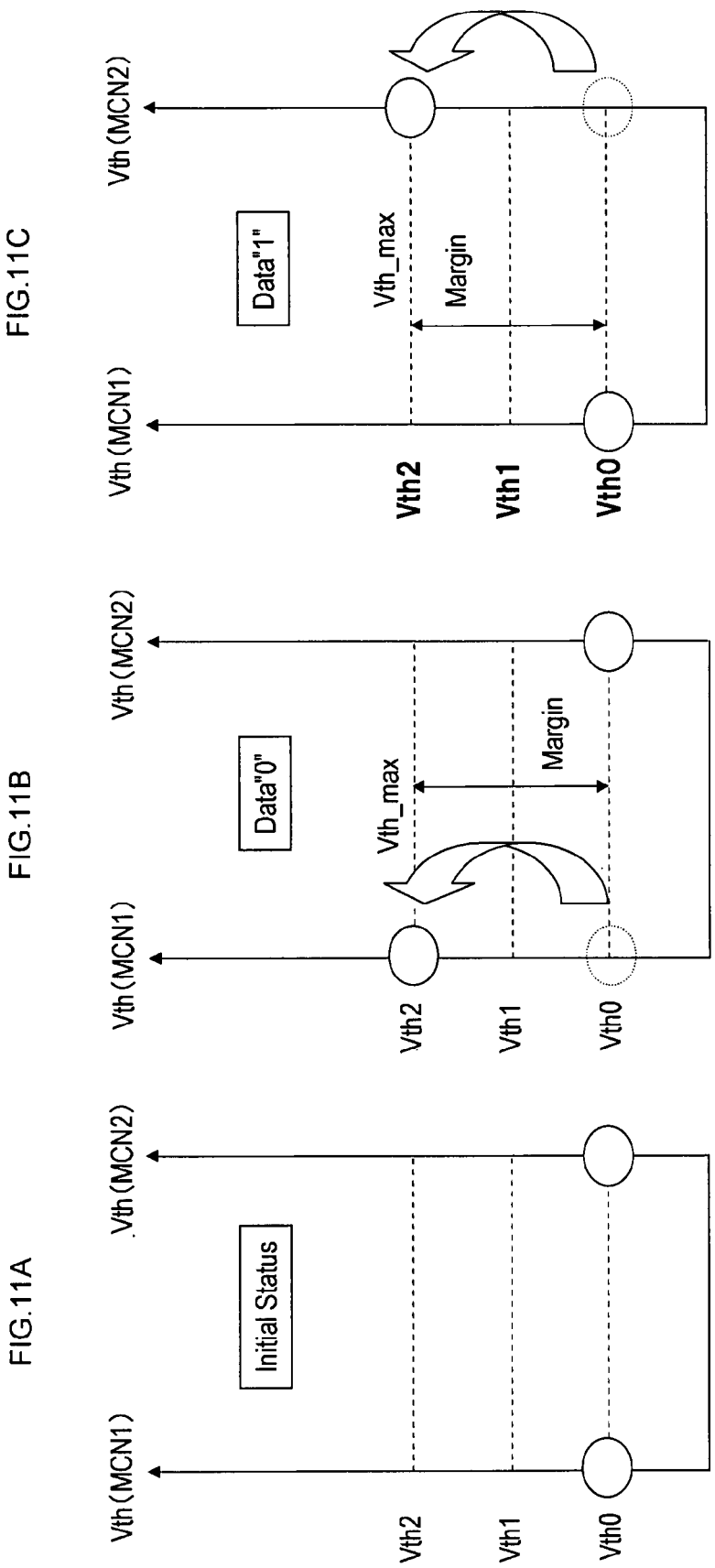
FIGS. 11A to 11C are conceptual diagrams illustrating a method for data setting and voltage differential in the memory cell of the first embodiment.
Figure 13:
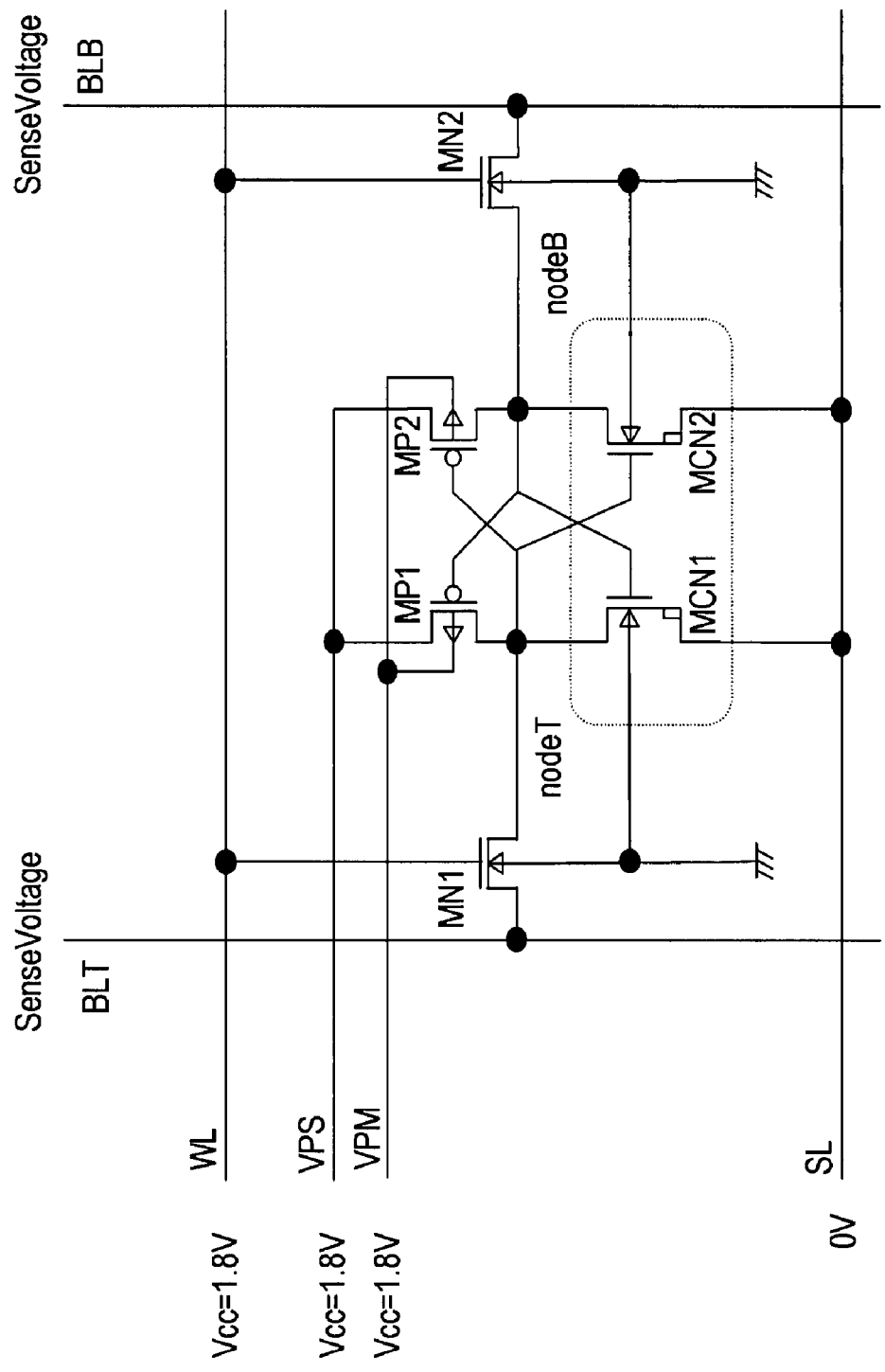
FIG. 13 is a schematic diagram showing a voltage applying procedure for reading data on a memory transistor of the memory cell of the first embodiment.

In addition, FIG. 8 is a schematic diagram showing a voltage applying procedure for writing data on a memory transistor MCN1 of the memory cell. FIG. 10 is a schematic diagram showing a voltage applying procedure for erasing data of the nonvolatile memory cell including the memory transistors MCN1, MCN2. FIG. 13 is a schematic diagram showing a voltage applying procedure for reading data of a nonvolatile memory cell including the memory transistors MCN1, MCN2.

As shown in FIG. 7, FIG. 9, and FIG. 12, a p-type well 104 with 0.8 μm in depth, and doped with average boron concentration $2 \times 10^{17}$ cm$^{-3}$ is formed in a surface area of a p-type silicon substrate 101 with electric resistivity 10 Ωcm. The two transistors MCN1 and MCN2 are formed in the p-type well 104, isolated by trenches with 250 nm in depth. This figure shows one memory transistor (MCN1).

The memory transistor is an n-channel type transistor. It comprises a drain 109 formed next to one trench, and a source 115 formed next to another trench in the surface area of the p-type well 104, and comprises a drain extension 107 formed in the vicinity of the drain 109. The drain 109 and the source 115 are doped with average arsenic concentration $1 \times 10^{20}$ cm$^{-3}$ and the drain extension 107 is doped with average arsenic concentration $5 \times 10^{18}$ cm$^{-3}$.

A 5 nm thick gate insulator layer 105 and a 200 nm thick gate electrode 106 of poly-silicon layer doped with phosphorus concentration $2 \times 10^{20}$ cm$^{-3}$ are formed on a channel region between the drain 109 and the source 115 on the surface of the p-type well 104. Side spacers 108 and 108S composed of a 50 nm thick insulator are formed on the drain 109 and source 115 at the side of the gate insulator 105 and the gate electrode 106. The source-side side spacer 108S contacts the channel region of the substrate because an extension area is not formed in the vicinity of the source 115.

A p-type diffused layer 111 with average boron concentration $1 \times 10^{20}$ cm$^{-3}$ is formed in the area isolated from the foregoing memory transistor by a trench 102 in the p-type well area 104. The layer 111 works an electrode for connecting this p-type well 104 to ground.

A threshold voltage of the memory transistor is raised by carrier injection into the source-side side spacer 108S, and as illustrated in FIG. 9, the threshold voltage revert back to the initial state by drawing out the injected carrier from the side spacer 108S. Accordingly, this memory transistor can record data without volatilization.

While the initial threshold voltage of the memory transistor is set at 1.2V, the transistor is unstable due to an atypical structure. Therefore, this memory transistor cannot be used solely in terms of reliability. The memory cell of this embodiment is formed with the flip-flop as shown FIG. 5.

In FIG. 7, programming operation is performed by applying 0V to a drain line VD, and applying a positive voltage (e.g., +6V) not more than a breakdown voltage to a source line VS and a gate line VG to generate a channel hot electron HE and to inject it into the side spacer 108S. Electrons trapped by the channel hot electron injection lead to raising the threshold voltage, and the memory transistor becomes a programmed state.

FIG. 8 shows a voltage applying procedure in the case of writing data "0" by raising threshold voltage of the memory transistor MCN1. For setting the memory transistor MCN1 to the voltage condition shown in FIG. 7, voltages are applied to the memory cell by the procedure shown in FIG. 8. Under the condition of applying 6V to VPM, VPS, SL, the procedure is performed by connecting a word line WL to Vcc (1.8V), connecting a bit line BLT to 0V, and connecting a bit line BLB to Vcc. NodeT (a drain of the memory transistor MCN1) comes to have approximately the same voltage as the bit line BLT (0V) by turning ON the transfer gate MN1, which is an n-type MOS transistor. And nodeB (a gate of the memory transistor MCN1) come to have approximately the same voltage as VPS (6V) by turning ON the load transistor MP2. Thus the applied voltage condition of the memory transistor MCN1 becomes the same as that of FIG. 7. In this procedure, a current of about 300 μA flow in the transfer gate MN1 and the memory transistor MCN1. This current raises a threshold voltage of the memory transistor MCN1 to Vth2.

On the other hand, in the case of writing data "1", the threshold voltage of the memory transistor MCN2 is raised, which all conditions but applying Vcc to BLT and applying 0V to BLB are the same as those of writing data "0".

6V is applied to both the gate (nodeB) of the transistor MCN1 and the drain (the source line SL) of the transistor MCN1 in the foregoing embodiment. Even a different power voltage can be applied to the gate and the drain. On the other hand, as the same voltage is applied to VPM and VPN, VPM and VPN can be connected to be applied a common signal.

FIG. 9 and FIG. 10 are schematic diagrams showing an applied voltage condition and a voltage applying procedure for erasing data of the memory transistor MCN1 (or MCN2). For setting the memory transistor MCN1, MCN2 to the voltage condition shown in FIG. 9, an erase operation is performed as follows. A positive voltage (e.g., +9V) not more than a breakdown voltage is applied to a source line VS, and 0V is applied to the gate line VG and the drain line VD, to generate avalanche hot holes HH from the source 115 and to inject the avalanche hot holes HH into the side spacer 108S. Electrons trapped in the side spacer 108S by the foregoing programming operation are neutralized, and the written data is erased due to reduce the threshold voltage.

FIG. 10 shows a voltage applying procedure in the case of erasing data by reducing threshold voltages of the memory transistor MCN1, MCN2. For setting the memory transistor MCN1, MCN2 to the applied voltage condition shown in FIG. 9, voltages are applied to the memory cells on the condition shown in FIG. 10. Typically, an erase operation is performed for the entire memory cell of the memory array shown in FIG. 6. Under the condition of applying Vcc to VPM, applying 0V to VPS, and applying 9V to SL, the operation is performed by connecting the word line WL to Vcc, and connecting the bit lines BLT, BLB to 0V. Transfer gates MN1 and MN2, which are n-type MOS transistors, turn ON when nodeT and nodeB come to have 0V. Thus the applied voltage condition of memory transistors MCN1, MCN2 is the same as that of FIG. 9 Additionally, although the Vcc (1.8V) is applied to VPM, the signal can work properly even if 0V would be applied. Therefore, a common signal can be applicable by connecting VPM to VPS.

As stated above, the applied voltage condition and the voltage applying procedure of the programming operation shown in FIGS. 7, 8 and the applied voltage condition and the voltage applying procedure of the erase operation shown in FIGS. 9, 10 are designed so that the word line and the bit line that are controlled individually for each memory cell can perform at either 0V or Vcc, in other words, no high voltage is required to be applied to the word line or bit line. Thus a high breakdown voltage transistor is not required and a high-performance transistor can be used in a word-line control circuit and a bit-line control circuit to speed up of reading operation.

FIGS. 11A through 11C are schematic diagrams illustrating a method for controlling a threshold voltage of each memory transistor MCN1, MCN2 in the case of the foregoing programming operation, i.e. a method for data setting for a nonvolatile memory cell. Here, when the threshold voltage of the memory transistor MCN1 is low-state (on state) and the threshold voltage of the memory transistor MCN2 is high-state (off state), the data is "1". Reversing state, when the threshold voltage of the memory transistor MCN1 is high-state (off state) and the threshold voltage of the memory transistor MCN2 is low-state (on-state), the data becomes "0."

FIG. 11A shows a case that both threshold voltages of the memory transistors MCN1 and MCN2 are at the initial state Vth0, i.e. a state of no data setting. In this case, the data of the memory cell is unstable.

FIG. 11B shows threshold voltages of memory transistors MCN1, MCN2 in the case that the nonvolatile memory cell is set at data "0." Writing data "0" is achieved by raising the threshold voltage of the memory transistor MCN1 from the initial state shown in FIG. 11A to Vth2 (Vth2>Vth0).

FIG. 11C shows threshold voltages of memory transistors MCN1, MCN2 in the case that the nonvolatile memory cell is set at data "1." Writing data "1" is achieved by raising the threshold voltage of the memory transistor MCN2 from the initial state shown in FIG. 11A to Vth2 (Vth2>Vth0).

The state of the nonvolatile memory cell reverts back to the state shown in FIG. 11A by erase operation illustrated in FIG. 9 and FIG. 10 even if the threshold voltage is controlled under the condition shown in FIG. 11B or FIG. 11C.

As stated above, memory transistors MCN1, MCN2 can be reduced back to Vth0 of the initial state from Vth2 of the programmed state. Thus enough voltage differential of the programmed side and the erased side can be secured even if data "0" or "1" is rewritten multiple times.

FIG. 12 and FIG. 13 are schematic diagrams showing a applied voltage condition and a voltage applying procedure of reading operation. In FIG. 12, the reading operation is performed by reading voltage of the drain line VD under the condition of applying Vcc to the gate line VG and applying 0V to the source line VS. For setting the memory transistor MCN1 to the applied voltage condition shown in FIG. 12, voltages are applied to the memory cell on the condition shown in FIG. 13. A differential sense amplifier is used for the reading operation same as reading operation of SRAM. The reading operation is performed as follows. Under the condition of connecting VPS and VPM to Vcc, connecting SL to 0V, and connecting the word line to Vcc, Each voltage of bit line BLT and BLB is retrieved by the differential sense amplifier. The voltage shifts according to the data stored in the flip-flop. When the memory transistor MCN1 is ON, BLT voltage is low (0V). When the memory transistor MCN1 is OFF, BLT voltage is high (Vcc). When the memory transistor MCN2 is ON, BLB voltage is low (0V). When the memory transistor MCN2 is OFF, BLB voltage is high (Vcc). When BLT voltage is low and BLB voltage is high, the stored data is "1". On the other hand, when BLT voltage is high and BLB voltage is low, the stored data is "0".

A Modified Embodiment of the First Embodiment

If data writing is not performed, i.e. threshold voltages of both memory transistors MCN1 and MCN2 are low stored data of the 6-transistor nonvolatile memory cell of the first embodiment is unstable. By putting a circuit configuration of true-side (the memory transistor MCN1) and bar-side (the memory transistor MCN2) out of balance as shown in FIG. 14 or FIG. 15, stored data of the memory cell can be fixed to "0" or "1", even if threshold voltages of both memory transistors MCN1 and MCN2 are low.

Figure 14:
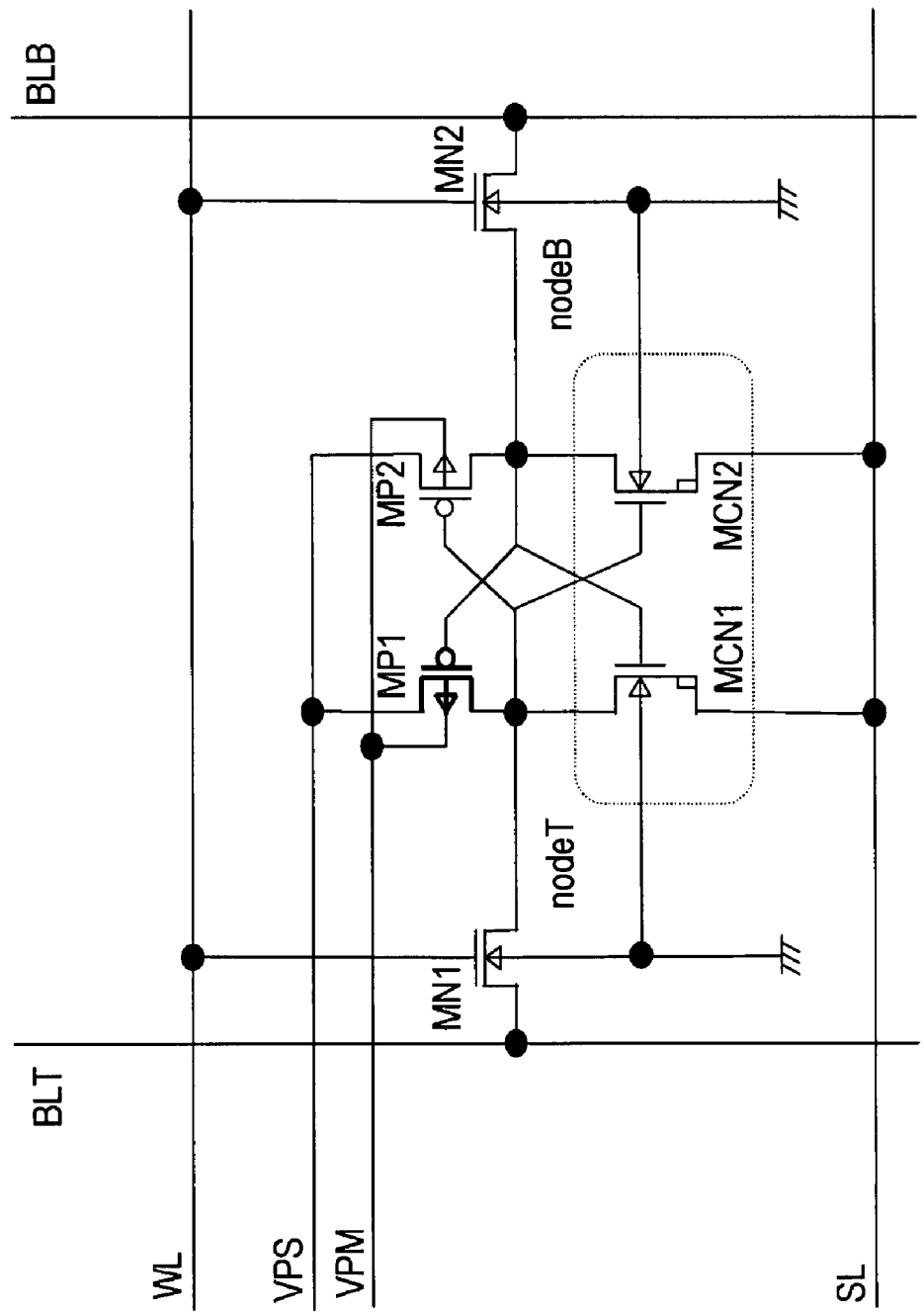
FIG. 14 is a schematic diagram showing a memory cell configuration that resistances of both inverters are differentiated with respect to each other by broadening a channel width of either load transistor.
Figure 15:
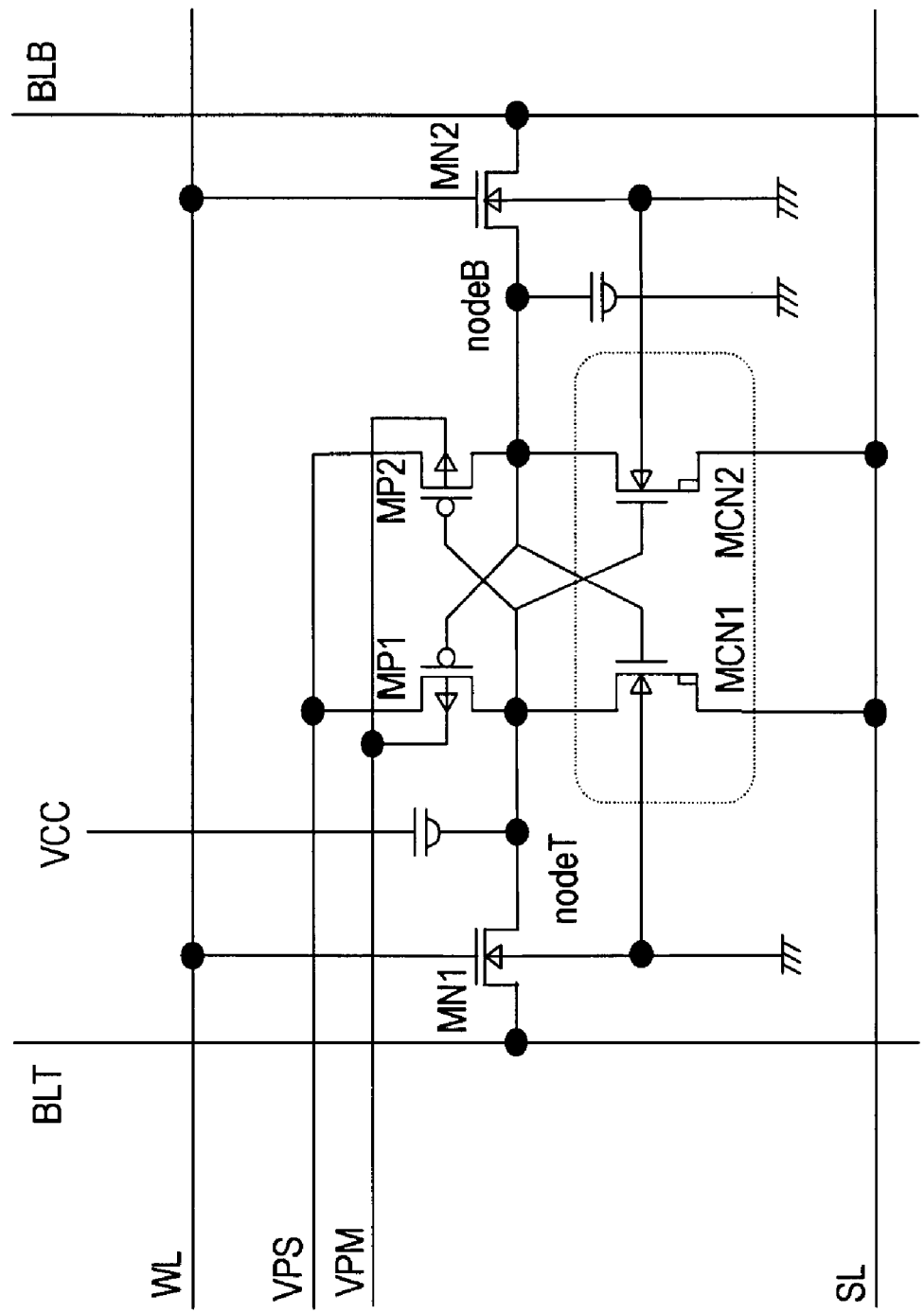
FIG. 15 is a schematic diagram showing a memory cell configuration that capacitances of both inverters are differentiated with respect to each other by connecting additional condensers.

A nonvolatile memory cell shown in FIG. 14 comprises two load transistors MP1 and MP2 of different channel width. In this case, with forming a channel width of the load transistor MP1 twice as wide as that of the load transistor MP2, ON resistance of the load transistor MP1 is reduced to half of the load transistor MP2.

When the memory cell with this configuration is powered on under the condition of both memory transistors MCN1 and MCN2 being not programmed, a voltage of nodeT raises faster than that of nodeB, and the load transistor MP1 and the memory transistor MCN2 go into on state, the load transistor MP2 and the memory transistor MCN1 go into off state, in other words, the data goes into fixed as "0".

In addition, a channel length instead of the channel width can be differentiated. Also either load transistor MP1 or MP2 can be changed its channel width or length. Moreover, the memory transistor MCN1 or MCN2 can be changed its channel width or length.

A nonvolatile memory cell shown in FIG. 15 comprises capacitors connected to the nodeT and the nodeB of the flip-flop. NodeT is connected to a power supply line through a capacitor C1, and nodeB is connected to ground through a capacitor C2. The capacitance of these capacitors is, for example, about 50 fF.

When the memory cell with the configuration shown in FIG. 15 is powered on under the condition of both memory transistors MCN1 and MCN2 being not programmed, a voltage of nodeT raises faster than that of nodeB, and the load transistor MP1 and the memory transistor MCN2 go into on state, the load transistor MP2 and the memory transistor MCN1 go into off state, in other words, the data is fixed as "0".

Although the two capacitors are connected to nodeT and nodeB respectively in the embodiment shown in FIG. 15, the circuit configuration of the nonvolatile memory cell can be asymmetric by connecting to either one of the two.

The Second Embodiment

A nonvolatile memory device and a semiconductor integrated circuit device therewith of the second embodiment will now be described with referent to FIG. 16 through FIG. 33.

Figure 16:
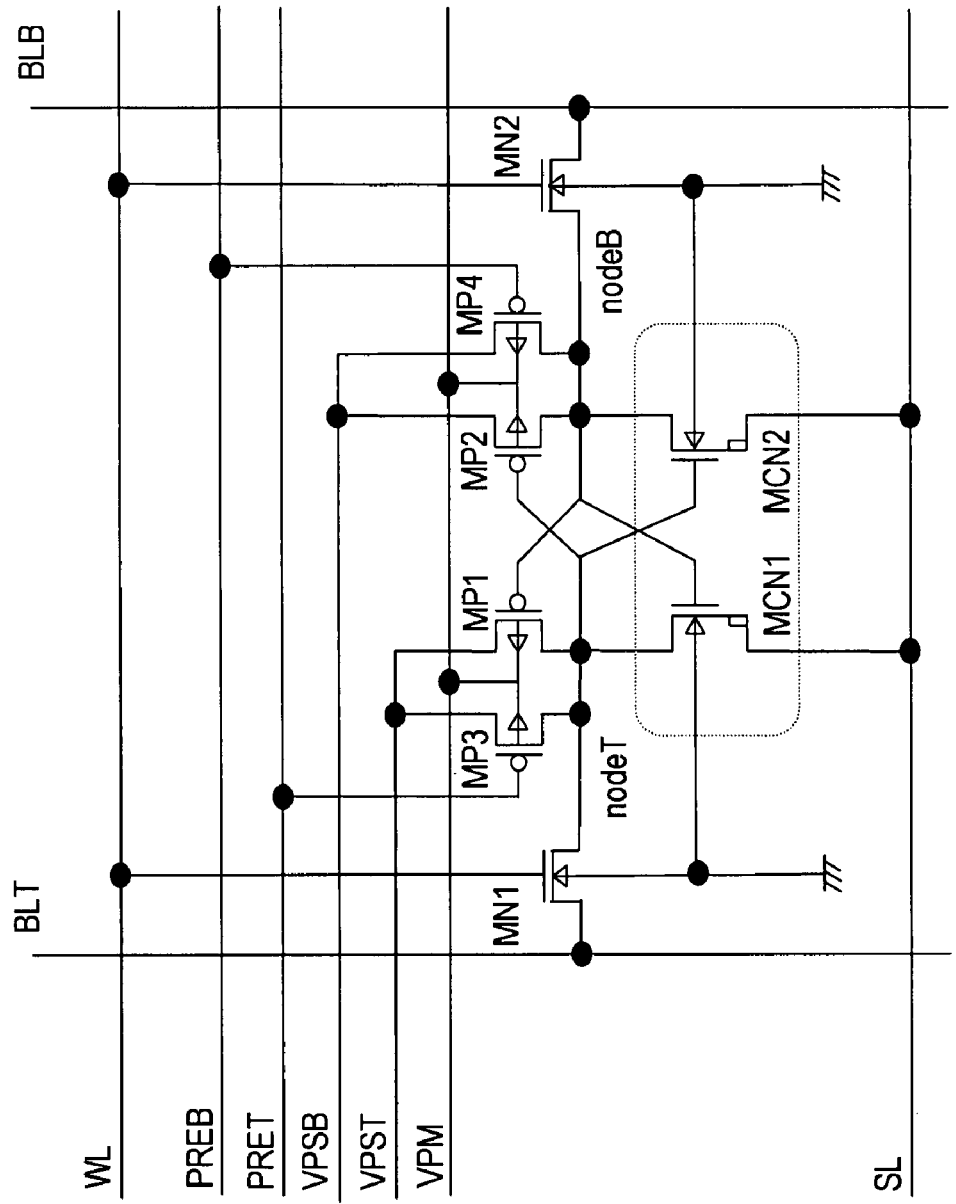
FIG. 16 is a schematic diagram showing a VPS separating type 8-transistor memory cell configuration of the second embodiment of the present invention

FIG. 16 is a circuit diagram of one nonvolatile memory cell of a nonvolatile memory device. This memory cell has a VPS separating type 8-transistor configuration. The memory cell has a static latch type flip-flop formed by connecting an inverter (true-side-inverter) formed by series connection of a p-type MOS transistor MP1 and an n-type MOS transistor MCN1 and an inverter (bar-side-inverter) formed by series connection of a p-type MOS transistor MP2 and an n-type MOS transistor MCN2. The p-type MOS transistors MP1 and MP2 are referred to as load transistors, and the n-type MOS transistors MCN1 and MCN2 are referred to as memory transistors. The memory transistors MCN1 and MCN2 can be injected and erased electrons in a side wall of a gate, as illustrated in and after FIG. 18. The threshold voltage of the memory transistors MCN1 and MCN2 is changed without volatilization, thus the memory transistors MCN1 and MCN2 perform as nonvolatile devices.

A side edge of the memory transistor of each inverter, i.e. a source of each memory transistor MCN1, MCN2, is connected to a source line SL. A side edge of a load transistor for the true-side-inverter, i.e. a source of the load transistor MP1 is connected to VPST line, and a side edge of a load transistor for the bar-side-inverter, i.e. a source of the load transistor MP2 is connected to VPSB line.

In the flip-flop, the inverter (true-side-inverter) formed by series connection of the load transistor MP1 and the memory transistor MCN1 performs as a memory unit for the "true" state of the cell, and the inverter (bar-side-inverter) formed by series connection of the load transistor MP2 and the memory transistor MCN2 performs as a memory unit for the "bar" state of the cell. The junction of the load transistor MP1 with the memory transistor MCN1 is nodeT, and the junction of the load transistor MP2 with the memory transistor MCN2 is nodeB. If nodeT has a high voltage and nodeB has a low voltage, then "0" is recorded in the memory, and if nodeT has a low voltage and nodeB has a high voltage, then "1" is recorded in the memory.

NodeT is connected to a bit line BLT (BitLine-True) through a transfer gate MN1, and NodeB is connected to a bit line BLB (BitLine-Bar) through a transfer gate MN2. Each transfer gate MN1, MN2 is composed of an n-type transistor, and each gate is connected to a common word line WL.

In addition, a p-type MOS transistor MP3 as a precharge transistor is connected in parallel, i.e. between nodeT and VPST, with the load transistor MP1. Moreover, a p-type MOS transistor MP4 as a precharge transistor is connected in parallel, i.e. between nodeB and VPSB, with the load transistor MP2. The true-side-precharge line PRET is connected to the p-type MOS transistor MP3, and the bar-side-precharge line PREB is connected to the p-type MOS transistor MP4. Furthermore, each p-type MOS transistor MP1~MP4 is formed in the same N well, and a voltage of the N well is controlled by VPM signal.

Figure 17:
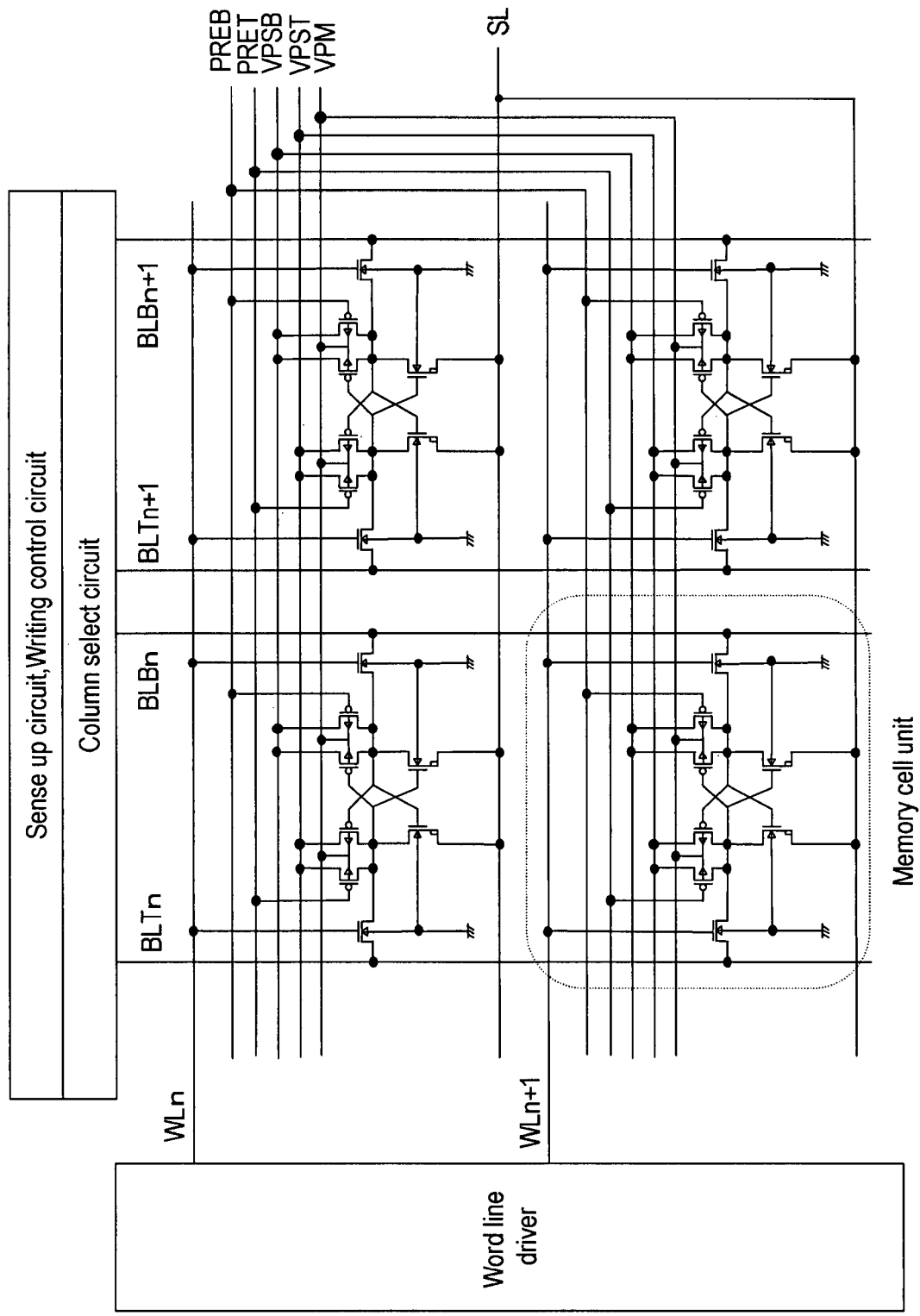
FIG. 17 is a schematic diagram showing a configuration of a memory device on which the memory cells of the second embodiment are arrayed.

FIG. 17 is a schematic diagram showing a memory device in which the nonvolatile memory cells as shown FIG. 16 are arrayed. In this memory cell array, the nonvolatile memory cells in FIG. 17 are arrayed so as to be row-column matrix layout. In addition, each row has a word line WL, and each column has one bit line BLT, BLB. Each word line WL, and each bit line BLT, BLB is individually controlled. Each memory cell has signal lines (PREB, PRET, VPST, VPSB, VPM, SL) other than the foregoing lines and these signal lines are controlled integrally in the entire memory cell array.

Figure 18:
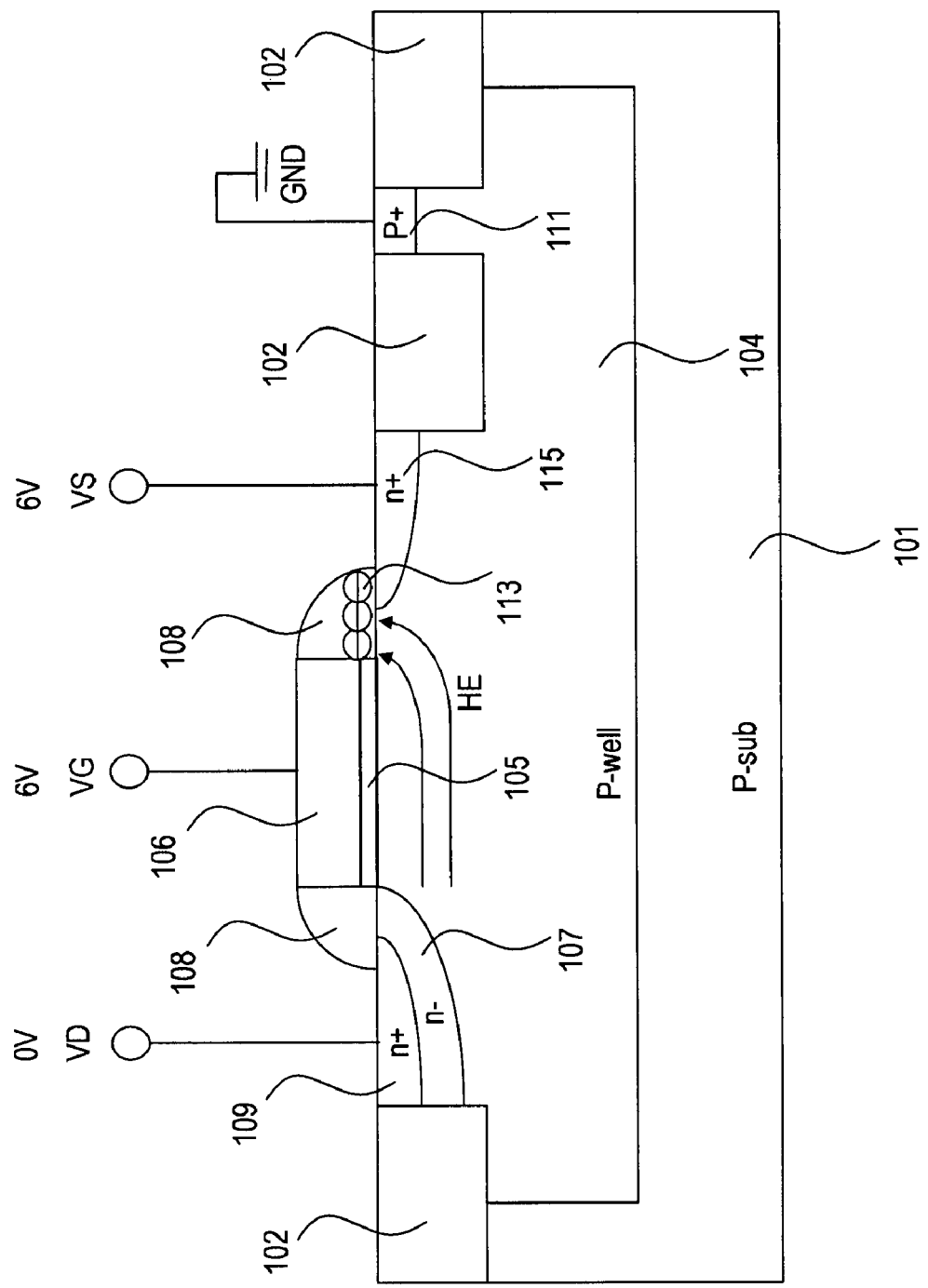
FIG. 18 is a schematic diagram showing an applied voltage condition for writing data of a memory transistor of the memory cell of the second embodiment.
Figure 20:
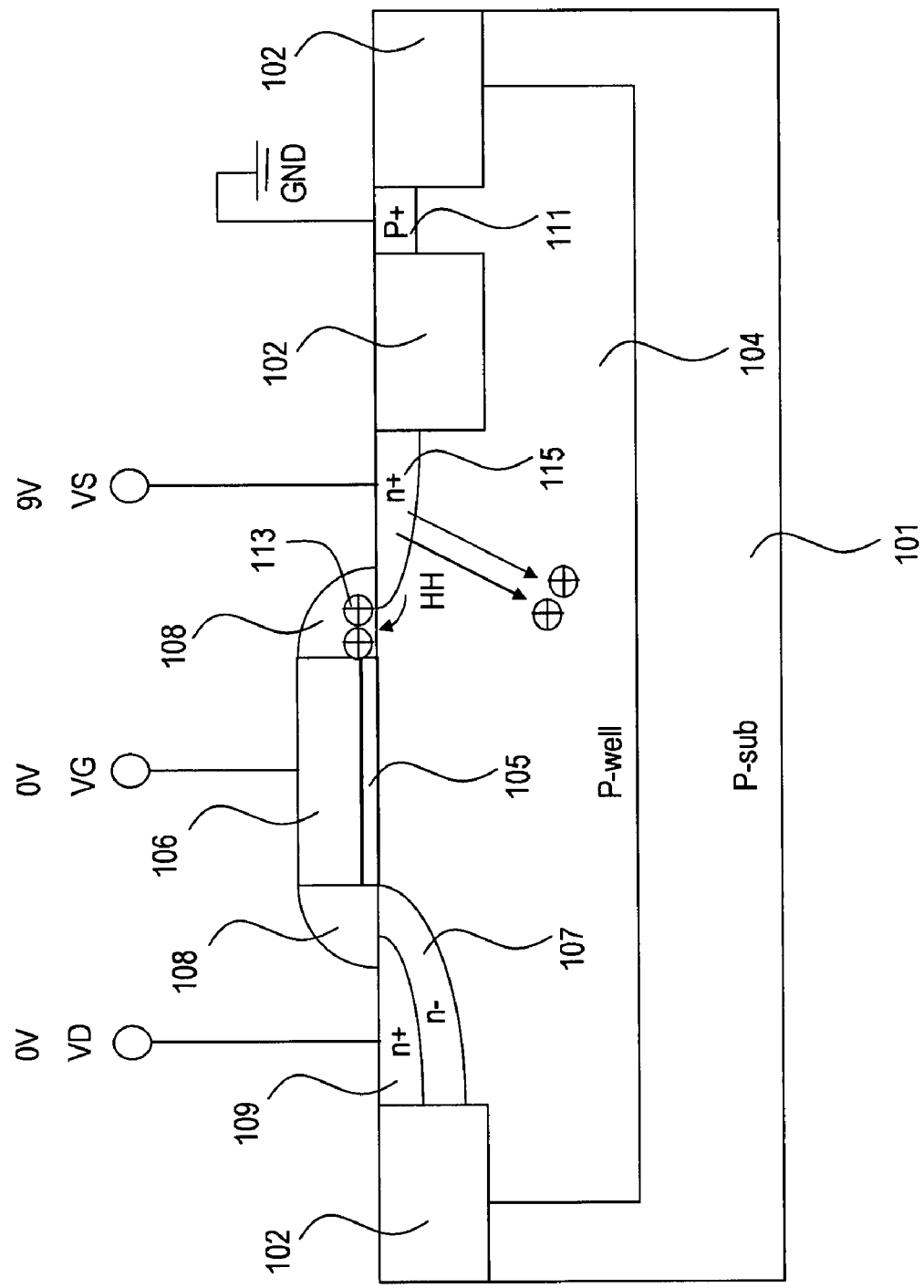
FIG. 20 is a schematic diagram showing an applied voltage condition for erasing data of the memory transistor of the second embodiment.
Figure 26:
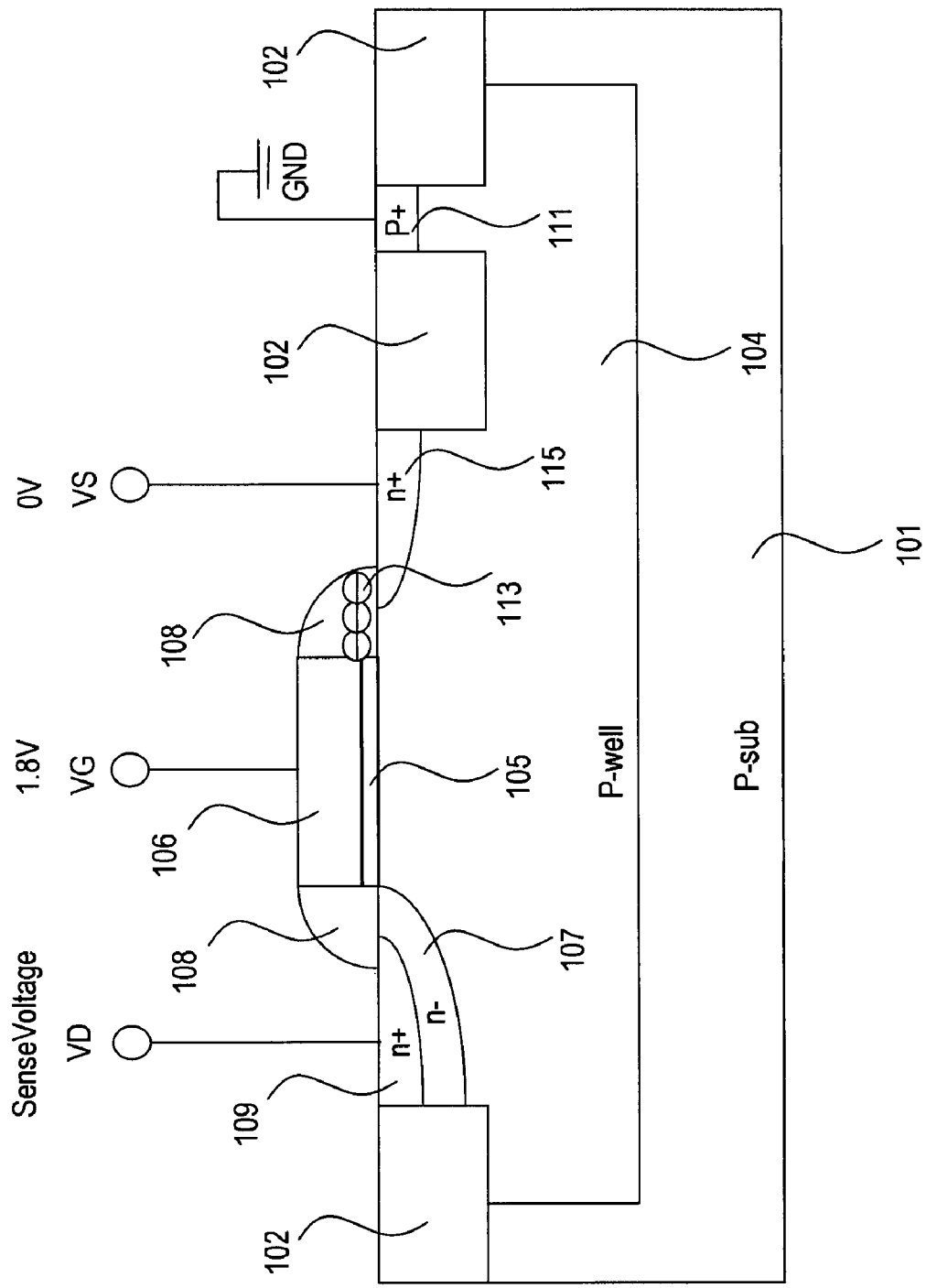
FIG. 26 is a schematic diagram showing an applied voltage condition for reading data of a memory transistor of the memory cell of the second embodiment.

FIG. 18, FIG. 20, and FIG. 26 are schematic diagrams showing the memory transistors MCN1 and MCN2 on a semiconductor substrate. Concretely, FIG. 18 shows an applied voltage condition during programming operation. FIG. 20 shows an applied voltage condition during erase operation. FIG. 26 shows an applied voltage condition during reading operation.

Figure 19:
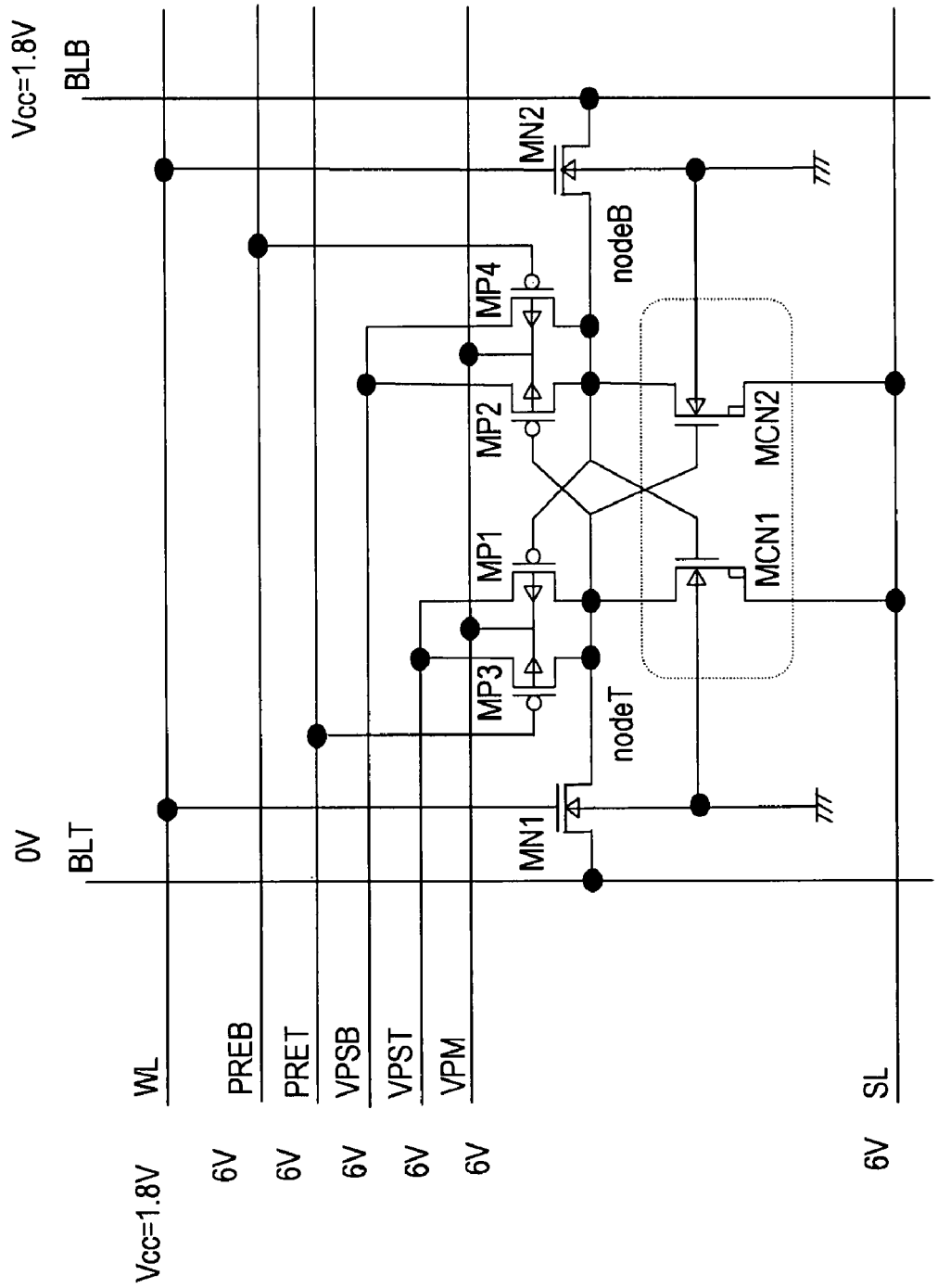
FIG. 19 is a schematic diagram showing a voltage applying procedure for writing data on a memory transistor of the memory cell of the second embodiment.
Figure 21:
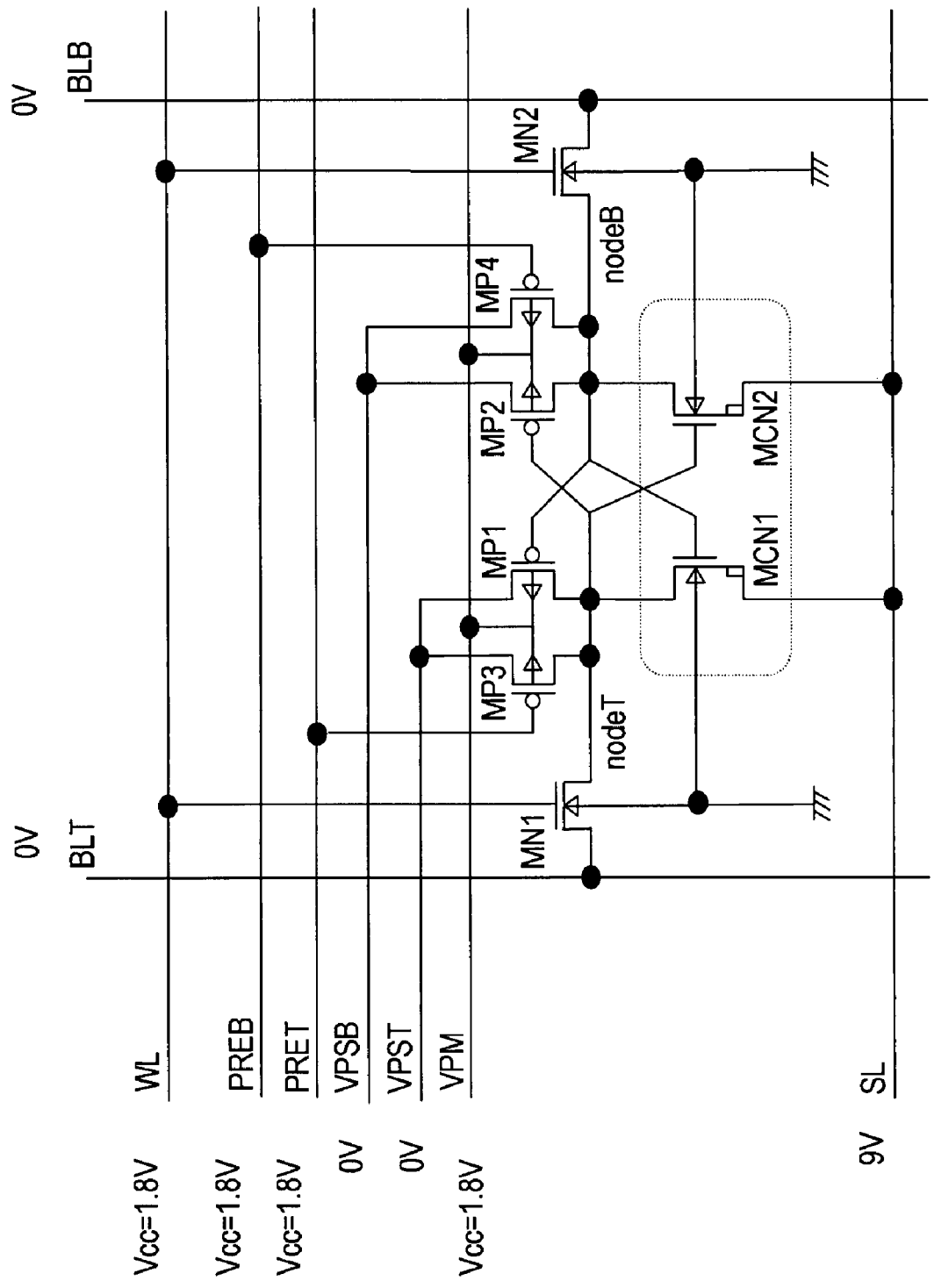
FIG. 21 is a schematic diagram showing a voltage applying procedure for erasing data on a memory transistor of the memory cell of the second embodiment.
Figure 27:
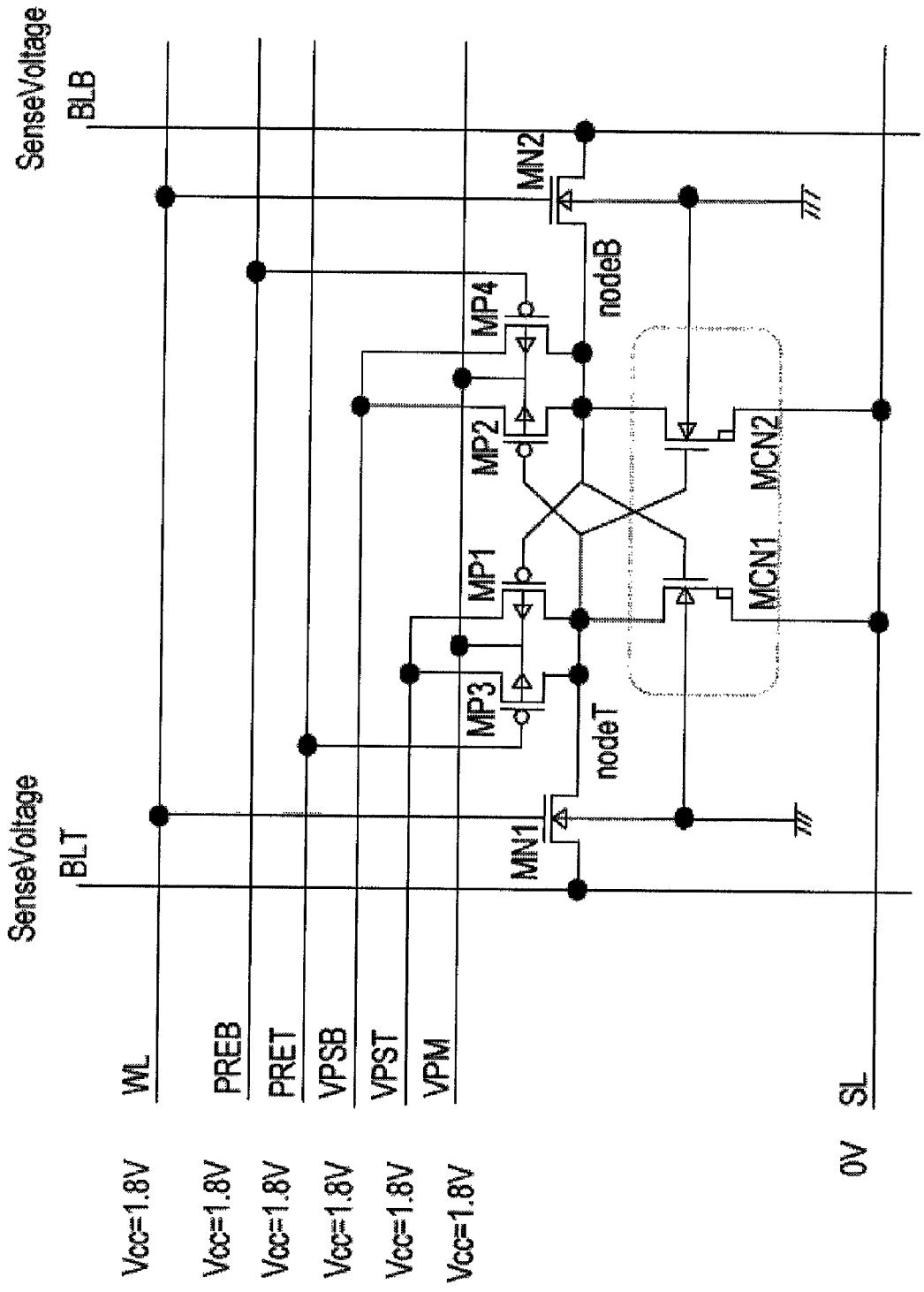
FIG. 27 is a schematic diagram showing a voltage applying procedure for reading data on a memory transistor of the memory cell of the second embodiment.

In addition, FIG. 19 is a schematic diagram showing an applied voltage condition for writing data to a memory transistor MCN1 of the memory cell. FIG. 21 is a schematic diagram showing an applied voltage condition for erasing data of the nonvolatile memory cell. FIG. 27 is a schematic diagram showing a voltage applying procedure for reading data of the nonvolatile memory cell.

As shown in FIG. 18, a p-type well 104 with 0.8 μm in depth, and average boron concentrations, $2\times10^{17}$ $cm^{-3}$ is formed in a surface area of a p-type silicon substrate 101 with electric resistivity 10 Ωcm. The two transistors MCN1 and MCN2 isolated by plurality of trenches (for device isolation) with 250 nm in depth are formed in the p-type well 104. In this figure, only one memory transistor (MCN1) is shown.

The memory transistor is an n-channel type transistor. It comprises a drain 109 formed next to one trench, and a source 115 formed next to another trench in the surface area of the p-type well 104, and comprises a drain extension 107 formed in the vicinity of the drain 109. The drain 109 and the source 115 are doped with average arsenic concentration $1\times10^{20}$ $cm^{-3}$, and the drain extension 107 is doped with average arsenic concentration $5\times10^{18}$ $cm^{-3}$.

A 5 nm thick gate insulator layer 105 and a 200 nm thick gate electrode 106 of poly-silicon layer doped with phosphorus concentration $2\times10^{20}$ $cm^{-3}$ are formed on a channel region between the drain 109 and the source 115 on the surface of the p-type well 104. Side spacers 108 and 108S composed of a 50 nm thick insulator are formed on the drain 109 and source 115 at the side of the gate insulator 105 and the gate electrode 106. The source-side side spacer 108S contacts the channel region of the substrate because an extension area is not formed in the vicinity of the source 115.

A p-type diffused layer 111 with average boron concentration $1 \times 10^{20}$ cm$^{-3}$ is formed in the area isolated from the foregoing memory transistor by a trench 102 in the p-type well area 104. The layer 111 works an electrode for connecting this p-type well 104 to ground.

A threshold voltage of the memory transistor is raised by carrier injection into the source-side side spacer 108S. As illustrated in FIG. 20, the threshold voltage revert back to the initial state by drawing out the injected carrier from the side spacer 108S. Accordingly, this memory transistor can record data without volatilization.

While the initial threshold voltage of the memory transistor is set at 1.2V, the transistor is unstable due to an atypical structure. Therefore, this memory transistor cannot be used solely in terms of reliability. The memory cell of this embodiment is formed with the flip-flop as shown FIG. 16.

In FIG. 18, programming operation is performed by applying 0V to a drain line VD, and applying a positive voltage (e.g., +6V) not more than a breakdown voltage to a source line VS and a gate line VG to generate a channel hot electron HE and to inject it into the side spacer 108S. Electrons trapped by the channel hot electron injection lead to raising the threshold voltage, and the memory transistor becomes a programmed state.

FIG. 19 shows an applied voltage condition in the case of writing data "0" by raising threshold voltage of the memory transistor MCN1. For setting the memory transistor MCN1 to this voltage condition shown in FIG. 18, voltages are applied to the memory cell on the condition shown in FIG. 19. Under the condition of applying 6V to PREB, PRET, VPST, VPSB, VPM, and SL, the operation is performed by connecting a word line WL to Vcc, connecting a bit line BLT to 0V, and connecting a bit line BLB to Vcc. NodeT (a drain of the memory transistor MCN1) comes to have approximately the same voltage as the bit line BLT (0V) by turning ON the transfer gate MN1, which is an n-type MOS transistor. And nodeB (a gate of the memory transistor MCN1) come to have approximately the same voltage as VPSB (6V) by turning ON the load transistor MP2. Thus the applied voltage condition of the memory transistor MCN1 becomes the same as that of FIG. 18. In this condition, a current of about 300 μA flow in the transfer gate MN1 and the memory transistor MCN1. This current makes a threshold voltage of the memory transistor MCN1 raised to Vth2.

On the other hand, in the case of writing data "1", the threshold voltage of the memory transistor MCN2 is raised, which all conditions but applying Vcc to BLT and applying 0V to BLB are the same as those of writing data "0".

6V is applied to both the gate (nodeB) of the transistor MCN1 and the drain (the source line SL) of the transistor MCN1 in the foregoing embodiment. Even a different power voltage can be applied to the gate and the drain. On the other hand, in the procedure shown in FIG. 21, as the same voltage is applied to PREB and PRET, PREB and PRET can be connected to be applied a common signal (e.g. PRE signal); as the same voltage is applied to VPSB and VPST, VPSB and VPST can be connected to be applied a common signal (e.g. VPS signal); as the writing procedure performs properly when 0V is applied to VPM, VPM and VPS can be connected to be applied a common signal.

FIGS. 20 and 21 are schematic diagrams showing voltage conditions for erasing data of the memory transistor MCN1 (or MCN2). For setting the memory transistor MCN1, MCN2 to this voltage condition shown in FIG. 20, an erase operation is performed as follows. A positive voltage (e.g., +9V) not more than a breakdown voltage is applied to a source line VS, and 0V is applied to the gate line VG and the drain line VD, to generate avalanche hot holes HH from the source 115 and to inject the avalanche hot holes HH into the side spacer 108S. Electrons trapped in the side spacer 108S by the foregoing programming operation are neutralized, and the written data is erased due to reduce the threshold voltage.

FIG. 21 shows a voltage condition in the case of erasing data by reducing threshold voltages of the memory transistor MCN1, MCN2. For setting the memory transistor MCN1, MCN2 to this voltage condition shown in FIG. 20, voltages are applied to the memory cells on the condition shown in FIG. 21. Typically, an erase operation is performed for the entire memory cell of the memory array shown in FIG. 17. Under the condition of applying Vcc to PREB, PRET, and VPM, applying 0V to VPST and VPSB, and applying 9V to SL, the operation is performed by connecting the word line WL to Vcc, and connecting the bit lines BLT, BLB to 0V. Transfer gates MN1 and MN2, which are n-type MOS transistors, turn ON when nodeT and nodeB come to have 0V. Thus the applied voltage condition of memory transistors MCN1, MCN2 is the same as that of FIG. 20. Additionally, a common signal (e.g. PRE signal) for PREB and PRET can be applicable because PREB and PRET have a same voltage as shown in FIG. 21. Moreover, a common signal can be applicable by connecting VPM to VPS because the signal can work properly even if 0V would be applied.

As stated above, the voltage condition of the programming operation shown in FIGS. 18 and 19 and the voltage condition of the erase operation shown in FIGS. 20 and 21 are designed so that the word line and the bit line that are necessary to be controlled individually for each memory cell can perform at either 0V or Vcc, in other words, no high voltage is required to be applied to the word line or bit line. Thus a high breakdown voltage transistor is not required and a high-performance transistor can be used in a word-line control circuit and a bit-line control circuit to speed up of reading operation.

FIGS. 22A through 22C are schematic diagrams illustrating a method for controlling a threshold voltage of each memory transistor MCN1, MCN2 in the case of the foregoing programming operation, i.e. a method for data setting for a nonvolatile memory cell. Here, when the threshold voltage of the memory transistor MCN1 is low-state (on state) and the threshold voltage of the memory transistor MCN2 is high-state (off state), the data is "1". Reversing state, when the threshold voltage of the memory transistor MCN1 is high-state (off state) and the threshold voltage of the memory transistor MCN2 is low-state (on-state), the data becomes "0."

FIG. 22A shows a case that both threshold voltages of the memory transistors MCN1 and MCN2 are at the initial state Vth0, i.e. a state of no data setting. Even in this case, the data of the nonvolatile memory cell is fixed at "1" by procedure in FIG. 23 or that in FIG. 25.

FIG. 22B shows threshold voltages of memory transistors MCN1, MCN2 in the case that the nonvolatile memory cell is set at data "0." Writing data "0" is achieved by raising the threshold voltage of the memory transistor MCN1 from the initial state shown in FIG. 22A to Vth2 (Vth2>Vth0).

FIG. 22C shows threshold voltages of memory transistors MCN1, MCN2 in the case that the nonvolatile memory cell is set at data "1." Writing data "1" is achieved by raising the threshold voltage of the memory transistor MCN2 from the initial state shown in FIG. 22A to Vth2 (Vth2>Vth0).

The state of the nonvolatile memory cell reverts back to the state shown in FIG. 22A by erase operation illustrated in FIG.

20 and FIG. 21 even if the threshold voltage is controlled under the condition shown in FIG. 22B or FIG. 22C.

As stated above, memory transistors MCN1, MCN2 can be reduced back to Vth0 of the initial state from Vth2 of the programmed state. Thus enough voltage differential of the programmed side and the erased side can be secured even if data "0" or "1" is rewritten multiple times.

A programming operation shown in FIG. 18 and FIG. 19 makes it possible to write data "1" or "0" to the memory cell by writing to either the memory transistor MCN1 or MCN2. In the case that both threshold voltages of the memory transistors MCN1 and MCN2 are Vth0 of the initial state, i.e. a state of no data setting, the data of the memory cell is unstable. However, the data of the nonvolatile memory cell of the initial state can be fixed at either "1" or "0" by applying voltage by the following procedure.

Figure 23A:
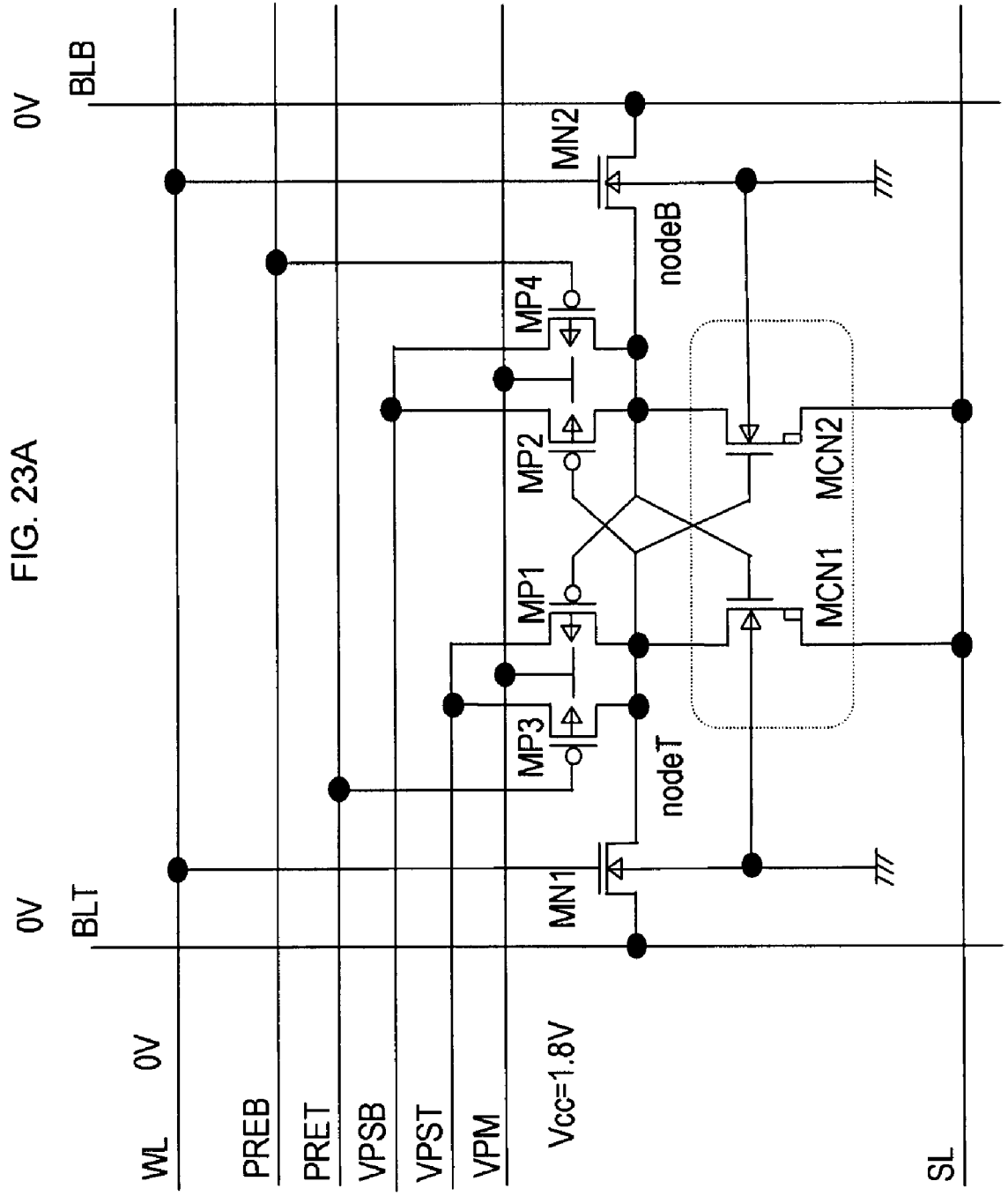
FIGS. 23a and 23b are schematic diagrams illustrating a voltage applying procedure for data fixing of the second embodiment to fix data "1" even if no programming operation is performed.
Figure 23B:
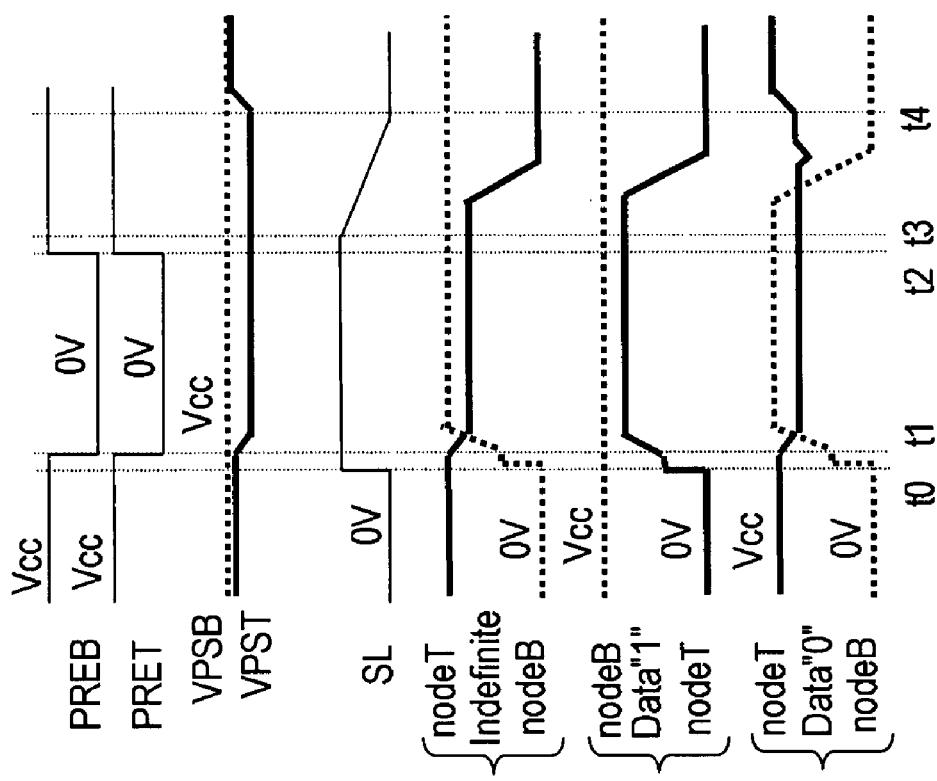

FIG. 23 is a schematic diagram showing a voltage applying procedure to fix data of the nonvolatile memory cell. This procedure fixes data of a memory cell to which data "1" or "0" is written as it is written, and fixes data of a memory cell at "1" which is of the initial state. By the procedure for the whole memory cell of the array including memory cell written data "0" or "1" and that of the initial state, the data of the memory cell written data "0" or "1" is set as it is written, also the data of the memory cell of the initial state is fixed the data at "1". This procedure is performed at the time of start-up of the memory.

The procedure shown in FIG. 23 is as follows. This procedure is preformed under the condition of setting a word line WL and bit lines BLT and BLB at 0V. To begin with, the memory transistors MCN1 and MCN2 are made to turn off state by raising a source voltage SL from 0V to Vcc at the time t0. Then, reducing precharge control signals PRET and PREB from Vcc to 0V at the time t1 leads to power on of the precharge transistors MP3 and MP4. At the same time, true-side precharge voltage VPST is reduced by ΔV (e.g., 0.2V) which is much lower than Vth2−Vth0. Therefore, precharge voltage of nodeT becomes Vcc−ΔV, and precharge voltage of nodeB becomes Vcc, and the voltage between the source and the drain of the memory transistor MCN2 is ΔV higher than the voltage between the source and the drain of the memory transistor MCN1. Consequently, an apparent threshold voltage of the memory transistor MCN2 can be ΔV higher.

Voltage of PRET, PREB reverts back to Vcc at the time t2, and the source voltage SL is started to reduce gradually to 0V at the time t3. At this time, the flip-flop data is fixed at "1" in the case that the data of the memory cell is "1", because voltage of nodeT is reduced to 0V and voltage of nodeB becomes Vcc−ΔV by MCN1 of lower threshold voltage turning on instead of MCN2. On the other hand, in the case that the data of the memory cell is "0", the flip-flop data is fixed at "0" because voltage of nodeB is reduced to 0V and voltage of nodeT becomes Vcc by MCN2 of lower threshold voltage turning on instead of MCN1.

Moreover, in the case that the data of the memory cell is "indetermination", i.e. both threshold voltages of MCN1 and MCN2 are Vth0, the flip-flop data is fixed at "1"; nodeT is reduced to 0V and nodeB becomes Vcc−ΔV by MCN1 turning on instead of MCN2 because the threshold voltage of MCN1 appears ΔV lower than that of MCN2.

The voltage of VPST reverts back to Vcc at the time t4, which is after fixing the flip-flop condition.

The voltage to take into account incipient fluctuation of threshold voltage of the transistor is appropriate for the ΔV; for example 0.2V. It is because most of memory cells that both threshold voltages of MCN1 and MCN2 are Vth0 have not written data yet and memory transistor MCN1, MCN2 are not deteriorated by writing data.

The voltage applying procedure shown in FIG. 23 is for applying voltage to fix the initial data of the memory cell at "1". On the other hand, the initial data of the memory cell can be fixed at "0" by ΔV reduction of the VPSB voltage instead of that of VPST in source voltage control of the p-type MOS transistor. On the other hand, in the procedure shown in FIG. 23, as the same voltage is applied to PREB and PRET, PREB and PRET can be connected to be applied a common signal (e.g. PRE signal).

FIGS. 24A through 24C are schematic diagram illustrating a margin of data fixing in the case of the procedure shown in FIG. 23. In the initial state that both threshold voltages of MCN1 and MCN2 are Vth0, as mentioned above, the data of the memory cell is fixed to "1" by raising an apparent threshold voltage of MCN2 by ΔV due to making precharge voltage of nodeT ΔV higher than that of nodeB. When data "0" is already written to a memory cell, 0.8V of voltage differential is secured in the case of Vth2−Vth0=1V and ΔV=0.2V, although the margin is reduced by ΔV. On the other hand, when data "1" is already written to a memory cell, the voltage differential is increased to 1.2V in the case of Vth2−Vth0=1V and ΔV=0.2V by ΔV.

Figure 25A:
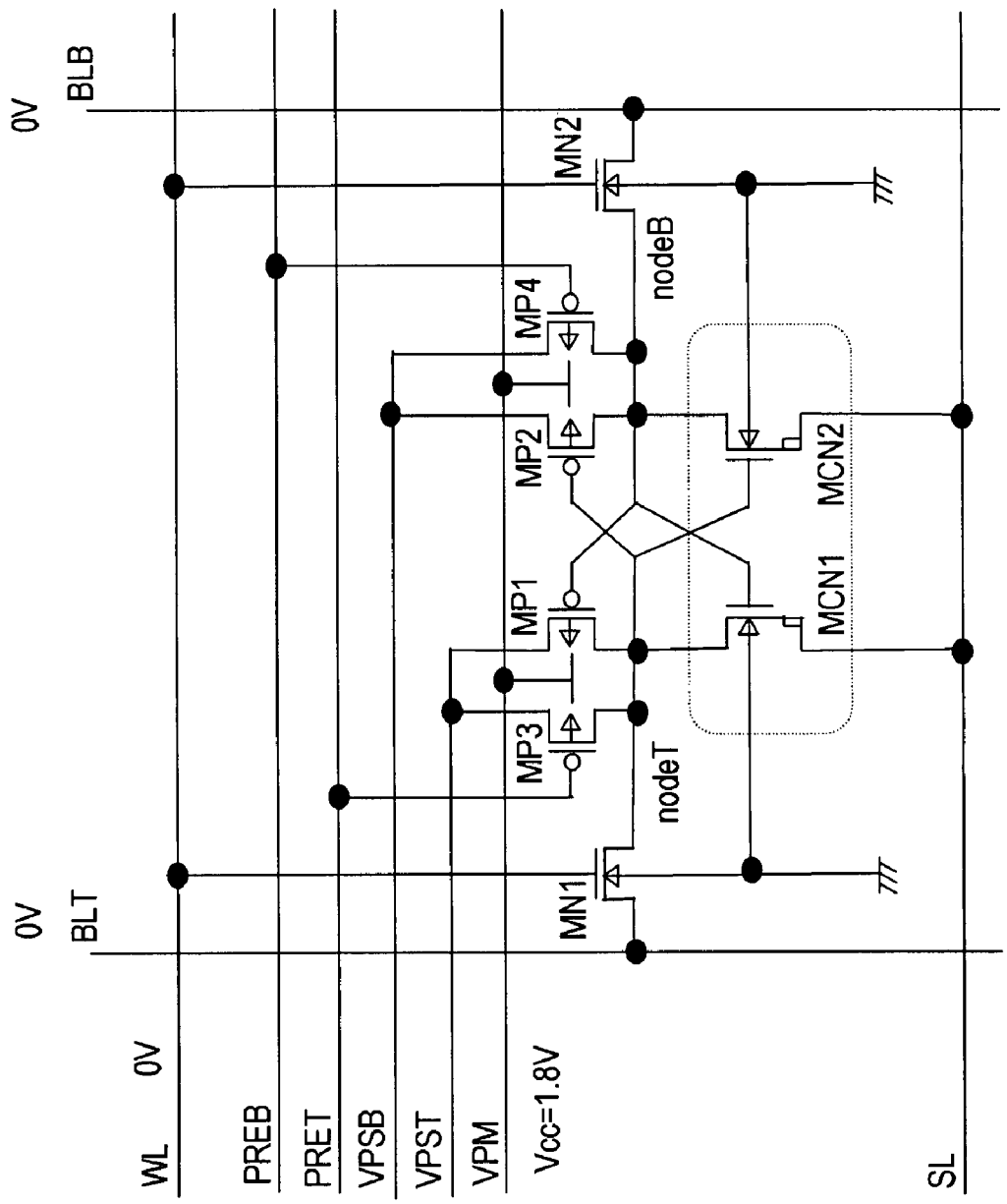
FIGS. 25A and 25B are schematic diagrams illustrating a voltage applying procedure for fixing an initial state of the memory cell of the second embodiment so as to fix "1".
Figure 25B:
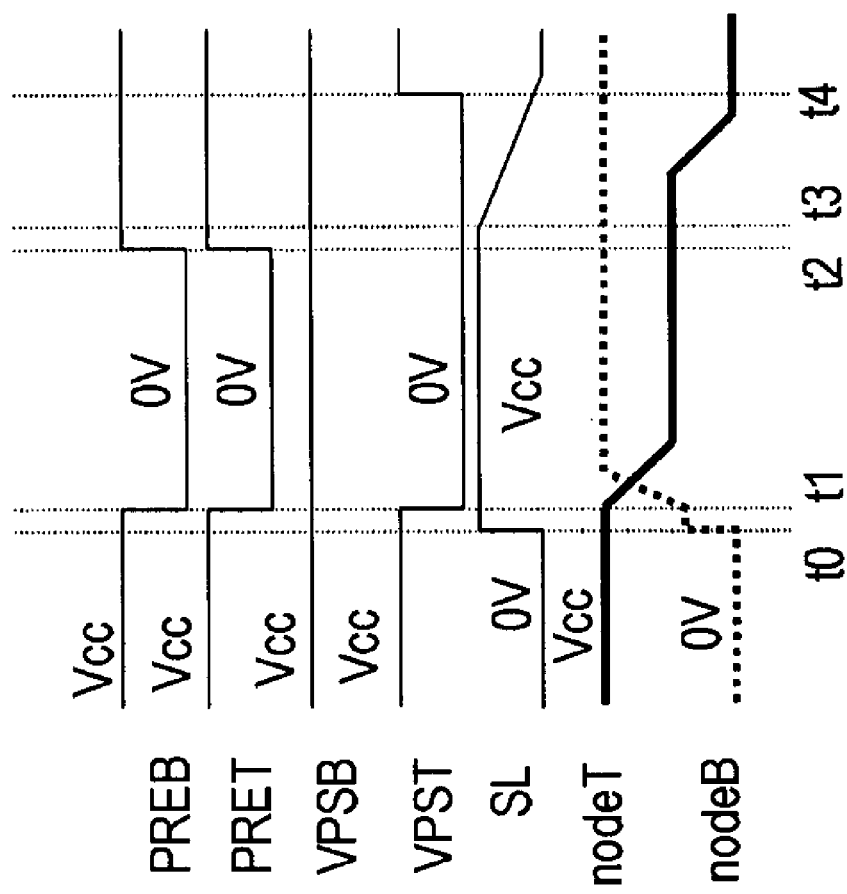

FIG. 25 is a schematic diagram showing an applied voltage condition to fix data of the memory cell of the initial state. The procedure shown in FIG. 23 is for fixing data of the entire memory cell in the memory array including the memory cells written data "0" and "1" as well as those of the initial state. On the other hand, the procedure shown in FIG. 25 is, effective only for the memory cell of the initial state, and makes the data of the memory cell in the initial state fixed at "1" or "0".

In the case of the memory array including memory cells written data as well as those of the initial state, applying the procedure only to memory cell of the initial state individually, the data of the memory cell can be fixed at "1" or "0". On the other hand, in the case of the memory array including only memory cells of the initial state, applying the procedure to the entire memory cell, the data of the memory cell can be fixed at "1" or "0". The following description shows the procedure to fix the data of the memory cell of the initial state at "1".

This procedure is preformed under the condition that a word line WL and bit lines BLT, BLB are set at 0V. To begin with, MCN1 and MCN2 is turned off state by raising a source voltage SL from 0V to Vcc at the time t0. Precharge control signals PREB, PRET and the source voltage VPST of the precharge transistor MP3 is reduced from Vcc to 0V at the time t1; thus, nodeB is charged to Vcc by the precharge transistor MP4 and nodeT is discharged through the precharge transistor MP3. The voltage of PREB and PRET is raised back to Vcc at the time t2, and the voltage of SL is reduced back to 0V from Vcc; then, MCN1 applied higher gate voltage turns on instead of MCN2; thus, nodeT is reduced to 0V under keeping the voltage of nodeB at Vcc, and the flip-flop data is fixed at "1".

The voltage applying procedure shown in FIG. 25 is for fixing the data of the memory cell at "1". On the other hand, the initial data of the memory cell can be fixed at "0". By reducing the source voltage VPSB of the precharge transistor MP4 from Vcc to 0V, instead of the source voltage VPST of the precharge transistor MP3, nodeB becomes 0V and the data is fixed at "0". On the other hand, in the procedure shown in FIG. 25, as the same voltage is applied to PREB and PRET, PREB and PRET can be connected to be applied a common signal (e.g. PRE signal).

The nonvolatile memory cell of the initial state can be used as a fuse by fixing the data at "1" by applying the procedure shown in FIG. 23 or FIG. 25. The data "1" corresponds to a state of the fuse before burning it out.

FIGS. 26 and 27 are schematic diagrams showing an applied voltage condition and a voltage applying procedure of reading data from the nonvolatile memory cell. As shown in FIG. 26, the reading operation is a operation that reading voltage of the drain line VD under the condition of applying Vcc on the gate line VG and applying 0V on the source line VS. The voltage applying procedure shown in FIG. 27 is as follows. As reading operation of SRAM, a differential sense amplifier is used for the reading operation. A voltage shift of each bit line BLT, BLB according to the data stored in the flip-flop is retrieved by the differential sense amplifier under the condition that PREB, PRET, VPST, VPSB, and VPM are set at Vcc, SL is set at 0V, and the word line is set at Vcc. When BLT is low voltage (0V) and BLB is high voltage (Vcc), the data is "1", on the other hand, when BLT is high voltage (Vcc) and BLB is low voltage (0V), the data is "0". On the other hand, in the procedure shown in FIG. 27, as the same voltage is applied to PREB and PRET, PREB and PRET can be connected to be applied a common signal (e.g. PRE signal); as the same voltage is applied to VPSB and VPST, VPSB and VPST can be connected to be applied a common signal (e.g. VPS signal); as the writing procedure performs properly when 0V is applied to VPM, VPM and VPS can be connected to be applied a common signal.

The voltage applying procedure for data fixing shown in FIG. 23 is a methods that can fix the data of the memory cell at "1" even if the memory array includes a memory cell of the initial state, i.e. a memory cell that each memory transistor MCN1, MCN2 is in the initial state (the threshold voltage=Vth0). On the other hand, voltage applying procedures shown in FIGS. 28 through 30 can be applied in the case of no memory cell of the initial state in the memory array or no need to care about unstable data of the memory cell of the initial state. This procedure does not cause the ΔV reduction of the voltage differential for fixing (cf. FIG. 24) as the procedure shown in FIG. 23.

Figure 28A:
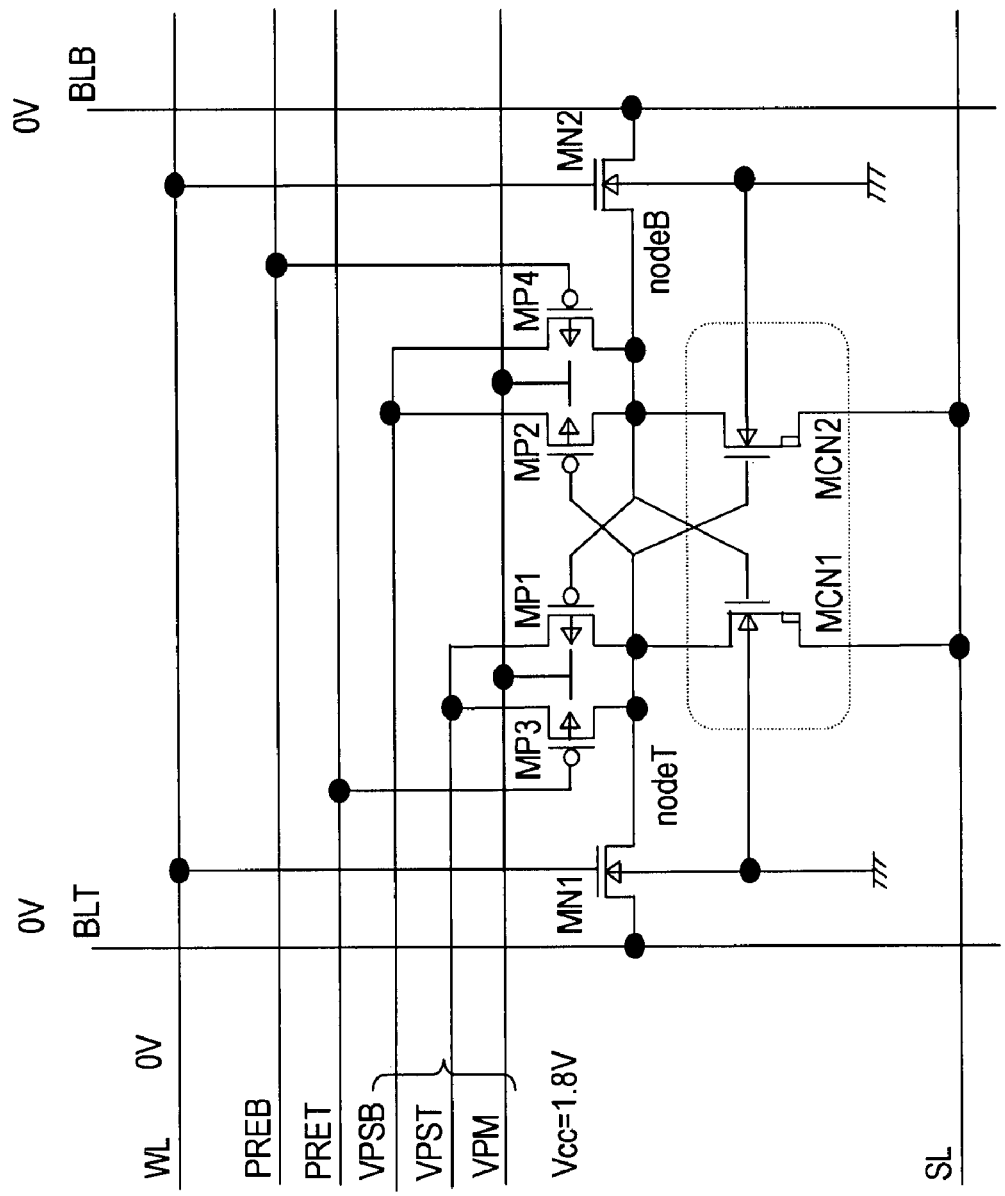
FIGS. 28A and 28B are schematic diagrams illustrating a voltage applying procedure for data fixing of the second embodiment.
Figure 28B:
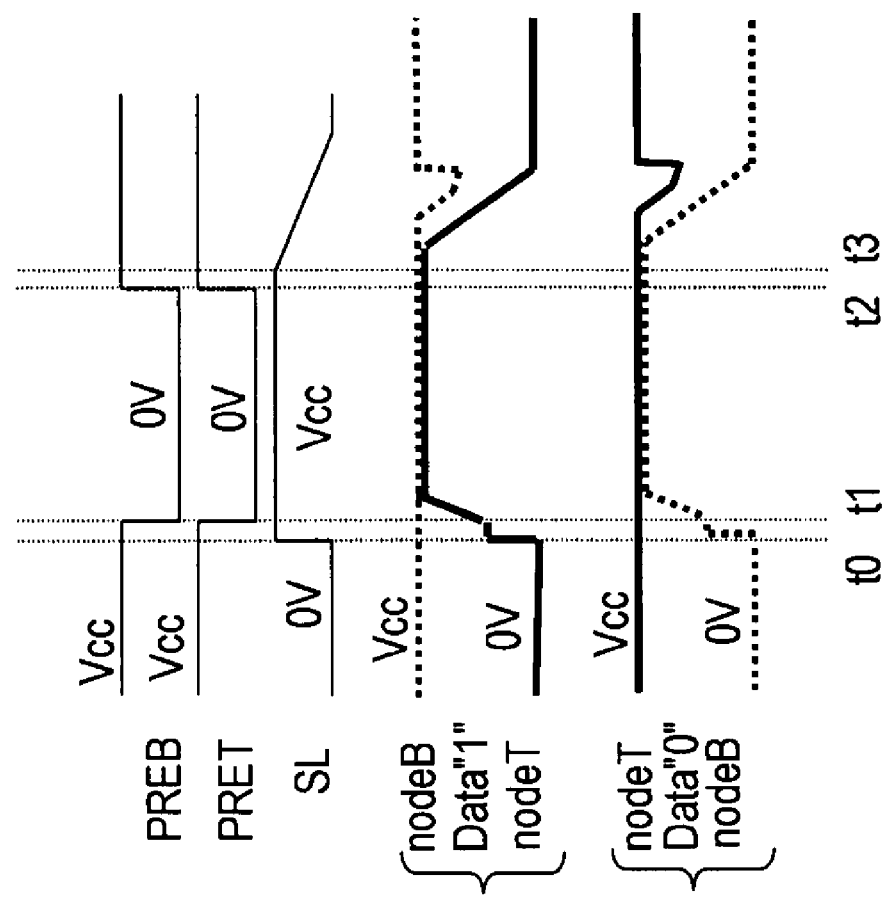

The procedure shown in FIG. 28 is as follows. Under the condition that a word line WL and bit lines BLT and BLB are set at 0V and VPST, VPSB, and VPM are set at Vcc, the memory transistors MCN1 and MCN2 are turned off state by raising a source voltage SL from 0V to Vcc at the time t0; then, the precharge transistors MP3 and MP4 are turned on state by reducing precharge control signals PRET and PREB from Vcc to 0V at the time t1, and this gives nodeT and nodeB to be precharged up to Vcc. To finish the precharge, voltage of PRET, PREB is raised back to Vcc at the time t2, and then, the source voltage SL starts to reduce gradually to 0V at the time t3. At this time, MCN1 turns on state instead of MCN2, in the case that the data of the memory cell is "1", in another words, the threshold voltage of MCN1 is lower than that of MCN2; thus, nodeT is reduced to 0V and nodeB becomes Vcc, which means that the flip-flop data is fixed at "1". On the other hand, in the case that the data of the memory cell is "0", MCN2 turns on state instead of MCN1, thus, nodeB is reduced to 0V and nodeT becomes Vcc, which means that the flip-flop data is fixed at "0". On the other hand, in the procedure shown in FIG. 28, as the same voltage is applied to PREB and PRET, PREB and PRET can be connected to be applied a common signal (e.g. PRE signal); as the same voltage is applied to VPSB and VPST, VPSB and VPST can be connected to be applied a common signal (e.g. VPS signal); as the writing procedure performs properly when 0V is applied to VPM, VPM and VPS can be connected to be applied a common signal.

Figure 29A:
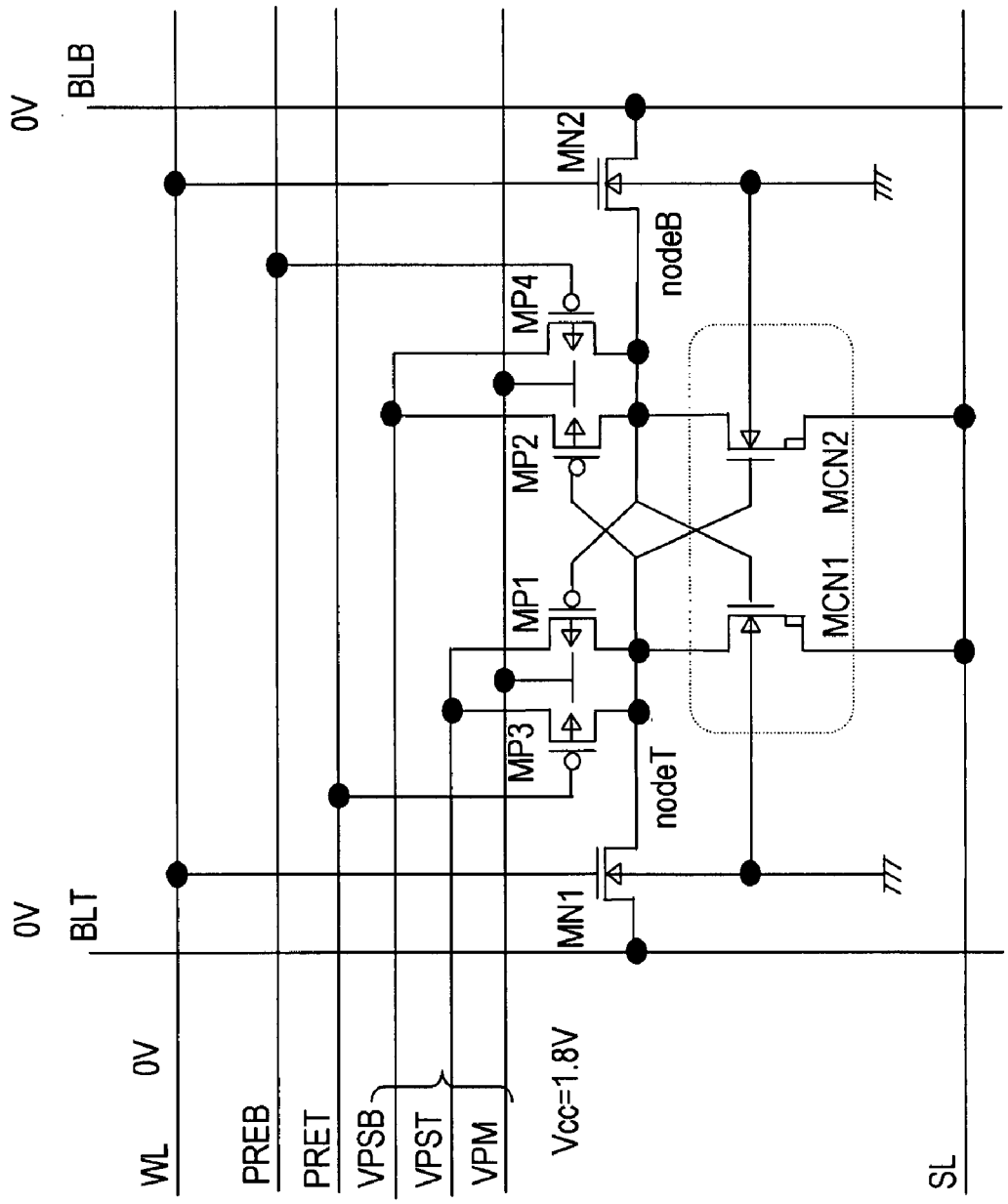
FIGS. 29A and 29B are schematic diagrams illustrating a voltage applying procedure for data fixing of the second embodiment.
Figure 29B:
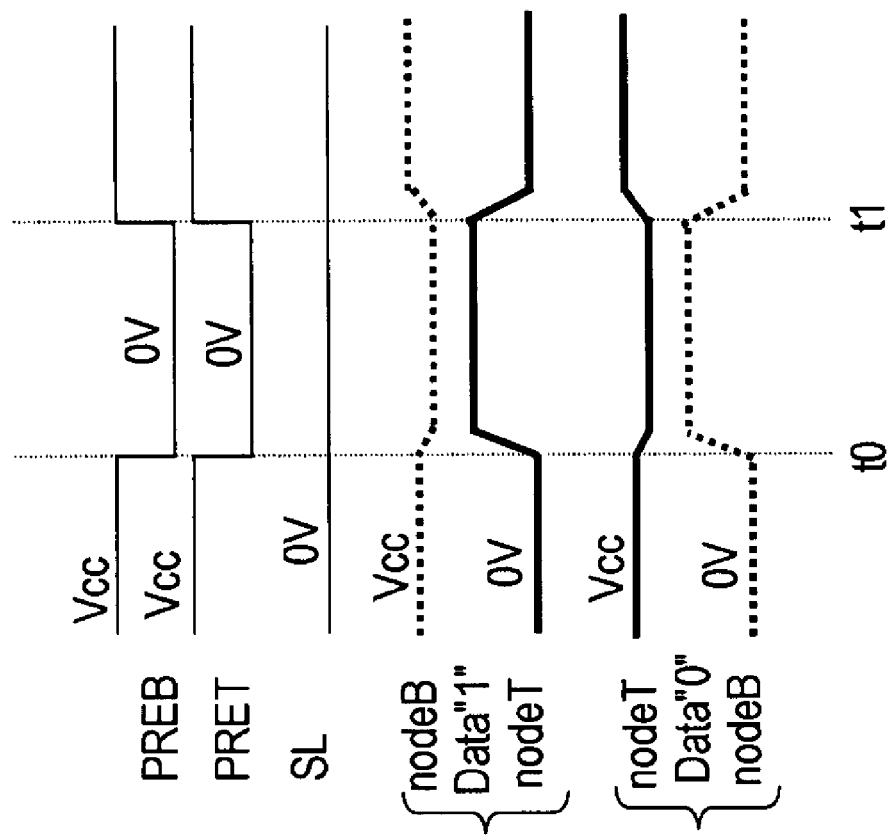

The procedure shown in FIG. 29 is as follows. Under the condition of setting a word line WL and bit lines BLT and BLB at 0V, VPST, VPSB, and VPM at Vcc and fixing a source voltage SL at 0V, the precharge transistors MP3 and MP4 are turns on state to precharge nodeT and nodeB by reducing precharge control signals PRET and PREB from Vcc to 0V at the time t0. The precharge voltages of nodeT and nodeB becomes stable when their respective DC currents of a path of MP1, MP3 and MCN1 and a path of MP2, MP4 and MCN2 becomes constant. At this time, the voltage of nodeT is lower than that of nodeB, in the case that the data of the memory cell is "1", in another words, the threshold voltage of MCN1 is lower than that of MCN2; this is because the resistance value of MCN1 of lower threshold voltage is lower than that of MCN2. The flip-flop data is fixed at "1" after finishing the precharge at the time t1. On the other hand, in the case that the data of the memory cell is data "0", the voltage of nodeB becomes lower than that of nodeT, and the flip-flop data is fixed at "1" after finishing the precharge at the time t1 because the resistance value of MCN2 of lower threshold voltage is lower than that of MCN1. On the other hand, in the procedure shown in FIG. 21, as the same voltage is applied to PREB and PRET, PREB and PRET can be connected to be applied a common signal (e.g. PRE signal); as the same voltage is applied to VPSB and VPST, VPSB and VPST can be connected to be applied a common signal (e.g. VPS signal); as the writing procedure performs properly when 0V is applied to VPM, VPM and VPS can be connected to be applied a common signal.

The procedure for fixing data shown in FIG. 29 has a disadvantage in terms of consumption of current compared to that shown in FIG. 28 because the DC penetration current flows in the flip-flop at the time of precharge. However, that shown in FIG. 29 has an advantage in terms of controllability than that shown in FIG. 28 because the source lines SLT and SVB can be controlled under fixing at 0V.

Figure 30A:
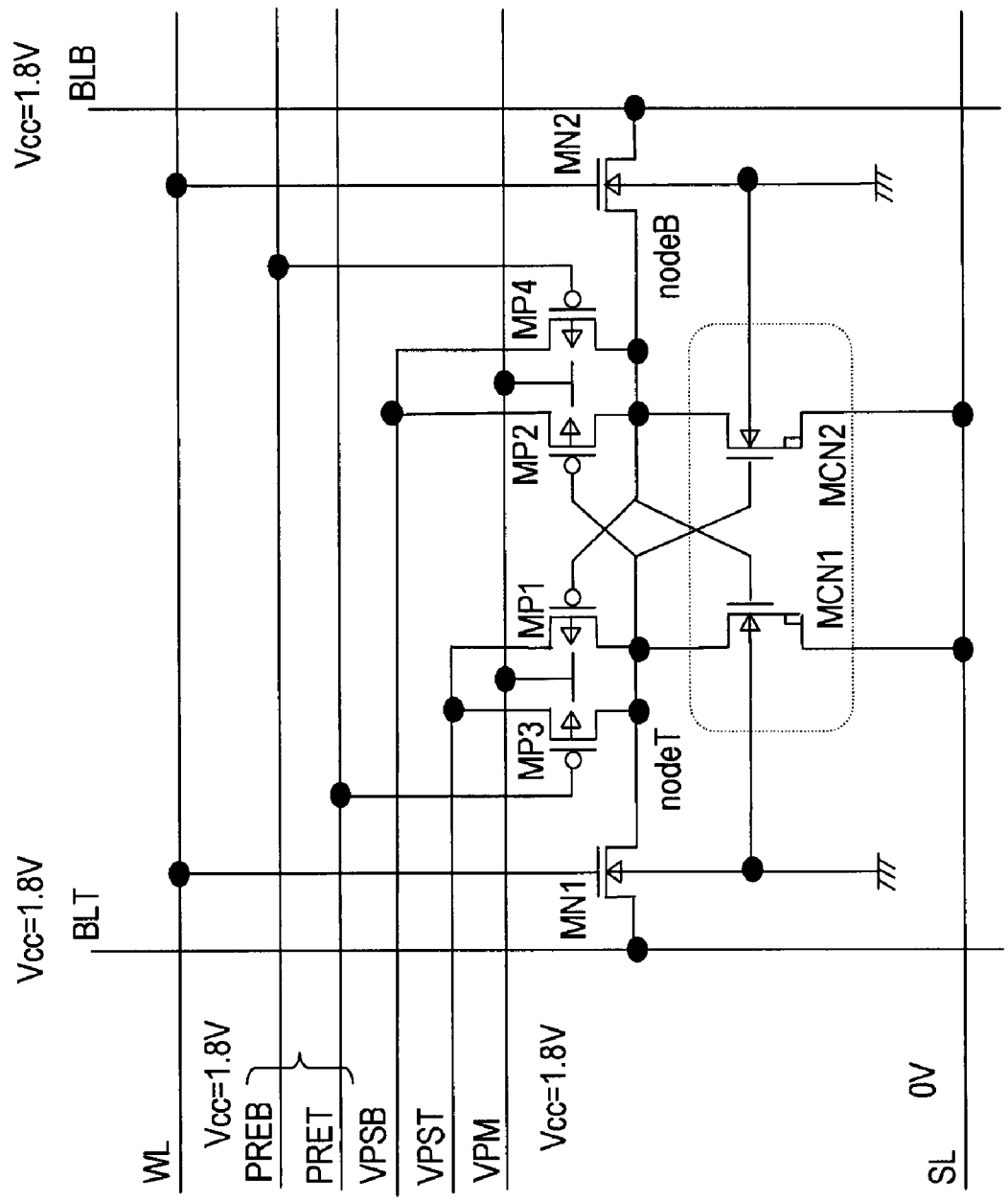
FIGS. 30A and 30B are schematic diagrams illustrating a voltage applying procedure for data fixing of the second embodiment.
Figure 30B:
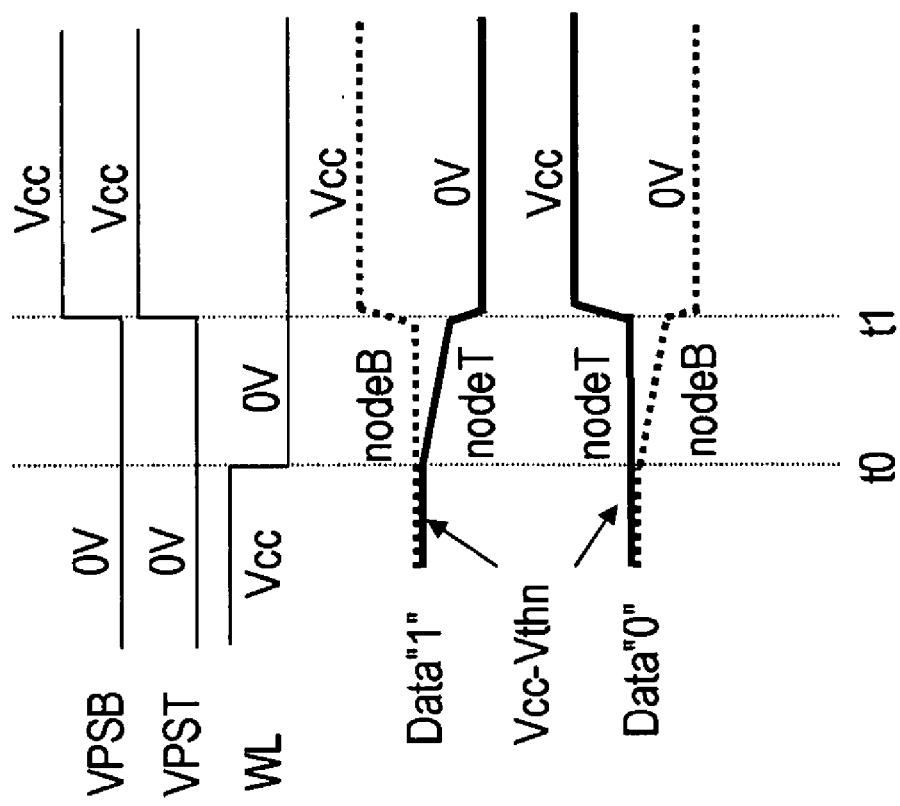

The procedure shown in FIG. 30 is as follows. The feature of this procedure for fixing data is that precharge voltage for nodeT and nodeB is supplied from bit lines. NodeT and nodeB are precharged to Vcc-Vthn through a transfer gate MN1 or MN2 by the bit line BLT or BLB that is charged up to Vcc, due to fixing PRET and PREB at Vcc as well as setting a word line WL, the bit lines BLT and BLB at Vcc and setting VPST and VPSB at 0V to cut off MP1 through MP4. Here, Vthn is threshold voltage of MP1 and MP2. NodeT and nodeB are set floating state by reducing the voltage of the word line WL from Vcc to 0V at the time t0; then, the flip-flop data is fixed by the discharge differential from MCN1 and MCN2. In the case of data "1", the voltage of nodeT becomes lower than that of nodeB because the resistance value of MCN1 of lower threshold voltage is lower than that of MCN2; thus, the data of the nonvolatile memory cell is fixed at "1" after raising voltage of VPST and VPSB from 0V to Vcc at the time t1. On the other hand, in the case of data "0", the voltage of nodeB becomes lower than that of nodeT because the resistance value of MCN2 of lower threshold voltage is lower than that of MCN1; thus, the data of the nonvolatile memory cell is fixed at "0" after raising the voltage of VPST and VPSB from 0V to Vcc at the time t1. On the other hand, in the procedure shown in FIG. 30, as the same voltage is applied to PREB and PRET, PREB and PRET can be connected to be applied a common signal (e.g. PRE signal); as the same voltage is applied to VPSB and VPST, VPSB and VPST can be connected to be applied a common signal (e.g. VPS signal).

A Modified Embodiment of the Second Embodiment

Figure 31:
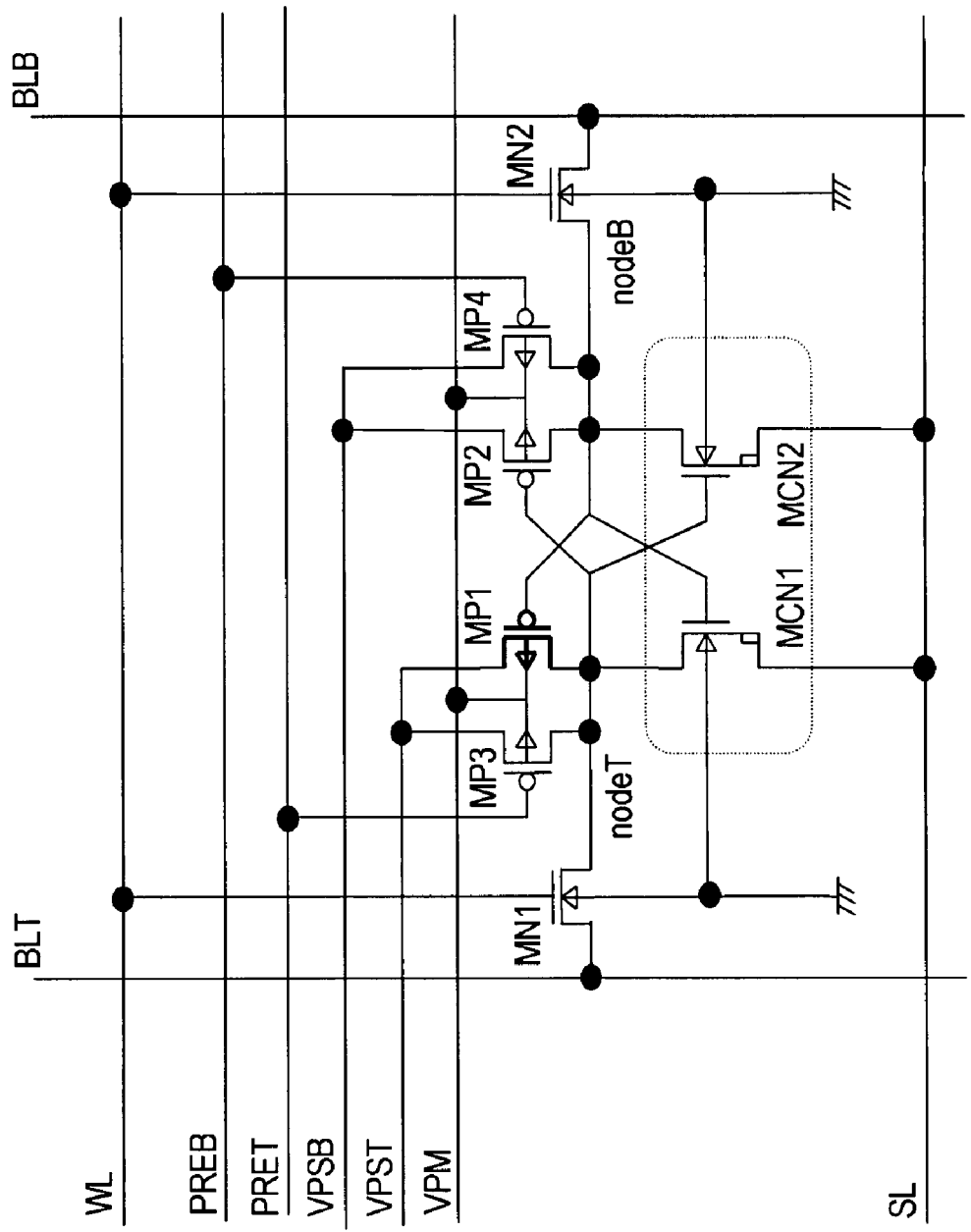
FIG. 31 is a schematic diagram showing a memory cell configuration that resistances of both inverters are differentiated with respect to each other by broadening a channel width of either load transistor.
Figure 32:
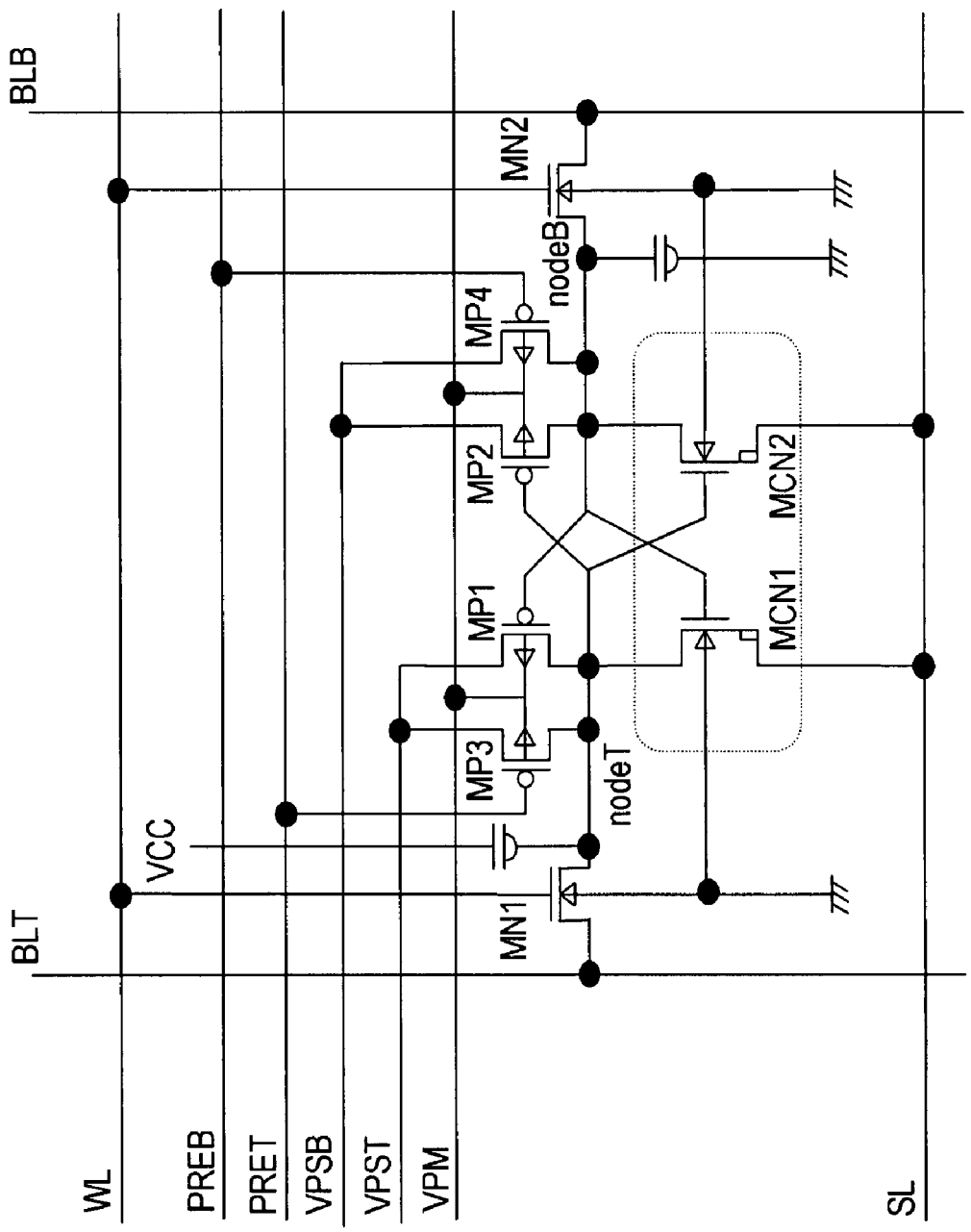
FIG. 32 is a schematic diagram showing a memory cell configuration that capacitances of both inverters are differentiated with respect to each other by connecting additional condensers.

If data writing of the VPS separating type 8-transistor configuration of the second embodiment is not performed, i.e. the threshold voltage of both memory transistors MCN1, MCN2 is low, stored data of the nonvolatile memory cell by data fixing procedure shown in FIG. 28 through FIG. 30 is unstable. By putting a circuit configuration of true-side (the memory transistor MCN1) and bar-side (the memory transistor MCN2) out of balance as shown in FIG. 31 or FIG. 32, stored data of the memory cell can be fixed to "0" or "1", even if threshold voltages of both memory transistors MCN1 and MCN2 are low.

Figure 49:
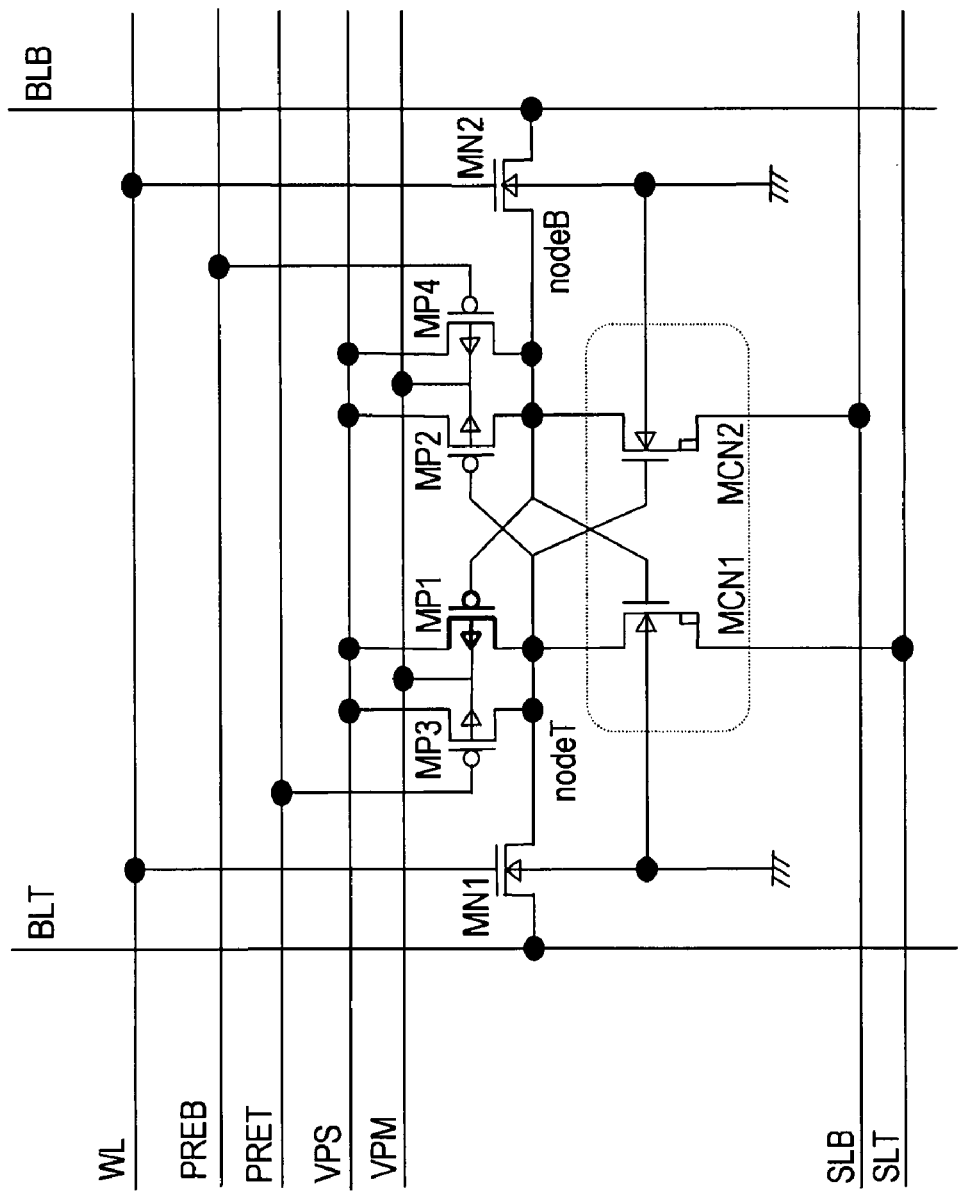
FIG. 49 is a schematic diagram showing a memory cell configuration that resistances of both inverters are differentiated with respect to each other by broadening a channel width of either load transistor.

A nonvolatile memory cell shown in FIG. 49 comprises two load transistors MP1 and MP2 of different channel width. In this case, with forming a channel width of the load transistor MP1 twice as wide as that of the load transistor MP2, ON resistance of the load transistor MP1 is reduced to half of the load transistor MP2.

When the memory cell with this configuration is powered on under the condition of both memory transistors MCN1 and MCN2 being not programmed, a voltage of nodeT raises faster than that of nodeB, and the load transistor MP1 and the memory transistor MCN2 go into on state, the load transistor MP2 and the memory transistor MCN1 go into off state, in other words, the data goes into fixed as "0".

In addition, a channel length instead of the channel width can be differentiated. Also either load transistor MP1 or MP2 can be changed its channel width or length. Moreover, the memory transistor MCN1 or MCN2 can be changed its channel width or length.

A nonvolatile memory cell shown in FIG. 15 comprises capacitors connected to the nodeT and the nodeB of the flip-flop. NodeT is connected to a power supply line through a capacitor C1, and nodeB is connected to ground through a capacitor C2. The capacitance of these capacitors is, for example, about 50 fF.

Figure 50:
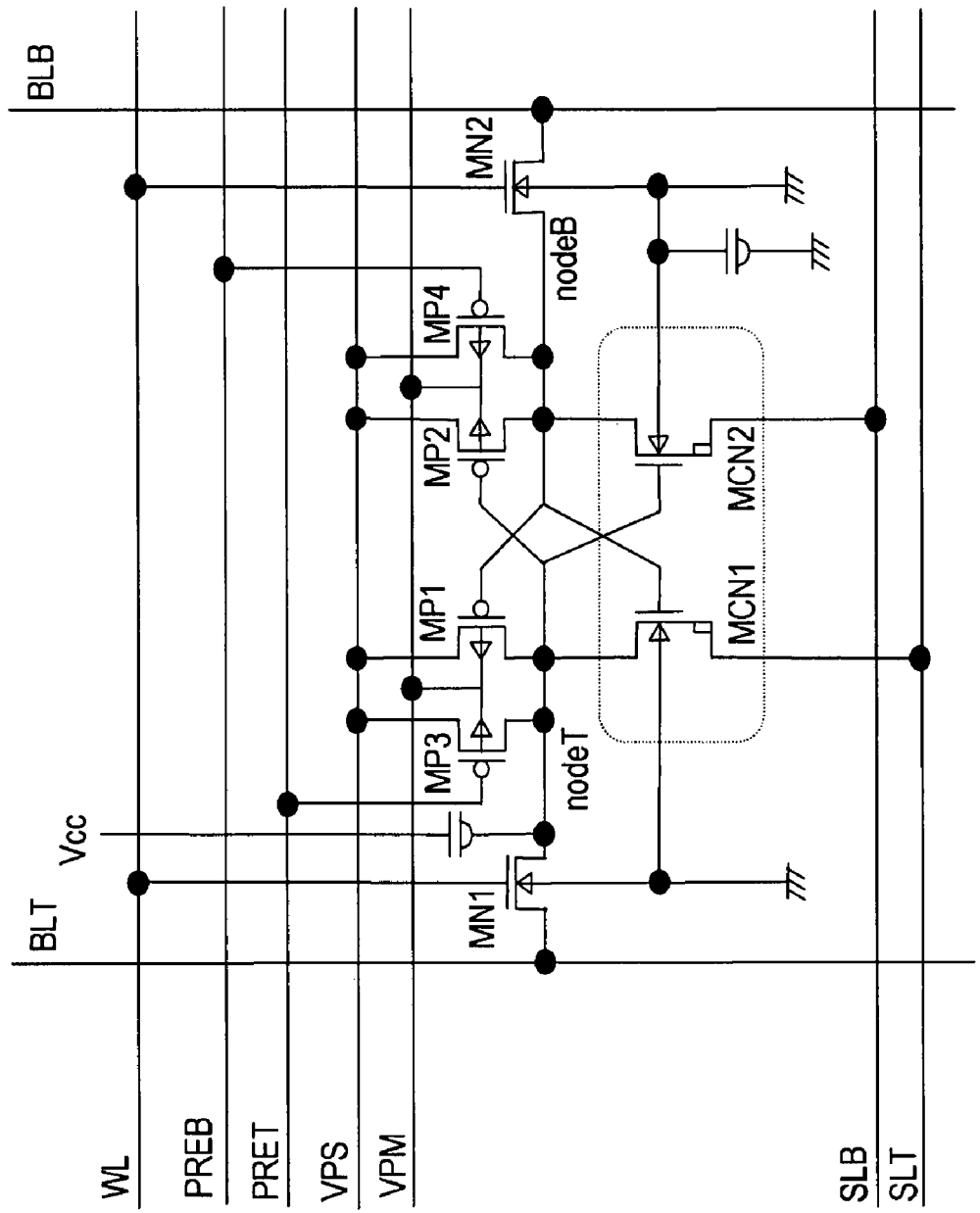
FIG. 50 is a schematic diagram showing a memory cell configuration that capacitances of both inverters are differentiated with respect to each other by connecting additional condensers.

When the memory cell with the configuration shown in FIG. 50 is powered on under the condition of both memory transistors MCN1 and MCN2 being not programmed, a voltage of nodeT raises faster than that of nodeB, and the load transistor MP1 and the memory transistor MCN2 go into on state, the load transistor MP2 and the memory transistor MCN1 go into off state, in other words, the data is fixed as "0".

Although the two capacitors are connected to nodeT and nodeB respectively in the embodiment shown in FIG. 50, the circuit configuration of the nonvolatile memory cell can be asymmetric by connecting to either one of the two.

A Measuring Method of the Threshold Voltage for the Second Embodiment

Figure 33:
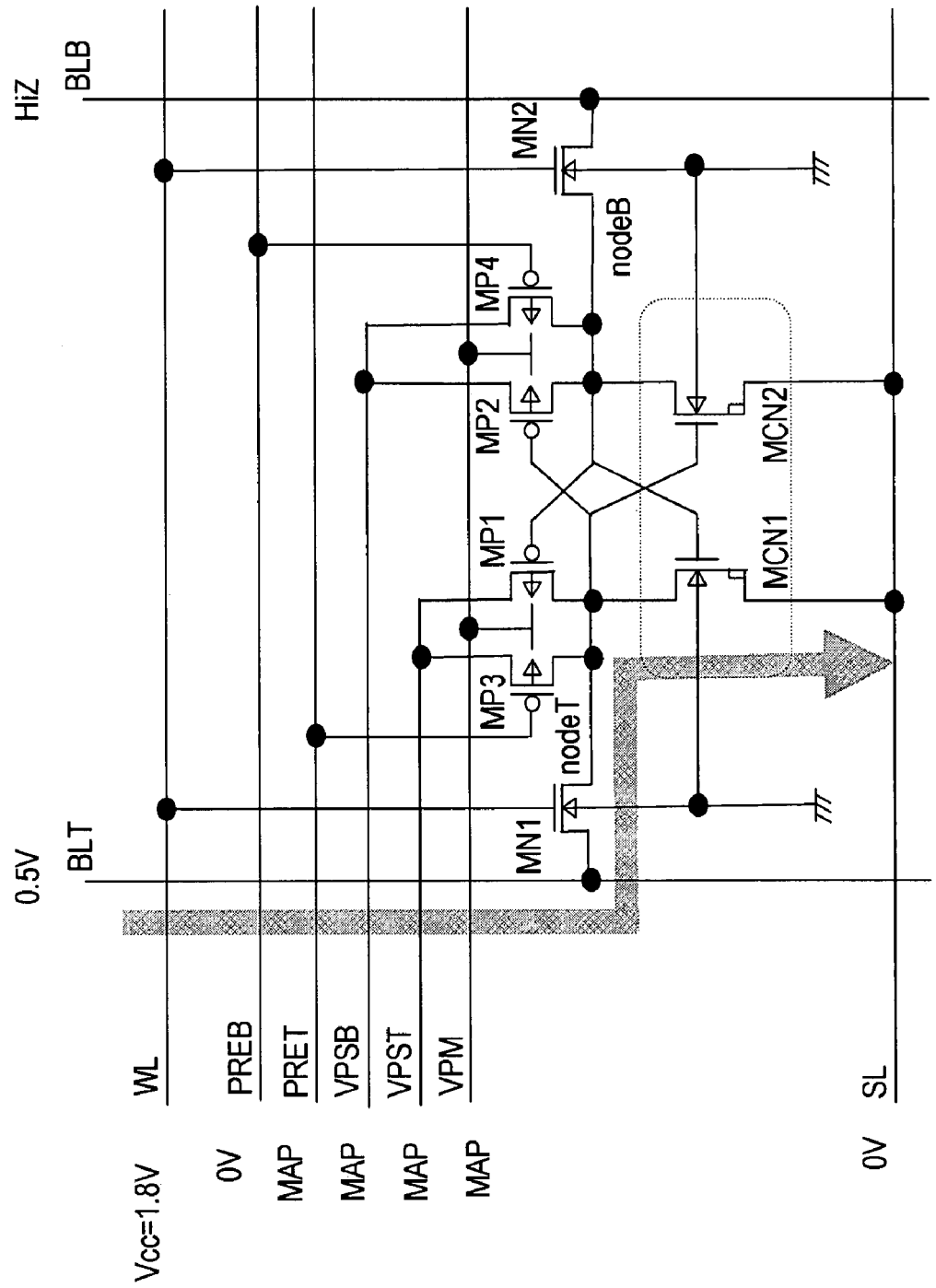
FIG. 33 is a schematic diagram illustrating a method for measuring a threshold voltage of the memory transistor.

Additionally, when the nonvolatile memory cell with the VPS separating type 8-transistor configuration is used, the configuration of voltage shown in FIG. 33 makes it possible to measure the threshold voltage of the memory transistor. This method enables to measure at least one of the values including the incipient threshold voltage fluctuation, a variation of the threshold voltage in the time of programming operation or erase operation, and a retention characteristic of the threshold voltage under high temperature after rewriting.

FIG. 33 shows a case where the threshold voltage of the memory transistor MCN1 is measured. Under the condition that a source voltage SL of the memory transistor MCN1 is set at 0V, the drain (nodeT) of the memory transistor MCN1 is supplied with 0.5V from the bit line BLT through the transfer gate MN1. NodeB is provided with VPSB voltage (MAP voltage) from the load transistors MP2 and MP4.

The load transistor MP2 becomes power-on and supplies nodeB with an voltage in the case that VPSB voltage is not less than 0.5V+Vthp because the gate voltage (nodeT) is set at 0.5V. On the other hand, the load transistor MP4 becomes power-on and supplies nodeB with an voltage in the case that VPSB voltage is not less than Vthp because the gate voltage PREB is set at 0V. Here, Vthp is the threshold voltage of the p-type MOS transistor shown as MP1~MP4, and the threshold voltage (required gate voltage for a certain current flow) of MCN1 can be measured on condition of not less than the threshold voltage. About 0.7V is the threshold voltage for a transistor by a standard CMOS process. The gate voltage nodeT of MCN2 should be power-off by setting nodeT at 0.5V so as not to cause reduction of the gate voltage applied CN1 by leak current in MCN2.

FIG. 33 shows an applied voltage condition for measuring the threshold voltage of the memory transistor MCN1, on the other hand, the measure of the threshold voltage of the memory transistor MCN2 can be achieved by only reversing control of the bit lines BLT, BLB and the precharge signals PRET, PREB.

In addition, although the precharge line is divided into two lines PRET, PREB, if this measurement is not performed, the precharge line can be shared by the true-side and the bar-side.

The Third Embodiment

A nonvolatile memory device and a semiconductor integrated circuit device therewith of the third embodiment will now be described with referent to FIG. 34 through FIG. 51.

Figure 34:
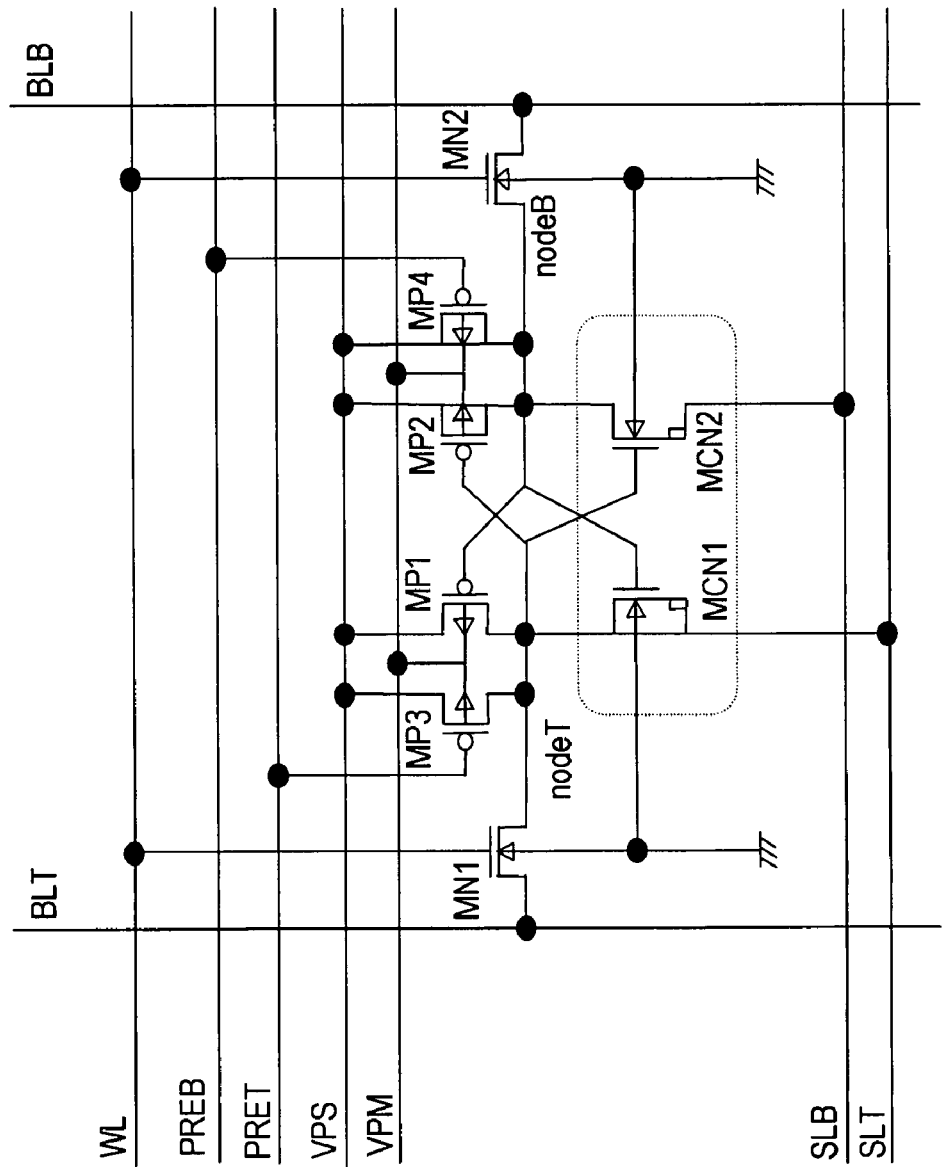
FIG. 34 is a schematic diagram showing a SL (source line) separating type 8-transistor memory cell configuration of the third embodiment of the present invention.

FIG. 34 is a circuit diagram of one nonvolatile memory cell of a nonvolatile memory device. This memory cell has a SL separating type 8-transistor configuration. The memory cell has a static latch type flip-flop formed by connecting an inverter (true-side-inverter) formed by series connection of a p-type MOS transistor MP1 and an n-type MOS transistor MCN1 and an inverter (bar-side-inverter) formed by series connection of a p-type MOS transistor MP2 and an n-type MOS transistor MCN2. The p-type MOS transistors MP1 and MP2 are referred to as load transistors, and n-type MOS transistors MCN1 and MCN2 are referred to as memory transistors. The memory transistors MCN1 and MCN2 can be injected and erased electrons in a side wall of a gate, as illustrated in and after FIG. 36. The threshold voltage of the memory transistors MCN1 and MCN2 is changed without volatilization, thus the memory transistors MCN1 and MCN2 perform as nonvolatile device.

A side edge of the memory transistor of the true-side-inverter, i.e. a source of the memory transistor MCN1 is connected to a source line SLT. A side edge of the memory transistor of the bar-side-inverter, i.e. a source of the memory transistor MCN2 is connected to a bar-side source line SLB. In addition, side edges of the load transistor of both inverters, i.e. sources of load transistors MP1 and MP2 are connected to VPS line.

In the flip-flop, the inverter (true-side-inverter) formed by series connection of the load transistor MP1 and the memory transistor MCN1 performs as a memory unit for the "true" state of the cell, and the inverter (bar-side-inverter) formed by series connection of the load transistor MP2 and the memory transistor MCN2 performs as a memory unit for the "bar" state of the cell. The junction of the load transistor MP1 with the memory transistor MCN1 is nodeT, and the junction of the load transistor MP2 with the memory transistor MCN2 is nodeB. If nodeT has a high voltage and nodeB has a low voltage, then "0" is written in the memory, and if nodeT has a low voltage and nodeB has a high voltage, then "1" is recorded in the memory.

NodeT is connected to a bit line BLT (BitLine-True) through a transfer gate MN1, and NodeB is connected to a bit line BLB (BitLine-Bar) through a transfer gate MN2. Each transfer gate MN1, MN2 is composed of an n-type transistor, and each gate is connected to a common word line WL.

In addition, a p-type MOS transistor MP3 as a precharge transistor is connected in parallel, i.e. between nodeT and VPS, with the load transistor MP1. Moreover, a p-type MOS transistor MP4 as a precharge transistor is connected in parallel, i.e. between nodeB and VPS, with the load transistor MP2. The true-side-precharge line PRET is connected to the p-type MOS transistor MP3, and the bar-side-precharge line PREB is connected to the p-type MOS transistor MP4. Furthermore, each p-type MOS transistor MP1~MP4 is formed in the same N well, and a voltage of the N well is controlled by VPM signal.

Figure 35:
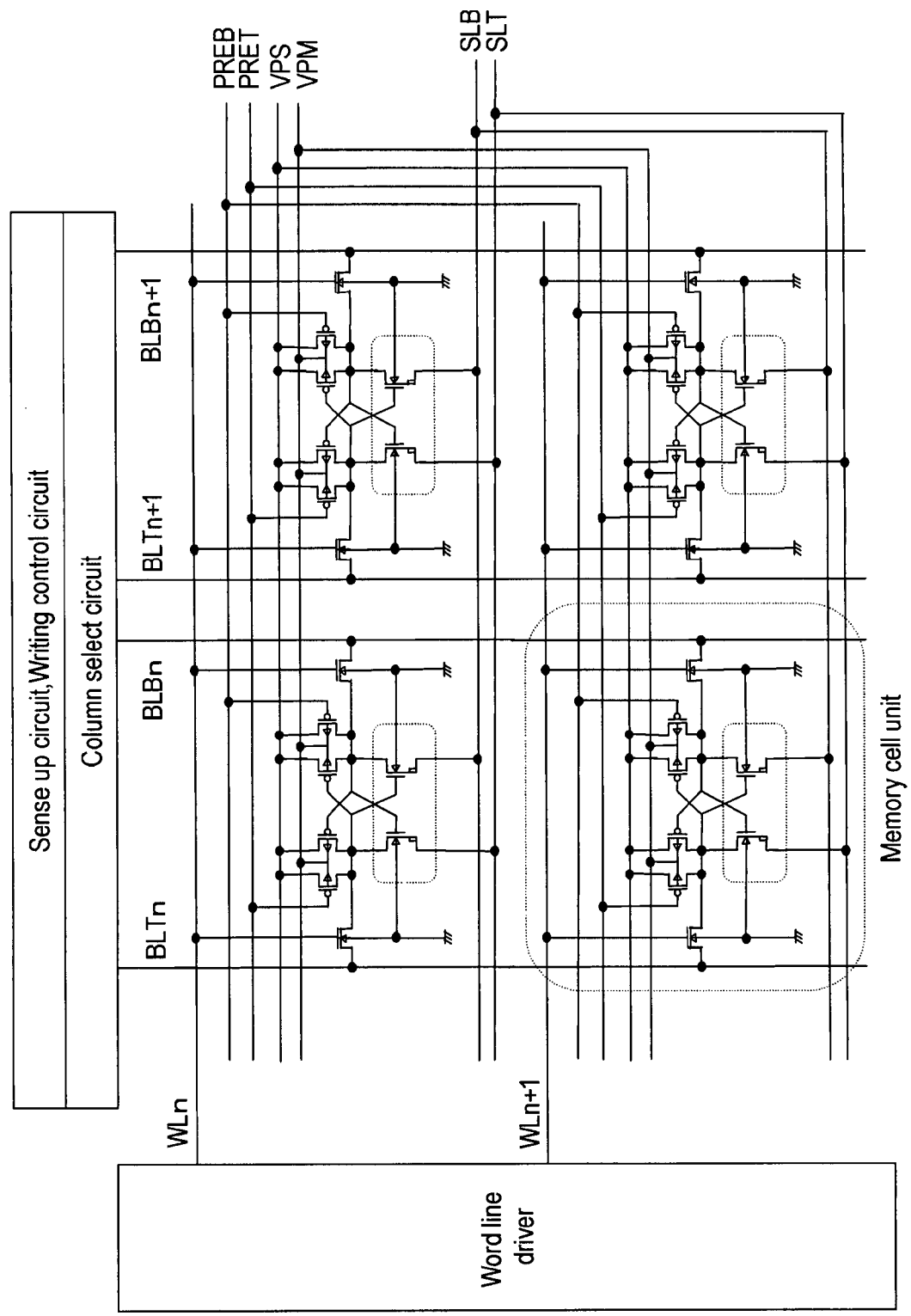
FIG. 35 is a schematic diagram showing a configuration of a memory device on which the memory cells of the third embodiment are arrayed.

FIG. 35 is a schematic diagram showing a memory device in which the nonvolatile memory cells as shown FIG. 34 are arrayed. In this memory cell array, the nonvolatile memory cells in FIG. 34 are arrayed so as to be row-column matrix layout. Each row has a word line WL, and each column has one bit line BLT and BLB. Each word line WL, and each bit line BLT, BLB is individually controlled. Each memory cell has signal lines (PREB, PRET, VPS, VPM, SLT, SLB) other than the foregoing lines and these signal lines are controlled integrally in the entire memory cell array.

Figure 36:
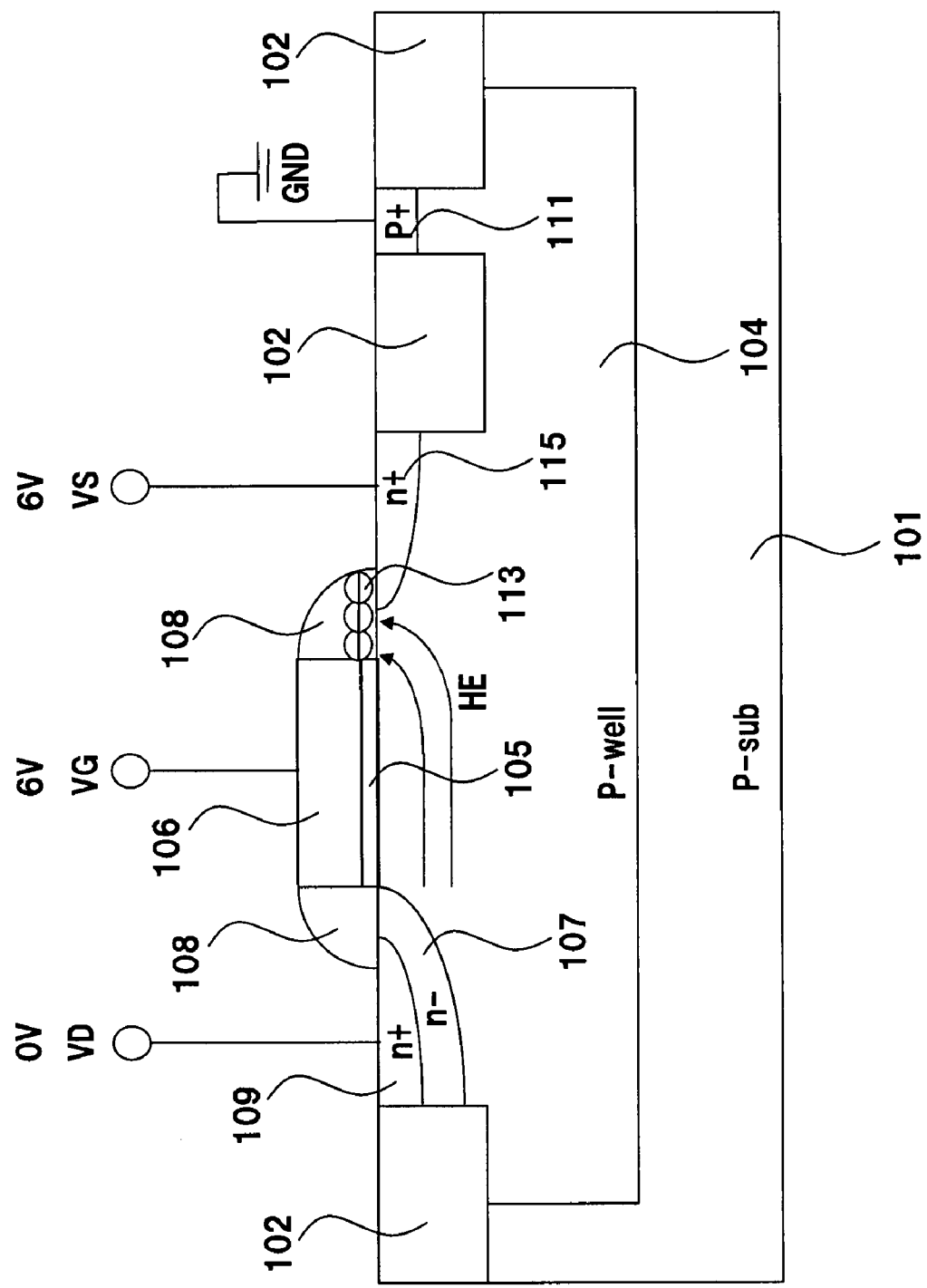
FIG. 36 is a schematic diagram showing an applied voltage condition for writing data of a memory transistor of the memory cell of the third embodiment.
Figure 38:
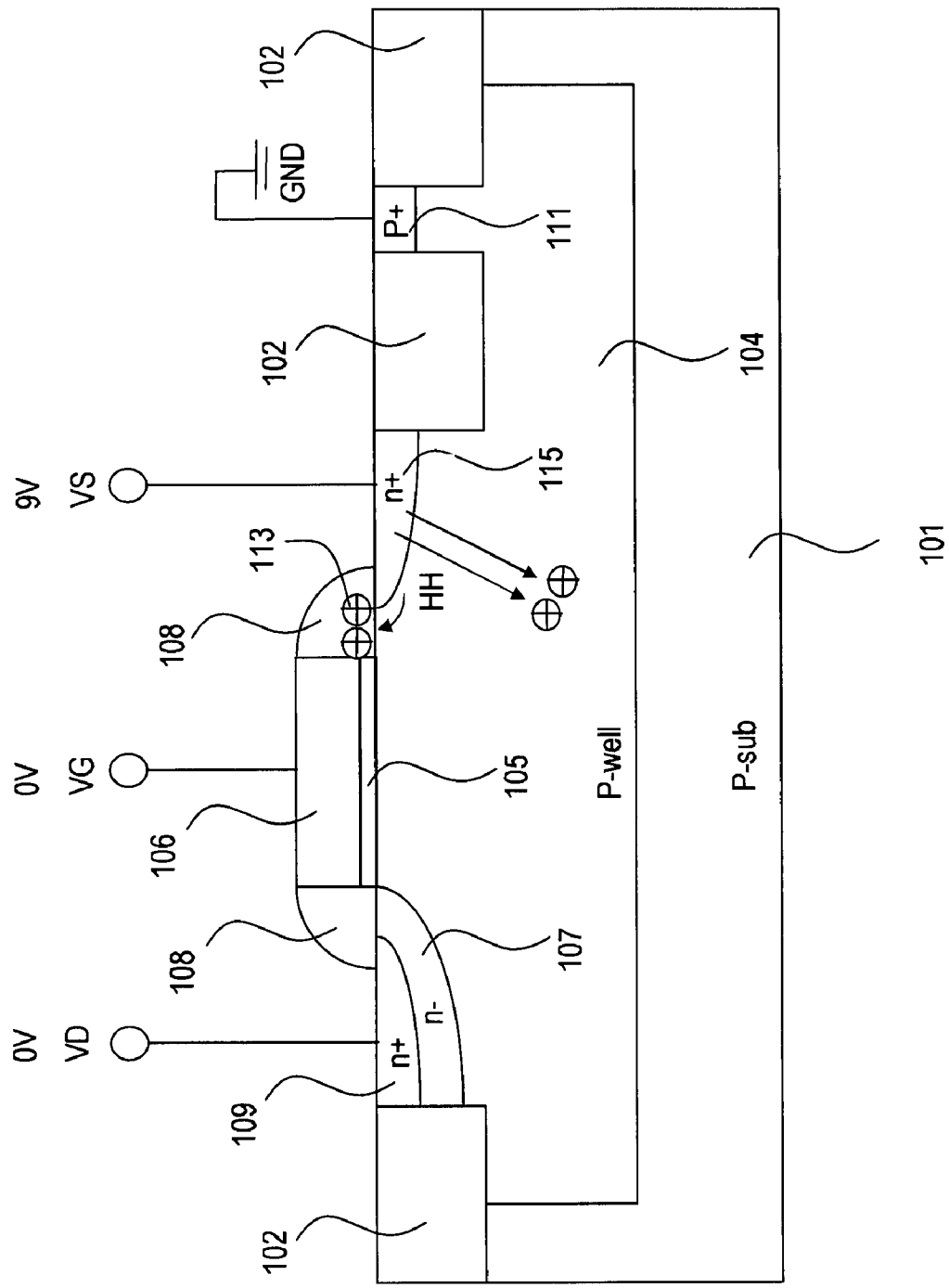
FIG. 38 is a schematic diagram showing an applied voltage condition for erasing data of the memory transistor of the third embodiment.
Figure 44:
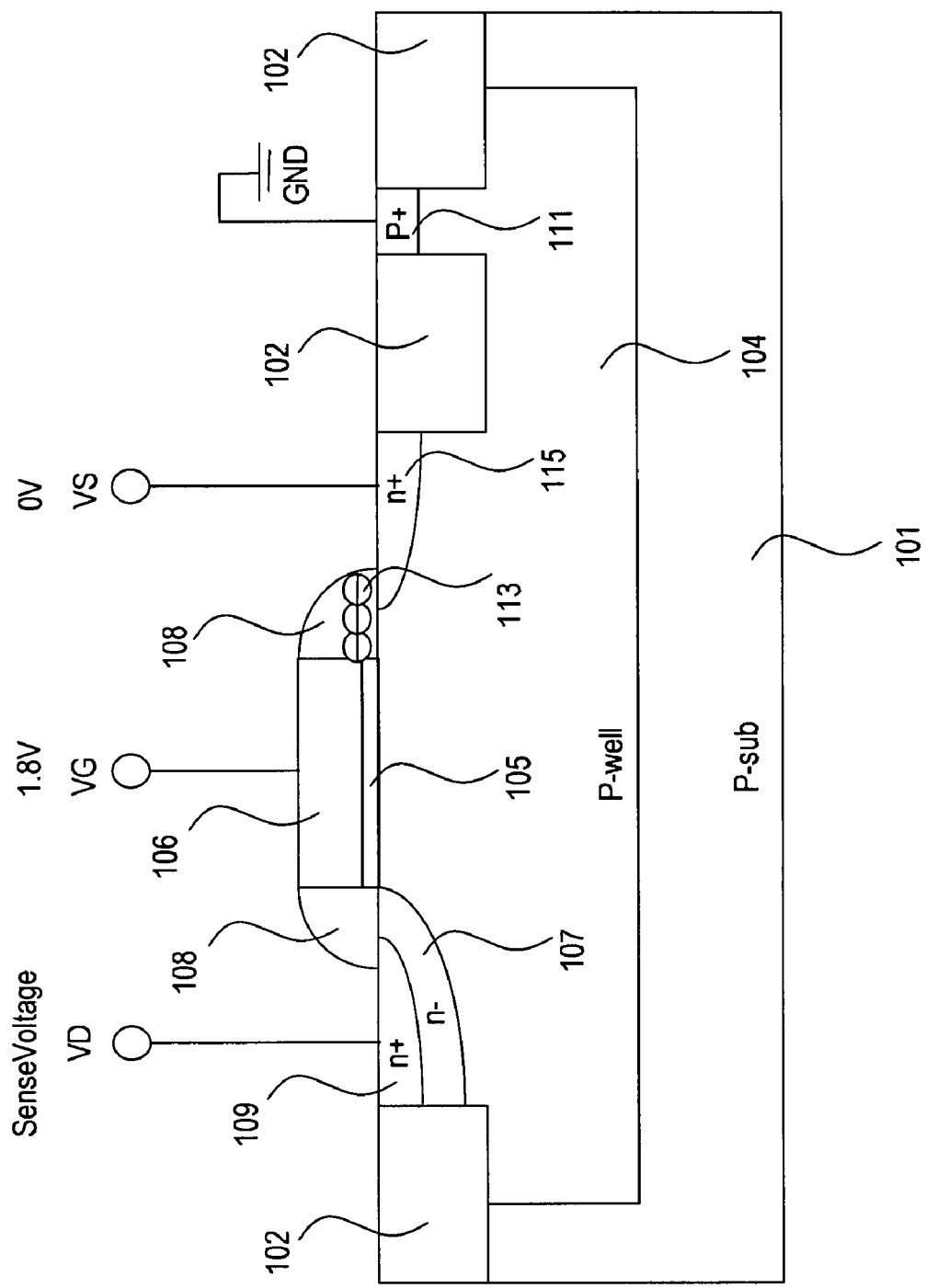
FIG. 44 is a schematic diagram showing an applied voltage condition for reading data of a memory transistor of the memory cell of the third embodiment.

FIG. 36, FIG. 38, and FIG. 44 are schematic diagrams showing the memory transistors MCN1 and MCN2 on a semiconductor substrate. Concretely, FIG. 36 shows an applied voltage condition during programming operation. FIG. 38 shows an applied voltage condition during erase operation. FIG. 44 shows an applied voltage condition during reading operation.

In addition, FIG. 36 is a schematic diagram showing a voltage applying procedure for writing data on a memory transistor MCN1 of the memory cell. FIG. 21 is a schematic diagram showing a voltage applying procedure for erasing data of the nonvolatile memory cell. FIG. 27 is a schematic diagram showing a voltage applying procedure condition for reading data of the nonvolatile memory cell.

As shown in FIG. 36, a p-type well 104 with 0.8 μm in depth, and average boron concentrations, $2 \times 10^{17}$ cm$^{-3}$ is formed in a surface area of a p-type silicon substrate 101 with electric resistivity 10 Ωcm. The two transistors MCN1 and MCN2 isolated by plurality of trenches (for device isolation) with 250 nm in depth are formed in the p-type well 104. In this figure, only one memory transistor (MCN1) is shown.

The memory transistor is an n-channel type transistor. It comprises a drain 109 formed next to one trench, and a source 115 formed next to another trench in the surface area of the p-type well 104, and comprises a drain extension 107 formed in the vicinity of the drain 109. The drain 109 and the source 115 are doped with average arsenic concentration $1 \times 10^{20}$ cm$^{-3}$, and the drain extension 107 is doped with average arsenic concentration $5 \times 10^{18}$ cm$^{-3}$.

A 5 nm thick gate insulator layer 105 and a 200 nm thick gate electrode 106 of poly-silicon layer doped with phosphorus concentration $2 \times 10^{20}$ cm$^{-3}$ are formed on a channel region between the drain 109 and the source 115 on the surface of the p-type well 104. Side spacers 108 and 108S composed of a 50 nm thick insulator are formed on the drain 109 and source 115 at the side of the gate insulator 105 and the gate electrode 106. The source-side side spacer 108S contacts the channel region of the substrate because an extension area is not formed in the vicinity of the source 115.

A p-type diffused layer 111 with average boron concentration $1 \times 10^{20}$ cm$^{-3}$ is formed in the area isolated from the foregoing memory transistor by a trench 102 in the p-type well area 104. The layer 111 works an electrode for connecting this p-type well 104 to ground.

A threshold voltage of the memory transistor is raised by carrier injection into the source-side side spacer 108S, and as illustrated in FIG. 38, the threshold voltage revert back to the initial state by drawing out the injected carrier from the side spacer 108S. Accordingly, this memory transistor can record data without volatilization.

While the initial threshold voltage of the memory transistor is set at 1.2V, the transistor is unstable due to an atypical structure. Therefore, this memory transistor cannot be used solely in terms of reliability. The memory cell of this embodiment is formed with the flip-flop as shown FIG. 34.

In FIG. 36, programming operation is performed by applying 0V to a drain line VD, and applying a positive voltage (e.g., +6V) not more than a breakdown voltage to a source line VS and a gate line VG to generate a channel hot electron HE and to inject it into the side spacer 108S. Electrons trapped by the channel hot electron injection lead to raising the threshold voltage, and the memory transistor becomes a programmed state.

Figure 37:
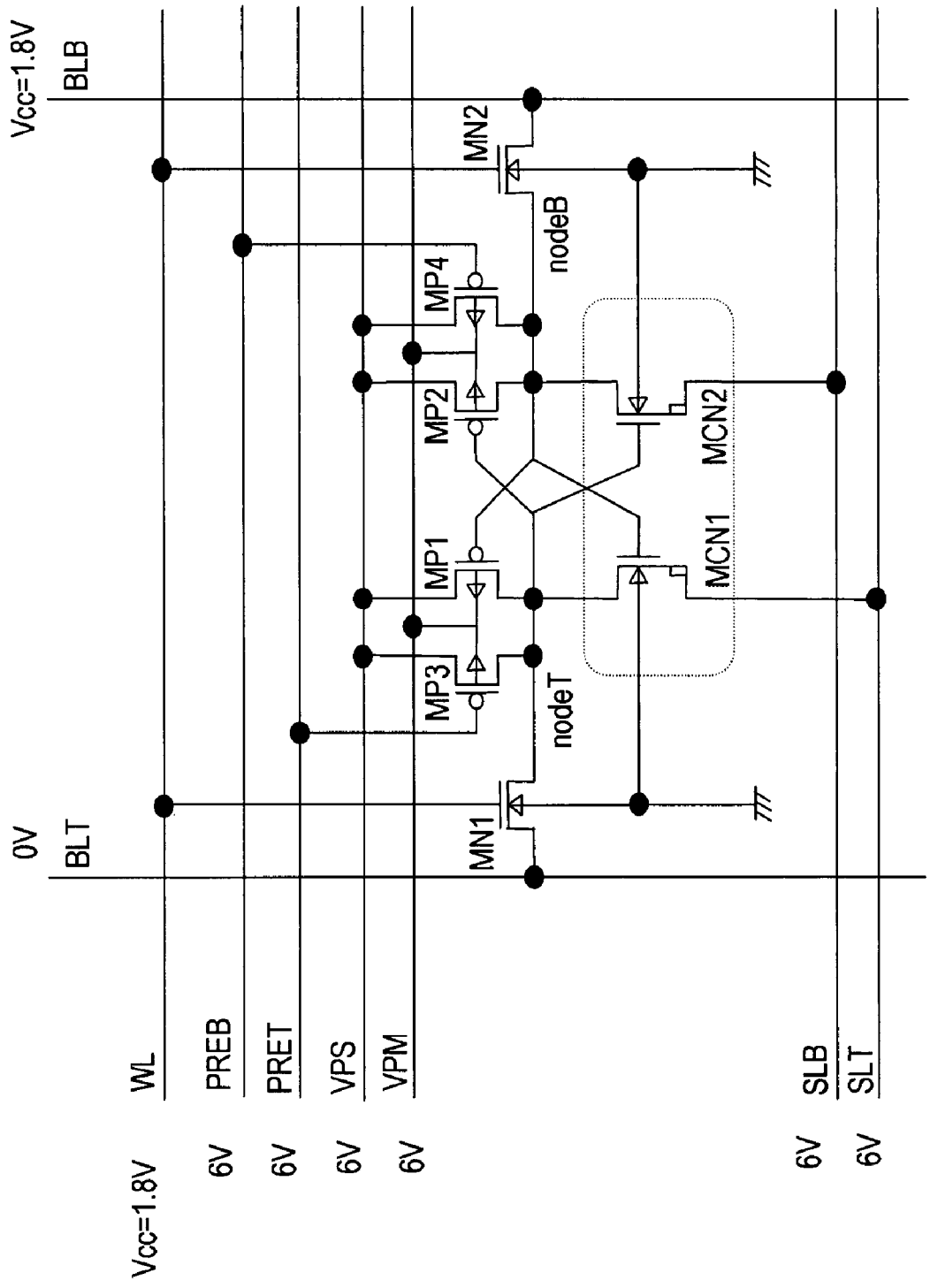
FIG. 37 is a schematic diagram showing a voltage applying procedure for writing data on a memory transistor of the memory cell of the third embodiment.

FIG. 37 shows an applied voltage condition in the case of writing data "0" by raising threshold voltage of the memory transistor MCN1. For setting the memory transistor MCN1 to this voltage condition shown in FIG. 36, voltages are applied to the memory cell on the condition shown in FIG. 37. Under the condition of applying 6V to PREB, PRET, VPS, VPM, SLT, and SLB, the operation is performed by connecting a word line WL to Vcc, connecting a bit line BLT to 0V, and connecting a bit line BLB to Vcc. NodeT (a drain of the memory transistor MCN1) comes to have approximately the same voltage as the bit line BLT (0V) by turning ON the transfer gate MN1, which is an n-type MOS transistor. And nodeB (a gate of the memory transistor MCN1) come to have approximately the same voltage as VPSB (6V) by turning ON the load transistor MP2. Thus the applied voltage condition of the memory transistor MCN1 becomes the same as that of FIG. 36. In this condition, a current of about 300 μA flow in the transfer gate MN1 and the memory transistor MCN1. This current makes a threshold voltage of the memory transistor MCN1 raised to Vth2.

On the other hand, in the case of writing data "1", the threshold voltage of the memory transistor MCN2 is raised, which all conditions but applying Vcc to BLT and applying 0V to BLB are the same as those of writing data "0".

6V is applied to both the gate (nodeB) of the transistor MCN1 and the drain (the source line SL) of the transistor MCN1 in the foregoing embodiment. Even a different power voltage can be applied to the gate and the drain. On the other hand, in the procedure shown in FIG. 37, as the same voltage is applied to PREB and PRET, PREB and PRET can be connected to be applied a common signal (e.g. PRE signal); as the same voltage is applied to SLB and SLT, SLB and SLT can be connected to be applied a common signal (e.g. SL signal); as the same voltage is applied to VPS and VPM, VPS and VPM can be connected to be applied a common signal.

Figure 39:
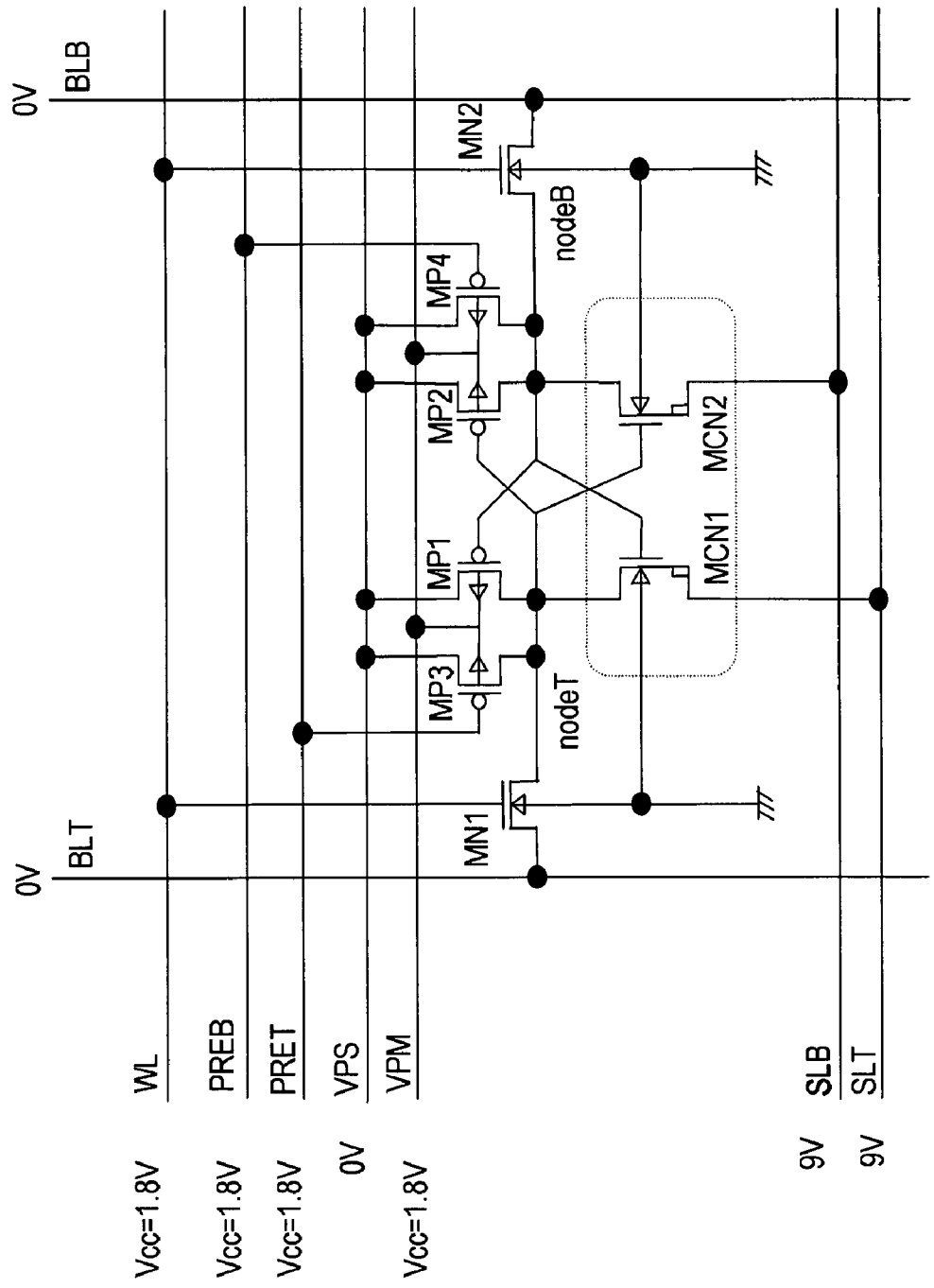
FIG. 39 is a schematic diagram showing a voltage applying procedure for erasing data on a memory transistor of the memory cell of the third embodiment.

FIG. 38 and FIG. 39 are schematic diagrams showing voltage conditions for erasing data of the memory transistor MCN1 (or MCN2). For setting the memory transistor MCN1, MCN2 to this voltage condition shown in FIG. 38, an erase operation is performed as follows. A positive voltage (e.g., +9V) not more than a breakdown voltage is applied to a source line VS, and 0V is applied to the gate line VG and the drain line VD, to generate avalanche hot holes HH from the source 115 and to inject the avalanche hot holes HH into the side spacer 108S. Electrons trapped in the side spacer 108S by the foregoing programming operation are neutralized, and the written data is erased due to reduce the threshold voltage.

FIG. 39 shows a voltage condition in the case of erasing data by reducing threshold voltages of the memory transistor MCN1, MCN2. For setting the memory transistor MCN1, MCN2 to this voltage condition shown in FIG. 38, voltages are applied to the memory cells on the condition shown in FIG. 39. Typically, an erase operation is performed for the entire memory cell of the memory array shown in FIG. 35. Under the condition of applying Vcc to PREB, PRET, and VPM, applying 0V to VPS, and applying 9V to SLT and SLB, the operation is performed by connecting the word line WL to Vcc, and connecting the bit lines BLT, BLB to 0V. Transfer gates MN1 and MN2, which are n-type MOS transistors, turn ON when nodeT and nodeB come to have 0V. Thus the applied voltage condition of memory transistors MCN1, MCN2 is the same as that of FIG. 38. Additionally, a common signal (e.g. PRE signal) can be applicable because PREB and PRET have a same voltage as shown in FIG. 39. Also, a common signal (e.g. SL signal) can be applicable because SLB and SLT have a same voltage. Moreover, a common signal can be applicable by connecting VPS to VPM because VPM can work properly even if 0V would be applied.

As stated above, the voltage condition of the programming operation shown in FIGS. 36 and 37 and the voltage condition of the erase operation shown in FIGS. 38 and 39 are designed so that the word line and the bit line that are necessary to be controlled individually for each memory cell can perform at either 0V or Vcc, in other words, no high voltage is required to be applied to the word line or bit line. Thus a high breakdown voltage transistor is not required and a high-performance transistor can be used in a word-line control circuit and a bit-line control circuit to speed up of reading operation.

Figure 40A:
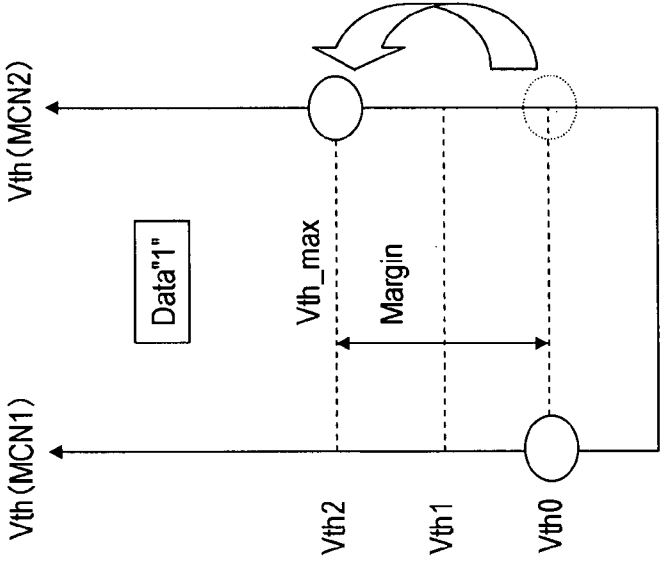
FIGS. 40A to 40C are conceptual diagrams illustrating a method for data setting and voltage differential in the memory cell of the third embodiment.
Figure 40B:
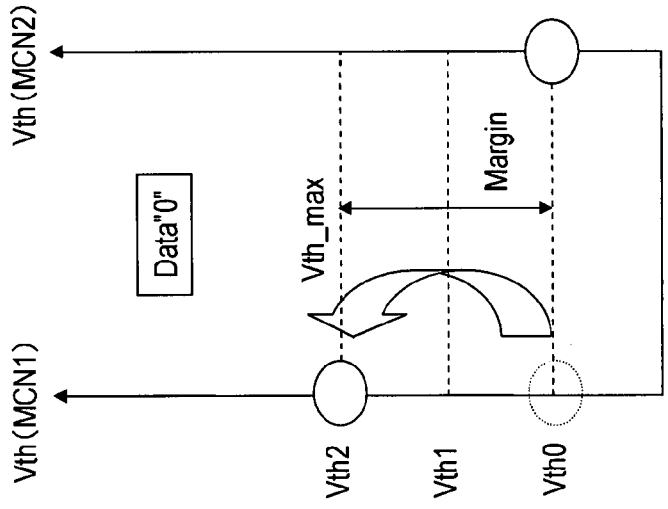
Figure 40C:
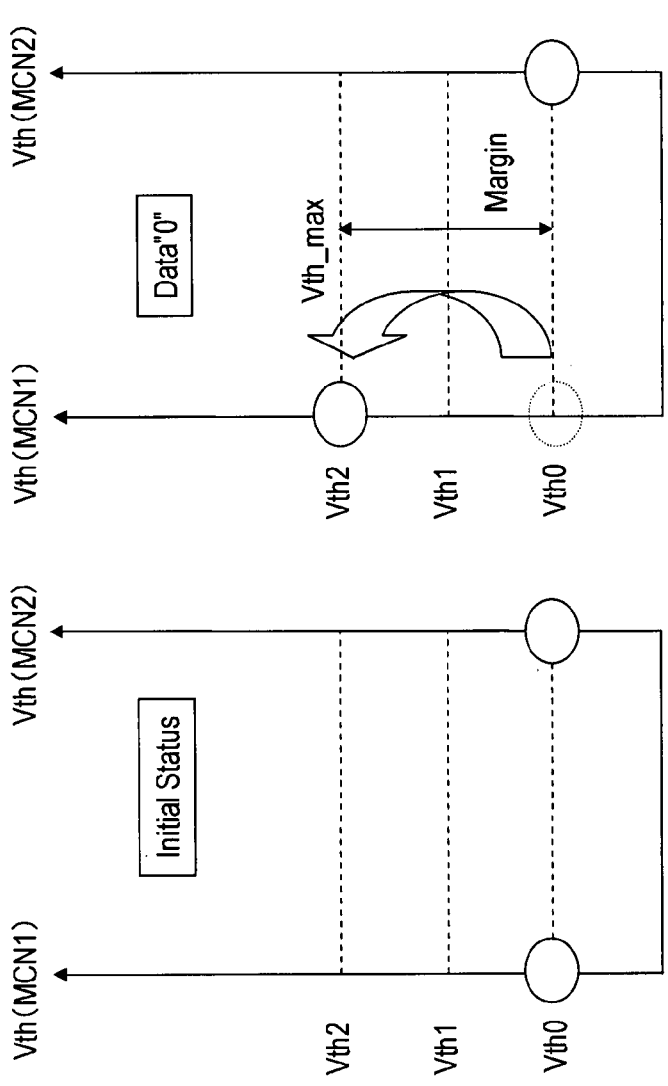

FIGS. 40A through 40C are schematic diagrams illustrating a method for controlling a threshold voltage of each memory transistor MCN1, MCN2 in the case of the foregoing programming operation, i.e. a method for data setting for a nonvolatile memory cell. Here, when the threshold voltage of the memory transistor MCN1 is low-state (on state) and the threshold voltage of the memory transistor MCN2 is high-state (off state), the data is "1". Reversing state, when the threshold voltage of the memory transistor MCN1 is high-state (off state) and the threshold voltage of the memory transistor MCN2 is low-state (on-state), the data becomes "0."

FIG. 40A shows a case that both threshold voltages of the memory transistors MCN1 and MCN2 are at the initial state Vth0, i.e. a state of no data setting. Even in this case, the data of the nonvolatile memory cell is fixed at "1" by either procedure in FIG. 41 or that in FIG. 43.

FIG. 40B shows threshold voltages of memory transistors MCN1, MCN2 in the case that the nonvolatile memory cell is set at data "0". Writing data "0" is achieved by raising the threshold voltage of the memory transistor MCN1 from the initial state shown in FIG. 22A to Vth2 (Vth2>Vth0).

FIG. 40C shows threshold voltages of memory transistors MCN1, MCN2 in the case that the nonvolatile memory cell is set at data "1." Writing data "1" is achieved by raising the threshold voltage of the memory transistor MCN2 from the initial state shown in FIG. 40A to Vth2 (Vth2>Vth0).

The state of the nonvolatile memory cell reverts back to the state shown in FIG. 40A by erase operation illustrated in FIG. 38 and FIG. 39 even if the threshold voltage is controlled under the condition shown in FIG. 40B or FIG. 40C.

As stated above, memory transistors MCN1, MCN2 can be reduced back to Vth0 of the initial state from Vth2 of the programmed state. Thus enough voltage differential of the programmed side and the erased side can be secured even if data "0" or "1" is rewritten multiple times.

A programming operation shown in FIG. 36 and FIG. 37 makes it possible to write data "1" or "0" to the memory cell by writing to either the memory transistor MCN1 or MCN2. In the case that both threshold voltages of the memory transistors MCN1 and MCN2 are Vth0 of the initial state, i.e. a state of no data setting, the data of the memory cell is unstable. However, the data of the nonvolatile memory cell of the initial state can be fixed at either "1" or "0" by applying voltage by the following procedure.

Figure 41A:
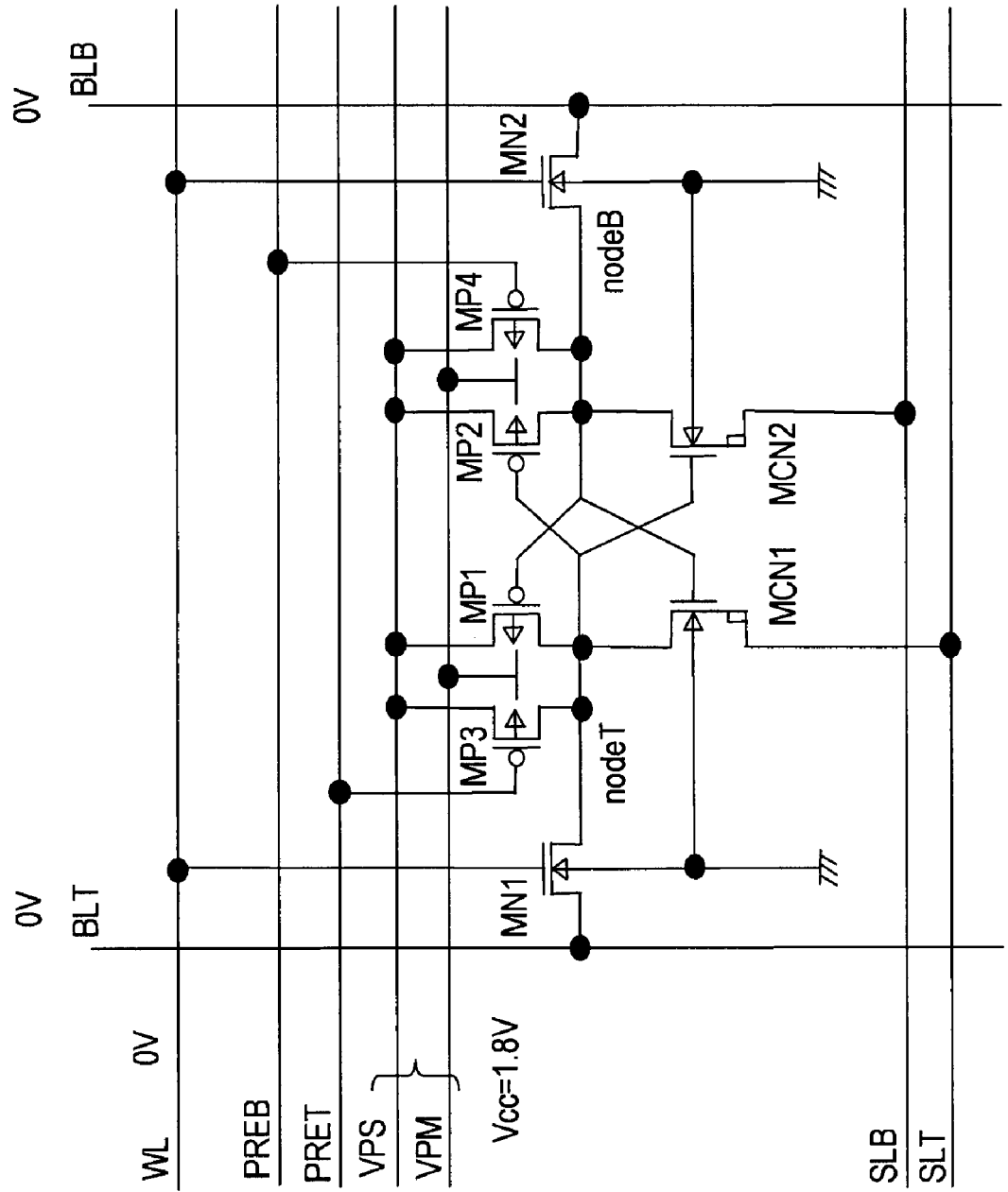
FIGS. 41A and 41B are schematic diagrams illustrating a voltage applying procedure for data fixing of the third embodiment to fix data "1" even if no programming operation is performed.
Figure 41B:
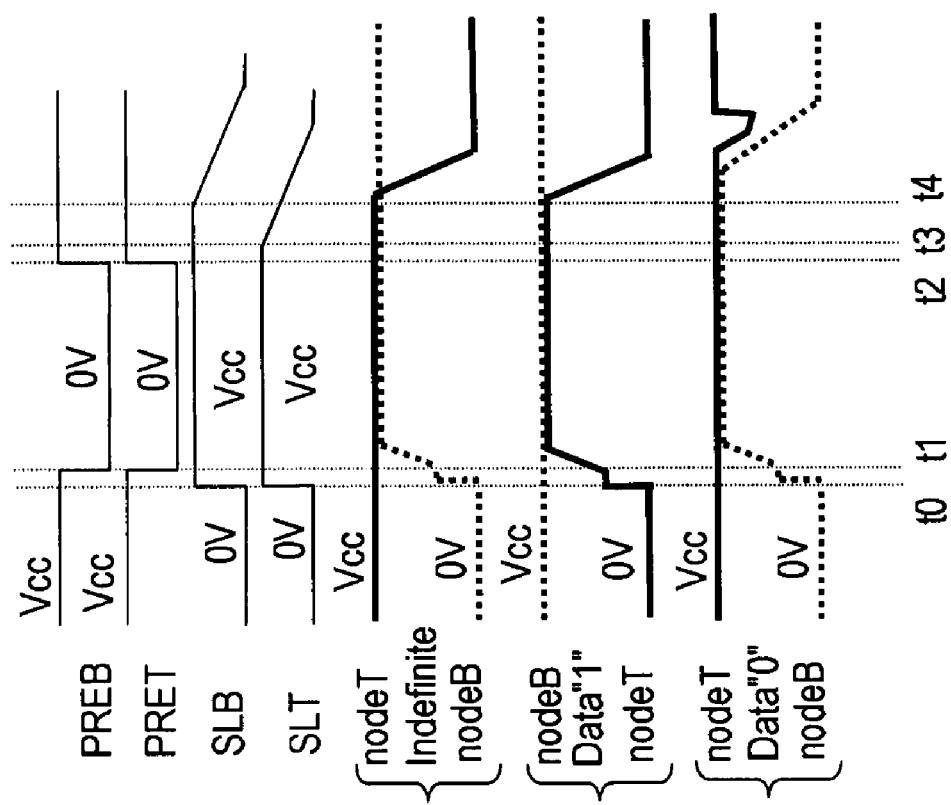

FIG. 41 is a schematic diagram showing a voltage applying procedure to fix data of the nonvolatile memory cell. This procedure fixes data of a memory cell to which data "1" or "0" is written as it is written, and fixes data of a memory cell at "1" which is of the initial state. By the procedure for the whole memory cell of the array including memory cell written data "0" or "1" and that of the initial state, the data of the memory cell written data "0" or "1" is set as it is written, also the data of the memory cell of the initial state is fixed the data at "1". This procedure is performed at the time of start-up of the memory.

The procedure shown in FIG. 41 is as follows. This procedure is preformed under the condition of setting a word line WL and bit lines BLT and BLB at 0V. To begin with, the memory transistors MCN1 and MCN2 are made to turn off state by raising a source voltage SL from 0V to Vcc at the time t0.

Then, reducing precharge control signals PRET and PREB from Vcc to 0V at the time t1 leads to power on of the precharge transistors MP3 and MP4. At the same time, Vcc is applied to nodeT and nodeB.

Voltage of PRET, PREB reverts back to Vcc at the time t2, and the source voltage SLT is started to reduce gradually to 0V at the time t3. The source voltage of SLB is started to raise gradually to 0V at the time t4. At this time, The voltages SLB and SLT are controlled so as to satisfy the formula SLB−SLT=$\Delta$Vs (e.g. $\Delta$Vs=0.2V). Consequently, the voltage between the source and the drain of the memory transistor MCN2 is controlled to be $\Delta$V higher than that of the memory transistor MCN1, thus the threshold voltage of MCN2 appears $\Delta$Vs higher than that of MCN1.

At this time, the flip-flop data is fixed at "1" in the case that the data of the memory cell is "1", because voltage of nodeT is reduced to 0V and voltage of nodeB becomes Vcc by MCN1 of lower threshold voltage turning on instead of MCN2. On the other hand, in the case that the data of the memory cell is "0", the flip-flop data is fixed at "0" because voltage of nodeB is reduced to 0V and voltage of nodeT becomes Vcc by MCN2 of lower threshold voltage turning on instead of MCN1.

Moreover, in the case that the data of the memory cell is "indetermination", i.e. both threshold voltages of MCN1 and MCN2 are Vth0, the flip-flop data fixed at "1"; nodeT is reduced to 0V and nodeB becomes Vcc by MCN1 turning on instead of MCN2 because the threshold voltage of MCN1 appears $\Delta$Vs lower than that of MCN2.

The voltage to take into account incipient fluctuation of threshold voltage of the transistor is appropriate for the ΔV; for example 0.2V. It is because most of memory cells that both threshold voltages of MCN1 and MCN2 are Vth0 have not written data yet and memory transistor MCN1, MCN2 are not deteriorated by writing data.

The voltage applying procedure shown in FIG. 41 is for applying voltage to fix the initial data of the memory cell at "1". On the other hand, the initial data of the memory cell can be fixed at "0" by reversing the relationship between SLT and SLB in terms of the control of the source voltage of the memory transistor. On the other hand, in the procedure shown in FIG. 41, as the same voltage is applied to PREB and PRET, PREB and PRET can be connected to be applied a common signal (e.g. PRE signal). Moreover, as the same voltage is applied to VPS and VPM, VPS and VPM can be connected to be applied a common signal.

FIGS. 42A through 42C are schematic diagram illustrating a margin of data fixing in the case of the procedure shown in FIG. 41. In the initial state that both threshold voltages of MCN1 and MCN2 are Vth0, as mentioned above, the data of the memory cell is fixed to "1" by raising an apparent threshold voltage of MCN2 by ΔV due to making the source voltage SLB ΔVs higher than that of SLT. When data "0" is already written to a memory cell, 0.8V of voltage differential is secured in the case of Vth2−Vth0=1V and ΔVs=0.2V, although the margin is reduced by ΔVs. On the other hand, when data "1" is already written to a memory cell, the voltage differential is increased to 1.2V in the case of Vth2−Vth0=1V and ΔVs=0.2V by ΔV.

Figure 43A:
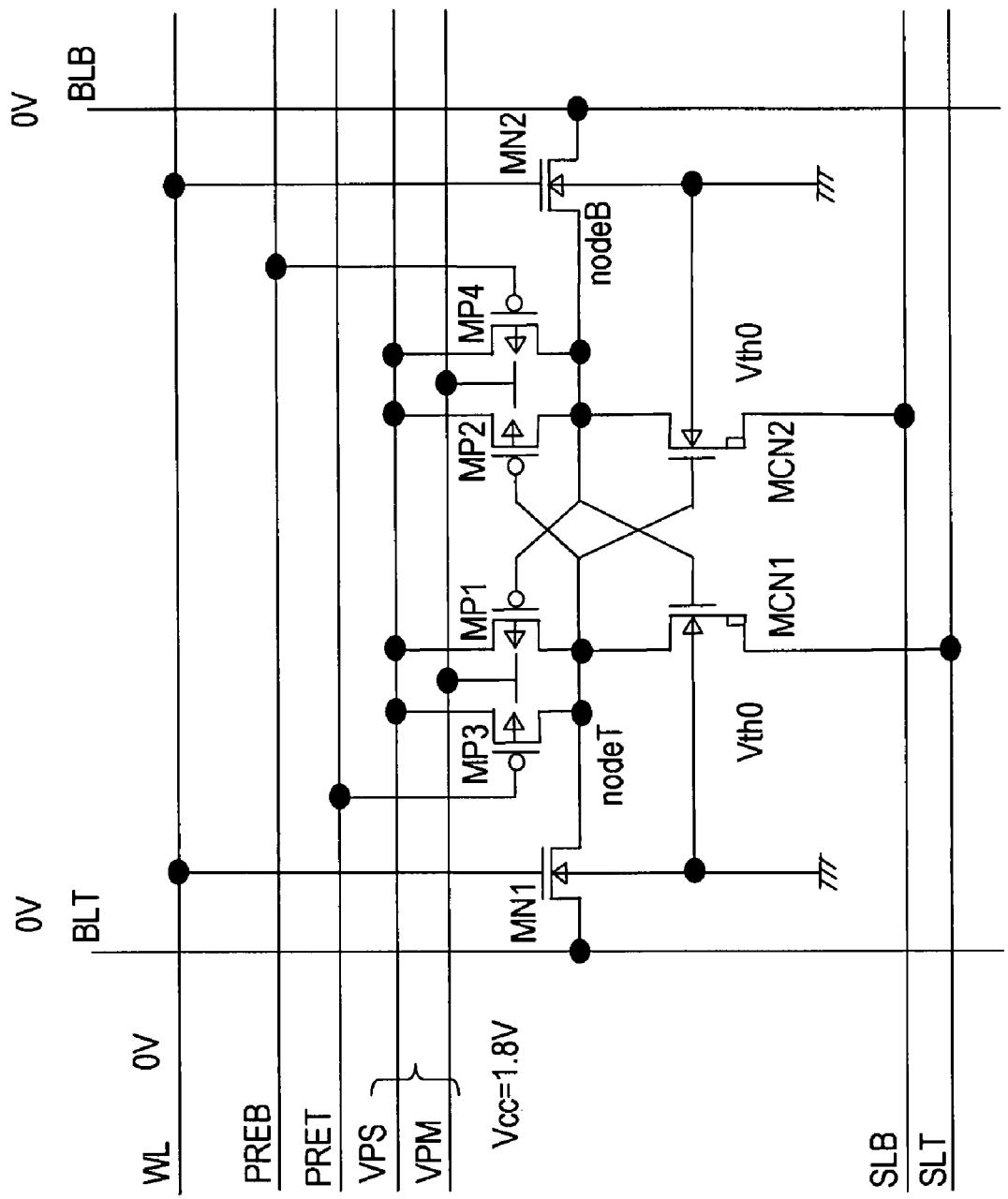
FIGS. 43A and 43B are schematic diagrams illustrating a voltage applying procedure for fixing an initial state of the memory cell of the third embodiment so as to fix "1".
Figure 43B:
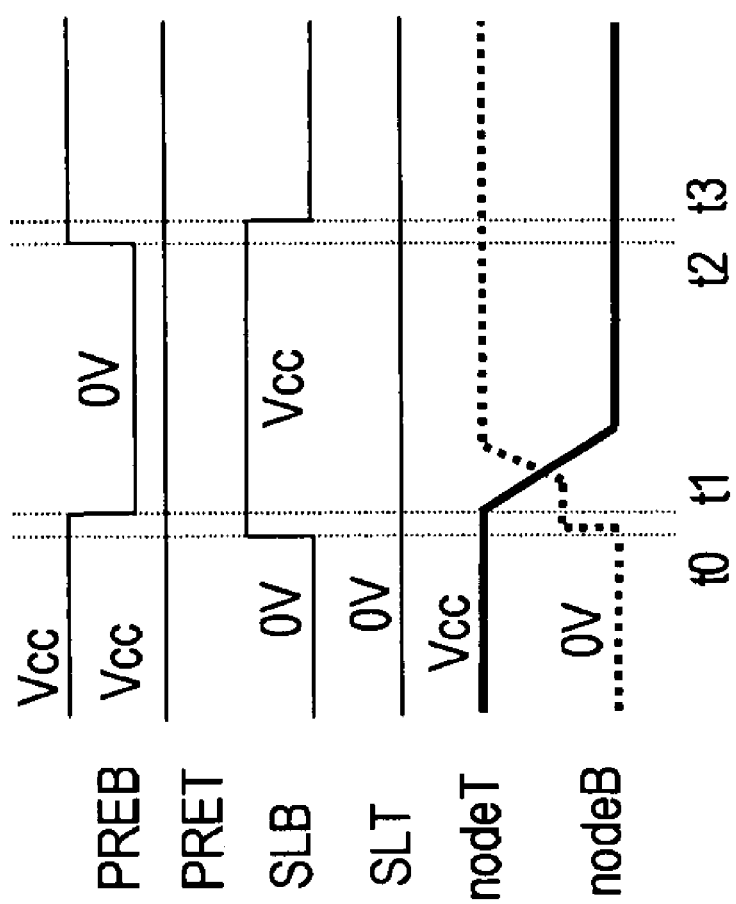

FIG. 43 is a schematic diagram showing an applied voltage condition to fix data of the memory cell of the initial state. The procedure shown in FIG. 41 is for fixing data of the entire memory cell in the memory array including the memory cells written data "0" and "1" as well as those of the initial state. On the other hand, the procedure shown in FIG. 43 is, effective only for the memory cell of the initial state, and makes the data of the memory cell in the initial state fixed at "1" or "0".

In the case of the memory array including memory cells written data as well as those of the initial state, applying the procedure only to memory cell of the initial state individually, the data of the memory cell can be fixed at "1" or "0". On the other hand, in the case of the memory array including only memory cells of the initial state, applying the procedure to the entire memory cell, the data of the memory cell can be fixed at "1" or "0". The following description shows the procedure to fix the data of the memory cell of the initial state at "1".

This procedure is preformed under the condition that a word line WL and bit lines BLT, BLB are set at 0V and that VPS, VPM are set at Vcc. To begin with, MCN2 is turned off state by raising a source voltage SLB from 0V to Vcc at the time t0. Precharge control signals PREB is reduced from Vcc to 0V at the time t1; thus, nodeB is charged to Vcc by the precharge transistor MP4 The voltage of PREB is raised back to Vcc at the time t2, and the voltage of SLB is reduced back to 0V from Vcc; then, MCN1 applied higher gate voltage turns on instead of MCN2; thus, nodeT is reduced to 0V under keeping the voltage of nodeB at Vcc, and the flip-flop data is fixed at "1".

The voltage applying procedure shown in FIG. 43 is for fixing the data of the memory cell at "1". On the other hand, the initial data of the memory cell can be fixed at "0". By reducing the source voltage VPSB of the source voltage SLT from Vcc to 0V, instead of the source voltage SLB, as well as by reducing the gate voltage PRET of the precharge transistor MP3 from Vcc to 0V, instead of the gate voltage PREB of the precharge transistor MP4, nodeB becomes 0V and the data is fixed at "0". As the same voltage is applied to VPS and VPM, VPS and VPM can be connected to be applied a common signal.

The nonvolatile memory cell of the initial state can be used as a fuse by fixing the data at "1" by applying the procedure shown in FIG. 23 or FIG. 25. The data "1" corresponds to a state of the fuse before burning it out.

Figure 45:
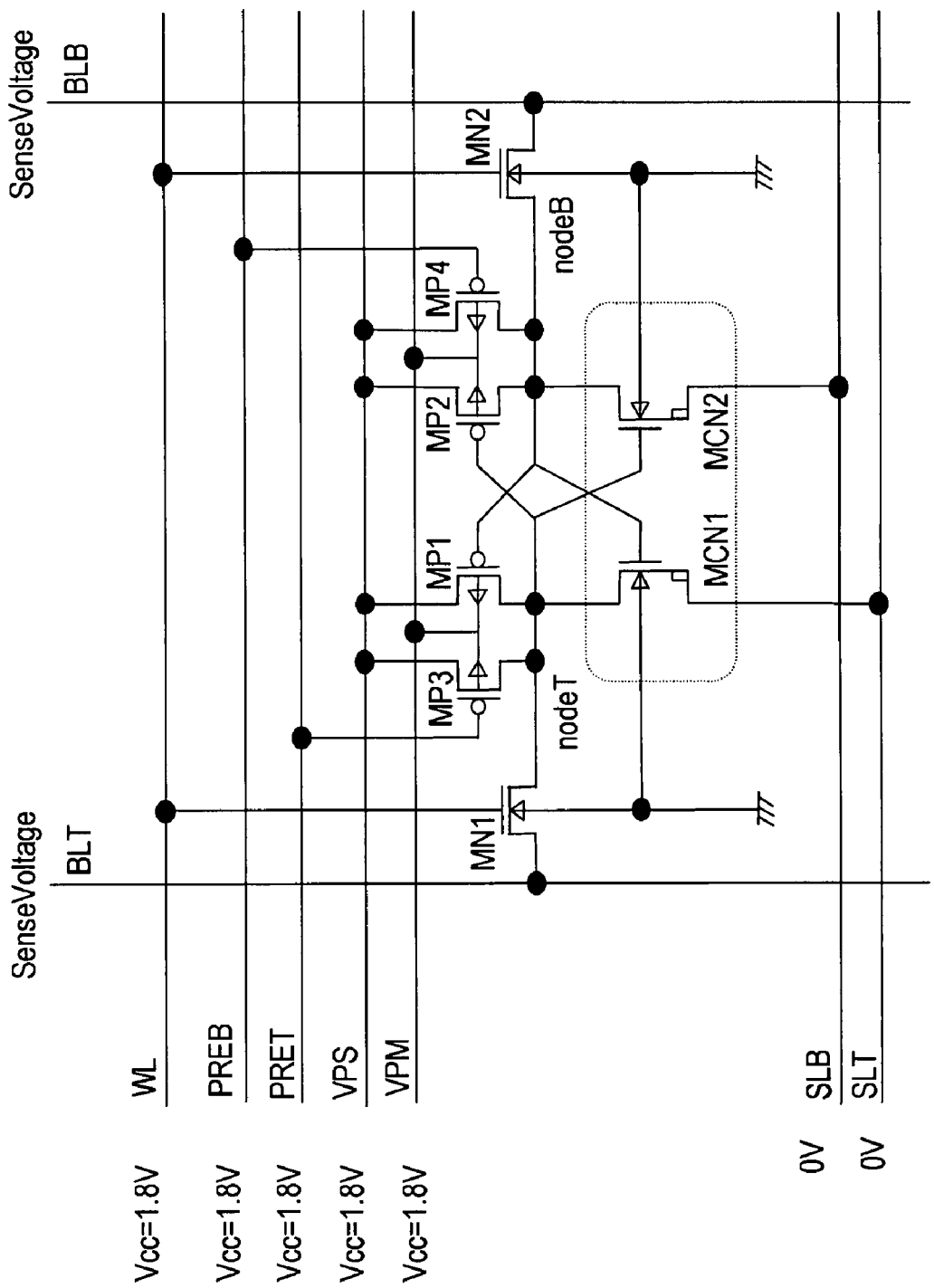
FIG. 45 is a schematic diagram showing a voltage applying procedure for reading data on a memory transistor of the memory cell of the third embodiment.

FIGS. 44 and 45 are schematic diagrams showing an applied voltage condition and a voltage applying procedure of reading data from the nonvolatile memory cell. As shown in FIG. 44, the reading operation is a operation that reading voltage of the drain line VD under the condition of applying Vcc on the gate line VG and applying 0V on the source line VS. The voltage applying procedure shown in FIG. 45 is as follows. As reading operation of SRAM, a differential sense amplifier is used for the reading operation. A voltage shift of each bit line BLT, BLB according to the data stored in the flip-flop is retrieved by the differential sense amplifier under the condition that PREB, PRET, VPS, VPM are set at Vcc, SLT and SLB are set at 0V, and the word line is set at Vcc. When BLT is low voltage (0V) and BLB is high voltage (Vcc), the data is "1", on the other hand, when BLT is high voltage (Vcc) and BLB is low voltage (0V), the data is "0". On the other hand, in the procedure shown in FIG. 45, as the same voltage is applied to PREB and PRET, PREB and PRET can be connected to be applied a common signal (e.g. PRE signal); as the same voltage is applied to SLB and SLT, SLB and SLT can be connected to be applied a common signal (e.g. SL signal).

The voltage applying procedure for data fixing shown in FIG. 43 is a methods that can fix the data of the memory cell at "1" even if the memory array includes a memory cell of the initial state, i.e. a memory cell that each memory transistor MCN1, MCN2 is in the initial state (the threshold voltage=Vth0). On the other hand, voltage applying procedures shown in FIGS. 46 through 48 can be applied in the case of no memory cell of the initial state in the memory array or no need to care about unstable data of the memory cell of the initial state. This procedure does not cause the ΔVs reduction of the voltage differential for fixing (cf. FIG. 42) as the procedure shown in FIG. 41.

Figure 46A:
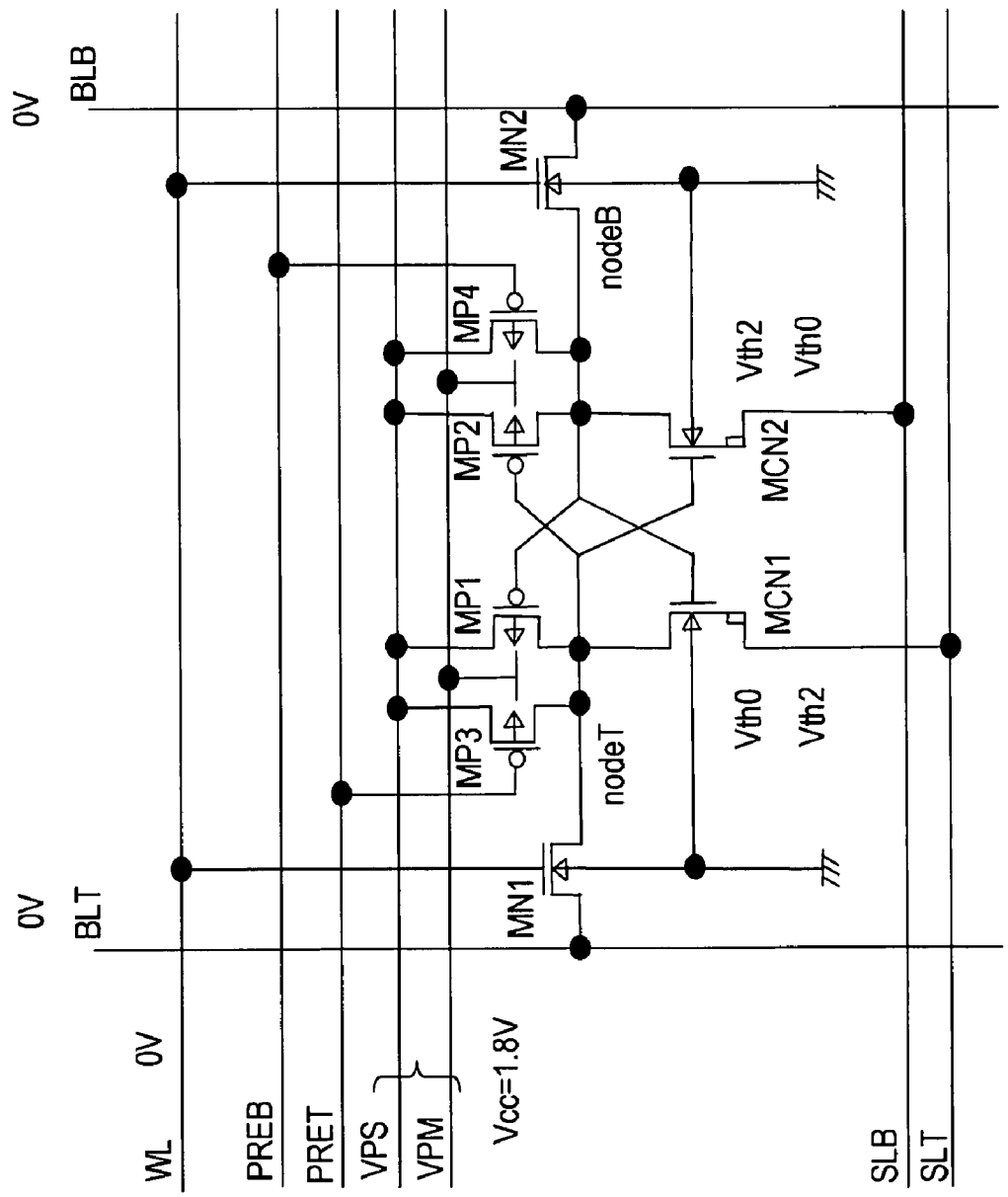
FIGS. 46A and 46B are schematic diagrams illustrating a voltage applying procedure for data fixing of the third embodiment.
Figure 46B:
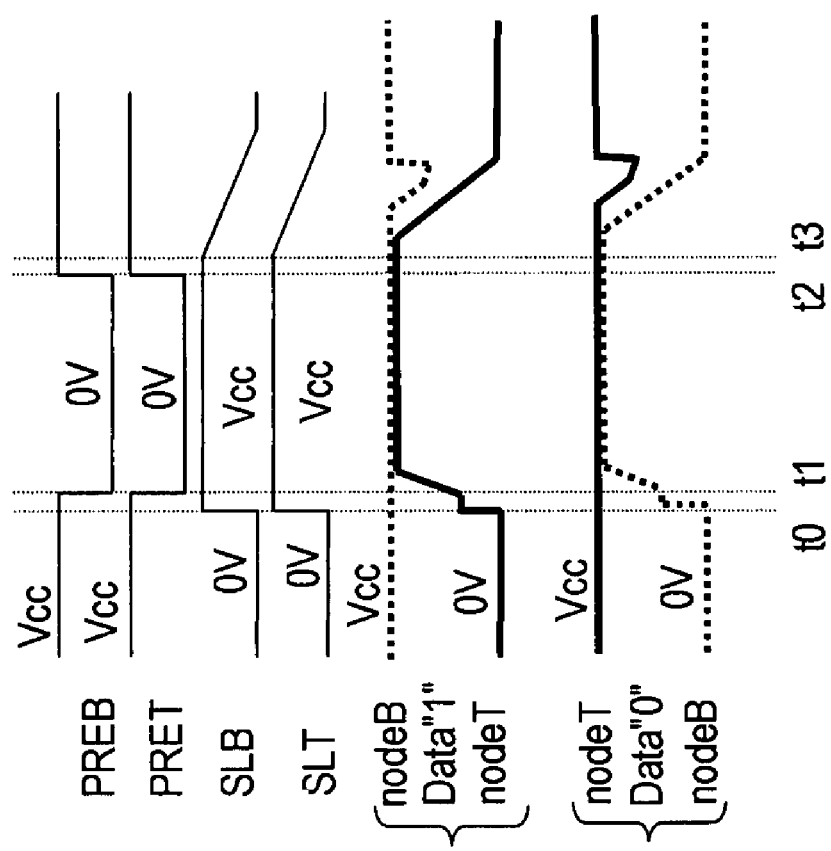

The procedure shown in FIG. 46 is as follows. Under the condition that a word line WL and bit lines BLT and BLB are set at 0V and VPS and VPM are set at Vcc, the memory transistors MCN1 and MCN2 are turned off state by raising source voltages SLT and SLB from 0V to Vcc at the time t0; then, the precharge transistors MP3 and MP4 are turned on state by reducing precharge control signals PRET and PREB from Vcc to 0V at the time t1, and this gives nodeT and nodeB to be precharged up to Vcc. To finish the precharge, voltage of PRET, PREB is raised back to Vcc at the time t2, and then, the source voltage SL starts to reduce gradually to 0V at the time t3. At this time, MCN1 turns on state instead of MCN2, in the case that the data of the memory cell is "1", in another words, the threshold voltage of MCN1 is lower than that of MCN2; thus, nodeT is reduced to 0V and nodeB becomes Vcc, which means that the flip-flop data is fixed at "1". On the other hand, in the case that the data of the memory cell is "0", MCN2 turns on state instead of MCN1, thus, nodeB is reduced to 0V and nodeT becomes Vcc, which means that the flip-flop data is fixed at "0". On the other hand, in the procedure shown in FIG. 28, as the same voltage is applied to PREB and PRET, PREB and PRET can be connected to be applied a common signal (e.g. PRE signal); as the same voltage is applied to SLB and SLT, SLB and SLT can be connected to be applied a common signal (e.g. SL signal); as the same voltage is applied to VPS and VPM, VPS and VPM and SLT can be connected to be applied a common signal.

Figure 47A:
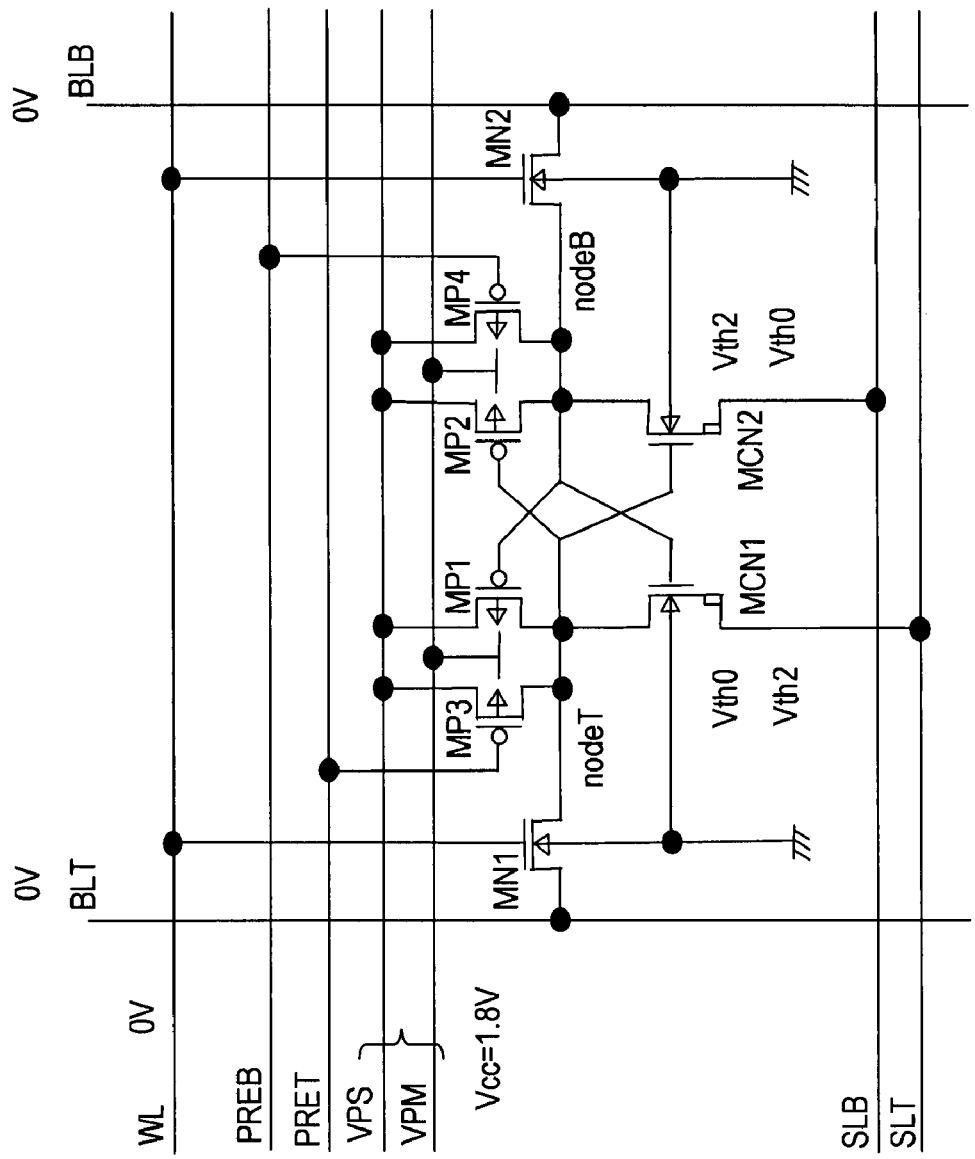
FIGS. 47A and 47B are schematic diagrams illustrating a voltage applying procedure for data fixing of the third embodiment.
Figure 47B:
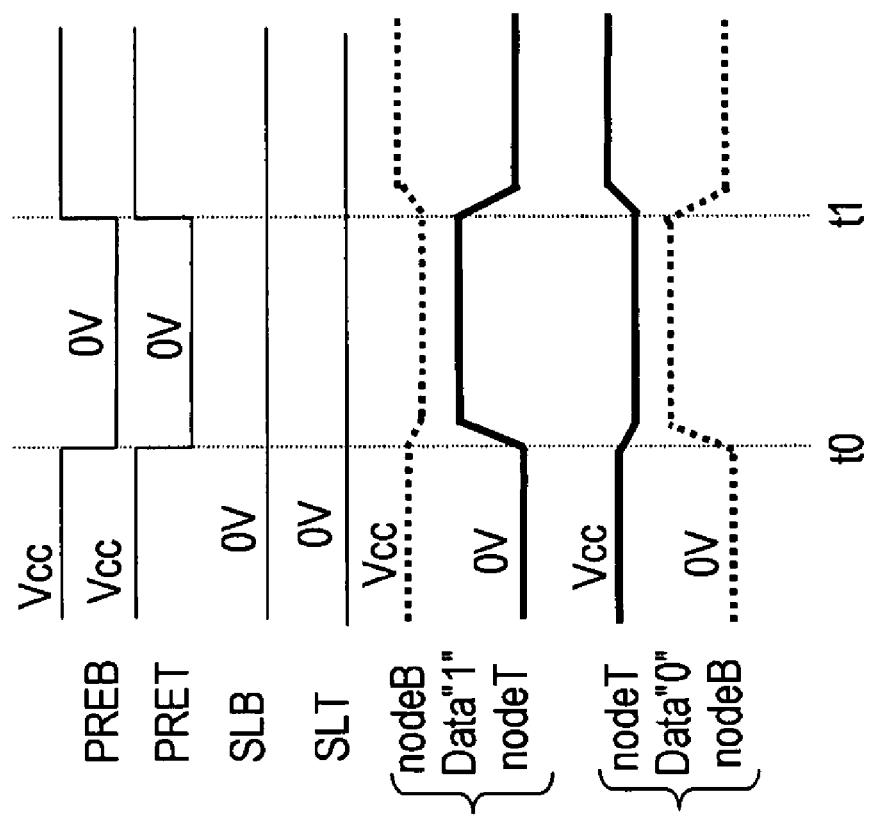

The procedure shown in FIG. 47 is as follows. Under the condition of setting a word line WL and bit lines BLT and BLB at 0V, VPS and VPM at Vcc and fixing a source voltage SL at 0V, the precharge transistors MP3 and MP4 are turns on state to precharge nodeT and nodeB by reducing precharge control signals PRET and PREB from Vcc to 0V at the time t0. The precharge voltages of nodeT and nodeB becomes stable when their respective DC currents of a path of MP1, MP3 and MCN1 and a path of MP2, MP4 and MCN2 becomes constant. At this time, the voltage of nodeT is lower than that of nodeB, in the case that the data of the memory cell is "1", in another words, the threshold voltage of MCN1 is lower than that of MCN2; this is because the resistance value of MCN1 of lower threshold voltage is lower than that of MCN2. The flip-flop data is fixed at "1" after finishing the precharge at the time t1. On the other hand, in the case that the data of the memory cell is data "0", the voltage of nodeB becomes lower than that of nodeT, and the flip-flop data is fixed at "1" after finishing the precharge at the time t1 because the resistance value of MCN2 of lower threshold voltage is lower than that of MCN1. On the other hand, in the procedure shown in FIG. 47, as the same voltage is applied to PREB and PRET, PREB and PRET can be connected to be applied a common signal (e.g. PRE signal); as the same voltage is applied to SLB and SLT, SLB and SLT can be connected to be applied a common signal (e.g. SL signal); as the same voltage is applied to VPS and VPM, VPS and VPM and SLT can be connected to be applied a common signal.

The procedure for fixing data shown in FIG. 46 has a disadvantage in terms of consumption of current compared to that shown in FIG. 28 because the DC penetration current flows in the flip-flop at the time of precharge. However, that shown in FIG. 29 has an advantage in terms of controllability than that shown in FIG. 28 because the source lines SLT and SVB can be controlled under fixing at 0V.

The procedure shown in FIG. 46 is as follows. The feature of this procedure for fixing data is that precharge voltage for nodeT and nodeB is supplied from bit lines. NodeT and nodeB are precharged to Vcc−Vthn through a transfer gate MN1 or MN2 by the bit line BLT or BLB that is charged up to Vcc, due to fixing PRET and PREB at Vcc as well as setting a word line WL, the bit lines BLT and BLB at Vcc and setting VPS at 0V to cut off MP1 through Mp4. Here, Vthn is threshold voltage of MP1 and MP2. NodeT and nodeB are set floating state by reducing the voltage of the word line WL from Vcc to 0V at the time to; then, the flip-flop data is fixed by the discharge differential from MCN1 and MCN2. In the case of data "1", the voltage of nodeT becomes lower than that of nodeB because the resistance value of MCN1 of lower threshold voltage is lower than that of MCN2; thus, the data of the nonvolatile memory cell is fixed at "1" after raising voltage of VPS from 0V to Vcc at the time t1. On the other hand, in the case of data "0", the voltage of nodeB becomes lower than that of nodeT because the resistance value of MCN2 of lower threshold voltage is lower than that of MCN1; thus, the data of the nonvolatile memory cell is fixed at "0" after raising the voltage of VPS from 0V to Vcc at the time t1. On the other hand, in the procedure shown in FIG. 48, as the same voltage is applied to SLB and SLT, SLB and SLT can be connected to be applied a common signal (e.g. SL signal); as the same voltage is applied to VPS and VPM, VPS and VPM and SLT can be connected to be applied a common signal.

A Modified Embodiment of the Third Embodiment

Figure 48A:
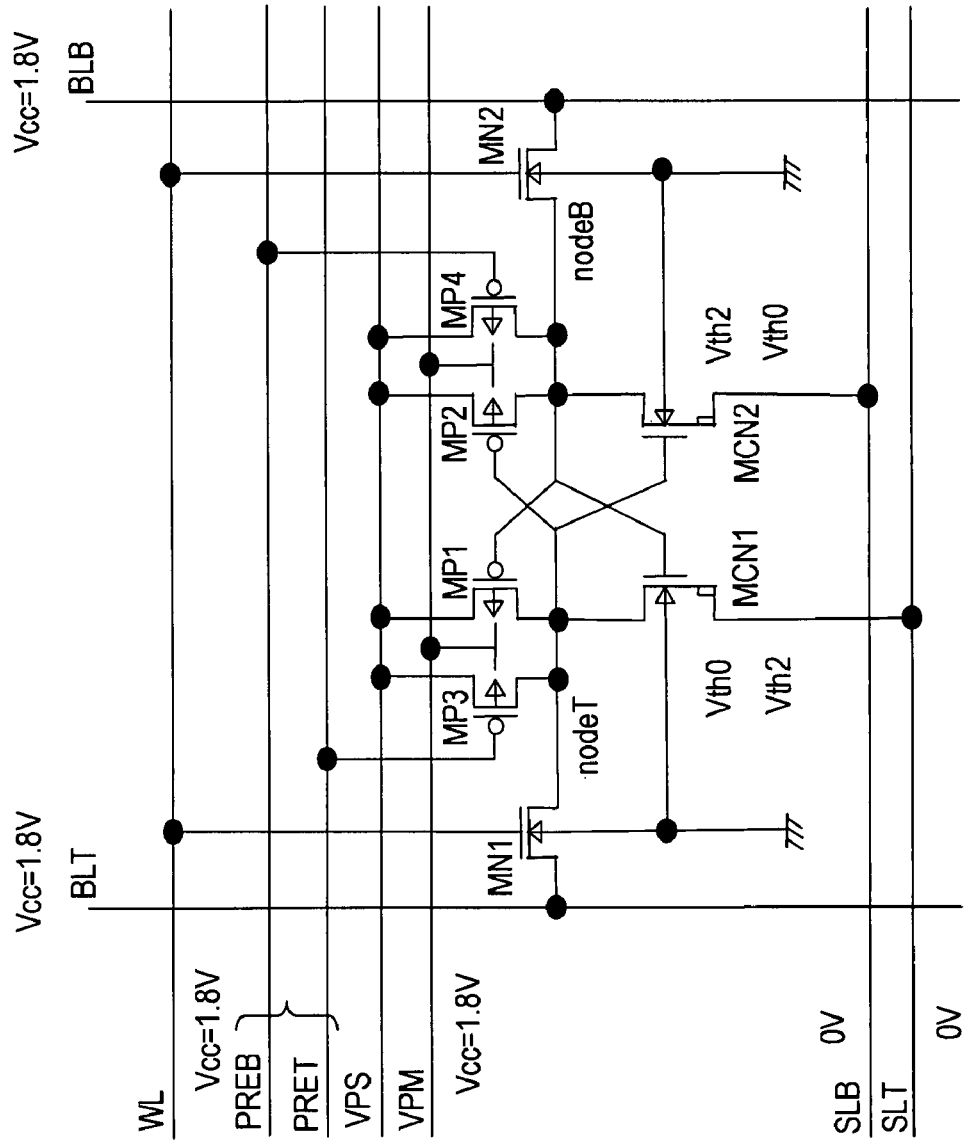
FIGS. 48A and 48B are schematic diagrams illustrating a voltage applying procedure for data fixing of the third embodiment.
Figure 48B:
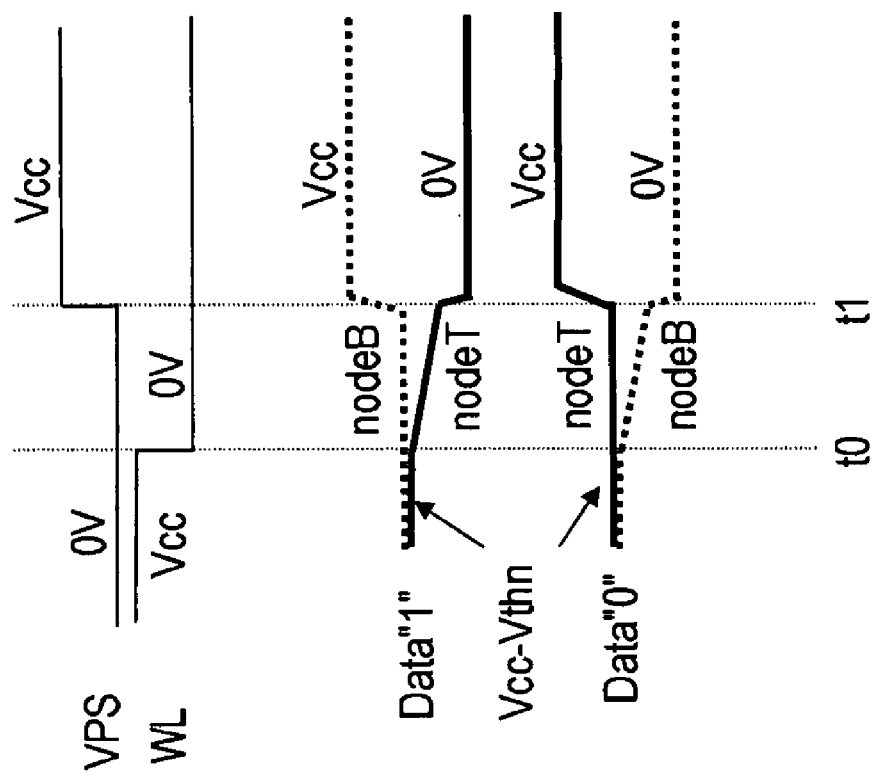

IF data writing of the SL separating type 8-transistor configuration of the third embodiment is not performed, i.e. the threshold voltage of both memory transistors MCN1, MCN2 is low, stored data of the nonvolatile memory cell by data fixing procedure shown in FIG. 46 through FIG. 48 is unstable. By putting a circuit configuration of true-side (the memory transistor MCN1) and bar-side (the memory transistor MCN2) out of balance as shown in FIG. 49 or FIG. 50, stored data of the memory cell can be fixed to "0" or "1", even if threshold voltages of both memory transistors MCN1 and MCN2 are low.

A nonvolatile memory cell shown in FIG. 49 comprises two load transistors MP1 and MP2 of different channel width. In this case, with forming a channel width of the load transistor MP1 twice as wide as that of the load transistor MP2, ON resistance of the load transistor MP1 is reduced to half of the load transistor MP2.

When the memory cell with this configuration is powered on under the condition of both memory transistors MCN1 and MCN2 being not programmed, a voltage of nodeT raises faster than that of nodeB, and the load transistor MP1 and the memory transistor MCN2 go into on state, the load transistor MP2 and the memory transistor MCN1 go into off state, in other words, the data goes into fixed as "0".

In addition, a channel length instead of the channel width can be differentiated. Also either load transistor MP1 or MP2 can be changed its channel width or length. Moreover, the memory transistor MCN1 or MCN2 can be changed its channel width or length.

A nonvolatile memory cell shown in FIG. 15 comprises capacitors connected to the nodeT and the nodeB of the flip-flop. NodeT is connected to a power supply line through a capacitor C1, and nodeB is connected to ground through a capacitor C2. The capacitance of these capacitors is, for example, about 50 fF.

When the memory cell with the configuration shown in FIG. 50 is powered on under the condition of both memory transistors MCN1 and MCN2 being not programmed, a voltage of nodeT raises faster than that of nodeB, and the load transistor MP1 and the memory transistor MCN2 go into on state, the load transistor MP2 and the memory transistor MCN1 go into off state, in other words, the data is fixed as "0".

Although the two capacitors are connected to nodeT and nodeB respectively in the embodiment shown in FIG. 50, the circuit configuration of the nonvolatile memory cell can be asymmetric by connecting to either one of the two.

A Measuring Method of the Threshold Voltage for the Third Embodiment

Figure 51:
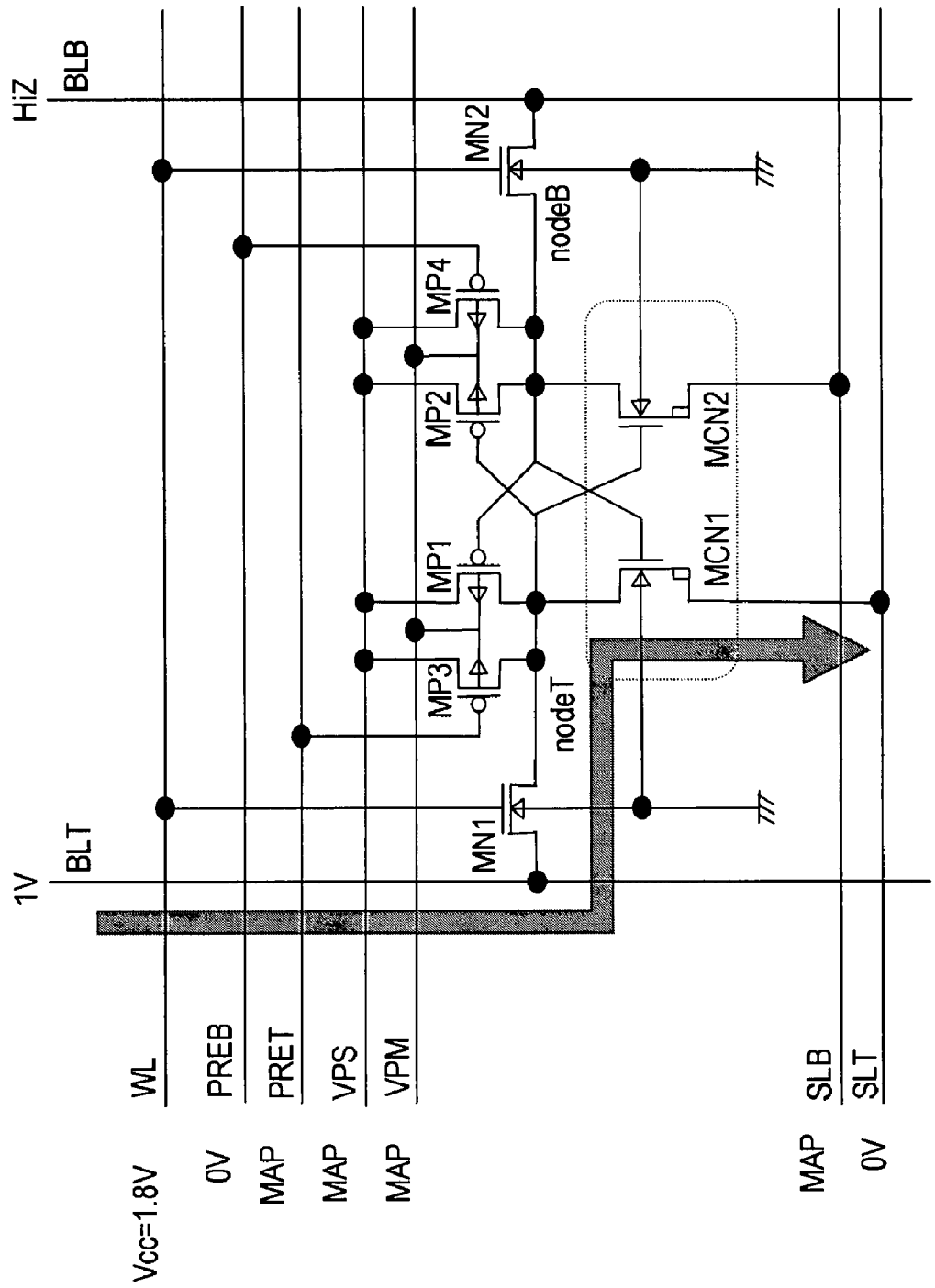
FIG. 51 is a schematic diagram illustrating a method for measuring a threshold voltage of the memory transistor.

Additionally, when the nonvolatile memory cell with the SL separating type 8-transistor configuration is used, the configuration of voltage shown in FIG. 51 makes it possible to measure the threshold voltage of the memory transistor. This method enables to measure at least one of the values including the incipient threshold voltage fluctuation, a variation of the threshold voltage in the time of programming operation or erase operation, and a retention characteristic of the threshold voltage under high temperature after rewriting.

FIG. 51 shows a case where the threshold voltage of the applied memory transistor MCN1 is measured. Under the condition that a source voltage SLT of the memory transistor MCN1 is set at 0V, the drain (nodeT) of the memory transistor MCN1 is supplied with 1V from the bit line BLT through the transfer gate MN1. NodeB is provided with VPS voltage (MAP voltage) from the load transistors MP2 and MP4.

The load transistor MP2 becomes power-on and supplies nodeB with an voltage in the case that VPS voltage is not less than 1V+Vthp because the gate voltage (nodeT) is set at 1V. On the other hand, The load transistor MP4 becomes power-on and supplies nodeB with an voltage in the case that VPS voltage is not less than Vthp because the gate voltage PREB is set at 0V. Here, Vthp is the threshold voltage of the p-type MOS transistor shown as MP1~MP4, and about 0.7V is the threshold voltage for a transistor by a conventional CMOS process. Therefore, the threshold voltage (required gate voltage for a certain current flow) of MCN1 can be measured on condition of not less than the threshold voltage. The gate voltage nodeT of MCN2 should be power-off by setting the source voltage SLB of the MCN2 at MAP voltage as well as setting the bit lines at floating state so as not to cause unwanted leak pass in MCN2.

FIG. 51 shows an applied voltage condition for measuring the threshold voltage of the memory transistor MCN1, on the other hand, the measurement of the threshold voltage of the memory transistor MCN2 can be achieved by only reversing control of the bit lines BLT, BLB, the source voltages SLT and SLB, and the precharge signals PRET, PREB.

In addition, although the precharge line is divided into two lines PRET, PREB, if this measurement is not performed, the precharge line can be shared by the true-side and the bar-side.

A Layout on the Semiconductor Substrate of the Second and the Third Embodiment

Figure 52C:
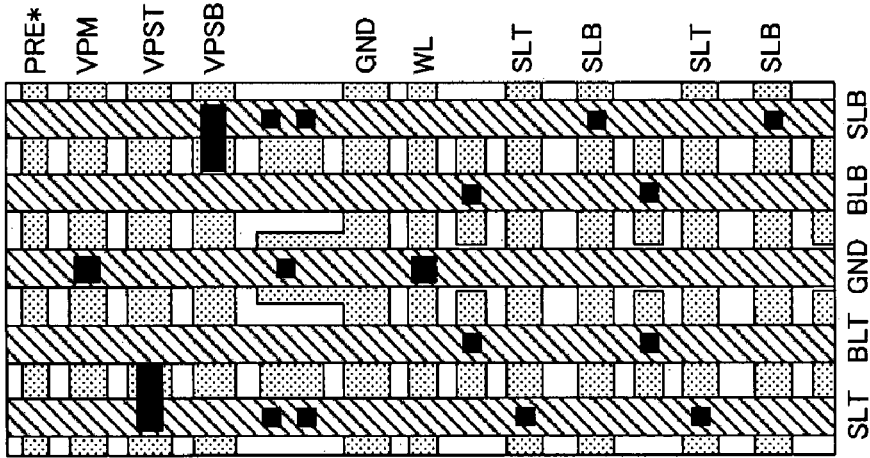
FIGS. 52A to 52C are schematic diagrams showing a layout on a semiconductor substrate for a memory cell of the second and the third embodiment.
Figure 52B:
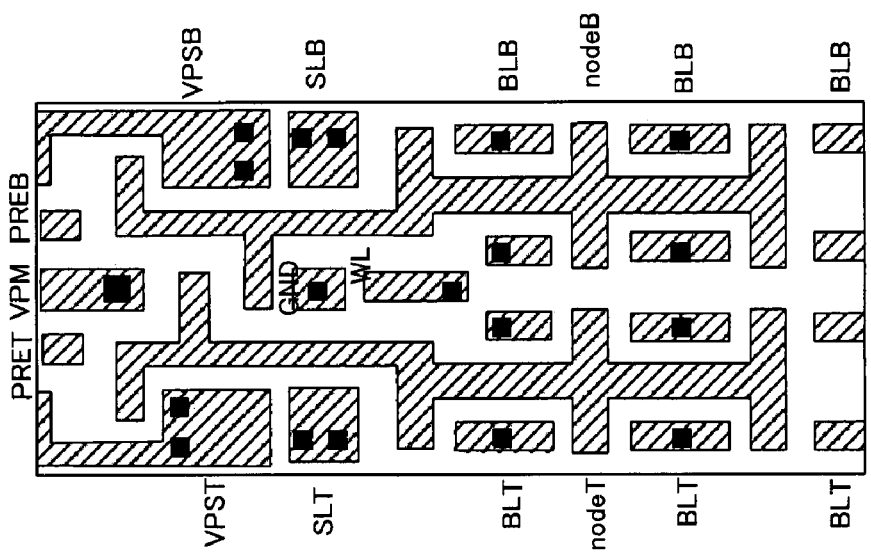
Figure 52A:
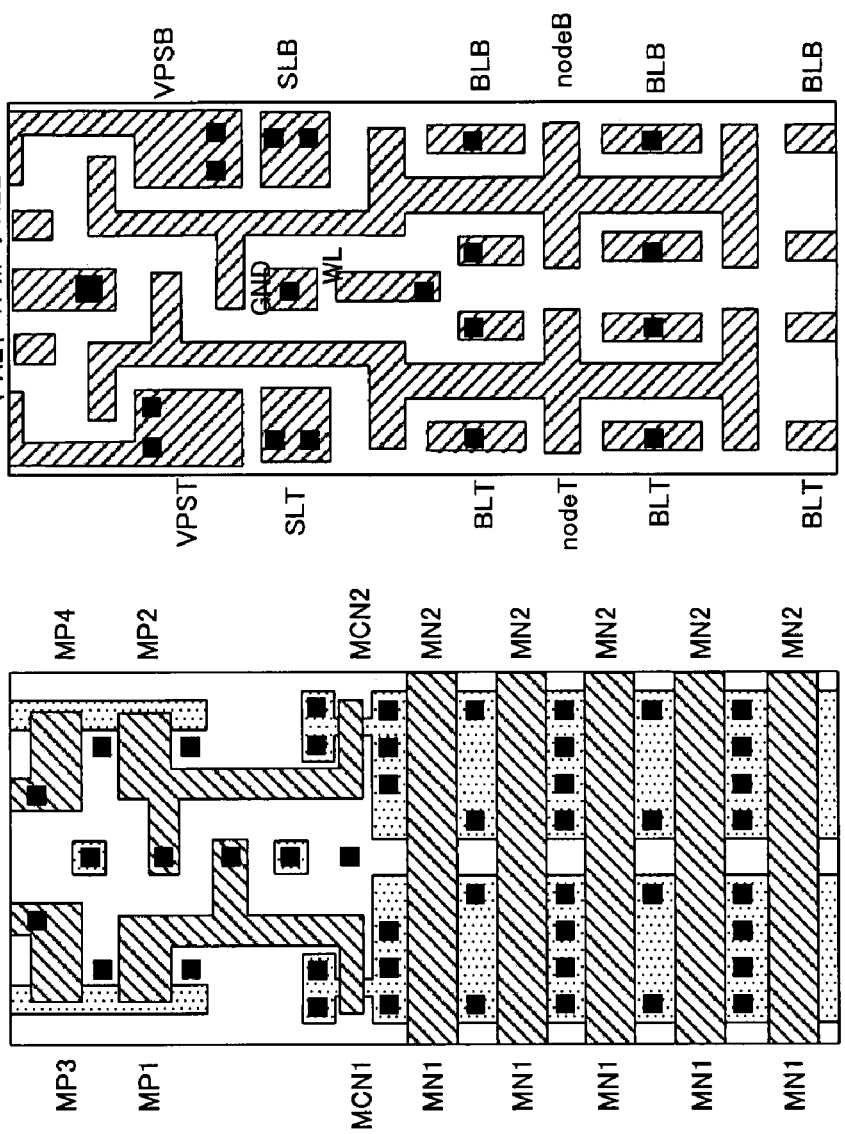

FIGS. 52A, 52B, and 52C show layouts on the semiconductor substrate for a memory cell of the second and the third embodiment.

FIG. 52A shows a layout of an active region on the substrate surface and a gate electrode. FIG. 52B shows a layout of metal wiring of the first layer. FIG. 52C shows a layout of metal wiring of the second and the third layer. As shown in FIG. 52A, the memory transistors of "true" state and "bar" state are laid out in the same direction, and designed so that both memory transistors have the same characteristics even if some errors of ion implantation would happen.

In addition, as shown in FIG. 52C, VPS line and the source line (SL) are divided in this layout so as to be "true" state and "bar" state, respectively, and the VPS separating type of the second embodiment or the SL separating type of the third embodiment can be configured by shorting (sharing) either one of the two. As just described, by adopting the layout in FIG. 52C, only the change of the third metal wiring can produce a nonvolatile semiconductor memory cell of either the VPS separating type of the second embodiment or the SL separating type of the third embodiment with a common process until the second metal wiring.

The Fourth Embodiment

A nonvolatile memory device and a semiconductor integrated circuit device therewith of the fourth embodiment will now be described with referent to FIG. 53 through FIG. 68.

Figure 53:
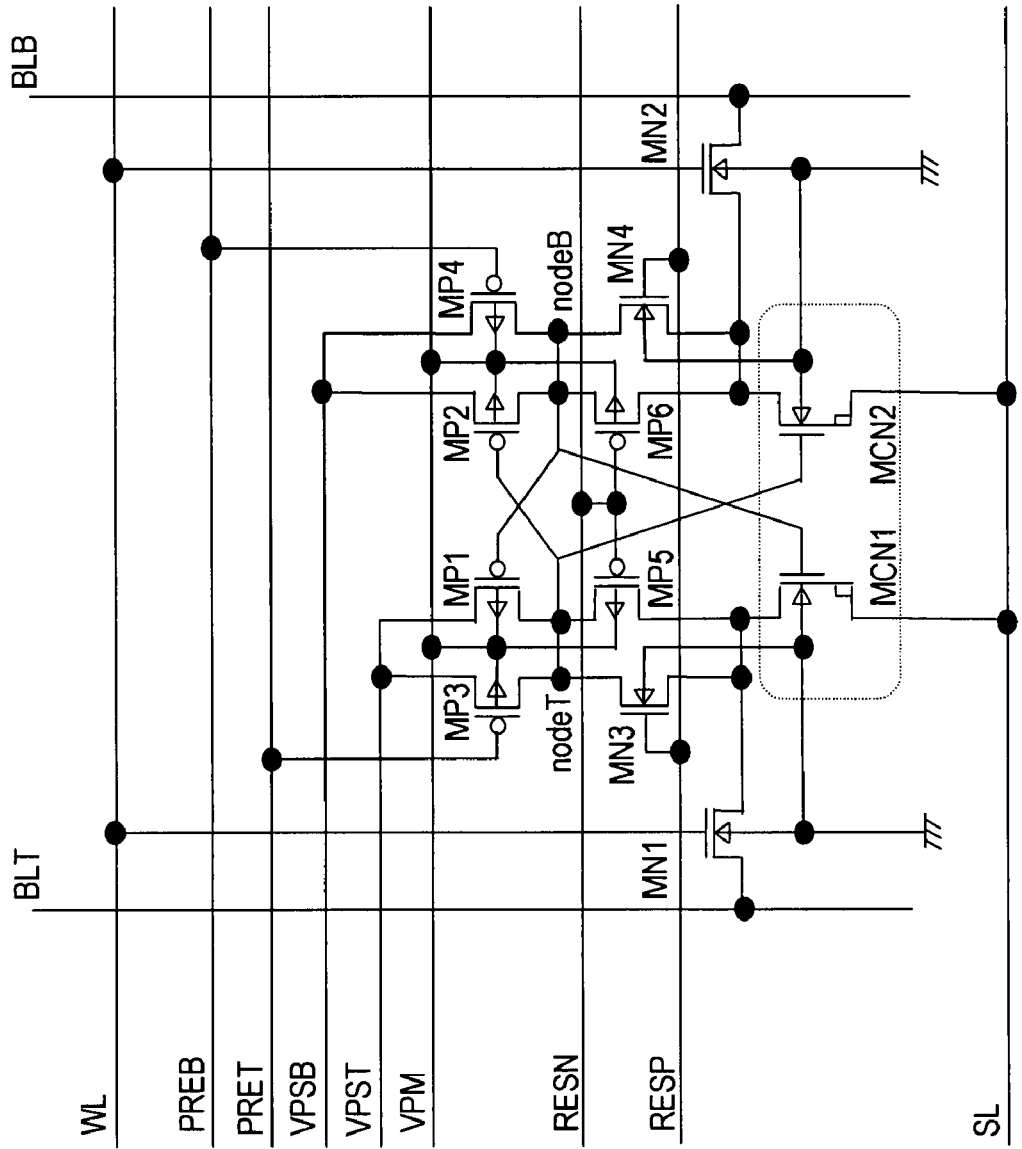
FIG. 53 is a schematic diagram showing a VPS separating type 12-transistor configuration of the fourth embodiment of the present invention.

FIG. 53 is a circuit diagram of one nonvolatile memory cell of a nonvolatile memory device. This memory cell has a 12-transistor configuration that an analog switch is added to a VPS separating type transistor described in the second embodiment.

The memory cell has a static latch type flip-flop formed by connecting an inverter (true-side-inverter) formed by series connection of a p-type MOS transistor MP1 and an n-type MOS transistor MCN1 and an inverter (bar-side-inverter) formed by series connection of a p-type MOS transistor MP2 and an n-type MOS transistor MCN2. The p-type MOS transistors MP1 and MP2 are referred to as load transistors, and n-type MOS transistors MCN1 and MCN2 are referred to as memory transistors. The memory transistors MCN1 and MCN2 can be injected and erased electrons in a side wall of a gate, as illustrated in and after FIG. 55. The threshold voltage of the memory transistors MCN1 and MCN2 are changed without volatilization, thus the memory transistors MCN1 and MCN2 perform as nonvolatile device.

This memory cell has further an analog switch, between a p-type transistor MP1 and an n-type transistor MCN1, comprising a p-type MOS transistor MP5 and an n-type MOS transistor MN3. This memory cell has also an analog switch, between a p-type transistor MP2 and an n-type transistor MCN2, comprising a p-type MOS transistor MP6 and an n-type MOS transistor MN4. An RESN line is connected to the gates of MP5 and MP6, and an RESP line is connected to the gates of MP2 and VPSB.

A side edge of the memory transistor of each inverter, i.e. a source of each memory transistor MCN1, MCN2, is connected to a source line SL. A side edge of a load transistor for the true-side-inverter, i.e. a source of the load transistor MP1 is connected to VPST line, and a side edge of a load transistor for the bar-side-inverter, i.e. a source of the load transistor MP2 is connected to VPSB line.

In the flip-flop, the inverter (true-side-inverter) formed by series connection of the load transistor MP1 and the memory transistor MCN1 performs as a memory unit for the "true" state of the cell, and the inverter (bar-side-inverter) formed by series connection of the load transistor MP2 and the memory transistor MCN2 performs as a memory unit for the "bar" state of the cell. The junction of the load transistor MP1 with the memory transistor MCN1 is nodeT, and the junction of the load transistor MP2 with the memory transistor MCN2 is nodeB. If nodeT has a high voltage and nodeB has a low voltage, then "0" is recorded in the memory, and if nodeT has a low voltage and nodeB has a high voltage, then "1" is recorded in the memory.

NodeT is connected to a bit line BLT (BitLine-True) through a transfer gate MN1, and NodeB is connected to a bit line BLB (BitLine-Bar) through a transfer gate MN2. Each transfer gate MN1, MN2 is composed of an n-type transistor, and each gate is connected to a common word line WL.

In addition, a p-type MOS transistor MP3 as a precharge transistor is connected in parallel, i.e. between nodeT and VPST, with the load transistor MP1. Moreover, a p-type MOS transistor MP4 as a precharge transistor is connected in parallel, i.e. between nodeB and VPSB, with the load transistor MP2. The true-side-precharge line PRET is connected to the p-type MOS transistor MP3, and the bar-side-precharge line PREB is connected to the p-type MOS transistor MP4. Furthermore, each p-type MOS transistor MP1~MP6 is formed in the same N well, and a voltage of the N well is controlled by VPM signal.

Figure 54:
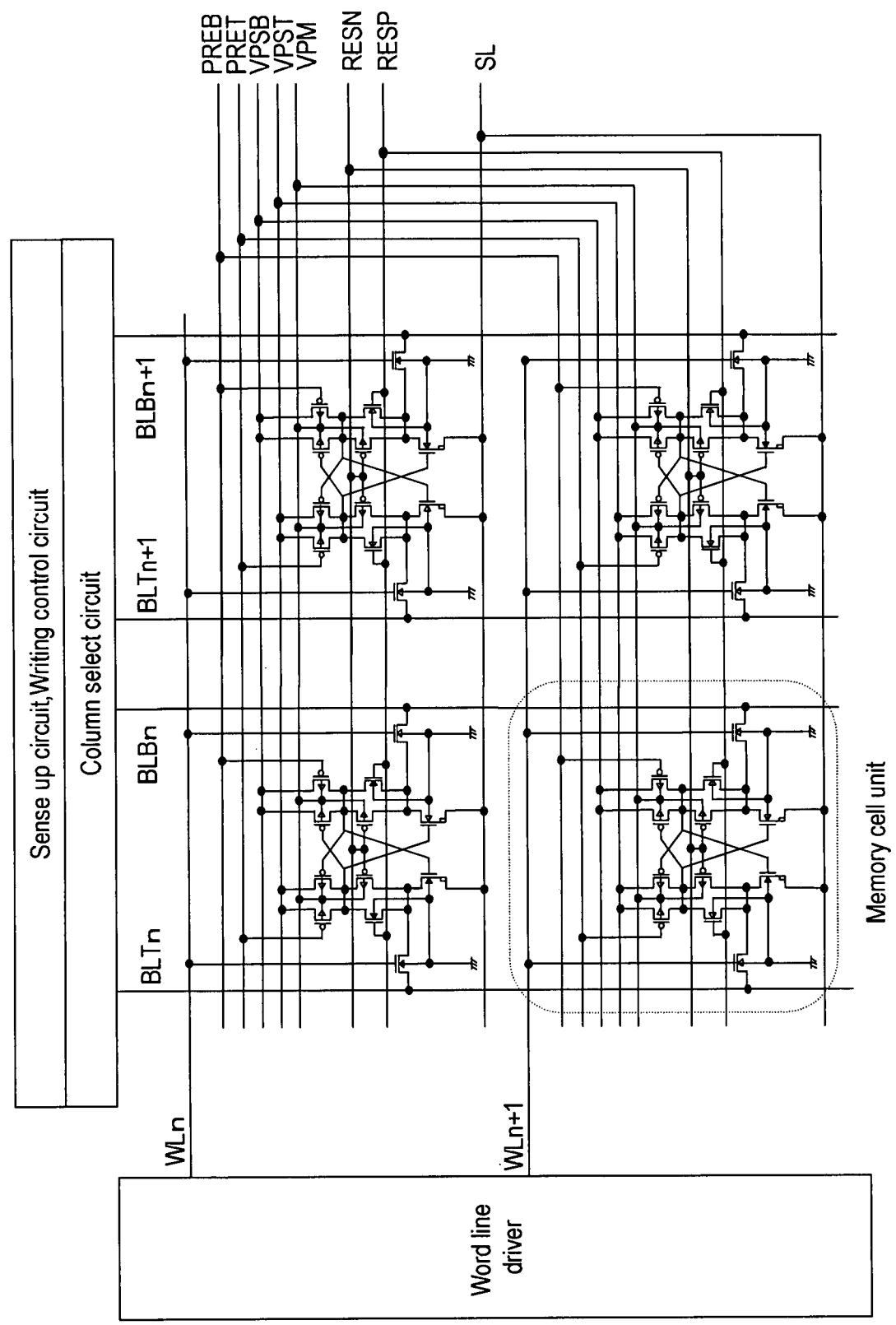
FIG. 54 is a schematic diagram showing a configuration of a memory device in which the memory cells of the fourth embodiment is arrayed.

FIG. 54 is a schematic diagram showing a memory device on which the nonvolatile memory cells as shown FIG. 53 are arrayed. In this memory cell array, the nonvolatile memory cells in FIG. 53 are arrayed so as to be row-column matrix layout. In addition, each row has a word line WL, and each column has one bit line BLT, BLB. Each word line WL, and each bit line BLT, BLB is individually controlled. Each memory cell has signal lines (PREB, PRET, VPST, VPSB, VPM, SL, RESN, RESP) other than the foregoing lines and these signal lines are controlled integrally in the entire memory cell array.

Figure 55:
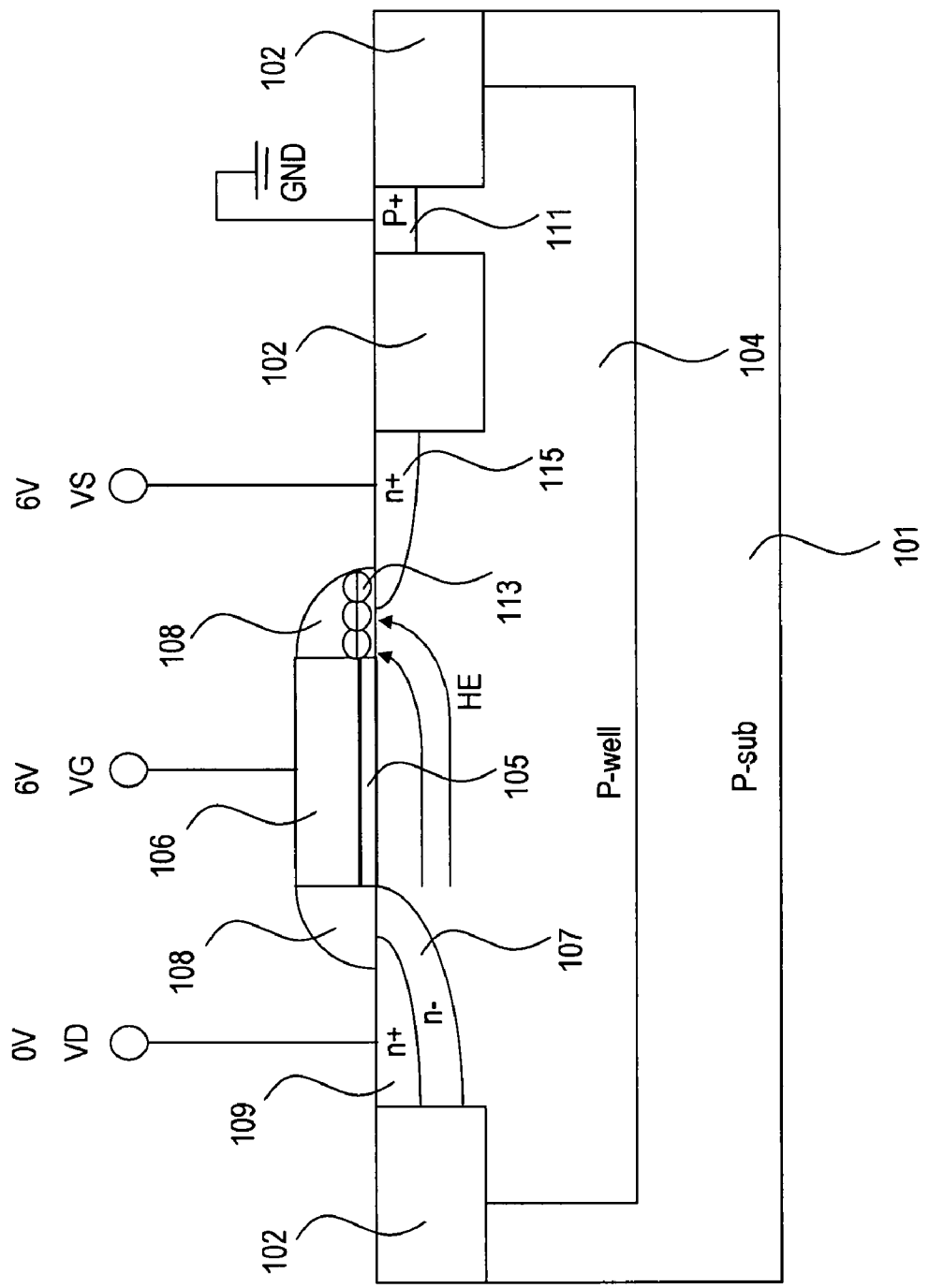
FIG. 55 is a schematic diagram showing an applied voltage condition for writing data of a memory transistor of the memory cell of the fourth embodiment.
Figure 57:
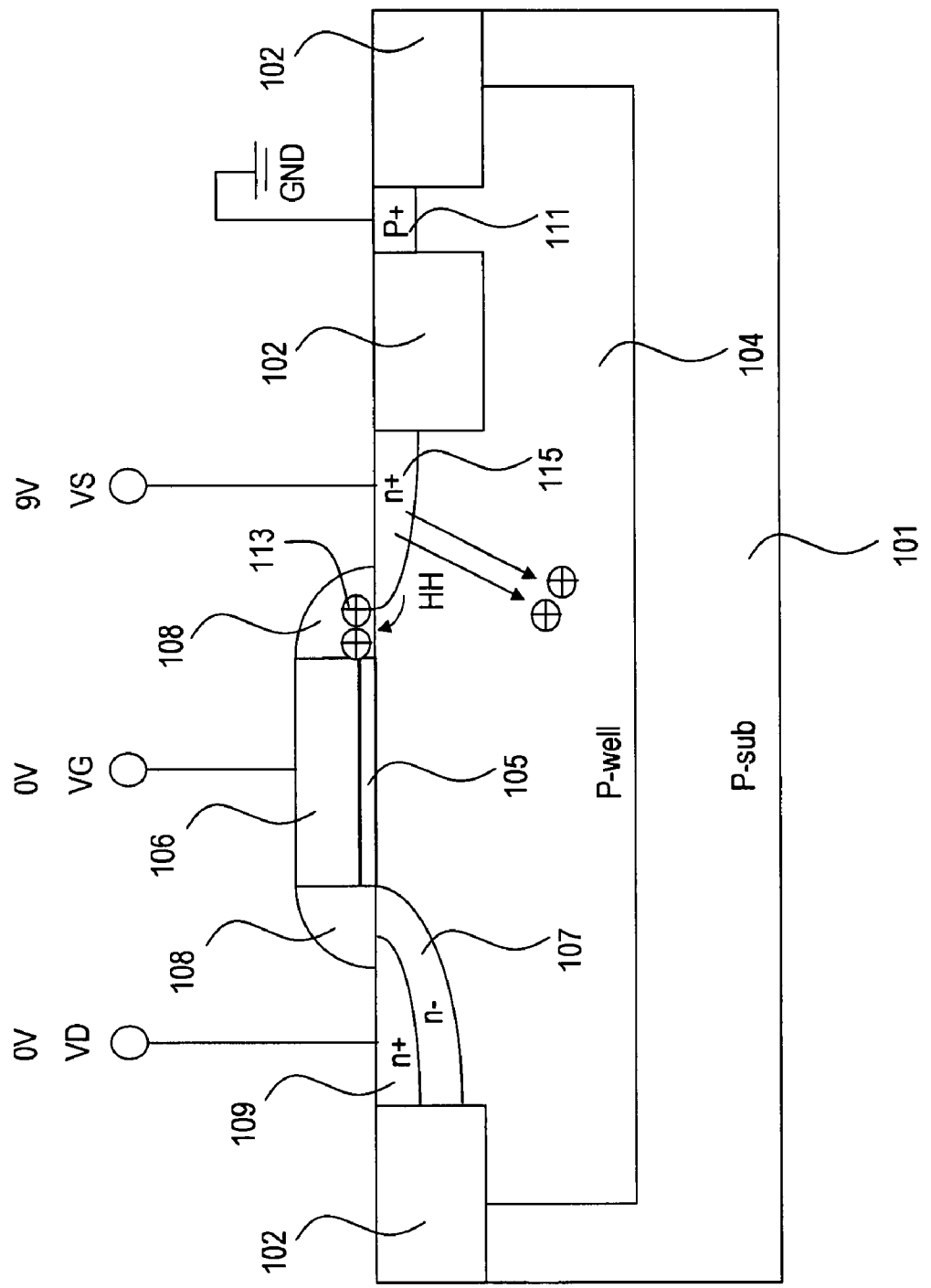
FIG. 57 is a schematic diagram showing an applied voltage condition for erasing data of the memory transistor of the fourth embodiment.
Figure 63:
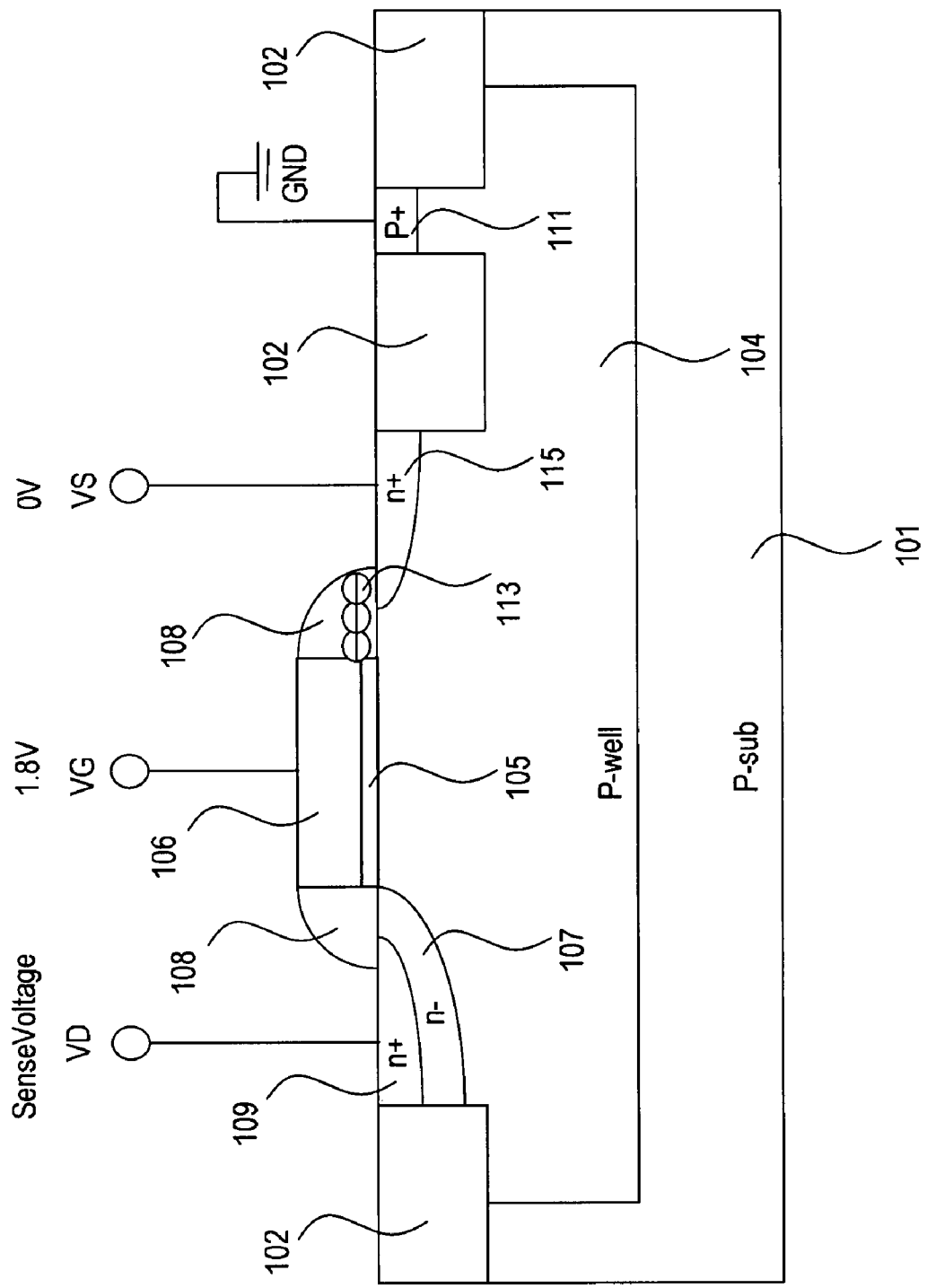
FIG. 63 is a schematic diagram showing an applied voltage condition for reading data of a memory transistor of the memory cell of the fourth embodiment.

FIG. 55, FIG. 57, and FIG. 63 are schematic diagrams showing the memory transistors MCN1 and MCN2 on a semiconductor substrate. Concretely, FIG. 55 shows an applied voltage condition during programming operation.

FIG. 57 shows an applied voltage condition during erase operation. FIG. 63 shows an applied voltage condition during reading operation.

Figure 56:
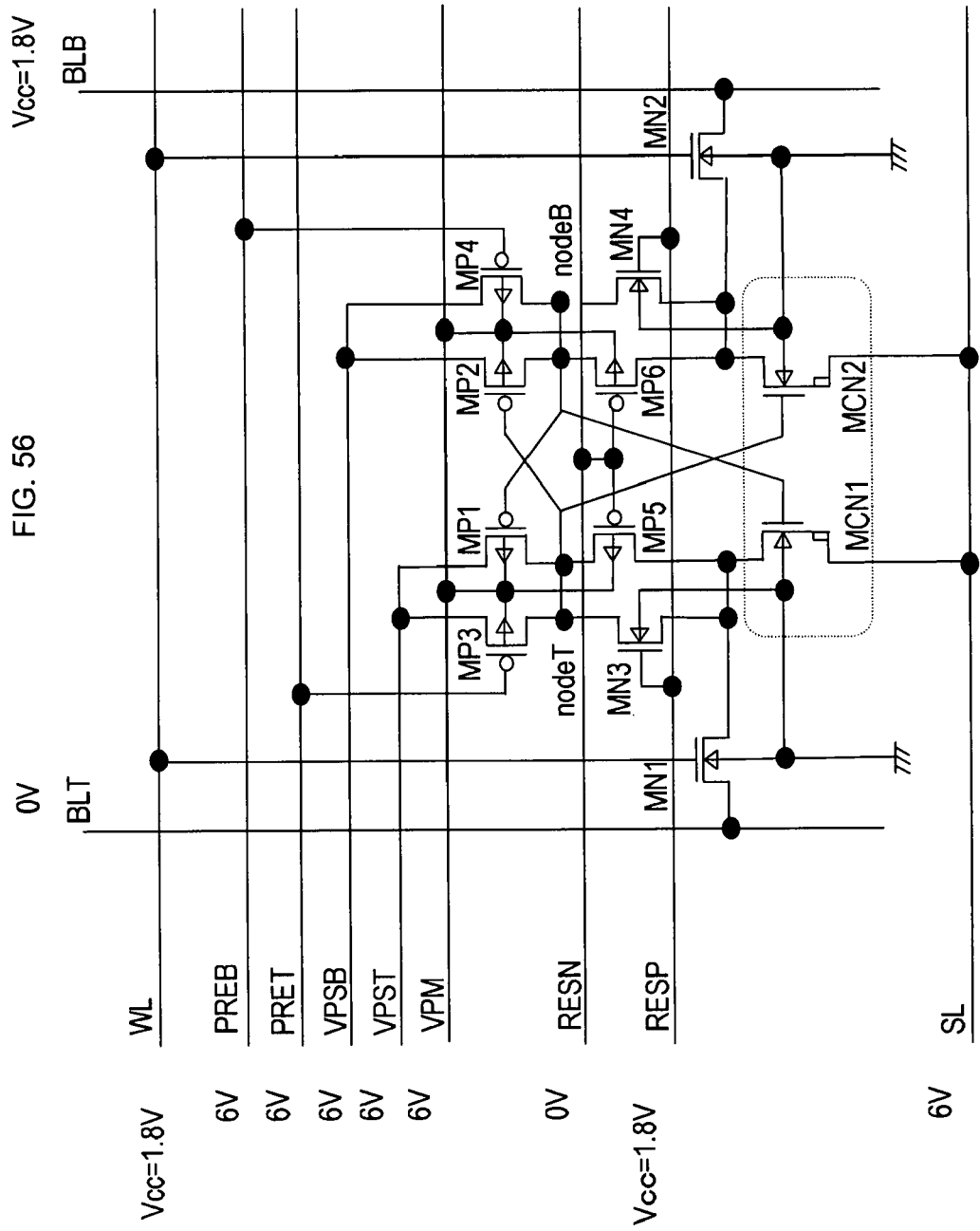
FIG. 56 is a schematic diagram showing a voltage applying procedure for writing data on a memory transistor of the memory cell of the fourth embodiment.
Figure 58:
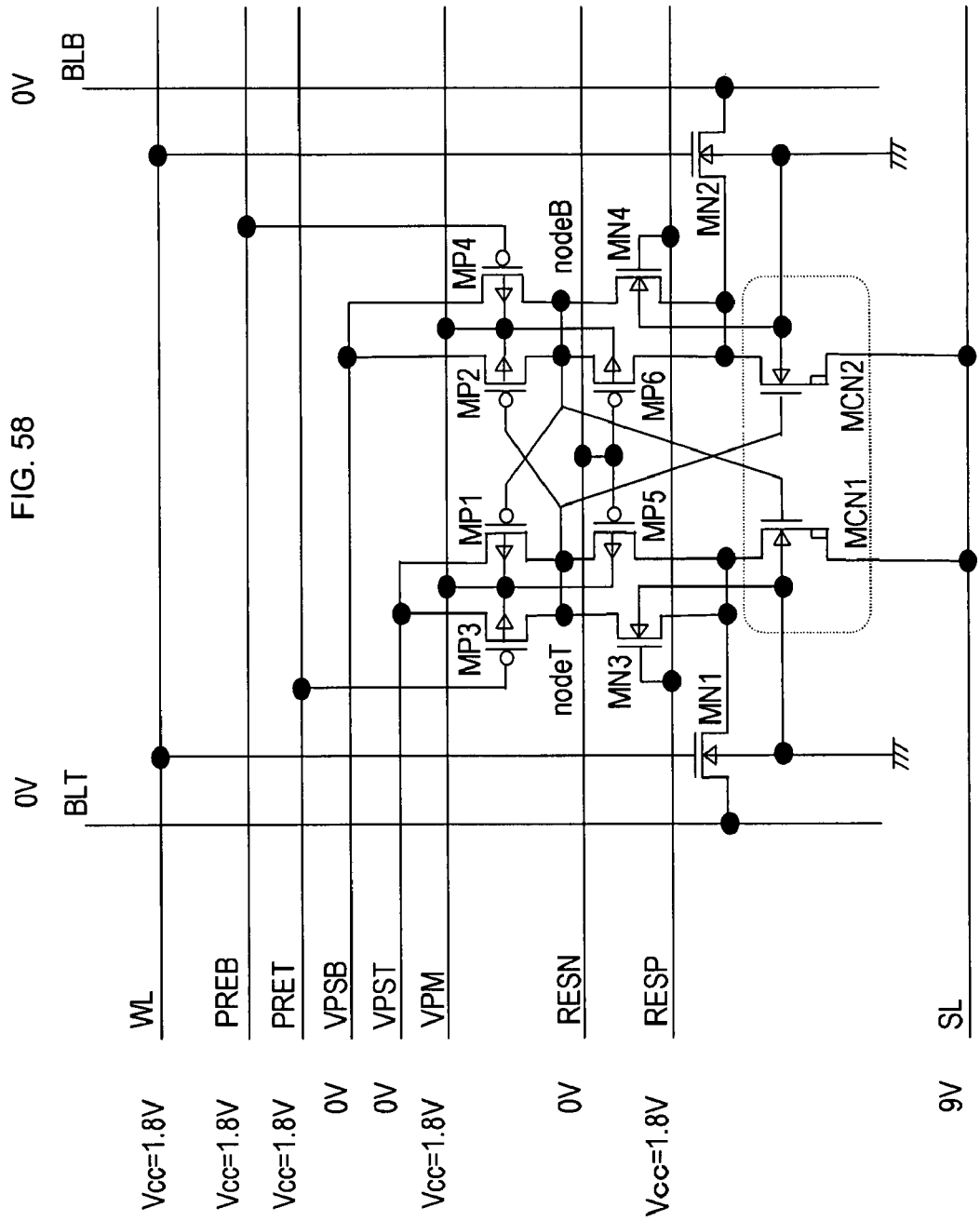
FIG. 58 is a schematic diagram showing a voltage applying procedure for erasing data on a memory transistor of the memory cell of the fourth embodiment.

In addition, FIG. 56 is a schematic diagram showing a voltage applying procedure for writing data on a memory transistor MCN1 of the memory cell. FIG. 58 is a schematic diagram showing a voltage applying procedure for erasing data of the nonvolatile memory cell. FIG. 64 is a schematic diagram showing an applied voltage condition for reading data of the nonvolatile memory cell.

As shown in FIG. 55, a p-type well 104 with 0.8 μm in depth, and average boron concentrations, $2 \times 10^{17}$ cm$^{-3}$ is formed in a surface area of a p-type silicon substrate 101 with electric resistivity 10 Ωcm. The two transistors MCN1 and MCN2 isolated by plurality of trenches (for device isolation) with 250 nm in depth are formed in the p-type well 104. In this figure, only one memory transistor (MCN1) is shown.

The memory transistor is an n-channel type transistor. It comprises a drain 109 formed next to one trench, and a source 115 formed next to another trench in the surface area of the p-type well 104, and comprises a drain extension 107 formed in the vicinity of the drain 109. The drain 109 and the source 115 are doped with average arsenic concentration $1 \times 10^{20}$ cm$^{-3}$, and the drain extension 107 is doped with average arsenic concentration $5 \times 10^{18}$ cm$^{-3}$.

A 5 nm thick gate insulator layer 105 and a 200 nm thick gate electrode 106 of poly-silicon layer doped with phosphorus concentration $2 \times 10^{20}$ cm$^{-3}$ are formed on a channel region between the drain 109 and the source 115 on the surface of the p-type well 104. Side spacers 108 and 108S composed of a 50 nm thick insulator are formed on the drain 109 and source 115 at the side of the gate insulator 105 and the gate electrode 106. The source-side side spacer 108S contacts the channel region of the substrate because an extension area is not formed in the vicinity of the source 115.

A p-type diffused layer 111 with average boron concentration $1 \times 10^{20}$ cm$^{-3}$ is formed in the area isolated from the foregoing memory transistor by a trench 102 in the p-type well area 104. The layer 111 works an electrode for connecting this p-type well 104 to ground.

A threshold voltage of the memory transistor is raised by carrier injection into the source-side side spacer 108S. As illustrated in FIG. 57, the threshold voltage revert back to the initial state by drawing out the injected carrier from the side spacer 108S. Accordingly, this memory transistor can record data without volatilization.

While the initial threshold voltage of the memory transistor is set at 1.2V, the transistor is unstable due to an atypical structure. Therefore, this memory transistor cannot be used solely in terms of reliability. The memory cell of this embodiment is formed with the flip-flop as shown FIG. 53.

In FIG. 55, programming operation is performed by applying 0V to a drain line VD, and applying a positive voltage (e.g., +6V) not more than a breakdown voltage to a source line VS and a gate line VG to generate a channel hot electron HE and to inject it into the side spacer 108S. Electrons trapped by the channel hot electron injection lead to raising the threshold voltage, and the memory transistor becomes a programmed state.

FIG. 56 shows an applied voltage condition in the case of writing data "0" by raising threshold voltage of the memory transistor MCN1. For setting the memory transistor MCN1 to this voltage condition shown in FIG. 55, voltages are applied to the memory cell on the condition shown in FIG. 56. After setting RESN at 0V and setting RESP at Vcc, under the condition of applying 6V to PREB, PRET, VPST, VPSB, VPM, and SL, the operation is performed by connecting a word line WL to Vcc, connecting a bit line BLT to 0V, and connecting a bit line BLB to Vcc. NodeT (a drain of the memory transistor MCN1) comes to have approximately the same voltage as the bit line BLT (0V) by turning ON the transfer gate MN1, which is an n-type MOS transistor. And nodeB (a gate of the memory transistor MCN1) come to have approximately the same voltage as VPSB (6V) by turning ON the load transistor MP2. Thus the applied voltage condition of the memory transistor MCN1 becomes the same as that of FIG. 57. In this condition, a current of about 300 μA flow in the transfer gate MN1 and the memory transistor MCN1. This current makes a threshold voltage of the memory transistor MCN1 raised to Vth2.

On the other hand, in the case of writing data "1", the threshold voltage of the memory transistor MCN2 is raised, which all conditions but applying Vcc to BLT and applying 0V to BLB are the same as those of writing data "0".

6V is applied to both the gate (nodeB) of the transistor MCN1 and the drain (the source line SL) of the transistor MCN1 in the foregoing embodiment. However, a different power voltage can be applied to the gate and the drain.

FIGS. 57 and 58 are schematic diagrams showing voltage conditions for erasing data of the memory transistor MCN1 (or MCN2). For setting the memory transistor MCN1, MCN2 to this voltage condition shown in FIG. 57, an erase operation is performed as follows. A positive voltage (e.g., +9V) not more than a breakdown voltage is applied to a source line VS, and 0V is applied to the gate line VG and the drain line VD, to generate avalanche hot holes HH from the source 115 and to inject the avalanche hot holes HH into the side spacer 108S. Electrons trapped in the side spacer 108S by the foregoing programming operation are neutralized, and the written data is erased due to reduce the threshold voltage.

FIG. 58 shows a voltage condition in the case of erasing data by reducing threshold voltages of the memory transistor MCN1, MCN2. For setting the memory transistor MCN1, MCN2 to this voltage condition shown in FIG. 57, voltages are applied to the memory cells on the condition shown in FIG. 58. Typically, an erase operation is performed for the entire memory cell of the memory array shown in FIG. 54. Under the condition of applying 0V to RESN, applying Vcc to RESP, PREB, PRET, and VPM, applying 0V to VPST and VPSB, and applying 9V to SL, the operation is performed by connecting the word line WL to Vcc, and connecting the bit lines BLT, BLB to 0V. Transfer gates MN1 and MN2, which are n-type MOS transistors, turn ON when nodeT and nodeB come to have 0V. Thus the applied voltage condition of memory transistors MCN1, MCN2 is the same as that of FIG. 57.

As stated above, the voltage condition of the programming operation shown in FIGS. 55 and 56 and the voltage condition of the erase operation shown in FIGS. 57 and 58 are designed so that the word line and the bit line that are necessary to be controlled individually for each memory cell can perform at either 0V or Vcc, in other words, no high voltage is required to be applied to the word line or bit line. Thus a high breakdown voltage transistor is not required and a high-performance transistor can be used in a word-line control circuit and a bit-line control circuit to speed up of reading operation.

Figure 59A:
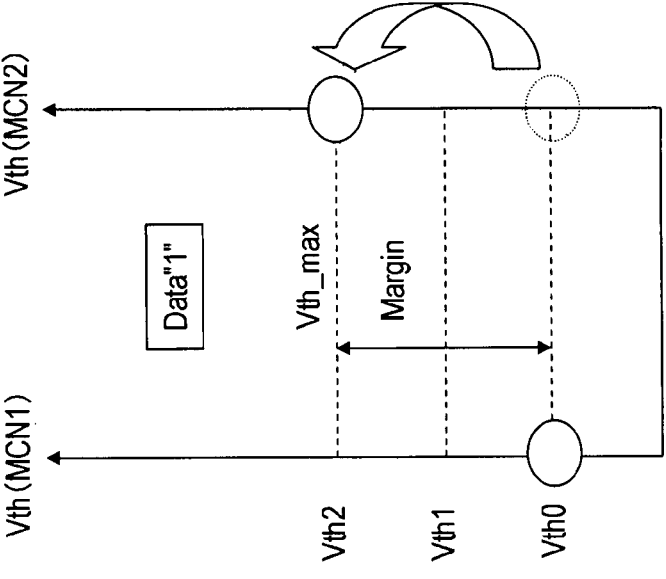
FIGS. 59A to 59C are conceptual diagrams illustrating a method for data setting and voltage differential in the memory cell of the fourth embodiment.
Figure 59B:
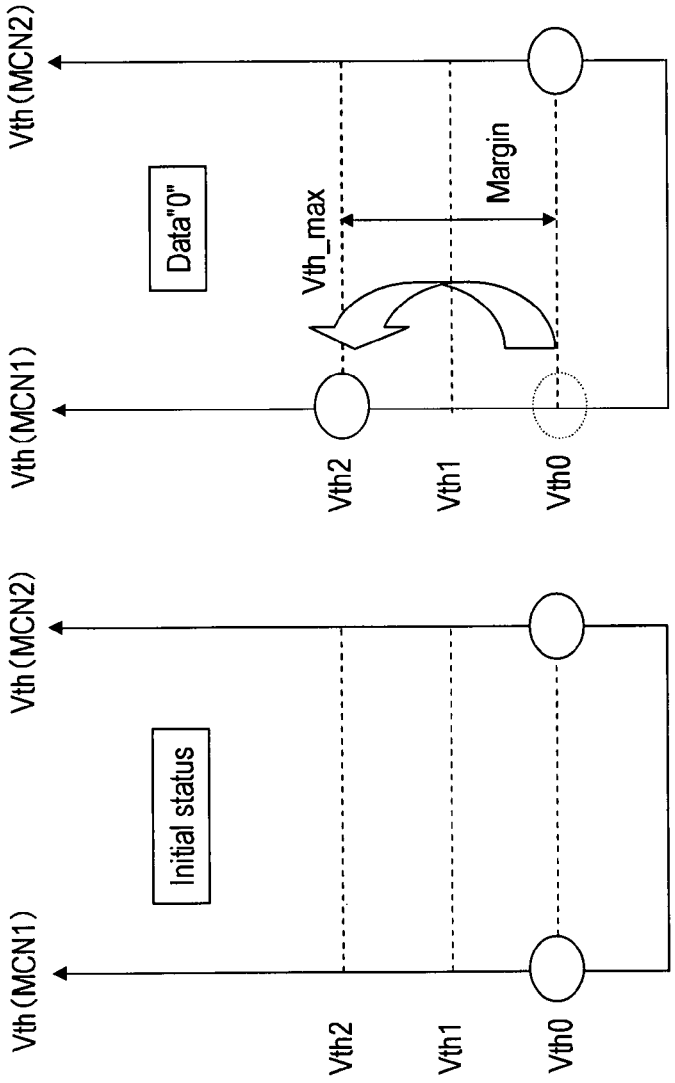
Figure 59C:
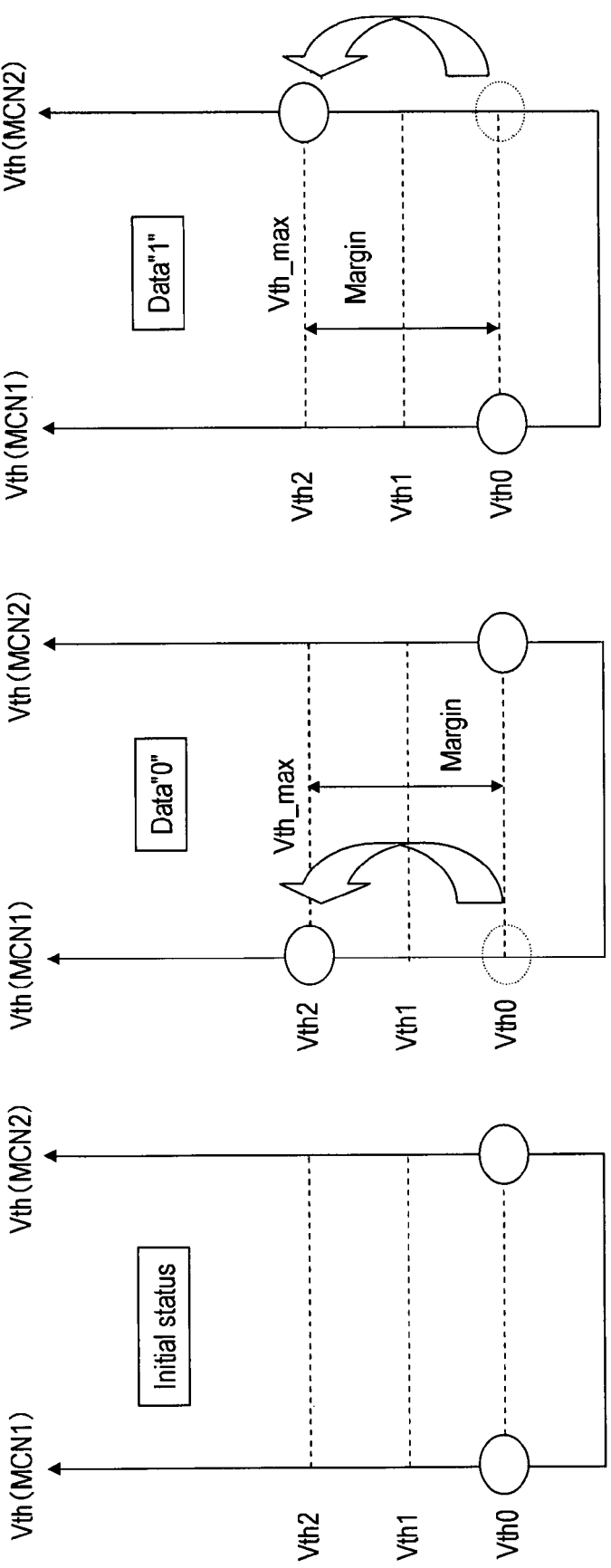

FIGS. 59A through 59C are schematic diagrams illustrating a method for controlling a threshold voltage of each memory transistor MCN1, MCN2 in the case of the foregoing programming operation, i.e. a method for data setting for a nonvolatile memory cell. Here, when the threshold voltage of the memory transistor MCN1 is low-state (on state) and the threshold voltage of the memory transistor MCN2 is high-state (off state), the data is "1". Reversing state, when the threshold voltage of the memory transistor MCN1 is high-state (off state) and the threshold voltage of the memory transistor MCN2 is low-state (on-state), the data becomes "0."

FIG. 59A shows a case that both threshold voltages of the memory transistors MCN1 and MCN2 are at the initial state Vth0, i.e. a state of no data setting. Even in this case, the data of the nonvolatile memory cell is fixed at "1" by procedure in FIG. 60 or that in FIG. 62.

FIG. 59B shows threshold voltages of memory transistors MCN1, MCN2 in the case that the nonvolatile memory cell is set at data "0". Writing data "0" is achieved by raising the threshold voltage of the memory transistor MCN1 from the initial state shown in FIG. 59A to Vth2 (Vth2>Vth0).

FIG. 59C shows threshold voltages of memory transistors MCN1, MCN2 in the case that the nonvolatile memory cell is set at data "1." Writing data "1" is achieved by raising the threshold voltage of the memory transistor MCN2 from the initial state shown in FIG. 59A to Vth2 (Vth2>Vth0).

The state of the nonvolatile memory cell reverts back to the state shown in FIG. 59A by erase operation illustrated in FIG. 57 and FIG. 58 even if the threshold voltage is controlled under the condition shown in FIG. 59B or FIG. 59C.

As stated above, memory transistors MCN1, MCN2 can be reduced back to Vth0 of the initial state from Vth2 of the programmed state. Thus enough voltage differential of the programmed side and the erased side can be secured even if data "0" or "1" is rewritten multiple times.

Figure 60B:
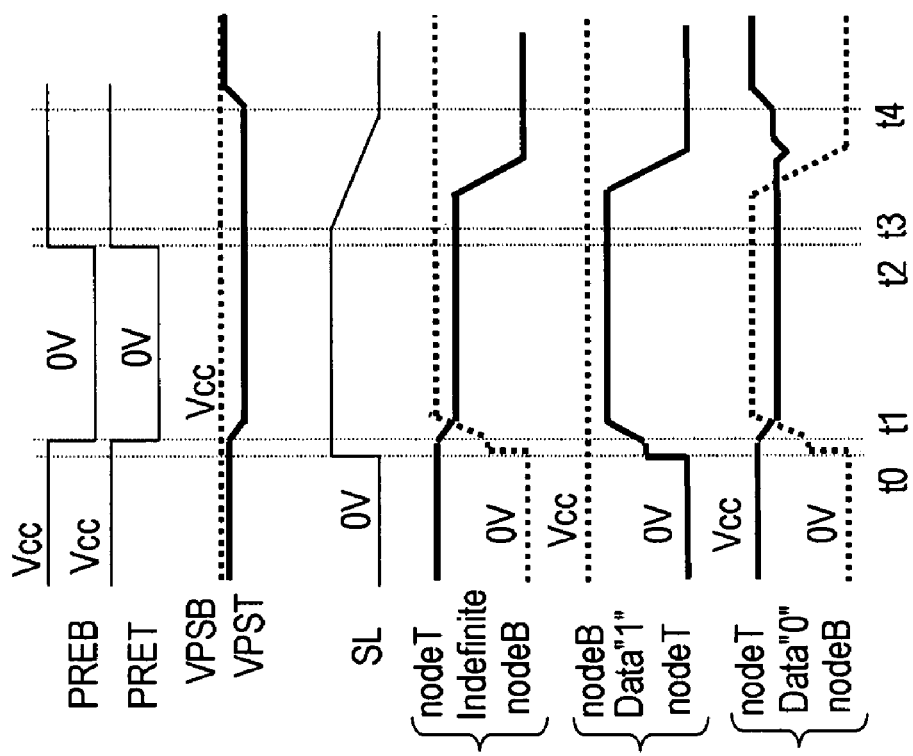

A programming operation shown in FIG. 55 and FIG. 56 makes it possible to write data "1" or "0" to the memory cell by writing to either the memory transistor MCN1 or MCN2. In the case that both threshold voltages of the memory transistors MCN1 and MCN2 are Vth0 of the initial state, i.e. a state of no data setting, the data of the memory cell is unstable. However, the data of the nonvolatile memory cell of the initial state can be fixed at either "1" or "0" by applying voltage by the following procedure FIG. 60 is a schematic diagram showing a voltage applying procedure to fix data of the nonvolatile memory cell. This procedure fixes data of a memory cell to which data "1" or "0" is written as it is written, and fixes data of a memory cell at "1" which is of the initial state. By the procedure for the whole memory cell of the array including memory cell written data "0" or "1" and that of the initial state, the data of the memory cell written data "0" or "1" is set as it is written, also the data of the memory cell of the initial state is fixed the data at "1". This procedure is performed at the time of start-up of the memory.

The procedure shown in FIG. 60 is as follows. This procedure is preformed under the condition of setting a word line WL, bit lines BLT, BLB and RESN at 0V as well as setting RESP at Vcc. To begin with, the memory transistors MCN1 and MCN2 are made to turn off state by raising a source voltage SL from 0V to Vcc at the time t0. Then, reducing precharge control signals PRET and PREB from Vcc to 0V at the time t1 leads to power on of the precharge transistors MP3 and MP4. At the same time, true-side precharge voltage VPST is reduced by ΔV (e.g. 0.2V) which is much lower than Vth2-Vth0. Therefore, precharge voltage of nodeT becomes Vcc-ΔV, and precharge voltage of nodeB becomes Vcc, and the voltage between the source and the drain of the memory transistor MCN2 is ΔV higher than the voltage between the source and the drain of the memory transistor MCN1. Consequently, an apparent threshold voltage of the memory transistor MCN2 can be ΔV higher.

Voltage of PRET, PREB reverts back to Vcc at the time t2, and the source voltage SL is started to reduce gradually to 0V at the time t3. At this time, the flip-flop data is fixed at "1" in the case that the data of the memory cell is "1", because voltage of nodeT is reduced to 0V and voltage of nodeB becomes Vcc-ΔV by MCN1 of lower threshold voltage turning on instead of MCN2. On the other hand, in the case that the data of the memory cell is "0", the flip-flop data is fixed at "0" because voltage of nodeB is reduced to 0V and voltage of nodeT becomes Vcc by MCN2 of lower threshold voltage turning on instead of MCN1.

Moreover, in the case that the data of the memory cell is "indetermination", i.e. both threshold voltages of MCN1 and MCN2 are Vth0, the flip-flop data fixed at "1"; nodeT is reduced to 0V and nodeB becomes Vcc-ΔV by MCN1 turning on instead of MCN2, that is caused that the threshold voltage of MCN1 appears ΔV lower than that of MCN2.

The voltage of VPST reverts back to Vcc at the time t4, which is after fixing the flip-flop condition.

The voltage to take into account incipient fluctuation of threshold voltage of the transistor is appropriate for the ΔV; for example 0.2V. It is because most of memory cells that both threshold voltages of MCN1 and MCN2 are Vth0 have not written data yet and memory transistor MCN1, MCN2 are not deteriorated by writing data.

The voltage applying procedure shown in FIG. 60 is for applying voltage to fix the initial data of the memory cell at "1". On the other hand, the initial data of the memory cell can be fixed at "0" by ΔV reduction of the VPSB voltage instead of that of VPST in source voltage control of the p-type MOS transistor.

FIGS. 61A through 61C are schematic diagram illustrating a margin of data fixing in the case of the procedure shown in FIG. 60. In the initial state that both threshold voltages of MCN1 and MCN2 are Vth0, as mentioned above, the data of the memory cell is fixed to "1" by raising an apparent threshold voltage of MCN2 by ΔV due to making precharge voltage of nodeT ΔV higher than that of nodeB. When data "0" is already written to a memory cell, 0.8V of voltage differential is secured in the case of Vth2-Vth0=1V and ΔV=0.2V, although the margin is reduced by ΔV. On the other hand, when data "1" is already written to a memory cell, the voltage differential is increased to 1.2V in the case of Vth2-Vth0=1V and ΔV=0.2V by ΔV.

Figure 62A:
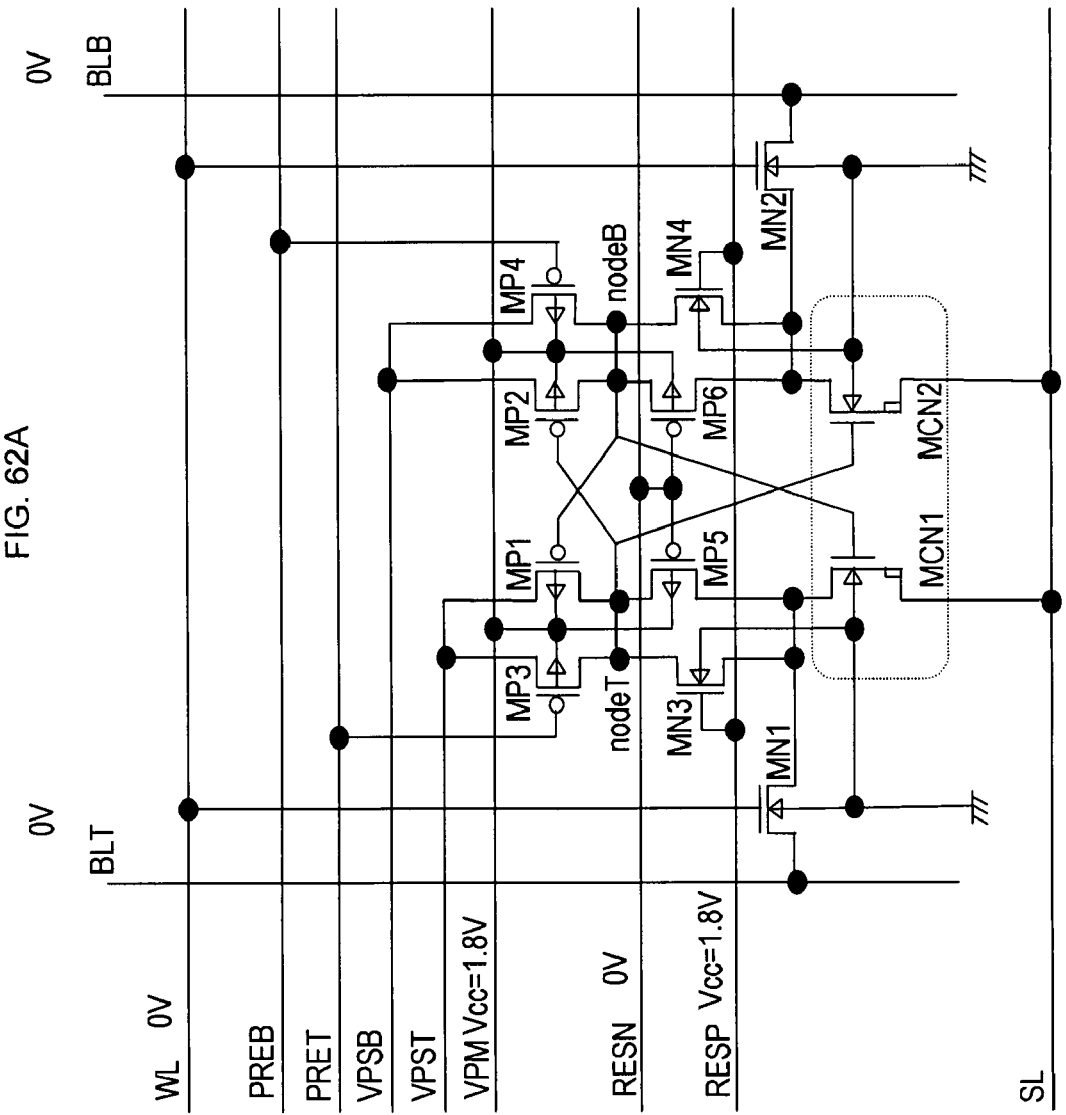
FIGS. 62A and 62B are schematic diagrams illustrating a method for fixing an initial state of the memory cell of the fourth embodiment so as to fix "1".
Figure 62B:
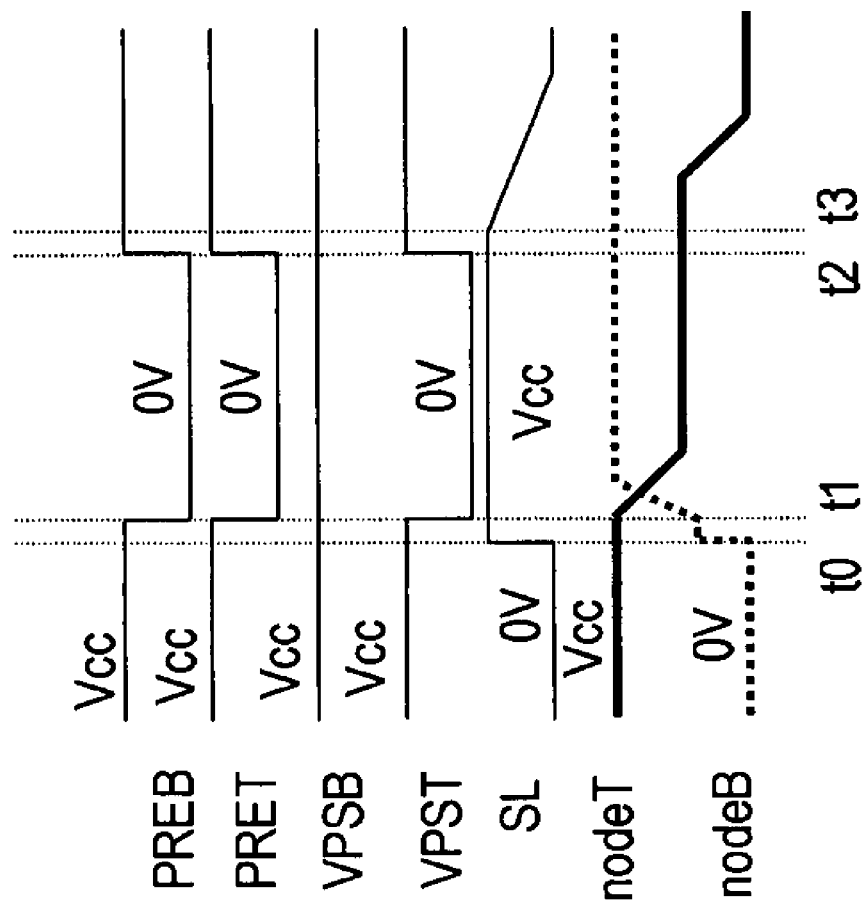

FIG. 62 is a schematic diagram showing an applied voltage condition to fix data of the memory cell of the initial state. The procedure shown in FIG. 60 is for fixing data of the entire memory cell in the memory array including the memory cells written data "0" and "1" as well as those of the initial state. On the other hand, the procedure shown in FIG. 62 is, effective only for the memory cell of the initial state, and makes the data of the memory cell in the initial state fixed at "1" or "0".

In the case of the memory array including memory cells written data as well as those of the initial state, applying the procedure only to memory cell of the initial state individually, the data of the memory cell can be fixed at "1" or "0". On the other hand, in the case of the memory array including only memory cells of the initial state, applying the procedure to the entire memory cell, the data of the memory cell can be fixed at "1" or "0". The following description shows the procedure to fix the data of the memory cell of the initial state at "1".

This procedure is preformed under the condition of setting a word line WL, bit lines BLT, BLB, and RESN at 0V and setting RESP at Vcc. To begin with, MCN1 and MCN2 is turned off state by raising a source voltage SL from 0V to Vcc at the time t0. Precharge control signals PREB, PRET and the source voltage VPST of the precharge transistor MP3 is reduced from Vcc to 0V at the time t1; thus, nodeB is charged to Vcc by the precharge transistor MP4 and nodeT is discharged through the precharge transistor MP3. The voltage of PREB and PRET is raised back to Vcc at the time t2, and the voltage of SL is reduced back to 0V from Vcc; then, MCN1 applied higher gate voltage turns on instead of MCN2; thus, nodeT is reduced to 0V under keeping the voltage of nodeB at Vcc, and the flip-flop data is fixed at "1".

The voltage applying procedure shown in FIG. 60 is for fixing the data of the memory cell at "1". On the other hand, the initial data of the memory cell can be fixed at "0". By reducing the source voltage VPSB of the precharge transistor MP4 from Vcc to 0V, instead of the source voltage VPST of the precharge transistor MP3, nodeB becomes 0V and the data is fixed at "0". On the other hand, in the procedure shown in FIG. 25, as the same voltage is applied to PREB and PRET, PREB and PRET can be connected to be applied a common signal (e.g. PRE signal).

The nonvolatile memory cell of the initial state can be used as a fuse by fixing the data at "1" by applying the procedure shown in FIG. 60 or FIG. 62. The data "1" corresponds to a state of the fuse before burning it out.

FIGS. 63 and 64 are schematic diagrams showing an applied voltage condition and a voltage applying procedure of reading data from the nonvolatile memory cell. As shown in FIG. 63, the reading operation is a operation that reading voltage of the drain line VD under the condition of applying Vcc on the gate line VG and applying 0V on the source line VS. The voltage applying procedure shown in FIG. 64 is as follows. As reading operation of SRAM, a differential sense amplifier is used for the reading operation. A voltage shift of each bit line BLT, BLB according to the data stored in the flip-flop is retrieved by the differential sense amplifier under the condition that RESN is set at 0V and RESP, PREB, PRET, VPST, VPSB, and VPM are set at Vcc, SL is set at 0V, and the word line is set at Vcc. When BLT is low voltage (0V) and BLB is high voltage (Vcc), the data is "1", on the other hand, when BLT is high voltage (Vcc) and BLB is low voltage (0V), the data is "0".

The voltage applying procedure for data fixing shown in FIG. 62 is a methods that can fix the data of the memory cell at "1" even if the memory array includes a memory cell of the initial state, i.e. a memory cell that each memory transistor MCN1, MCN2 is in the initial state (the threshold voltage=Vth0). On the other hand, voltage applying procedures shown in FIGS. 65 through 67 can be applied in the case of no memory cell of the initial state in the memory array or no need to care about unstable data of the memory cell of the initial state. This procedure does not cause the ΔV reduction of the voltage differential for fixing (cf. FIG. 61) as the procedure shown in FIG. 60.

Figure 65A:
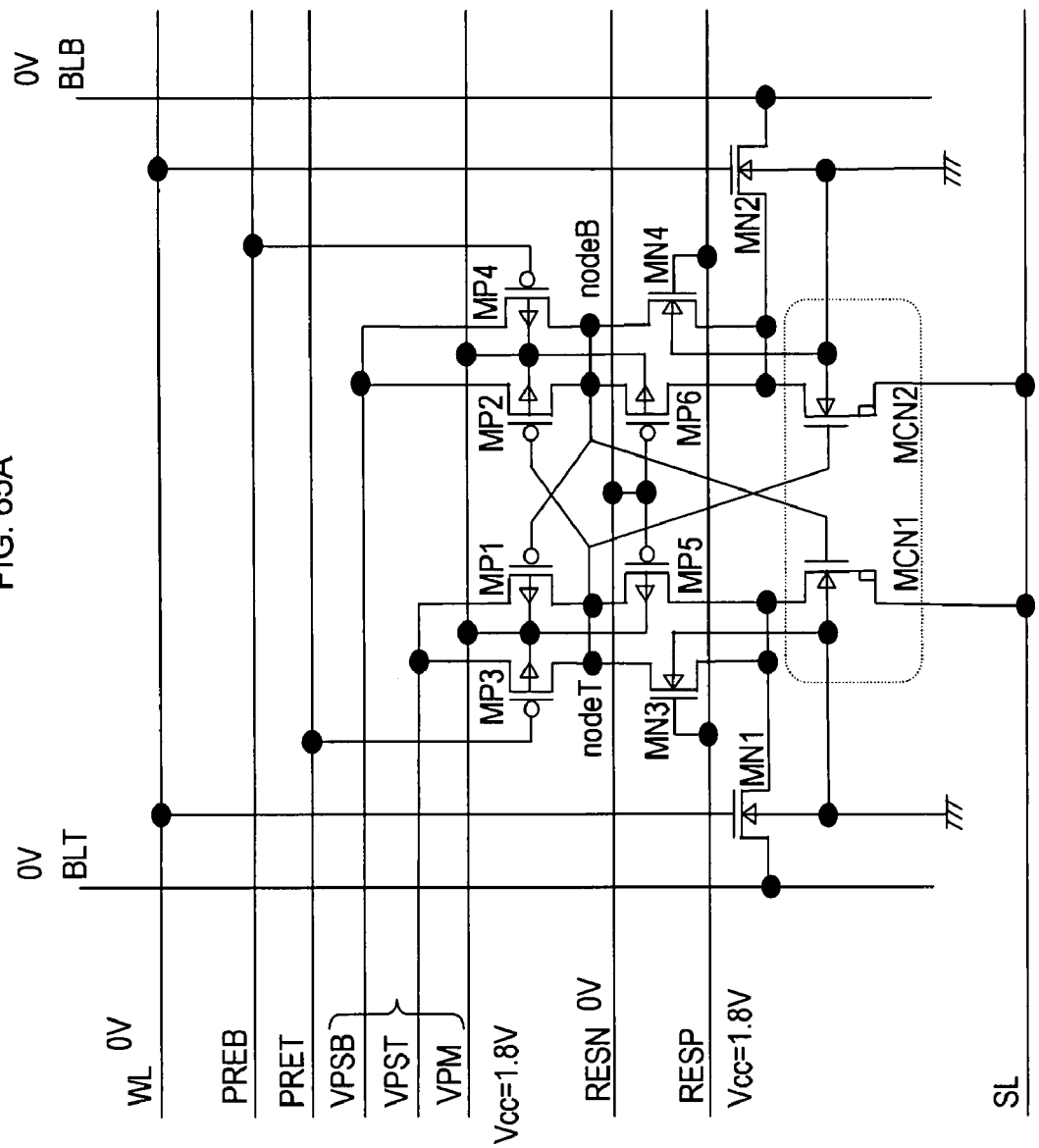
FIGS. 65A and 65B are schematic diagrams illustrating a voltage applying procedure for data fixing of the fourth embodiment.
Figure 65B:
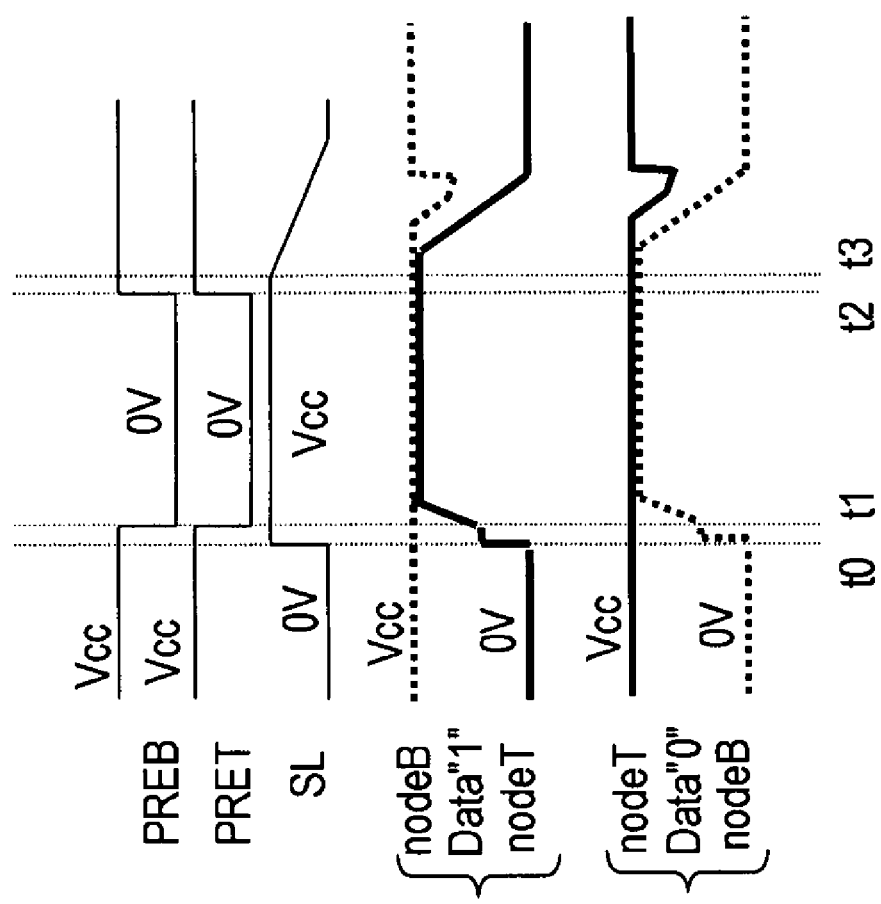

The procedure shown in FIG. 65 is as follows. Under the condition that a word line WL, bit lines BLT, BLB, and RESN are set at 0V and RESP, VPST, VPSB, and VPM are set at Vcc, the memory transistors MCN1 and MCN2 are turned off state by raising a source voltage SL from 0V to Vcc at the time t0; then, the precharge transistors MP3 and MP4 are turned on state by reducing precharge control signals PRET and PREB from Vcc to 0V at the time t11 and this gives nodeT and nodeB to be precharged up to Vcc. To finish the precharge, voltage of PRET, PREB is raised back to Vcc at the time t2, and then, the source voltage SL starts to reduce gradually to 0V at the time t3. At this time, MCN1 turns on state instead of MCN2, in the case that the data of the memory cell is "1", in another words, the threshold voltage of MCN1 is lower than that of MCN2; thus, nodeT is reduced to 0V and nodeB becomes Vcc, which means that the flip-flop data is fixed at "1". On the other hand, in the case that the data of the memory cell is "0", MCN2 turns on state instead of MCN1, thus, nodeB is reduced to 0V and nodeT becomes Vcc, which means that the flip-flop data is fixed at "0".

Figure 66A:
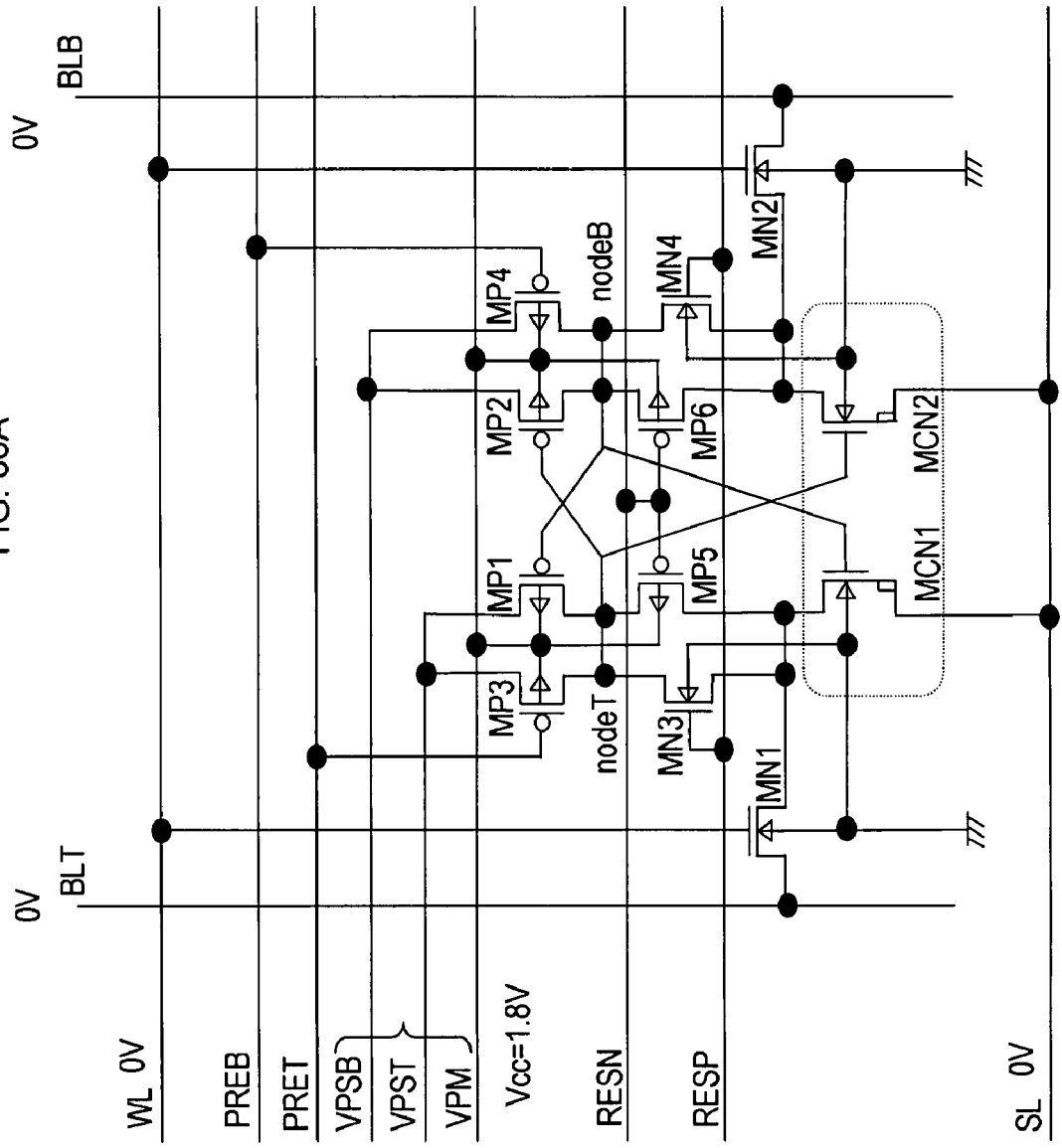
Figure 66B:
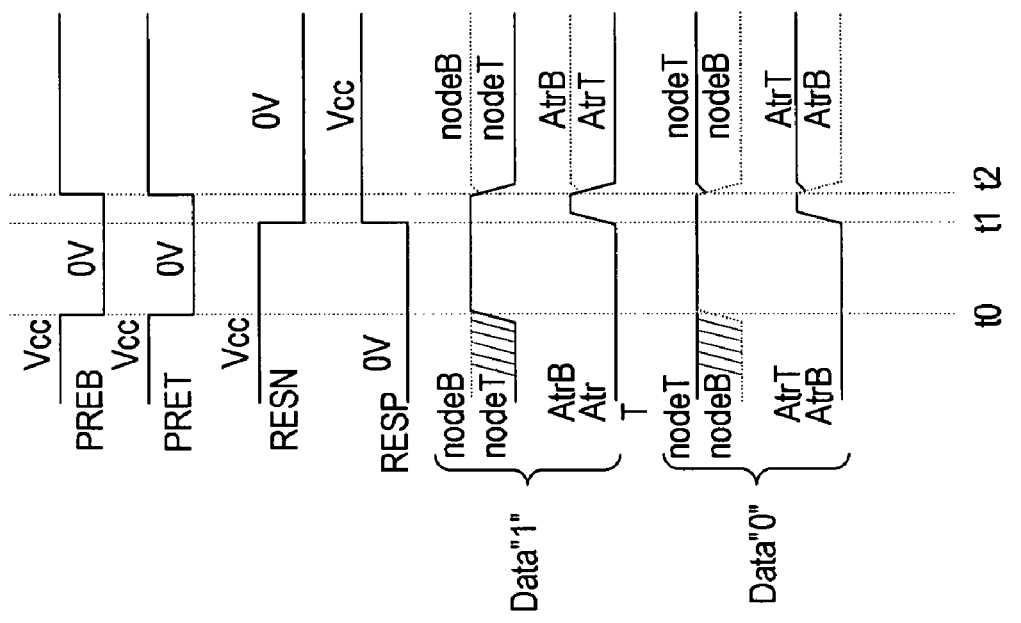

The procedure shown in FIG. 66 is as follows. Under the condition of setting a word line WL, bit lines BLT, BLB, and RESP at 0V, RESN, VPST, VPSB, and VPM at Vcc and fixing a source voltage SL at 0V, the precharge transistors MP3 and MP4 are turns on state to precharge nodeT and nodeB by reducing precharge control signals PRET and PREB from Vcc to 0V at the time t0. At this time, nodeT and nodeB are precharged to Vcc because the transistors MN3, MN4, MN5, and MN6 are off state. On the other hand, drain AtrT of MCN1 and drain AtrB of MNC2 are nearly 0V because they are set floating state. At the time of t1, PESN is set at 0V and RESP is set at Vcc. At this time, nodeT and AtrT as well as nodeB and AtrB are set conduction state and AtrT and AtrB are charged to Vcc because the transistors MN3, MN4, MN5, and MN6 are on state. At the time of t2, PRET and PREB are raised from 0V to Vcc. In the case of data "1", the voltage of nodeT becomes lower than that of nodeB because the resistance value of MCN1 of lower threshold voltage is lower than that of MCN2; thus, the data of the flip-flop is fixed at "1". On the other hand, in the case of data "0", the voltage of nodeB becomes lower than that of nodeT because the resistance value of MCN2 of lower threshold voltage is lower than that of MCN1; thus, the data of the flip-flop is fixed at "0".

The procedure for fixing data has an advantage in terms of consumption of current compared to that of the second embodiment shown in FIG. 29 because the term of the DC penetration current flows in the flip-flop at the time of precharge is limited to length of time between t1 and t2.

Figure 67B:
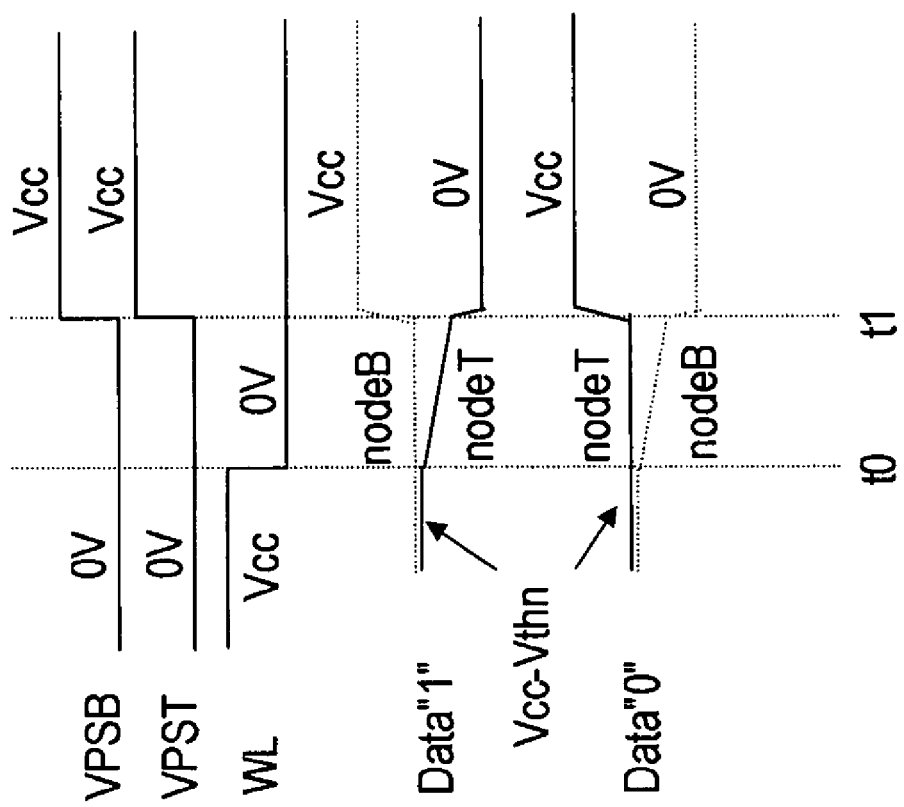

The procedure shown in FIG. 67 is as follows. The feature of this procedure for fixing data is that precharge voltage for nodeT and nodeB is supplied from bit lines. NodeT and nodeB are precharged to Vcc−Vthn through a transfer gate MN1 or MN2 by the bit line BLT or BLB that is charged up to Vcc, due to fixing PRET and PREB at Vcc as well as setting a word line WL, the bit lines BLT and BLB at Vcc and setting VPST and VPSB at 0V to cut off MP1 through Mp4. Here, Vthn is threshold voltage of MP1 and MP2. NodeT and nodeB are set floating state by reducing the voltage of the word line WL from Vcc to 0V at the time t0; then, the flip-flop data is fixed by the discharge differential from MCN1 and MCN2. In the case of data "1", the voltage of nodeT becomes lower than that of nodeB because the resistance value of MCN1 of lower threshold voltage is lower than that of MCN2; thus, the data of the nonvolatile memory cell is fixed at "1" after raising voltage of VPST and VPSB from 0V to Vcc at the time t1. On the other hand, in the case of data "0", the voltage of nodeB becomes lower than that of nodeT because the resistance value of MCN2 of lower threshold voltage is lower than that of MCN1; thus, the data of the nonvolatile memory cell is fixed at "0" after raising the voltage of VPST and VPSB from 0V to Vcc at the time t1. Then VPS is raised to Vcc at the time t1.

In addition, as described in the second embodiment with reference to FIG. 31 and FIG. 32, the nonvolatile memory device of the fourth embodiment permits a different length or a different width of channel of the memory transistors MCN1, MCN2, and the load transistor MP1, MP2. the nonvolatile memory device of the fourth embodiment also permits asymmetric circuit configuration of the flip-flop by connecting a capacitor to one of inverters.

A Measuring Method of the Threshold Voltage for the Fourth Embodiment

Figure 68:
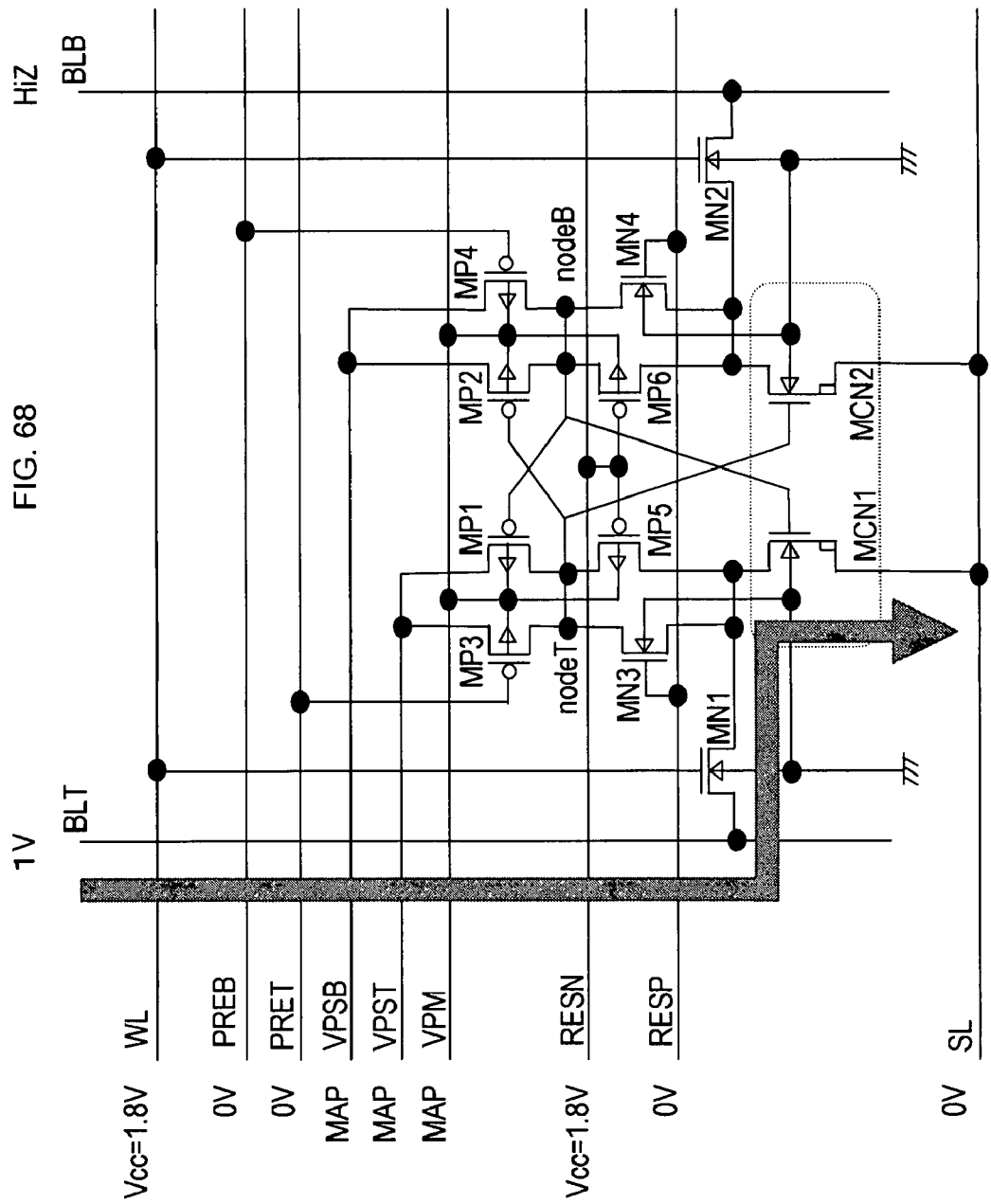
FIG. 68 is a schematic diagram illustrating a method for measuring a threshold voltage of the memory transistor.

Additionally, when the nonvolatile memory cell with the VPS separating type 12-transistor configuration is used, the configuration of voltage shown in FIG. 68 makes it possible to measure the threshold voltage of the memory transistor. This method enables to measure at least one of the values including the incipient threshold voltage fluctuation, a variation of the threshold voltage in the time of programming operation or erase operation, and a retention characteristic of the threshold voltage under high temperature after rewriting.

FIG. 68 shows a case where the threshold voltage of the memory transistor MCN1 is measured. Under the condition that a source voltage SLT of the memory transistor MCN1 is set at 0V, the drain (nodeT) of the memory transistor MCN1 is supplied with 1V from the bit line BLT through the transfer gate MN1. NodeB is provided with VPSB voltage (MAP voltage) from the load transistor MP4.

The load transistor MP3 becomes power-on and supplies nodeT with a MAP voltage in the case that VPSB voltage is not less than Vthp because the gate voltage PRET is set at 0V. Also, the load transistor MP4 becomes power-on and is able to supply nodeB with a MAP voltage in the case that VPSB voltage is not less than Vthp because the gate voltage PREB is set at 0V. The Vthp is the threshold voltage of the p-type MOS transistor shown as MP1~MP4, and a threshold voltage of the transistor produced by a conventional CMOS process is about 0.7V. Accordingly, the threshold voltage (required gate voltage for a certain current flow) of MCN1 can be measured. During the measurement of the threshold voltage of MCN1, BL can stay at 0V because transistors MN3, MP5, MN4 and MP6 are not set conduction state and both a pass from nodeT to SL and a pass from nodeB to SL are cut off.

FIG. 68 shows an applied voltage condition for measuring the threshold voltage of the memory transistor MCN1, on the other hand, the measurement of the threshold voltage of the memory transistor MCN2 can be achieved by only reversing control of the bit lines BLT, BLB.

In addition, it is not necessary to divide the precharge line into two lines PRET, PREB to measure the threshold voltage.

The Fifth Embodiment

A nonvolatile memory device and a semiconductor integrated circuit device therewith of the fifth embodiment will now be described with referent to FIG. 69 and FIG. 70.

Figure 69:
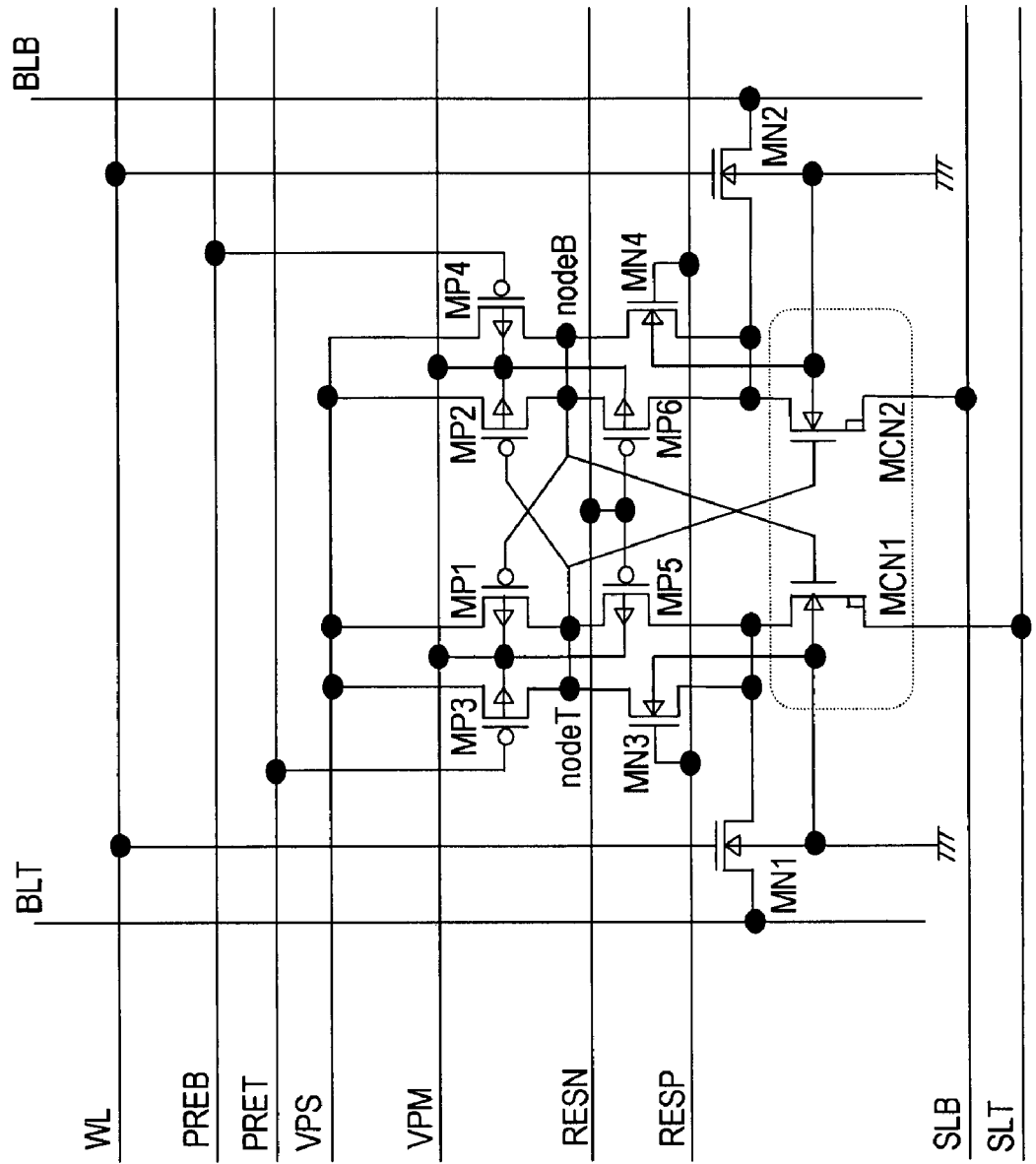
FIG. 69 is a schematic diagram showing a SL (source line) separating type 12-transistor memory cell configuration of the fifth embodiment of the present invention.

FIG. 69 is a circuit diagram of one nonvolatile memory cell of a nonvolatile memory device. This memory cell has a 12-transistor configuration that an analog switch is added to an SL separating type transistor described in the third embodiment.

The memory cell has a static latch type flip-flop formed by connecting an inverter (true-side-inverter) formed by series connection of a p-type MOS transistor MP1 and an n-type MOS transistor MCN1 and an inverter (bar-side-inverter) formed by series connection of a p-type MOS transistor MP2 and an n-type MOS transistor MCN2. The p-type MOS transistors MP1 and MP2 are referred to as load transistors, and n-type MOS transistors MCN1 and MCN2 are referred to as memory transistors. The memory transistors MCN1 and MCN2 can be injected and erased electrons in a side wall of a gate. The threshold voltage of the memory transistors MCN1 and MCN2 are changed without volatilization, thus the memory transistors MCN1 and MCN2 perform as nonvolatile device.

This memory cell has further an analog switch, between a p-type transistor MP1 and an n-type transistor MCN1, comprising a p-type MOS transistor MP5 and an n-type MOS transistor MN3. This memory cell has also an analog switch, between a p-type transistor MP2 and an n-type transistor MCN2, comprising a p-type MOS transistor MP6 and an n-type MOS transistor MN4. An RESN line is connected to the gates of MP5 and MP6, and an RESP line is connected to the gates of MP2 and VPSB.

A side edge of the memory transistor of the true-side-inverter, i.e. a source of the memory transistor MCN1 is connected to a source line SLT. A side edge of the memory transistor of the bar-side-inverter, i.e. a source of the memory transistor MCN2 is connected to a bar-side source line SLB. In addition, side edges of the load transistor of both inverters, i.e. sources of load transistors MP1 and MP2 are connected to VPS line.

In the flip-flop, the inverter (true-side-inverter) formed by series connection of the load transistor MP1 and the memory transistor MCN1 performs as a memory unit for the "true" state of the cell, and the inverter (bar-side-inverter) formed by series connection of the load transistor MP2 and the memory transistor MCN2 performs as a memory unit for the "bar" state of the cell. The junction of the load transistor MP1 with the memory transistor MCN1 is nodeT, and the junction of the load transistor MP2 with the memory transistor MCN2 is nodeB. If nodeT has a high voltage and nodeB has a low voltage, then "0" is written in the memory, and if nodeT has a low voltage and nodeB has a high voltage, then "1" is recorded in the memory.

NodeT is connected to a bit line BLT (BitLine-True) through a transfer gate MN1, and NodeB is connected to a bit line BLB (BitLine-Bar) through a transfer gate MN2. Each transfer gate MN1, MN2 is composed of an n-type transistor, and each gate is connected to a common word line WL.

In addition, a p-type MOS transistor MP3 as a precharge transistor is connected in parallel, i.e. between nodeT and VPST, with the load transistor MP1. Moreover, a p-type MOS transistor MP4 as a precharge transistor is connected in parallel, i.e. between nodeB and VPSB, with the load transistor MP2. The true-side-precharge line PRET is connected to the p-type MOS transistor MP3, and the bar-side-precharge line PREB is connected to the p-type MOS transistor MP4. Furthermore, each p-type MOS transistor MP1~MP6 is formed in the same N well, and a voltage of the N well is controlled by VPM signal.

A configuration and operation of memory transistors MCN1 and MCN2 of a nonvolatile memory cell of this embodiment is the same as those of the fourth embodiment described in FIG. 53 through FIG. 68 but data fixing procedure. Therefore, only the data fixing procedure will now be described.

Figure 70A:
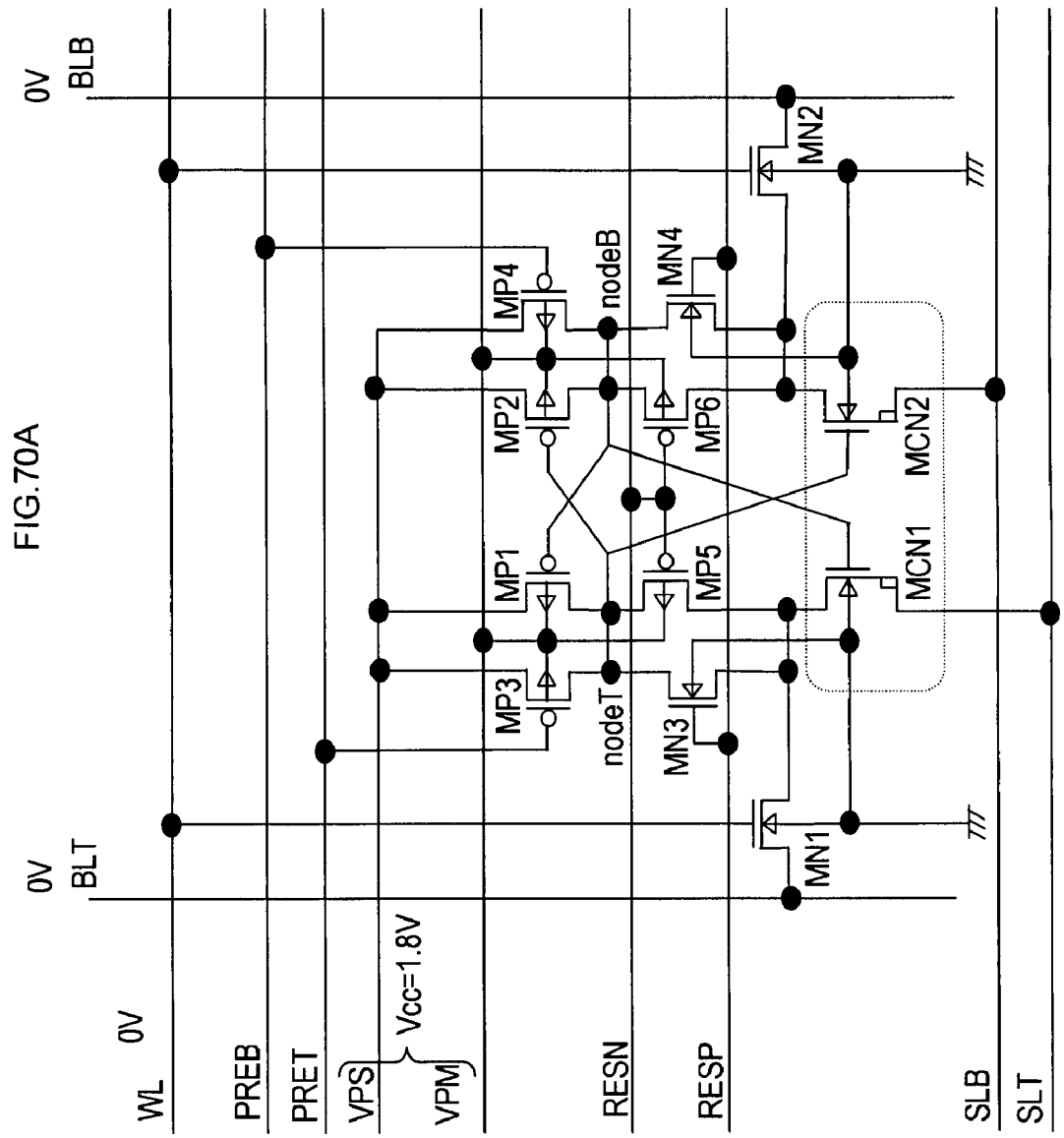
FIGS. 70A and 70B are schematic diagrams illustrating a voltage applying procedure for data fixing of the fifth embodiment to fix data "1" even if no programming operation is performed.
Figure 70B:
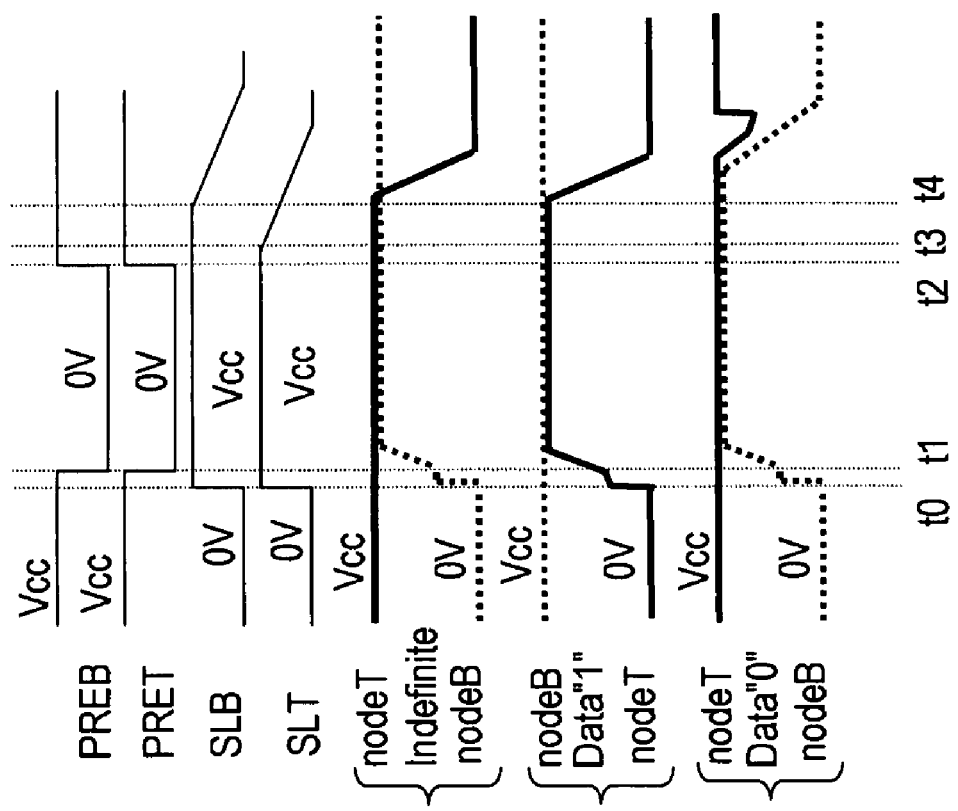

FIG. 70 is a schematic diagram showing a voltage applying procedure to fix data of the nonvolatile memory cell. This procedure fixes data of a memory cell to which data "1" or "0" is written as it is written, and fixes data of a memory cell at "1" which is of the initial state. By the procedure for the whole memory cell of the array including memory cell written data "0" or "1" and that of the initial state, the data of the memory cell written data "0" or "1" is set as it is written, also the data of the memory cell of the initial state is fixed the data at "1". This procedure is performed at the time of start-up of the memory.

The procedure shown in FIG. 70 is as follows. This procedure is preformed under the condition of setting a word line WL, bit lines BLT, BLB, and RESN at 0V and setting RESP, VPS, and VPM at Vcc. To begin with, the memory transistors MCN1 and MCN2 are made to turn off state by raising a source voltage SL from 0V to Vcc at the time t0. Then, reducing precharge control signals PRET and PREB from Vcc to 0V at the time t1 leads to power on of the precharge transistors MP3 and MP4. At the same time, Vcc is applied to nodeT and nodeB.

Voltage of PRET, PREB reverts back to Vcc at the time t2, and the source voltage SLT is started to reduce gradually to 0V at the time t3. The source voltage of SLB is started to raise gradually to 0V at the time t4. At this time, The voltages SLB and SLT are controlled so as to satisfy the formula SLB−SLT=ΔVs (e.g. ΔVs=0.2V). Consequently, the voltage between the source and the drain of the memory transistor MCN2 is controlled to be ΔV higher than that of the memory transistor MCN1, thus the threshold voltage of MCN2 appears ΔVs higher than that of MCN1.

At this time, the flip-flop data is fixed at "1" in the case that the data of the memory cell is "1", because voltage of nodeT is reduced to 0V and voltage of nodeB becomes Vcc by MCN1 of lower threshold voltage turning on instead of MCN2. On the other hand, in the case that the data of the memory cell is "0", the flip-flop data is fixed at "0" because voltage of nodeB is reduced to 0V and voltage of nodeT becomes Vcc by MCN2 of lower threshold voltage turning on instead of MCN1.

Moreover, in the case that the data of the memory cell is "indetermination", i.e. both threshold voltages of MCN1 and MCN2 are Vth0, the flip-flop data fixed at "1"; nodeT is reduced to 0V and nodeB becomes Vcc by MCN1 turning on instead of MCN2, that is because the threshold voltage of MCN1 appears ΔVs lower than that of MCN2.

The voltage to take into account incipient fluctuation of threshold voltage of the transistor is appropriate for the ΔV; for example 0.2V. It is because most of memory cells that both threshold voltages of MCN1 and MCN2 are Vth0 have not written data yet and memory transistor MCN1, MCN2 are not deteriorated by writing data.

The voltage applying procedure shown in FIG. 70 is for applying voltage to fix the initial data of the memory cell at "1". On the other hand, the initial data of the memory cell can be fixed at "0" by reversing the relationship between SLT and SLB in terms of the control of the source voltage of the memory transistor. On the other hand, in the procedure shown in FIG. 70, as the same voltage is applied to PREB and PRET, PREB and PRET can be connected to be applied a common signal (e.g. PRE signal).

The Sixth and the Seventh Embodiment

Figure 71:
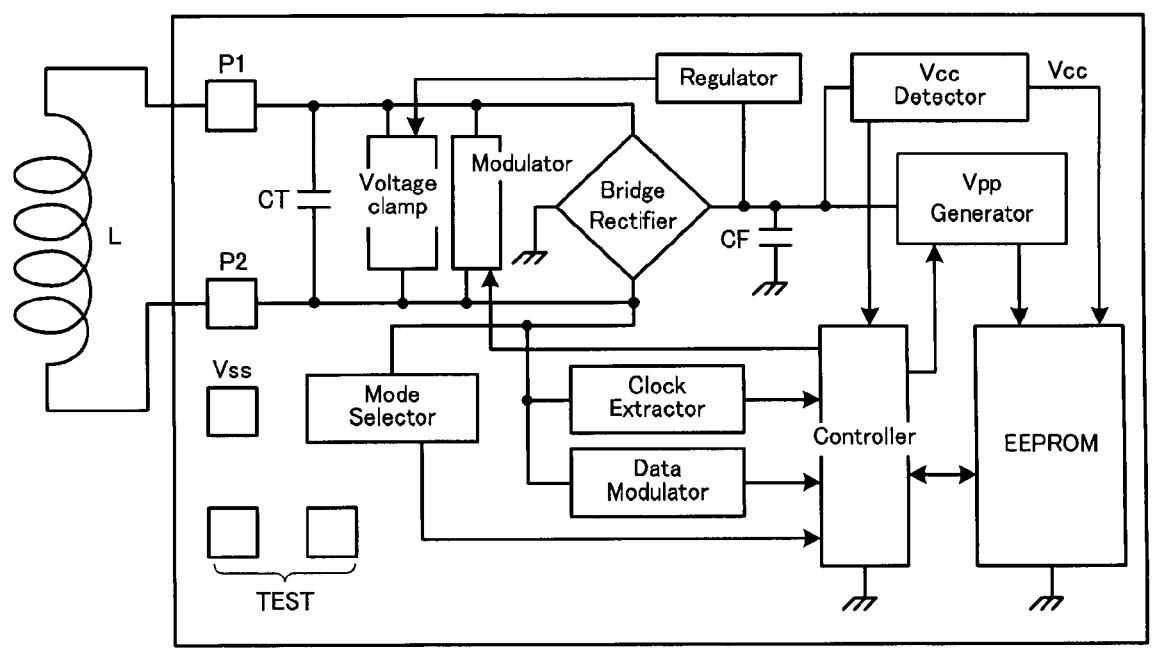
FIG. 71 is a configuration of a RFID chip on which the memory cells of the above embodiments are stored.

FIG. 71 is a block diagram showing an RFID chip with the above-mentioned nonvolatile memory cell. An antenna L laid out outside of the chip is connected to pads P1 and P2 to receive RF signals from an outside reader. A 120 pF capacitance power-supply capacitor CT, a voltage clamp, a modulator, and a bridge rectifier are connected to the line between the foregoing pads P1 and P2. The power-supply (stabilizing) capacitor CT that is connected to the output of the bridge rectifier contributes to stabilizing the power supply voltage by providing feed-back of the regulator control signals to detect the output voltage to the foregoing voltage clamp. Moreover, the output of the foregoing bridge rectifier is connected to a Vcc detector generating internal power voltage Vcc, a Vpp generator generating various kind of voltages other than Vcc. Additionally, the output of the foregoing bridge rectifier is equipped with a mode selector detecting an operation mode in the RF signals received by the foregoing bridge rectifier, a clock extractor, and a data modulator retrieving write data of a module of nonvolatile memory devices (EEPROM). A controller controls operation of the module of the nonvolatile memory device (EEPROM) based on the data of the operation mode.

An ID number for chip authentication, an address for home delivery, merchandise information (e.g. price, manufacturing date, place of production, producer, and component information), essential Information (e.g. flight number, owner name, boarding place, and destination) for an airfreight tag alternating a barcode are written in the module (EEPROM) of the nonvolatile memory device mounted on this RFID chip.

Figure 72:
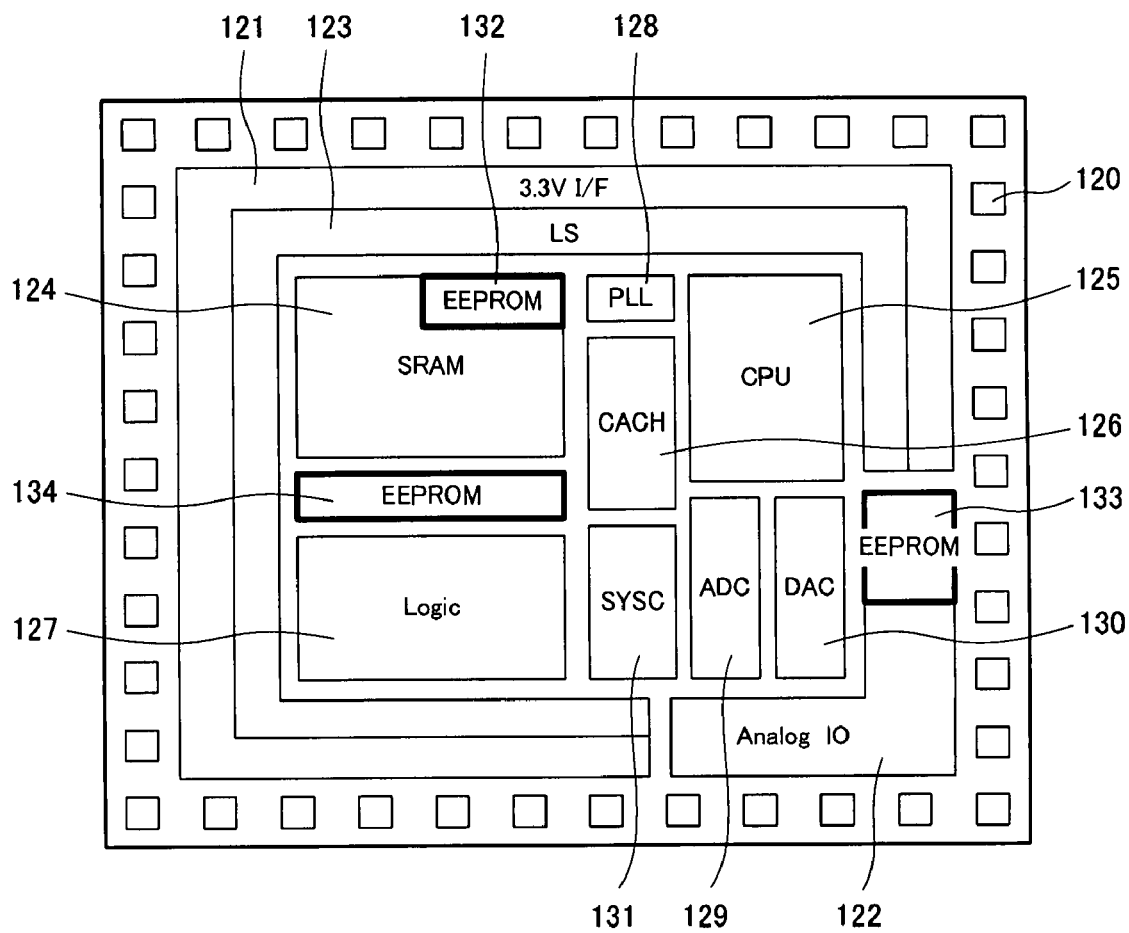
FIG. 72 is a configuration of a system LSI chip on which the memory cells of the above embodiments are stored.

FIG. 72 is a general plan view depicting a system LSI chip as one embodiment of semiconductor integrated circuit device with the nonvolatile memory cell of the present invention. In the system LSI shown in FIG. 54, a number of external connection electrodes 120 such as bond pads are laid out in the vicinity of the semiconductor substrate, and an external input/output circuit 121 as well as an analog input/output circuit 122 inside of the external connection electrodes 120, although the layout of the system is not limited to the foregoing one. The external input/output circuit 121 and the analog input/output circuit 122 use an relatively high-level external power supply such as 3.3V power supply as an operating power supply. A level shifter circuit 123 reduce the voltage of the foregoing external power supply to an internal power supply voltage such as 1.8V.

The system LSI chip has a static random access memory (SRAM) 124, a central processing unit (CPU) 125, a cash memory (CASH) 126, a logic circuit (Logic) 127, a phase-locked loop circuit (PLL) 128, an analog digital converter (ADC) 129, an digital analog converter (DAC) 130, and a system controller (SYSC) 131 inside of the level shifter circuit 123. Components shown as 132, 133, and 134 are nonvolatile memories (EEPROM) that can be independently erased and written electrically, and have the nonvolatile memory device with required capacitance for the present invention.

The foregoing nonvolatile memory 132 is used to store relief information (control information for replacing defective memory cells by redundant memory cells) of the SRAM 124.

In addition, the nonvolatile memory cell 133 is mounted instead of a relief program circuit with a fuse and is used for storing information to identify a circuit constant of an analog circuit of a constant trimming circuit that trims the foregoing circuit constant, storing trimming data of transmission frequency of the analog circuit, or recording information to identify the foregoing reference voltage of the voltage trimming circuit.

Moreover, the foregoing nonvolatile memory 134 is used for storing an ID information of the chip, operation mode information of the chip, and other required data by mounting a 256 bit memory capacitance.

What is claimed is:

1. A nonvolatile semiconductor memory device comprising:
   a flip-flop having a first node (node T) and a second node (node B), the flip-flop having a first inverter to control the first node and a second inverter to control the second node, the first inverter and the second inverter being cross coupled, the first inverter including a first load transistor (MP1) and a first cell transistor (MCN1) connected in series, the second inverter including a second load transistor (MP2) and a second cell transistor (MCN2) connected in series, each of the first cell transistor and the second cell transistor being a threshold controllable transistor;
   a first bit line (BLT) and a second bit line (BLB);
   a voltage source line (SL) commonly and directly connected to a source of the first cell transistor and a source of the second cell transistor;
   a word line;

a first gate transistor (MN1) connected between the first bit line and the first node, the first gate transistor being controlled by the word line;

a second gate transistor (MN2) connected between the second bit line and the second node, the second gate transistor being controlled by the word line;

a first precharge transistor (MP3) connected in parallel to the first load transistor; and a second precharge transistor (MP4) connected in parallel to the second load transistor, wherein the voltage source line (SL) is configured so as to provide a positive voltage to the source of the first cell transistor (MCN1) and the source of second cell transistor (MCN2) in a write mode.

2. The nonvolatile semiconductor memory device according to claim 1, wherein:
each of the first cell transistor and the second cell transistor has a sidewall spacer to trap carriers.

3. The nonvolatile semiconductor memory device according to claim 1, wherein:
each of the first cell transistor and the second cell transistor has a source diffusion and a drain diffusion with different impurity profile than the source diffusion.

4. The nonvolatile semiconductor memory device according to claim 1, further comprising:
a first voltage supply line (VPST) connected to a source of the first load transistor; and
a second voltage supply line (VPSB) connected to a source of the second load transistor.

5. The nonvolatile semiconductor memory device according to claim 4 wherein:
one of the first and the second bit lines is controlled to be a first voltage during a programming operation; and
the first and the second voltage supply lines are controlled to be a second voltage higher than the first voltage during the programming operation,
wherein the first voltage is a logical high voltage (Vcc).

6. The nonvolatile semiconductor memory device according to claim 1, further comprising:
a common voltage supply line (VPS) connected to a source of the first load transistor and a source of the second load transistor.

7. The nonvolatile semiconductor memory device according to claim 6 wherein:
one of the first and the second bit lines is controlled to be a first voltage at maximum during a programming operation; and
the common voltage supply line is controlled to be a second voltage higher than the first voltage at maximum during the programming operation.

8. The nonvolatile semiconductor memory device according to claim 1, wherein:
sizes of the first load transistor and that of the second load transistor are different.

9. The nonvolatile semiconductor memory device according to claim 1, further comprising:
a first capacitor connected to the first node; and
a second capacitor connected to the second node.

10. The nonvolatile semiconductor memory device according to claim 1 further comprising:
a first switching transistor (MP5) connected between the first load transistor and the first cell transistor;
a second switching transistor (MP6) connected between the second load transistor and the second cell transistor;
a first analog switch transistor (MN3) connected between the first node and the first gate transistor; and a second analog switch transistor (MN4) connected between the second node and the second gate transistor.

11. The nonvolatile semiconductor memory device according to claim 10, wherein:
each of the first cell transistor and the second cell transistor has a sidewall spacer to trap carriers.

12. The nonvolatile semiconductor memory device according to claim 10, wherein:
each of the first cell transistor and the second cell transistor has a source diffusion and a drain diffusion with different impurity profile than the source diffusion.

13. The nonvolatile semiconductor memory device according to claim 10, further comprising:
a first voltage supply line (VPST) connected to a source of the first load transistor; and
a second voltage supply line (VPSB) connected to a source of the second load transistor.

14. The nonvolatile semiconductor memory device according to claim 13 wherein:
one of the first and the second bit lines is controlled to be a first voltage during a programming operation; and
the first and the second voltage supply lines are controlled to be a second voltage higher than the first voltage during the programming operation,
wherein the first voltage is a logical high voltage (Vcc).

15. The nonvolatile semiconductor memory device according to claim 10, further comprising:
a common voltage supply line (VPS) connected to a source of the first load transistor and a source of the second load transistor.

16. The nonvolatile semiconductor memory device according to claim 15 wherein:
one of the first and the second bit lines is controlled to be a first voltage at maximum during a programming operation; and
the common voltage supply line is controlled to be a second voltage higher than the first voltage at maximum during the programming operation.

17. A nonvolatile semiconductor memory device comprising:
a flip-flop having a first node (node T) and a second node (node B), the flip-flop having a first inverter to control the first node and a second inverter to control the second node, the first inverter and the second inverter being cross coupled, the first inverter including a first load transistor (MP1) and a first cell transistor (MCN1) connected in series, the second inverter including a second load transistor (MP2) and a second cell transistor (MCN2) connected in series, each of the first cell transistor and the second cell transistor being a threshold controllable transistor without floating gate;
a first bit line (BLT) and a second bit line (BLB);
a voltage source line (SL) commonly and directly connected to a source of the first cell transistor and a source of the second cell transistor;
a word line;
a first gate transistor (MN1) connected between the first bit line and the first node, the first gate transistor being controlled by the word line;
a second gate transistor (MN2) connected between the second bit line and the second node, the second gate transistor being controlled by the word line;
a first voltage supply line (VPST) connected to a source of the first load transistor; and
a second voltage supply line (VPSB) connected to a source of the second load transistor, independent from the first voltage supply line (VPST), wherein the voltage source line (SL) is configured so as to provide a positive voltage to the source of the first cell transistor (MCN1) and the source of second cell transistor (MCN2) in a write mode.

18. The nonvolatile semiconductor memory device according to claim 17, wherein:
each of the first cell transistor and the second cell transistor has a sidewall spacer to trap carriers.

19. The nonvolatile semiconductor memory device according to claim 17, wherein:
each of the first cell transistor and the second cell transistor has a source diffusion and a drain diffusion with different impurity profile than the source diffusion.

20. The nonvolatile semiconductor memory device according to claim 17, wherein:
sizes of the first load transistor and that of the second load transistor are different.

21. The nonvolatile semiconductor memory device according to claim 17, further comprising:
a first capacitor connected to the first node; and
a second capacitor connected to the second node.

22. The nonvolatile semiconductor memory device according to claim 17 wherein:
one of the first and the second bit lines is controlled to be a first voltage during a programming operation; and
the first and the second voltage supply lines are controlled to be a second voltage higher than the first voltage during the programming operation,
wherein the first voltage is a logical high voltage (Vcc).

* * * * *